US011016372B2

(12) United States Patent
Endo et al.

(10) Patent No.: US 11,016,372 B2
(45) Date of Patent: May 25, 2021

(54) ELECTRONIC APPARATUS TO WHICH ACCESSORY IS REMOVABLY ATTACHED, ACCESSORY, AND SYSTEM

(71) Applicant: CANON KABUSHIKI KAISHA, Tokyo (JP)

(72) Inventors: Yosaku Endo, Yokohama (JP); Yusuke Mogi, Kawasaki (JP); Yasuhiro Kojima, Inagi (JP); Yuko Teruya, Yokohama (JP); Hideki Toichi, Tokyo (JP); Shigeshi Maekawa, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/855,504

(22) Filed: Apr. 22, 2020

(65) Prior Publication Data
US 2020/0355990 A1    Nov. 12, 2020

(30) Foreign Application Priority Data

May 10, 2019  (JP) .............................. JP2019-089926
May 10, 2019  (JP) .............................. JP2019-089927
(Continued)

(51) Int. Cl.
*G03B 17/56*    (2021.01)
*H04N 5/225*    (2006.01)
(Continued)

(52) U.S. Cl.
CPC ........... *G03B 17/563* (2013.01); *F16M 13/04* (2013.01); *H04N 5/2252* (2013.01); *G03B 2217/002* (2013.01); *H05K 1/189* (2013.01)

(58) Field of Classification Search
USPC ....................................................... 396/420
See application file for complete search history.

(56) References Cited

U.S. PATENT DOCUMENTS

| 5,381,179 | A | * | 1/1995 | Kashimura | ........ | H04N 5/23209 |
| | | | | | | 348/376 |
| 5,696,555 | A | * | 12/1997 | Kashimura | ........ | H04N 5/23209 |
| | | | | | | 348/316 |
| 2021/0055632 | A1 | * | 2/2021 | Nakamura | ............. | G03B 17/14 |

FOREIGN PATENT DOCUMENTS

| JP | H04102799 A | 4/1992 |
| JP | H0822437 A | 1/1996 |

(Continued)

*Primary Examiner* — Clayton E. LaBalle
*Assistant Examiner* — Warren K Fenwick
(74) *Attorney, Agent, or Firm* — Rossi, Kimms & McDowell LLP

(57) ABSTRACT

An electronic apparatus to which an accessory is removably attached. One of a grip and an image capture apparatus body includes a first attachment part formed by a first screw, a first electrical connection part disposed outside the first screw, and a first engagement part formed outside the first electrical connection part. The other of them includes a second attachment part formed by a second screw and screwed with the first screw, a second electrical connection part disposed outside the second screw, and electrically connected to the first electrical connection part, and a second engagement part formed outside the second electrical connection part, and engaged with the first engagement part. When the first and second screws are screwed, the first and second engagement parts are engaged, and the first and second electrical connection parts are electrically connected.

33 Claims, 83 Drawing Sheets

(30) Foreign Application Priority Data

| May 10, 2019 | (JP) | ............................ JP2019-089928 |
| May 10, 2019 | (JP) | ............................ JP2019-089929 |
| May 21, 2019 | (JP) | ............................ JP2019-095297 |
| May 21, 2019 | (JP) | ............................ JP2019-095298 |
| May 21, 2019 | (JP) | ............................ JP2019-095299 |
| Apr. 7, 2020 | (JP) | ............................ JP2020-068879 |

(51) Int. Cl.
*F16M 13/04* (2006.01)
*H05K 1/18* (2006.01)

(56) References Cited

FOREIGN PATENT DOCUMENTS

| JP | H11154536 A | 6/1999 |
| JP | 2007194953 A | 8/2007 |
| JP | 2013092678 A | 5/2013 |

* cited by examiner

ELECTRONIC APPARATUS TO WHICH ACCESSORY IS REMOVABLY ATTACHED, ACCESSORY, AND SYSTEM

BACKGROUND OF THE INVENTION

Field of the Invention

The present invention relates to an electronic apparatus, an accessory, and a system, and more particularly to an electronic apparatus to which removably attached is an accessory which is provided for an electronic apparatus body and has electrical contacts, and to a technique for protecting electrical contacts included in the electronic apparatus.

Description of the Related Art

In general, an image capture apparatus as one of electronic apparatuses is provided with a grip (one of accessories) to be gripped by a user for holding an image capture apparatus body, and this grip is sometimes configured to be removably attached to the image capture apparatus body. For example, if the grip is removably attached to the image capture apparatus body, it is possible to reduce a space occupied by the image capture apparatus itself, in cases where the grip is not needed, including a case where a tripod is used.

Further, assuming that the grip is configured to be rotatable with respect to the image capture apparatus body, when a user changes the shooting angle, for example, from a high-shooting angle to a low shooting-angle, the user can smoothly change the shooting angle in a state in which the user is holding the grip.

On the other hand, them is a case where a cable is used to perform power supply and communication between the image capture apparatus body and the grip (see e.g. Japanese Laid-Open Patent Publication (Kokai) No. 2013-92678). However, in a case where a cable is used, the image capture apparatus body and the grip are increased in size, due to the necessity of inserting and routing the cable, the necessity of providing a space for accommodating connection terminals, and so forth. Further, in a case where the grip is rotated, routing of the cable becomes complicated.

To solve this problem, there has been proposed a camera configured such that electrical contacts are provided on a fixing portion provided on a grip, and electrical communication is enabled by attachment of the grip to the image capture apparatus body (see e.g. Japanese Laid-Open Patent Publication (Kokai) No. 2007-194953).

However, in Japanese Laid-Open Patent Publication (Kokai) No. 2007-194953, the image capture apparatus body and the grip are fixed to each other by bayonet fixing, and hence it is difficult to firmly fix the image capture apparatus body and the grip to each other. As a result, there is a possibility that the fixation between the grip and the image capture apparatus body is loosened in a state in which the grip is held by a user. Further, if looseness is caused in the state in which the grip is held by a user, a gap is created between the electrical contacts, which can cause unstable electrical connection.

As a method of fixing (connecting) two devices at a desired angle, there has been known a method using a rosette (toothed washer)(see e.g. Japanese Laid-Open Patent Publication (Kokai) No. H04-102799), and this method can be used to attach and remove a grip to and from an image capture apparatus. A rosette and a screw are disposed in both of the image capture apparatus and the grip, and it is possible to fix the grip to the image capture apparatus at a desired angle by fastening the screws after engaging the rosettes of the image capture apparatus and the grip with each other.

In doing this, to perform power supply and communication between the image capture apparatus and the grip, a configuration can be envisaged in which electrical contacts are provided inside the rosettes, respectively. However, the configuration described in Japanese Laid-Open Patent Publication (Kokai) No. H04-102799 can cause the electrical contacts to be damaged by the rosettes. Further, if the respective electrical contacts of the image capture apparatus and the grip are exposed to the outside when the grip is not attached, there is a possibility that a film is formed on any of the electrical contacts e.g. due to an unintended touch of a finger or the like thereon, which may cause a contact failure. To prevent this, it is desirable to cover and protect the electrical contacts when the electrical contacts are not used.

As an example of a technique for protecting electrical contacts, Japanese Laid-Open Patent Publication (Kokai) No. H11-154536 discloses a terminal cover that covers the electrical contacts (contact terminals) of a charger for a battery when the charger is not used. When the charger is used, the terminal cover is pressed in by the battery by an operation of attaching the battery, whereby the electrical contacts of the charger are exposed and brought into contact with terminals of the battery.

Further, Japanese Laid-Open Patent Publication (Kokai) No. H08-22437 discloses mobile information apparatuses each having an opening and closing cover provided on each of sides where a connector is disposed, and when connecting one mobile information apparatus to another, the opening and closing covers are opened and the connector of the one mobile information apparatus is caused to protrude therefrom and thereby cause the connector to be connected to the connector of the other.

However, the terminal cover disclosed in Japanese Laid-Open Patent Publication (Kokai) No. H11-154536 has a problem that the electrical contacts are easily exposed e.g. by the operation of pressing the terminal cover with a finger other than the operation of setting a proper standard battery. For example, in an apparatus for which a plurality of methods of holding the apparatus by a user are assumed and for which the holding method is frequently changed, such as an image capture apparatus, there is a possibility that a user's finger or another device unintendedly presses in the terminal cover, whereby the electrical contacts are exposed. Therefore, the terminal cover associated with the conventional technique described above has a possibility that a contact failure is caused by an insulating film formed due to a touch of a finger on the electrical contacts and a possibility that the electrical contacts are damaged by being brought into contact with another device. Further, if the electrical contacts are easily exposed to the outside, an oxide film is liable to be formed on the electrical contacts, which lowers the reliability of electrical connection.

Further, in the mobile information apparatus disclosed in Japanese Laid-Open Patent Publication (Kokai) No. H08-22437, each opening and closing cover linearly moves like a sliding door, and hence a space for retracting the opening and closing cover is required. Provision of this retracting space imposes large restrictions on the design of a structure where electrical contacts are arranged within a limited space inside the rosette. Further, when the opening and closing cover of the mobile information apparatus is opened, the electrical contacts of the connector are visible from the outside, and hence similar to the technique disclosed in Japanese Laid-Open Patent Publication (Kokai) No. H11-154536, there is a possibility that a contact failure or damage to the electrical contacts is caused by a touch of a finger or another device on the connector.

SUMMARY OF THE INVENTION

The present invention provides an electronic apparatus to which an accessory, such as a grip, is removably attached and which is capable of firmly fixing an electronic apparatus body and the accessory to each other and easily and also positively achieving electrical connection between the electronic apparatus body and the accessory, an accessory, and a system.

In a first aspect of the present invention, there is provided an electronic apparatus to which an accessory is removably attached, wherein one of the accessory and a body of the electronic apparatus includes a first attachment part opposed to the other of the accessory and the body, the first attachment part comprising a first screw portion disposed in the center of the first attachment part, a first electrical connection part disposed outside the first screw portion, and a first engagement part formed outside the first electrical connection part, wherein the other of the accessory and the body includes a second attachment part opposed to the one of the accessory and the body, the second attachment part comprising a second screw portion disposed in the center of the second attachment part, for being screwed with the first screw portion, a second electrical connection part disposed outside the second screw portion, for being electrically connected to the first electrical connection part, and a second engagement part formed outside the second electrical connection part, for being engaged with the first engagement part, and wherein when the first screw portion and the second screw portion are screwed with each other, the first engagement part and the second engagement part are engaged with each other, and the first electrical connection part and the second electrical connection part are electrically connected to each other.

In a second aspect of the present invention, there is provided an electronic apparatus to which an accessory is removably attached, wherein one of the accessory and a body of the electronic apparatus includes a first attachment part opposed to the other of the accessory and the body, the first attachment part comprising a first screw portion, a first electrical connection part, and a first engagement part, wherein the other of the accessory and the body includes a second attachment part opposed to the one of the accessory and the body, the second attachment part comprising a second screw portion for being screwed with the first screw portion, a second electrical connection part for being electrically connected to the first electrical connection part, and a second engagement part for being engaged with the first engagement part, wherein one of the first electrical connection part and the second electrical connection part is formed by a plurality of traces of a contact pattern, which are concentrically formed at predetermined spaced intervals from the center of the attachment part where the one of the first electrical connection part and the second electrical connection part is disposed, wherein the other of the first electrical connection part and the second electrical connection part is formed by a plurality of contact pins arranged in a line in a radial direction at the same intervals as those of the plurality of traces of the contact pattern, and wherein when the first screw portion and the second screw portion are screwed with each other, the first engagement part and the second engagement part are engaged with each other and the first electrical connection part and the second electrical connection part are electrically connected to each other.

In a third aspect of the present invention, there is provided a system including an electronic apparatus, and an accessory that is removably attached to a body of the electronic apparatus, wherein one of the accessory and a body of the electronic apparatus includes a first attachment part opposed to the other of the accessory and the body, the first attachment part comprising a first screw portion disposed in the center of the first attachment part, a first electrical connection part disposed outside the first screw portion, and a first engagement part formed outside the first electrical connection part, wherein the other of the accessory and the body includes a second attachment part opposed to the one of the accessory and the body, the second attachment part comprising a second screw portion disposed in the center of the second attachment part, for being screwed with the first screw portion, a second electrical connection part disposed outside the second screw portion, for being electrically connected to the first electrical connection part, and a second engagement part formed outside the second electrical connection part, for being engaged with the first engagement part, and wherein when the first screw portion and the second screw portion are screwed with each other, the first engagement part and the second engagement part are engaged with each other, and the first electrical connection part and the second electrical connection part are electrically connected to each other.

In a fourth aspect of the present invention, there is provided a system including an electronic apparatus, and an accessory that is removably attached to a body of the electronic apparatus, wherein one of the accessory and a body of the electronic apparatus includes a first attachment part opposed to the other of the accessory and the body, the first attachment part comprising a first screw portion, a first electrical connection part, and a first engagement part, wherein the other of the accessory and the body includes a second attachment part opposed to the one of the accessory and the body, the second attachment part comprising a second screw portion for being screwed with the first screw portion, a second electrical connection part for being electrically connected to the first electrical connection part, and a second engagement part for being engaged with the first engagement part, wherein one of the first electrical connection part and the second electrical connection part is formed by a plurality of traces of a contact pattern, which are concentrically formed at predetermined spaced intervals from the center of the attachment part where the one of the first electrical connection part and the second electrical connection part is disposed, wherein the other of the first electrical connection part and the second electrical connection part is formed by a plurality of contact pins arranged in a line in a radial direction at the same intervals as those of the plurality of traces of the contact pattern, and wherein when the first screw portion and the second screw portion are screwed with each other, the first engagement part and the second engagement part are engaged with each other and the first electrical connection part and the second electrical connection part are electrically connected to each other.

In a fifth aspect of the present invention, there is provided an accessory that can be attached and removed to and from an electronic apparatus, wherein one of the accessory and a body of the electronic apparatus includes a first attachment part opposed to the other of the accessory and the body, the first attachment part comprising a first screw portion disposed in the center of the first attachment part, a first electrical connection part disposed outside the first screw portion, and a first engagement part formed outside the first electrical connection part, wherein the other of the accessory and the body includes a second attachment part opposed to the one of the accessory and the body, the second attachment part comprising a second screw portion disposed in the center of the second attachment part, for being screwed with the first screw portion, a second electrical connection part disposed outside the second screw portion, for being electrically connected to the first electrical connection part, and a second engagement part formed outside the second electrical connection part, for being engaged with the first engagement part, and wherein when the first screw portion and the second screw portion are screwed with each other, the first engagement part and the second engagement part are engaged with each other, and the first electrical connection part and the second electrical connection part are electrically connected to each other.

In a sixth aspect of the present invention, there is provided an accessory that can be attached and removed to and from an electronic apparatus, wherein one of the accessory and a body of the electronic apparatus includes a first attachment part opposed to the other of the accessory and the body, the first attachment part comprising a first screw portion, a first electrical connection part, and a first engagement part, wherein the other of the accessory and the body includes a second attachment part opposed to the one of the accessory and the body, the second attachment part comprising a second screw portion for being screwed with the first screw portion, a second electrical connection part for being electrically connected to the first electrical connection part, and a second engagement part for being engaged with the first engagement part, wherein one of the first electrical connection part and the second electrical connection part is formed by a plurality of traces of a contact pattern, which are concentrically formed at predetermined spaced intervals from the center of the attachment part where the one of the first electrical connection part and the second electrical connection part is disposed, wherein the other of the first electrical connection part and the second electrical connection part is formed by a plurality of contact pins arranged in a line in a radial direction at the same intervals as those of the plurality of traces of the contact pattern, and wherein when the first screw portion and the second screw portion are screwed with each other, the first engagement part and the second engagement part are engaged with each other and the first electrical connection part and the second electrical connection part are electrically connected to each other.

According to the present invention, it is possible to firmly fix the electronic apparatus body and the accessory, such as a grip, to each other and easily and positively achieve electrical connection between the electronic apparatus body and the accessory.

Further features of the present invention will become apparent from the following description of exemplary embodiments (with reference to the attached drawings).

DESCRIPTION OF THE EMBODIMENTS

The present invention will now be described in detail below with reference to the accompanying drawings showing embodiments thereof.

Figure 1:
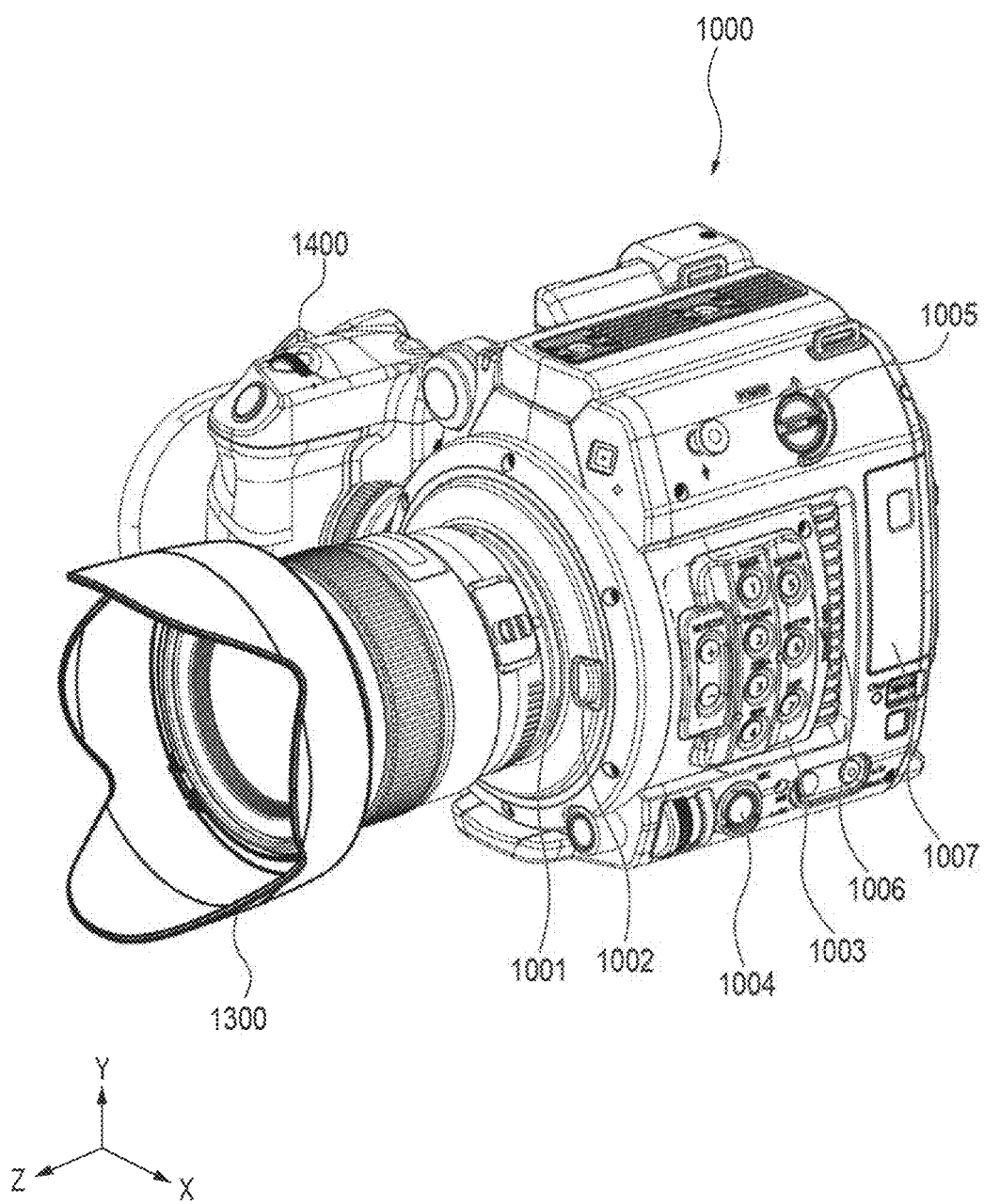
FIG. 1 is a perspective view of an image capture apparatus as one example of an electronic apparatus according to a first embodiment of the present invention, in a state in which a grip as an accessory has been attached, as viewed from the front.
Figure 2:
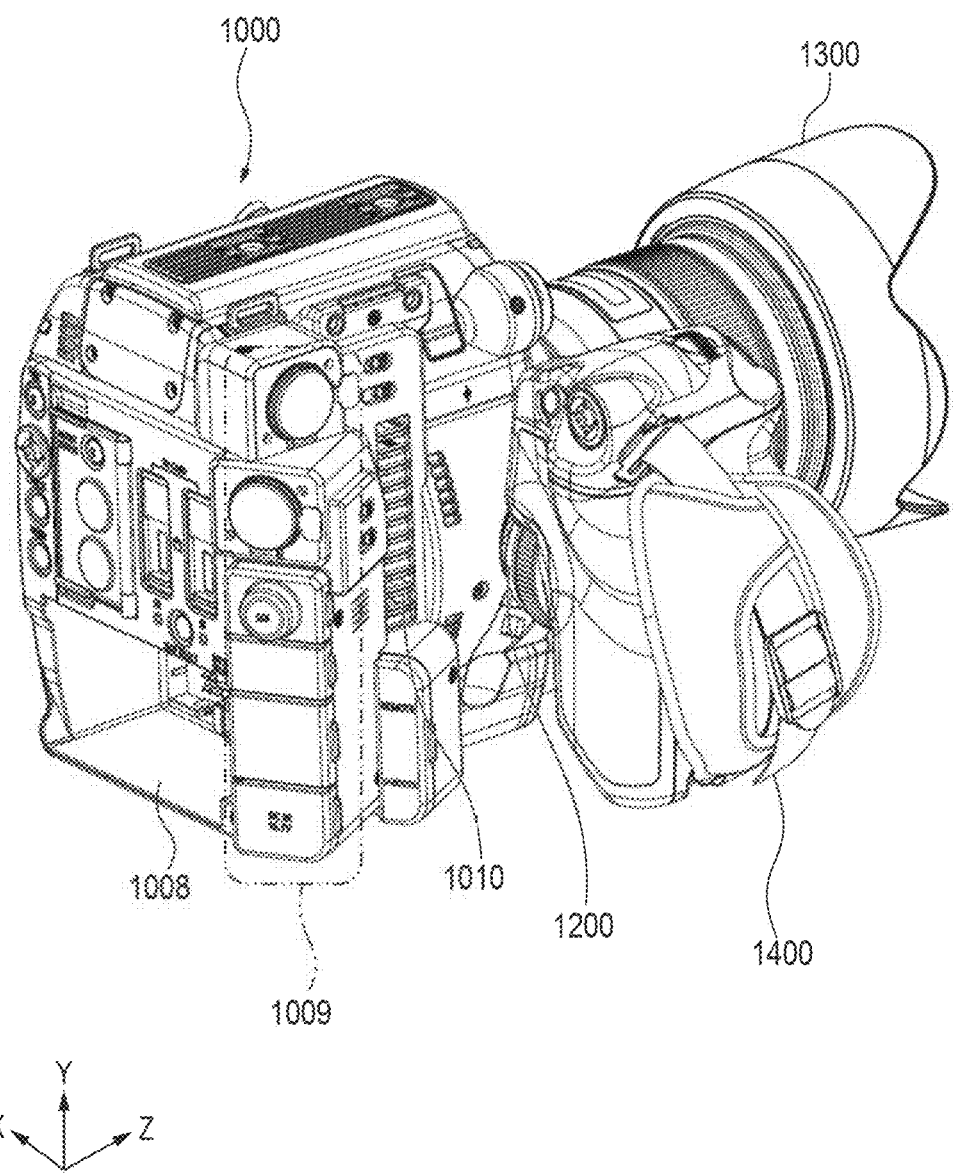
FIG. 2 is a perspective view of the image capture apparatus according to the first embodiment of the present invention, in the state in which the grip has been attached, as viewed from the rear.
Figure 3:
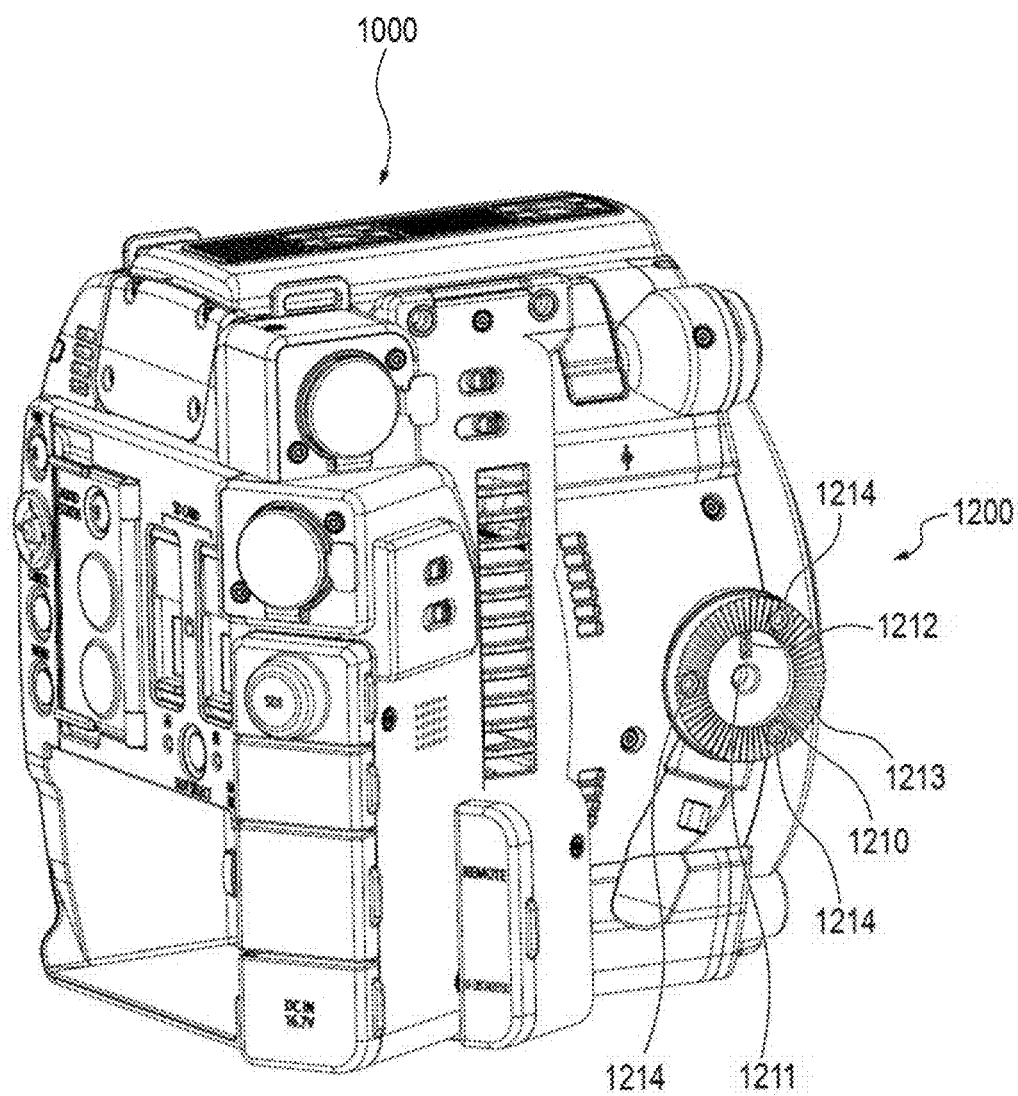
FIG. 3 is a perspective view of the image capture apparatus according to the first embodiment of the present invention, in a state in which the grip has been removed, as viewed from the rear.

FIG. 1 is a perspective view of an image capture apparatus as an electronic apparatus according to a first embodiment of the present invention, showing a state in which a grip as an accessory has been attached, as viewed from the front. Further, FIG. 2 is a perspective view of the image capture apparatus according to the first embodiment of the present invention, showing the state in which the grip has been attached, as viewed from the rear. Further, FIG. 3 is a perspective view of the image capture apparatus according to the first embodiment of the present invention, showing a state in which the grip has been removed, as viewed from the rear.

Note that the coordinate system in the present embodiment is defined as shown in FIG. 1 for convenience of explanation. The Z-axis is defined to extend in a front-rear direction of the image capture apparatus (the direction toward a lens on the front side is defined as a +Z direction), the Y-axis is defined to extend in a vertical direction of the image capture apparatus (the direction toward a top side is defined as a +Y direction), and the X-axis is defined to extend in a left-right direction of the image capture apparatus (the direction toward a right side as viewed from the front is defined as a +X direction).

As shown in FIG. 1, the front side of an image capture apparatus body (electronic apparatus body) 1000 is provided with a lens mount 1001, a lens contact portion (not shown) for detecting attachment of an interchangeable lens 1300, and a lens removal button 1002 for removing the interchangeable lens. The interchangeable lens 1300 is removably supported on the lens mount 1001.

Further, although not shown, the image capture apparatus body 1000 accommodates an image capture device on which an optical image formed through the lens is formed and a sensor circuit board having the image capture device mounted thereon, at respective locations rearward of the lens mount 1001.

A right side of the image capture apparatus body 1000 as viewed from the front is provided with an operation button group 1003 operated by a photographer so as to cause the image capture apparatus body to execute predetermined operations. Further, the right side is provided with a REC button 1004 and a power switch 1005 and is formed with an air outlet port 1006 for discharging high-temperature air to the outside using a fan provided in the image capture apparatus body 1000. Further, the right side is provided with a recording medium accommodating cover 1007 that covers an accommodating chamber for accommodating a recording medium (not shown).

As shown in FIG. 2, a rear side of the image capture apparatus body 1000 is provided with a battery accommodating section 1008 for accommodating a battery, and an input/output terminal group 1009, such as an external connection terminal and a power supply terminal.

A left side of the image capture apparatus body 1000 as viewed from the front is formed with an intake port 1010 for sucking low-temperature air from the outside of the image capture apparatus body 1000 into the inside using the above-mentioned fan, and is provided with a body-side attachment mechanism 1200 to which an accessory, such as a grip 1400, can be attached.

As shown in FIG. 3, the body-side attachment mechanism 1200 is provided with a body-side attachment member 1210 to which the grip 1400 can be attached. The body-side attachment member 1210 has e.g. a substantially disc-like shape, and includes a body-side screw 1211 provided in the center thereof, for being screwed with a grip-side screw 1411 provided on the grip 1400, described hereinafter.

Body-side contact pins (electrical contact pins) 1212 to be electrically connected to a grip-side contact pattern 1412 provided on the grip 1400 are provided outside the body-side screw 1211. A body-side engagement part 1213 to be engaged with a grip-side engagement part 1413 formed on the grip 1400 is formed outside the body-side contact pins 1212. That is, the body-side attachment member 1210 has the body-side screw 1211, the body-side contact pins 1212, and the body-side engagement part 1213 arranged from the center to the outside in the mentioned order.

The body-side engagement part 1213 has recessed-shape portions and protruding-shape portions radially arranged from its center at predetermined spaced intervals and is engaged with the grip-side engagement part 1413 having recessed-shape portions and protruding-shape portions similarly formed in association with the recessed-shape portions and protruding-shape portions of the body-side engagement part 1213. With this, the grip 1400 and the image capture apparatus body 1000 are firmly fixed. Fixing of the grip 1400 and the image capture apparatus body 1000 will be described hereinafter. Further, the body-side attachment member 1210 is fixed to the image capture apparatus body 1000 with screws 1214.

Figure 4:
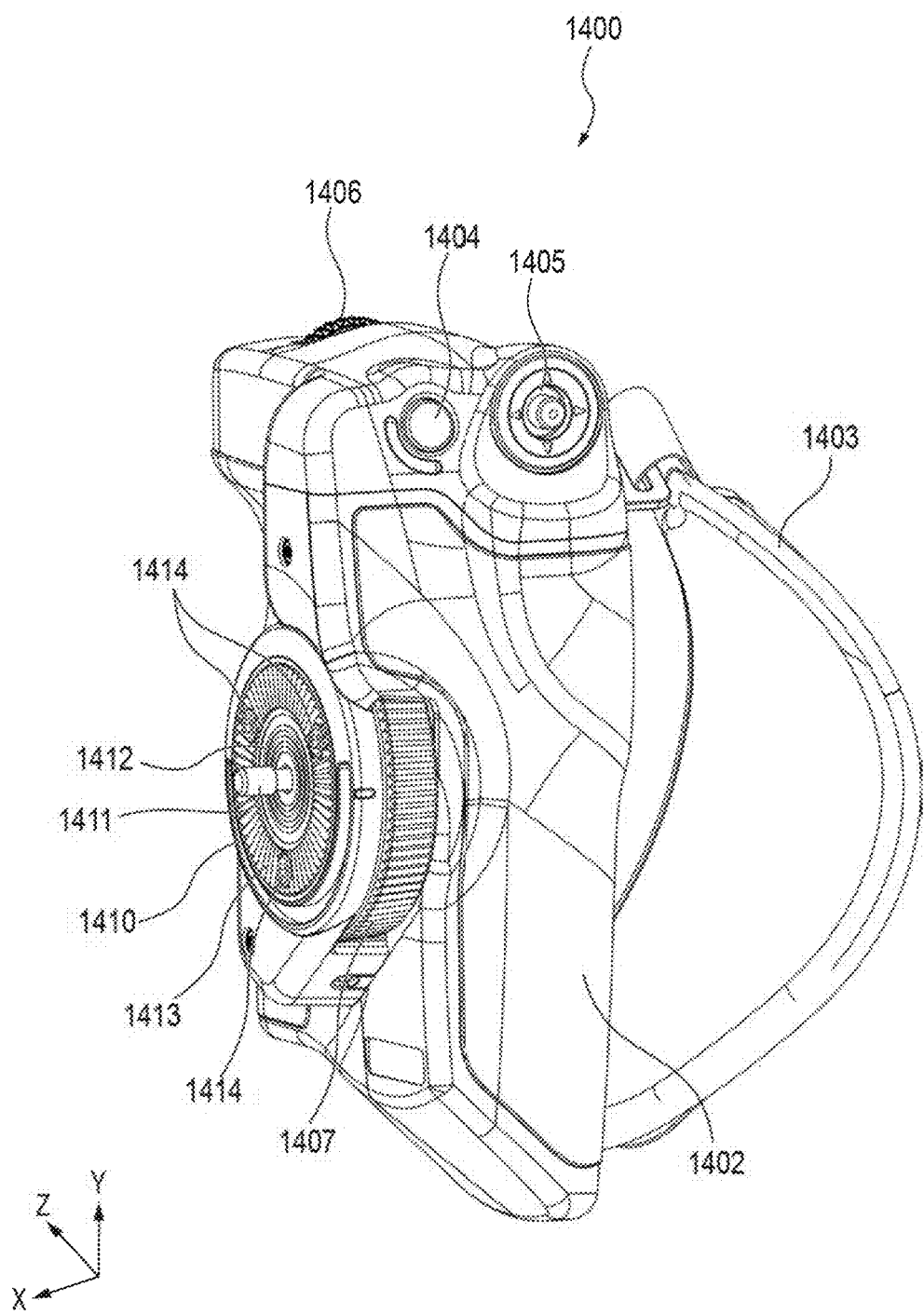
FIG. 4 is a perspective view of the grip for being attached to an image capture apparatus body appearing in FIGS. 1 and 2, as viewed from the rear.

FIG. 4 is a perspective view of the grip attached to the image capture apparatus body appearing in FIGS. 1 and 2, as viewed from the rear.

The grip 1400 is one type of accessory that enables a photographer (user) to hold the image capture apparatus body 1000 with ease. The grip 1400 has a holding portion 1402 for being held by a user and has a shape conforming to the fingers of a human being.

A belt 1403 is a member that is tightened to prevent a user's hand from being moved away from the holding portion 1402. A REC button 1404, a cross key 1405, and an operation dial 1406 are operation members, and are connected to the grip-side contact pattern 1412, described hereinafter, by electrical wiring (not shown). Hereafter, it is assumed that the grip has a contact pattern unless otherwise described.

A grip-side attachment member 1410 is attached to the body-side attachment member 1210 when the grip 1400 is attached to the image capture apparatus body 1000, and has substantially the same size as the body-side attachment member 1210. The grip-side attachment member 1410 has the grip-side screw 1411 disposed in the center thereof for being screwed with the body-side screw 1211. The grip-side contact pattern 1412 to be electrically connected to the body-side contact pins 1212 is provided outside the grip-side screw 1411. The grip-side engagement part 1413 to be engaged with the body-side engagement part 1213 is provided outside the grip-side contact pattern 1412.

The grip-side engagement part 1413 has the recessed-shape portions and protruding-shape portions radially arranged from its center, similar to the body-side engagement part 1213, and is engaged with the body-side engagement part 1213 to firmly fix the grip 1400 and the image capture apparatus body 1000 to each other. Note that fixing of the two will be described hereinafter.

The grip-side attachment member 1410 is fixed to the grip 1400 with screws 1414. The grip-side screw 1411 is mechanically connected to a tightening knob 1407. When attaching the grip 1400 to the image capture apparatus body 1000, the grip-side screw 1411 hidden inside the grip 1400 and the image capture apparatus body 1000 can be rotated by rotating the tightening knob 1407 exposed to the outside.

Figure 5:
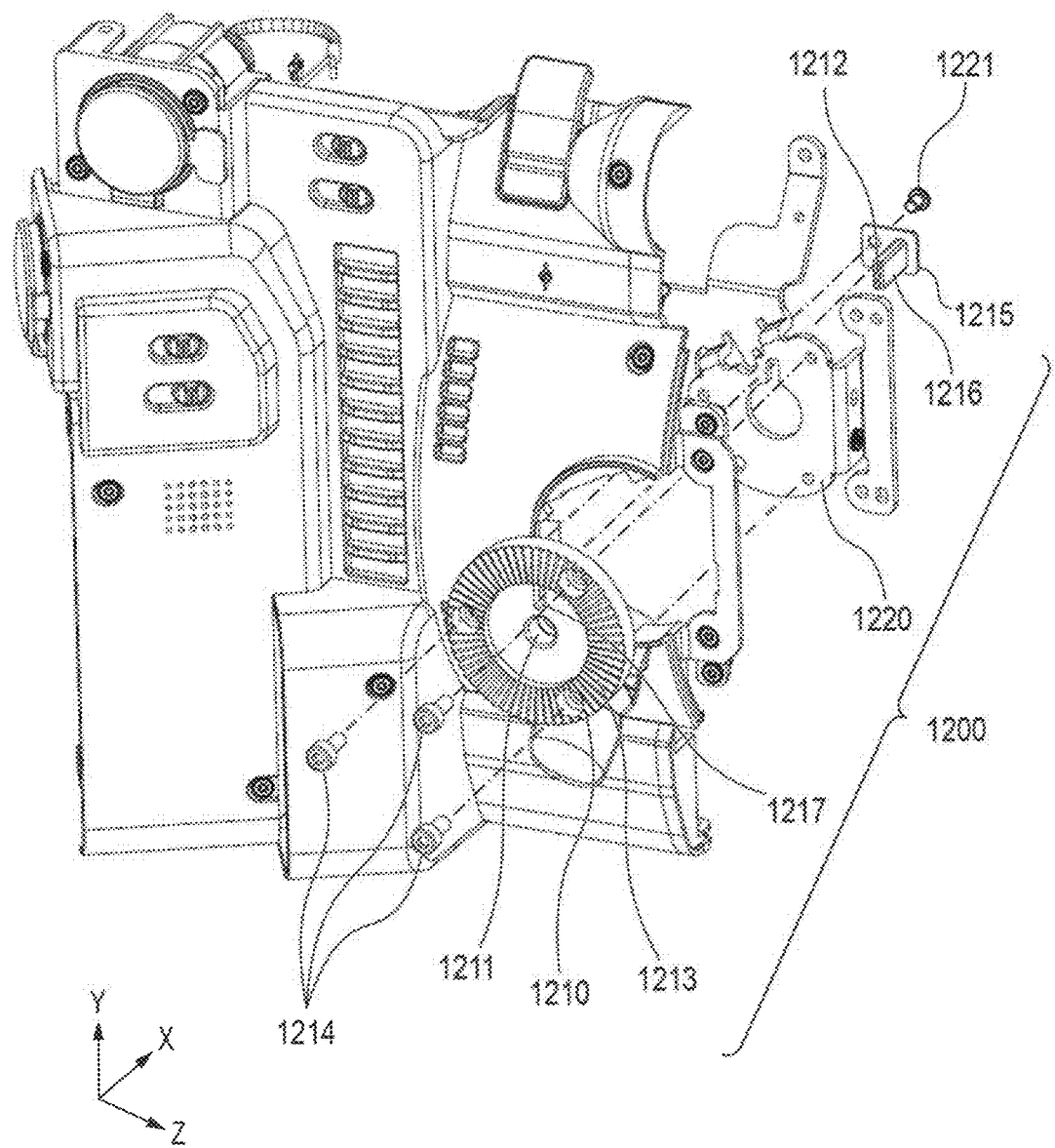
FIG. 5 is an exploded perspective view of an attachment portion of the image capture apparatus body appearing in FIGS. 1 and 2.

FIG. 5 is an exploded perspective view of the body-side attachment mechanism 1200 of the image capture apparatus body appearing in FIGS. 1 and 2 in manner.

As shown in FIG. 5, the body-side attachment member 1210 is fixed to a body-side attachment sheet metal 1220 included in the image capture apparatus body 1000 with the screws 1214. The body-side contact pins 1212 are accommodated in a contact block 1216, and one end of each body-side contact pin 1212, which is opposite to the other end for being brought into contact with the grip-side contact pattern 1412, is electrically connected to a body-side circuit board 1215 e.g. by soldering and is held in this state. The body-side circuit board 1215 is connected to a body-side control circuit board (not shown) by electrical wiring (not shown) and is fixed to the body-side attachment sheet metal 1220 with a screw 1221. Further, the body-side attachment sheet metal 1220 is fixed to a body inner sheet metal (not shown).

The body-side contact pins 1212 are each urged by a compression spring (not shown) accommodated in the contact block 1216 in a direction of protruding from the image capture apparatus body 1000 (in the −X direction). The contact block 1216 is inserted through an opening hole 1217 formed in the body-side attachment member 1210, whereby the body-side contact pins 1212 urged by the compression springs are exposed from the image capture apparatus body 1000 toward the grip 1400 (in the −X direction). The body-side contact pins 1212 are urged by the compression springs, whereby it is possible to ensure a predetermined contact pressure when the body-side contact pins 1212 are brought into contact with the grip-side contact pattern 1412. That is, the body-side contact pins 1212 are slidably brought into contact with the grip-side contact pattern 1412 with the predetermined contact pressure.

Further, when the body-side contact pins 1212 are in a state exposed to the outside of the image capture apparatus body 1000, they are positioned at a location toward the inside of the image capture apparatus body 1000 where they are lower than valley portions (recessed-shape portions) of the body-side engagement part 1213. This makes it possible to prevent the body-side contact pins 1212 from being brought into contact with the grip-side engagement part 1413 and being damaged, when the grip 1400 is attached. Note that the position of the body-side contact pins 1212 will be described hereinafter.

The body-side contact pins 1212 are arranged in one straight line in a radial direction in the contact block 1216 at predetermined spaced intervals, and are brought into contact with the grip-side contact pattern 1412 to be electrically connected thereto. In the illustrated example, the three of the body-side contact pins 1212 are provided in the contact block 1216 and are connected to corresponding points on the grip-side contact pattern 1412, as a power terminal, a communication terminal, and a ground terminal, respectively.

Figure 6:
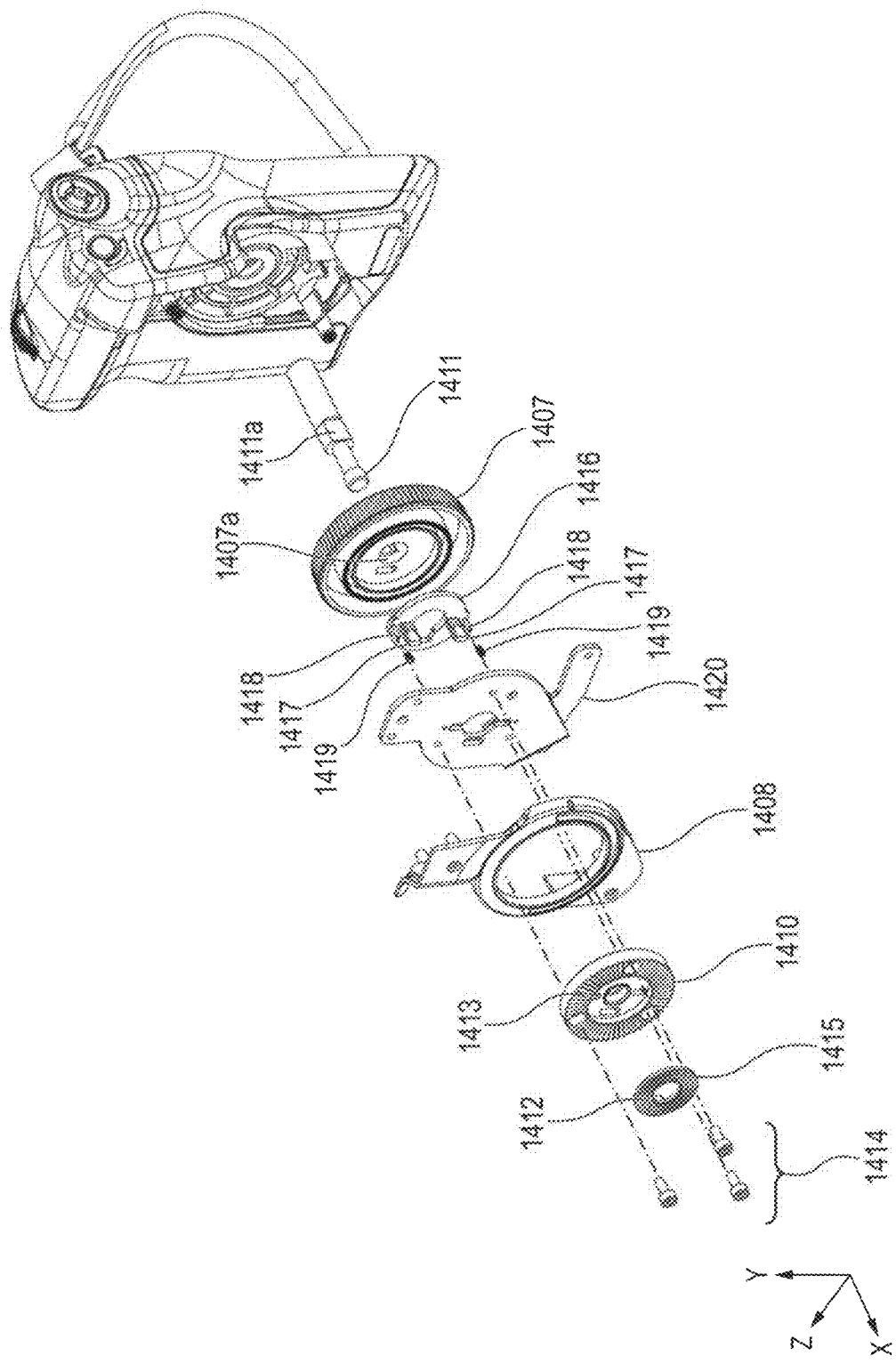
FIG. 6 is an exploded perspective view of an attachment portion of the grip shown in FIG. 4.

FIG. 6 is an exploded perspective view of an attachment portion of the grip shown in FIG. 4. As shown in FIG. 6, a grip-side holding member 1416 is sandwiched between the tightening knob 1407 and a grip-side attachment sheet metal 1420. The grip-side holding member 1416 is formed with protruding portions 1417 and shaft portions 1418. The grip-side holding member 1416 is held in a state urged by compression springs 1419 fitted on the shaft portions 1418 of the grip-side holding member 1416 toward the tightening knob 1407 (in the −X direction), i.e. in a direction away from the image capture apparatus body 1000.

In the illustrated example, the shaft portions 1418 on which the compression springs 1419 are fitted are disposed at two locations symmetrical with respect to the center of the grip-side attachment member 1410, and this makes it possible to stably urge the grip-side holding member 1416. Further, the components within the grip 1400 are covered with a decorative cover 1408 to prevent foreign matter from entering the grip 1400.

A grip-side circuit board 1415 is connected to a grip-side control circuit board (not shown) by electrical wiring (not shown), and the grip-side contact pattern 1412 as a conductive portion is formed into a shape of a plurality of annular portions (traces) each arranged concentrically with a predetermined width from the center. Further, the annular portions of the grip-side contact pattern 1412 are formed in parallel at the same predetermined spaced intervals as those of the above-described body-side contact pins 1212 and are electrically connected to the associated body-side contact pins 1212, respectively. In the illustrated example, similar to the body-side contact pins 1212, the three traces of the grip-side contact pattern 1412 are provided. Then, even when the grip 1400 is fixed at a desired phase with respect to the image capture apparatus body 1000, it is possible to electrically connect the two.

The grip-side attachment member 1410 is fixed to the grip-side attachment sheet metal 1420 with the screws 1414. Further, the protruding portions 1417 formed on the grip-side holding member 1416 are inserted through the grip-side attachment sheet metal 1420 and the grip-side attachment member 1410. Then, the grip-side circuit board 1415 has a surface thereof, which is opposite to the surface formed with the grip-side contact pattern 1412, brought into contact with the protruding portions 1417 of the grip-side holding member 1416 and is fixed thereto e.g. with double-sided adhesive tape. In the illustrated example, the protruding portions 1417 are arranged at two locations symmetrical with respect to the center of the grip-side attachment member 1410, and this makes it possible to stably fix the grip-side circuit board 1415.

A central shaft 1411a of the grip-side screw 1411 is inserted through a central hole 1407a of the tightening knob 1407. The central shaft 1411a and the central hole 1407a both have a so-called I-cut shape, formed by cutting opposite two sides of a columnar shape, and are fitted to each other such that I-cut opposite sides of the central shaft 1411a are engaged with I-cut opposite sides of the central hole 1407a.

When the tightening knob 1407 is rotated, the grip-side screw 1411 is rotated in unison therewith and is screwed with the body-side screw 1211 of the image capture apparatus body 1000. This makes it possible to fix the grip 1400 to the image capture apparatus body 1000. Further, when the tightening knob 1407 is rotated, the grip-side holding member 1416 held in a state urged toward the tightening knob 1407 is pressed in toward the image capture apparatus body 1000. That is, when the tightening knob 1407 is rotated, the grip-side contact pattern 1412 is pressed in toward the body-side contact pins 1212 of the image capture apparatus body 1000. This causes the traces of the grip-side contact pattern 1412 to be electrically connected to the associated body-side contact pins 1212, respectively, whereby the image capture apparatus body 1000 and the grip 1400 are electrically connected to each other.

Figure 7A:
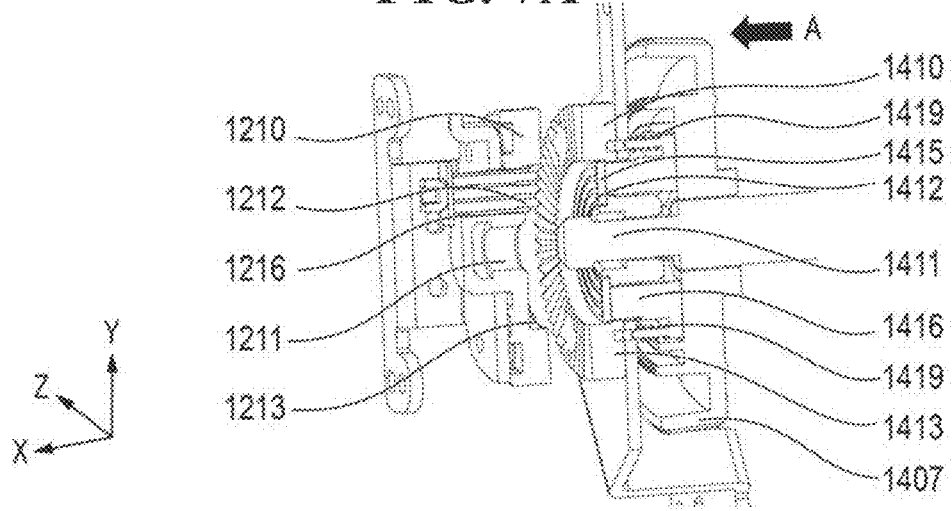
FIGS. 7A to 7C are cross-sectional views useful in explaining an attachment structure of the image capture apparatus body and the grip appearing in FIGS. 1 and 2.
Figure 7B:
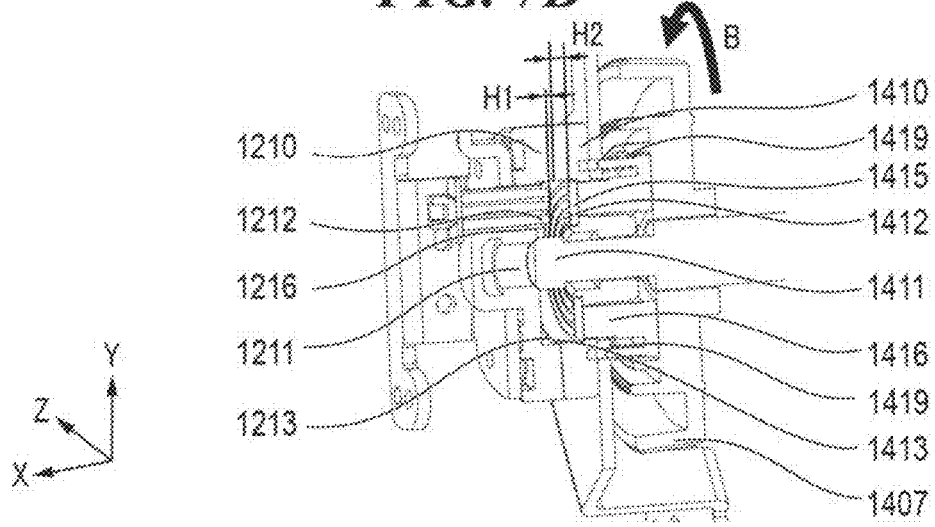
Figure 7C:
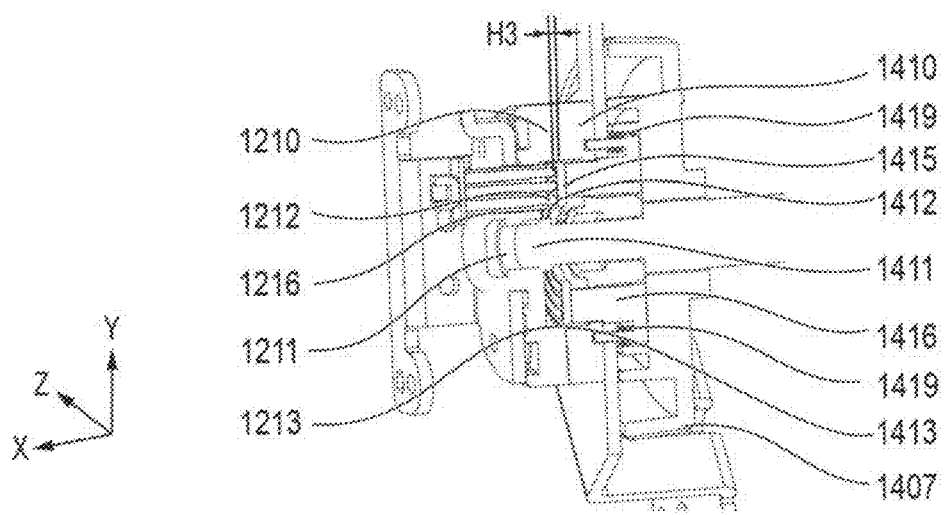

FIGS. 7A to 7C are cross-sectional views useful in explaining the attachment structure of the image capture apparatus body and the grip appearing in FIGS. 1 and 2. Further, FIG. 7A is a cross-sectional view showing a state before the grip is attached to the image capture apparatus body, and FIG. 7B is a cross-sectional view showing a state in which the grip has been engaged with the image capture apparatus body. Further, FIG. 7C is a cross-sectional view showing a state in which the grip has been fixed to the image capture apparatus body.

As shown in FIG. 7A, when attaching the grip 1400 to the image capture apparatus body 1000, the centers of the body-side attachment member 1210 and the grip-side attachment member 1410, which have substantially the same size, are aligned. Then, the grip 1400 is pressed toward the image capture apparatus body 1000 (in a direction indicated by an arrow A (+X direction)). In the state shown in FIG. 7A, the image capture apparatus body 1000 and the grip 1400 are neither fixed nor electrically connected to each other.

FIG. 7B shows the state in which the grip 1400 has been pressed in the direction indicated by the arrow A (+X direction) whereby the body-side engagement part 1213 and the grip-side engagement part 1413 have been engaged with each other.

As shown in FIG. 7B, the body-side engagement part 1213 and the grip-side engagement part 1413 are engaged to mesh with each other, whereby the phase of the grip 1400 with respect to the image capture apparatus body 1000 is determined. Further, since the body-side engagement part 1213 and the grip-side engagement part 1413 are radially formed, it is possible to engage the grip 1400 with the image capture apparatus body 1000 at a desired angle.

In the illustrated example, the body-side engagement part 1213 and the grip-side engagement part 1413 are both formed with the protruding-shape portions and recessed-shape portions in 6 degrees, and hence it is possible to adjust the angle of the grip 1400 in 6 degree increments.

At this time, the grip-side contact pattern 1412 of the grip-side circuit board 1415 fixed to the grip-side holding member 1416 is urged toward the tightening knob 1407 (in the −X direction) by the compression springs 1419. Then, the grip-side contact pattern 1412 is accommodated in a position lower than the protruding-shape portions of the grip-side engagement part 1413 by a height H2 in the X direction. Further, the body-side contact pins 1212 are also in a position lower than the recessed-shape portions of the body-side engagement part 1213 by a height H1 in the X direction. Thus, in the state shown in FIG. 7B, although the body-side engagement part 1213 and the grip-side engagement part 1413 are engaged with each other, the body-side contact pins 1212 and the grip-side contact pattern 1412 are not electrically connected to each other. In other words, when causing the grip-side engagement part 1413 and the body-side engagement part 1213 to be engaged with each other, it is possible to prevent the body-side contact pins 1212 and the grip-side contact pattern 1412 from being carelessly brought into contact with opposed portions to engaged with.

The tightening knob 1407 is rotated in a direction indicated by an arrow B in FIG. 7B in a state in which the grip 1400 is pressed in the direction indicated by the arrow A (+X direction), whereby the grip-side screw 1411 is screwed into the body-side screw 1211.

FIG. 7C shows a state in which the body-side screw 1211 and the grip-side screw 1411 have been screwed with each other, with the body-side engagement part 1213 and the grip-side engagement part 1413 having been engaged with each other. With this, it is possible to firmly fix the grip 1400 to the image capture apparatus body 100 without looseness of the grip 1400. By further rotating the tightening knob 1407 in the direction indicated by the arrow B the grip-side contact pattern 1412 of the grip-side circuit board 1415 fixed to the grip-side holding member 1416 is pressed in the +X direction by the tightening knob 1407 against the urging force of the compression springs 1419. This causes the grip-side contact pattern 1412 to protrude in the X direction to a position higher than the protruding-shape portions of the grip-side engagement part 1413 by a height H3.

The height (i.e. protruding amount) H3 corresponds to a position to which the body-side contact pins 1212 are further pressed in from the height H1 to a predetermined contact pressure. This causes the grip-side contact pattern 1412 pressed in the +X direction to be electrically connected to the body-side contact pins 1212 of the image capture apparatus body 1000. That is, it is possible to firmly fix the grip 1400 to the image capture apparatus body 1000 and easily electrically connect between the body-side contact pins 1212 and the grip-side contact pattern 1412. Further, since electrical connection is positively performed in the state in which the image capture apparatus body 1000 and the grip 1400 have been firmly fixed to each other, it is possible to ensure electrical connection with high reliability.

To remove the grip 1400 from the image capture apparatus body 1000, a reverse operation to the attachment operation described above with reference to FIGS. 7A to 7C is performed. First, the tightening knob 1407 is rotated in a direction opposite to the direction indicated by the arrow B to loosen the grip-side screw 1411 from the body-side screw 1211. With this, the grip-side contact pattern 1412 is separated from the body-side contact pins 1212 by the urging force of the compression springs 1419, and the image capture apparatus body 1000 and the grip 1400 are placed in a state not electrically connected.

Further, the grip-side screw 1411 is removed from the body-side screw 1211, and the image capture apparatus body 1000 and the grip 1400 are released from the fixed state. Then, by separating the grip 1400 in a direction opposite to the direction indicated by the arrow A, the grip 1400 can be removed from the image capture apparatus body 1000.

Although in the present example, the contact pins are arranged on the image capture apparatus body side and the contact pattern is arranged on the grip side, the configuration may be such that the contact pattern is arranged on the image capture apparatus body side and the contact pins are arranged on the grip side.

Here, an example of the above-mentioned grip-side contact pattern 1412 will be described.

Figure 8:
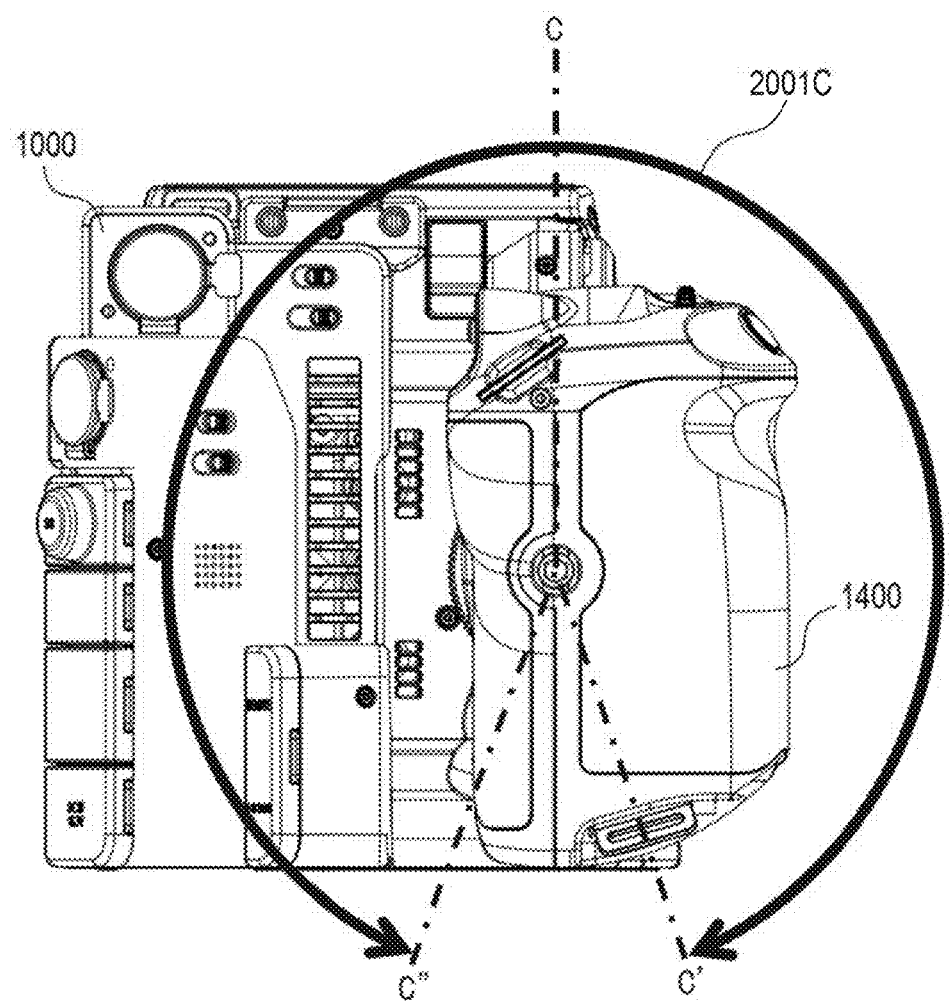
FIG. 8 is a side view of the image capture apparatus body and the grip in a state in which an interchangeable lens and a belt are removed from the state shown in FIG. 2, as viewed from a −X direction.

FIG. 8 is a side view of the image capture apparatus body and the grip in a state in which the interchangeable lens and the belt have been removed from the state shown in FIG. 2, as viewed from the −X direction.

As shown in FIG. 8, the grip 1400 can be rotated to a desired angle within a range 2001C of the angular position C thereof from an angular position C' to an angular position C" with respect to the image capture apparatus body 1000.

Figure 9:
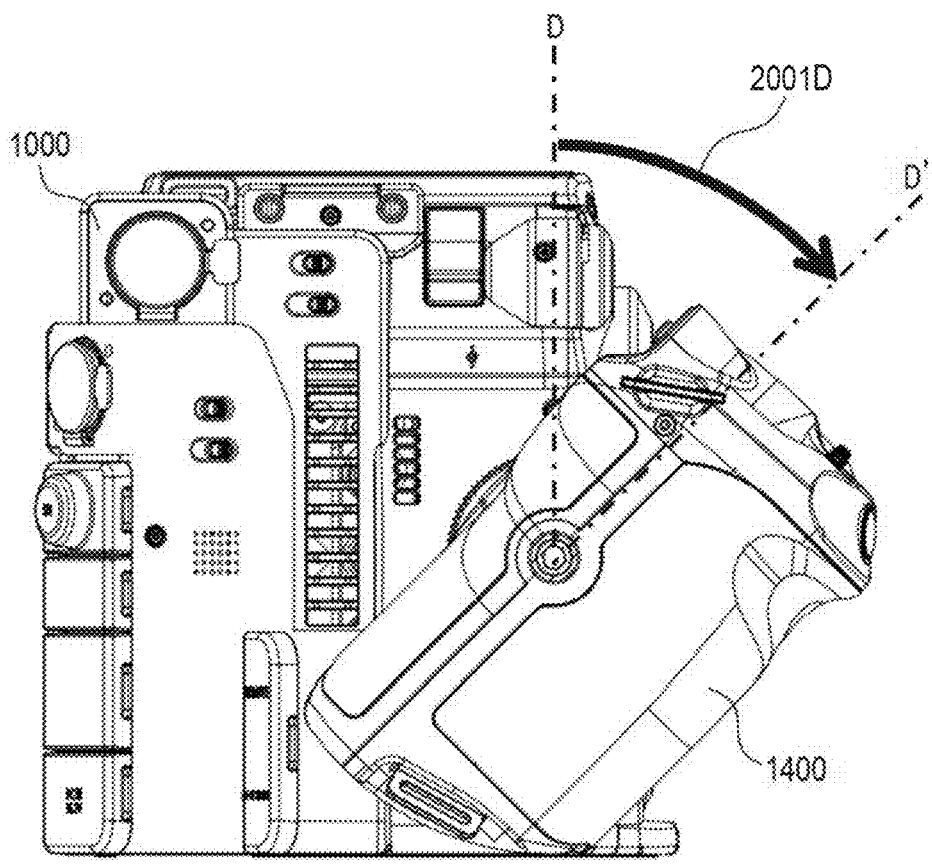
FIG. 9 is a side view showing a state in which the grip has been rotated to a predetermined position about an axis thereof with respect to the image capture apparatus body appearing in FIG. 8.

FIG. 9 is a side view showing a state in which the grip has been rotated to a predetermined angular position with respect to the image capture apparatus body appearing in FIG. 8.

FIG. 9 shows the state in which the grip 1400 has been rotated through an angle 2001D from an angular position D to an angular position D' with respect to the image capture apparatus body 1000. Here, description of the components of the image capture apparatus body 1000 and the grip 1400 other than the grip-side circuit board 1415 is omitted.

Figure 10A:
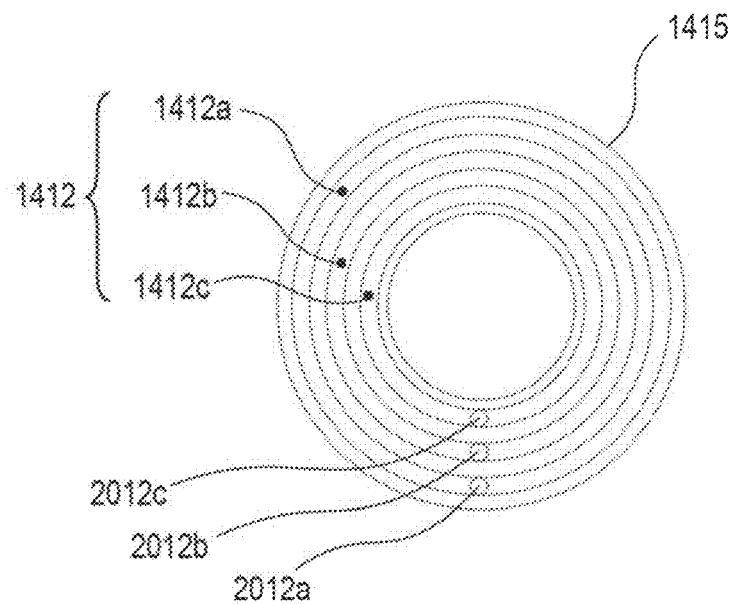
FIGS. 10A and 10B are views useful in explaining a grip-side circuit board provided in the grip appearing in FIG. 1.
Figure 10B:
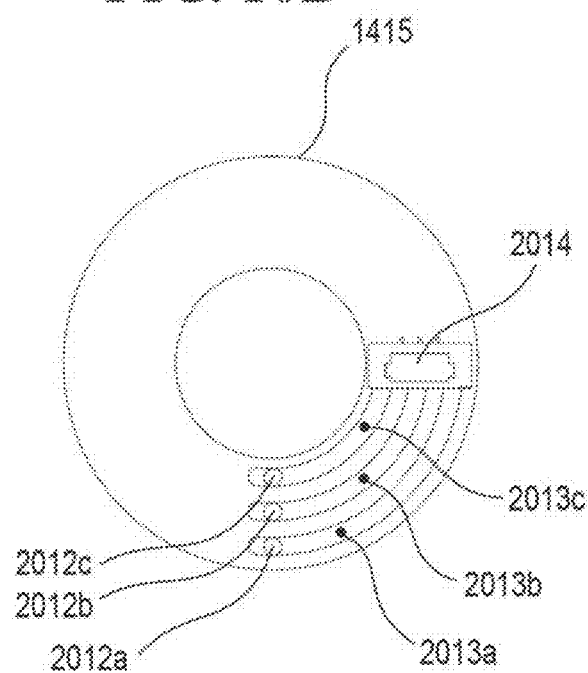

FIGS. 10A and 10B are views useful in explaining the grip-side circuit board provided in the grip appearing in FIG. 1. FIG. 10A shows the grip-side circuit board extracted for illustration from the grip as viewed from the X direction and FIG. 10B shows the grip-side circuit board as viewed from a direction opposite to the direction in FIG. 10A.

Referring to FIG. 10A, the grip-side circuit board 1415 has the three traces, denoted by 1412a, 1412b, and 1412c, of the grip-side contact pattern 1412 concentrically arranged at predetermined radially spaced intervals. The traces 1412a, 1412b, and 1412c as the connection portions are formed with through holes 2012a, 2012b, and 2012c, respectively. The traces 1412a, 1412b, and 1412c are electrically connected to respective associated traces 2013a, 2013b, and 2013c as wiring portions on a reverse side of the grip-side circuit board 1415 through the above-mentioned through holes, respectively.

The through holes 2012a, 2012b, and 2012c as wiring lead portions form rough irregularities on the surfaces of the grip-side circuit board 1415, and hence they are not suitable for being brought into contact with the body-side contact pins 1212 of the image capture apparatus body 1000.

As shown in FIG. 10B, an electric connector 2014 is mounted on the grip-side circuit board 1415, and pins of the electric connector 2014 are electrically connected to the traces 2013a, 2013b, and 2013c on the reverse side of the grip-side circuit board 1415, respectively. The grip-side circuit board 1415 and a circuit board inside the grip 1400 (not shown in FIGS. 10A and 10B) are connected by wires (not shown), and this makes it possible to perform power supply and communication between the image capture apparatus body 1000 and the grip 1400.

Figure 11A:
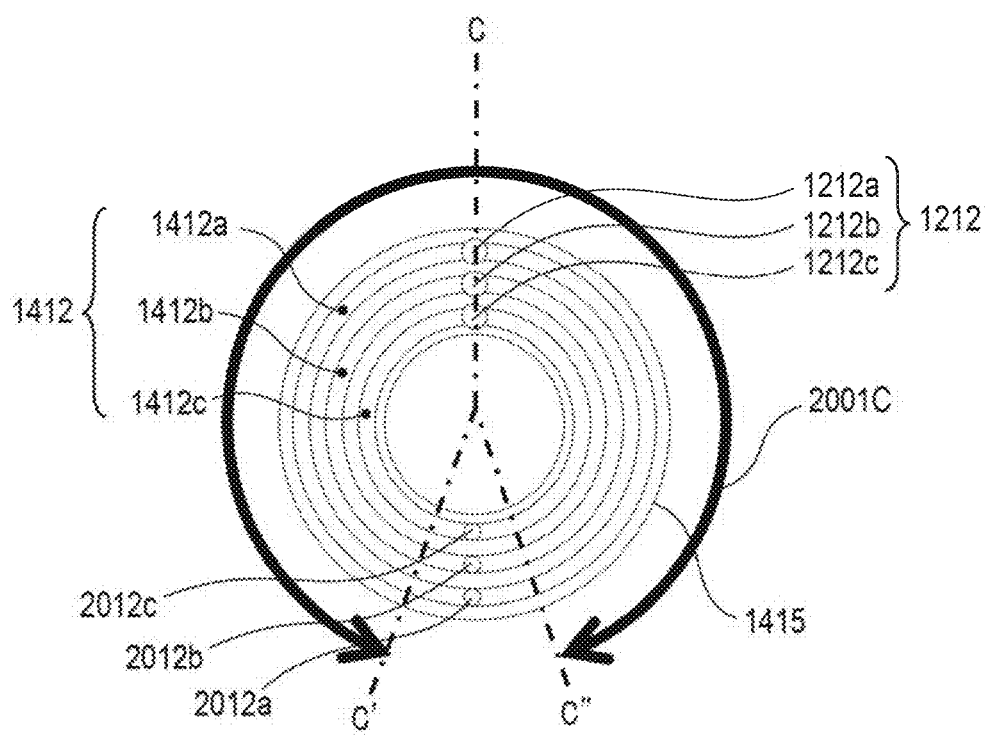
FIGS. 11A and 11B are views useful in explaining body-side contact pins of the image capture apparatus body and the grip-side circuit board of the grip appearing in FIGS. 8 and 9.
Figure 11B:
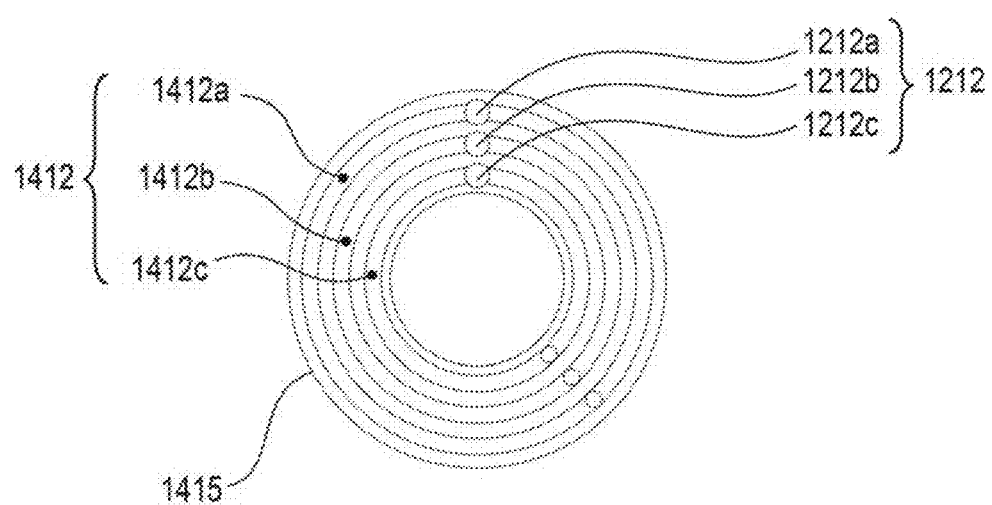

FIGS. 11A and 11B are views useful in explaining the body-side contact pins of the image capture apparatus body and the grip-side circuit board of the grip appearing in FIGS. 8 and 9. FIG. 11A shows the body-side contact pins of the image capture apparatus body and the grip-side circuit board of the grip in the state shown in FIG. 8, while FIG. 11B shows the contact points of the image capture apparatus body and the grip-side circuit board of the grip in the state shown in FIG. 9.

Referring to FIG. 11A, contact points 1212a, 1212b, and 1212c of the body-side contact pins 1212, arranged on a line corresponding to the angular position C, are brought into contact with the traces 1412a, 1412b, and 1412c of the grip-side contact pattern 1412, respectively. This makes it possible to perform power supply and communication between the image capture apparatus body 1000 and the grip 1400.

In a case where the grip 1400 is rotated with respect to the image capture apparatus body 1000 by an angle within the range 2001C indicated in FIG. 8, the body-side contact pins 1212 are moved within the range 2001C. Therefore, the body-side contact pins 1212 are not brought into contact with the through holes 2012a, 2012b, and 2012c.

Referring to FIG. 11B, the grip 1400 is rotated with respect to the image capture apparatus body 1000, whereby the grip-side circuit board 1415 is rotated. During the rotation as well, the contact points 1212a, 1212b, and 1212c of the body-side contact pins 1212 are also in contact with the traces 1412a, 1412b, and 1412c of the grip-side contact patterns 1412, respectively. This makes it possible to perform power supply and communication between the image capture apparatus body 1000 and the grip 1400.

Here, a case where the grip-side circuit board 1415 is a flexible circuit board will be described.

Figure 12:
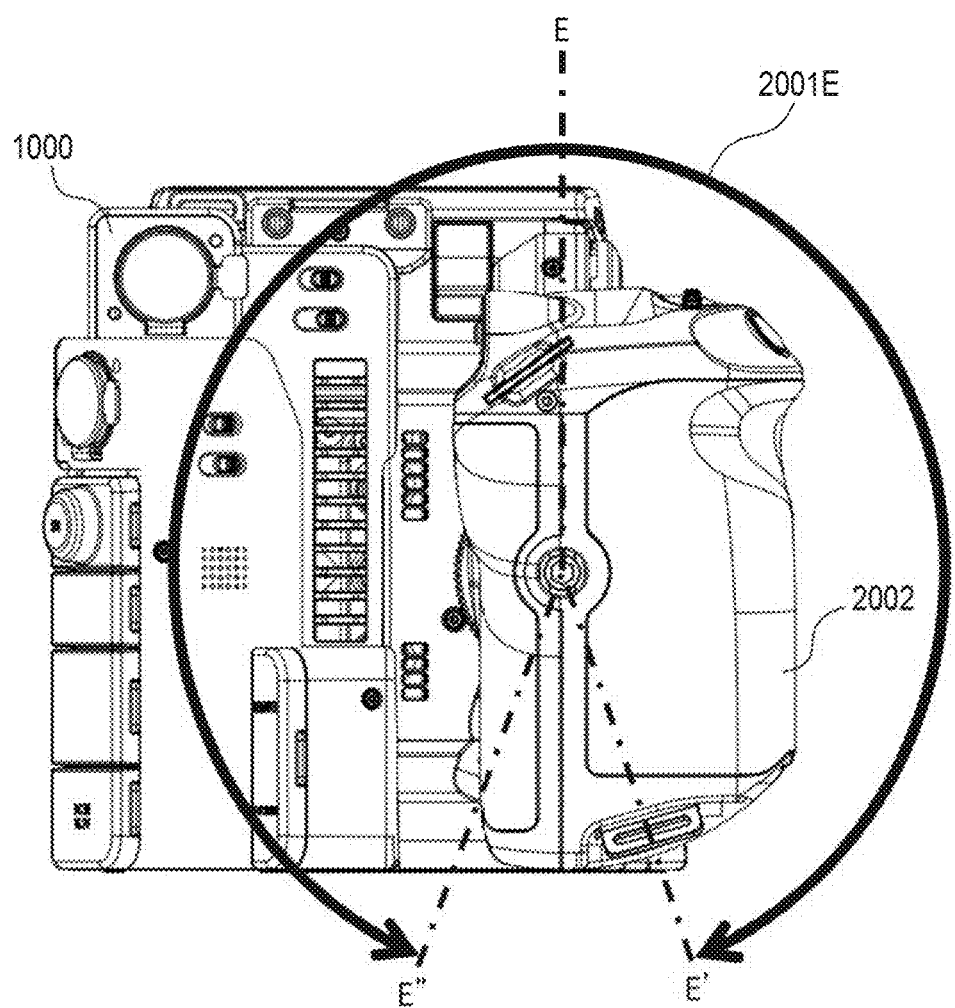
FIG. 12 is a left side view showing a state in which the grip has been attached to the image capture apparatus body appearing in FIG. 8.

FIG. 12 is a let side view showing a state in which the grip has been attached to the image capture apparatus body appearing in FIG. 8. Further, FIG. 13 is a perspective view of the grip appearing in FIG. 12.

As shown in FIG. 12, a grip 2002 can be rotated with respect to the image capture apparatus body 1000 to a desired angle within a range 2001E of an angular position E from an angular position E' to an angular position E". Further, part of the grip 2002, which is connected to the image capture apparatus body 1000, is formed by a flexible circuit board 2006 as appearing in FIG. 13. The grip-side attachment member 1410, the screws 1414, and so forth, as the components other than the flexible circuit board 2006 are the same as those described above, and hence description thereof is omitted.

Figure 13:
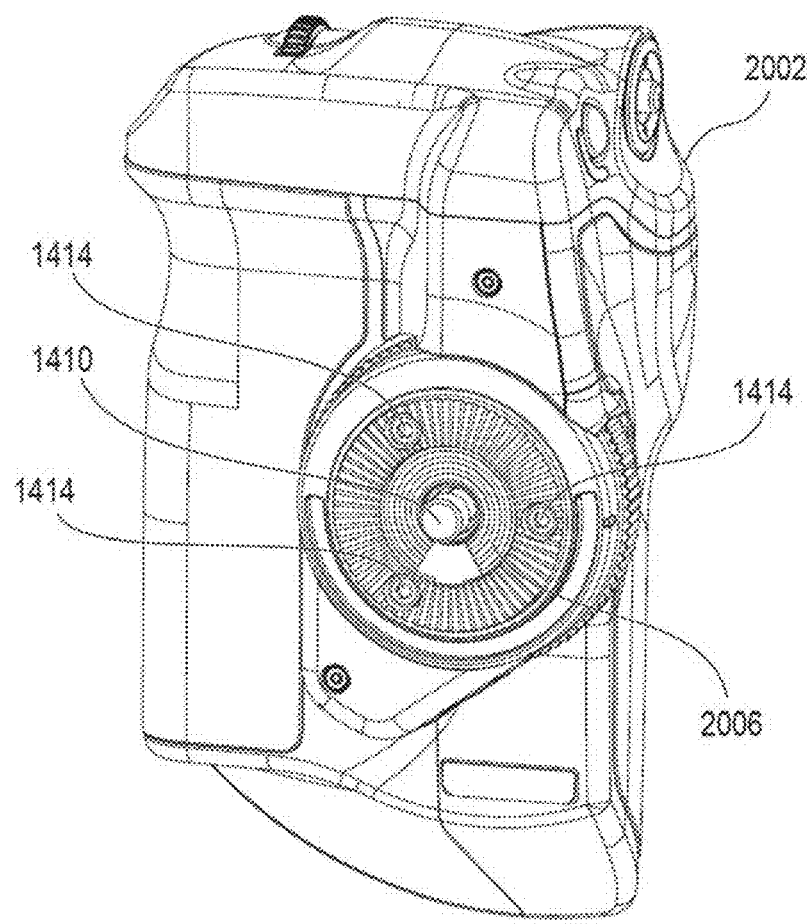
FIG. 13 is a perspective view of the grip appearing in FIG. 12.
Figure 14A:
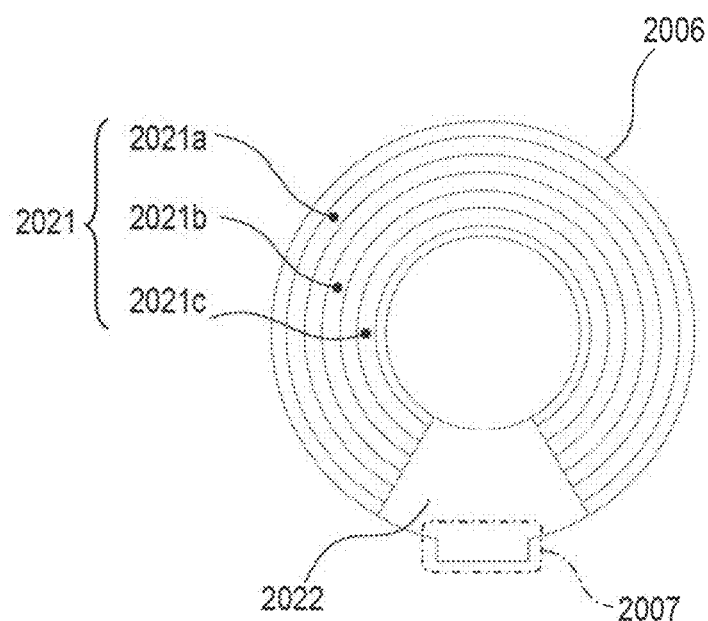
FIGS. 14A and 14B are views useful in explaining a flexible circuit board appearing in FIG. 13.
Figure 14B:
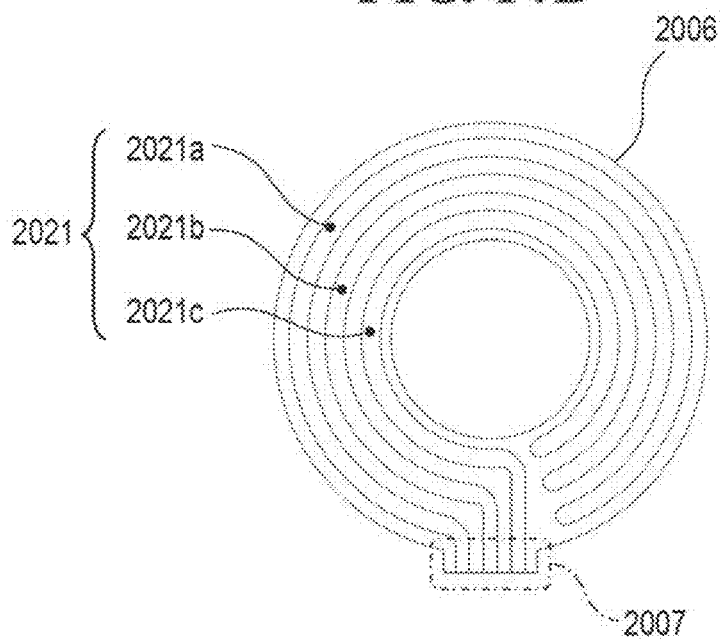

FIGS. 14A and 14B are views useful in explaining the flexible circuit board appearing in FIG. 13. FIG. 14A shows the flexible circuit board extracted for illustration from the grip as viewed from the X direction, while FIG. 14B shows a state in which a cover lay for the flexible circuit board has been removed from the state shown in FIG. 14A.

As shown in FIG. 14A, the flexible circuit board 2006 has three traces 2021a, 2021b, and 2021c of a grip-side contact pattern 2021 arranged at predetermined radially spaced intervals. Further, part of the flexible circuit board 2006 is provided with a cover lay 2022 such that the cover lay 2022 overlaps the traces 2021a, 2021b, and 2021c. The traces 2021a, 2021b, and 2021c are covered with the cover lay 2022 but not exposed.

As shown in FIG. 14B, the flexible circuit board 2006 has a folded portion 2007 in the lower part thereof. The traces 2021a, 2021b, and 2021c are folded toward the reverse side of the flexible circuit board 2006 and are electrically connected to a circuit board (not shown) within the grip 2002.

Figure 15:
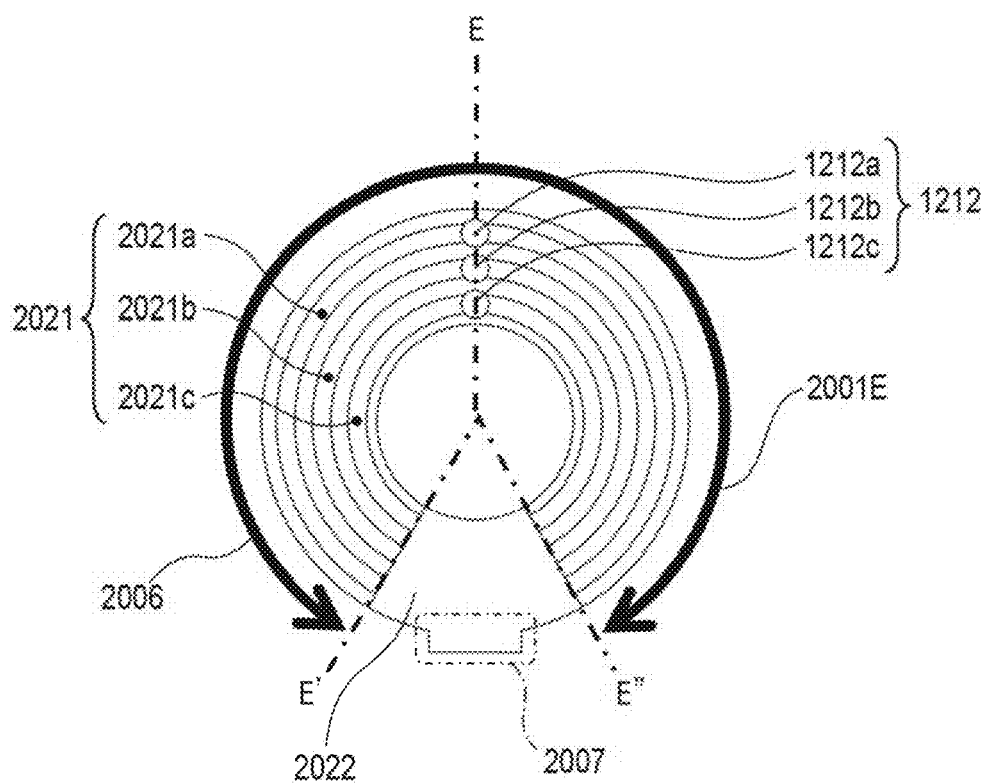
FIG. 15 is a view showing contact points of the image capture apparatus body and the flexible circuit board of the grip in the state shown in FIG. 12.

FIG. 15 is a view showing the contact points of the image capture apparatus body and the flexible circuit board of the grip in the state shown in FIG. 12.

As shown in FIG. 15, the grip 2002 is rotated with respect to the image capture apparatus body 100 within the range 2001E. During the rotation as well, the contact points 1212a, 1212b, and 1212c of the body-side contact pins 1212 are also in contact with the traces 2021a, 2021b, and 2021c of the grip-side contact pattern 2021 within the range 2001E, respectively. This makes it possible to perform power supply and communication between the image capture apparatus body 1000 and the grip 2002.

Here, the description will be given of a case where the image capture apparatus body is provided with two types of connection pins, i.e. body-side first contact pins and body-side second contact pins.

Figure 16:
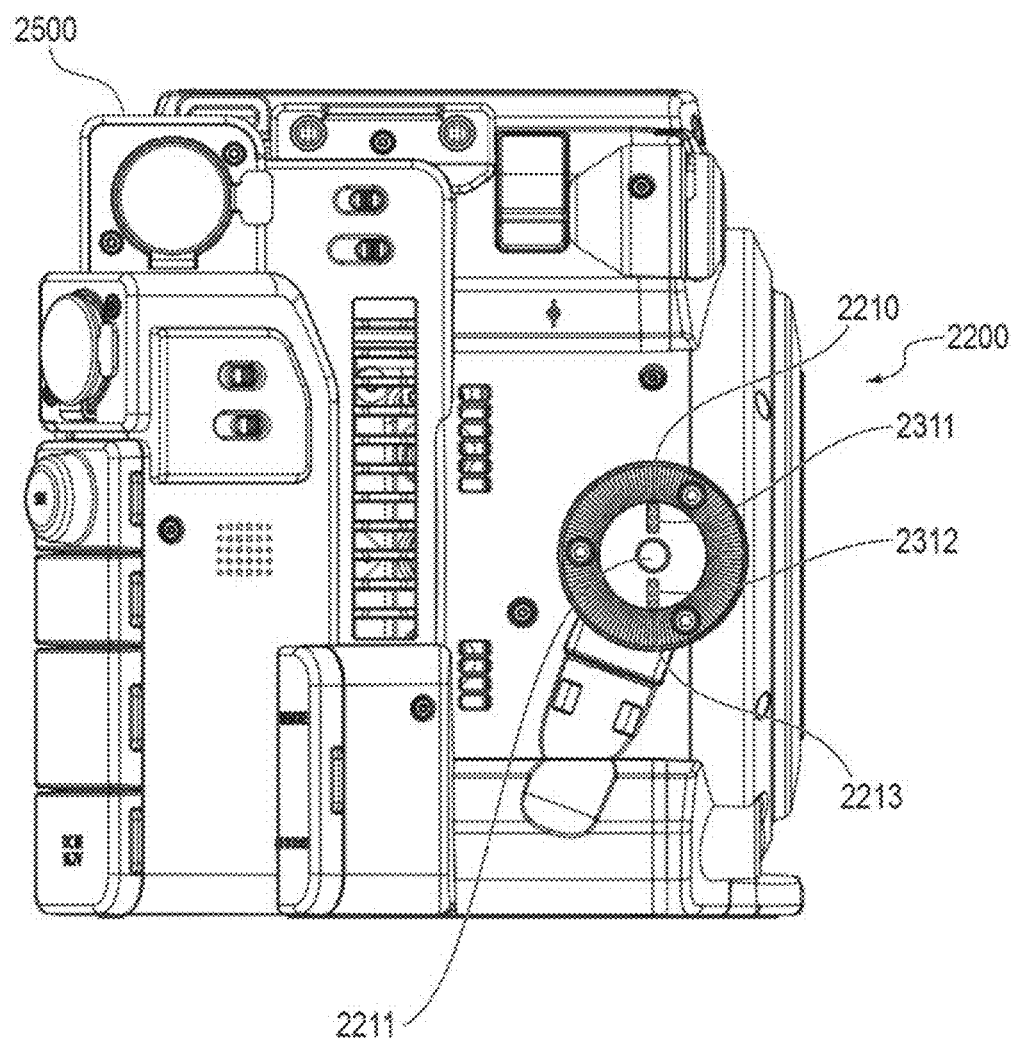
FIG. 16 is a left side view of the image capture apparatus body including body-side first contact pins and body-side second contact pins.

FIG. 16 is a left side view showing an image capture apparatus body including the body-side first contact pins and the body-side second contact pins. Further, FIG. 17 is a left side view showing a state in which the grip has been attached to the image capture apparatus body shown in FIG. 16.

As shown in FIG. 16, a body-side attachment mechanism 2200 includes a body-side attachment member 2210 to which the grip 2002 can be attached. The body-side attachment member 2210 has a substantially disc-like shape, and has a body-side screw 2211 arranged in the center thereof, for being screwed with a grip screw (not shown) of the grip 2002, referred to hereinafter.

The body-side first contact pins, denoted by reference numeral 2311, and the body-side second contact pins, denoted by reference numeral 2312, which are electrically connected to the grip-side contact pattern 2021 (not shown in FIG. 16) of the grip 2002 are arranged outside the body-side screw 2211. A body-side engagement part 2213 to be engaged with the grip 2002 is disposed outside the body-side first contact pins 2311 and the body-side second contact pins 2312. The body-side engagement part 2213 has protruding-shape portions and recessed-shape portions, radially arranged from the center at predetermined spaced intervals. Further, the body-side engagement part 2213 is engaged with a grip-side engagement part (not shown) having similar recessed-shape portions and protruding-shape portions, which makes it possible to firmly fix the grip 2002 and the image capture apparatus body, denoted by reference numeral 2500.

Figure 17:
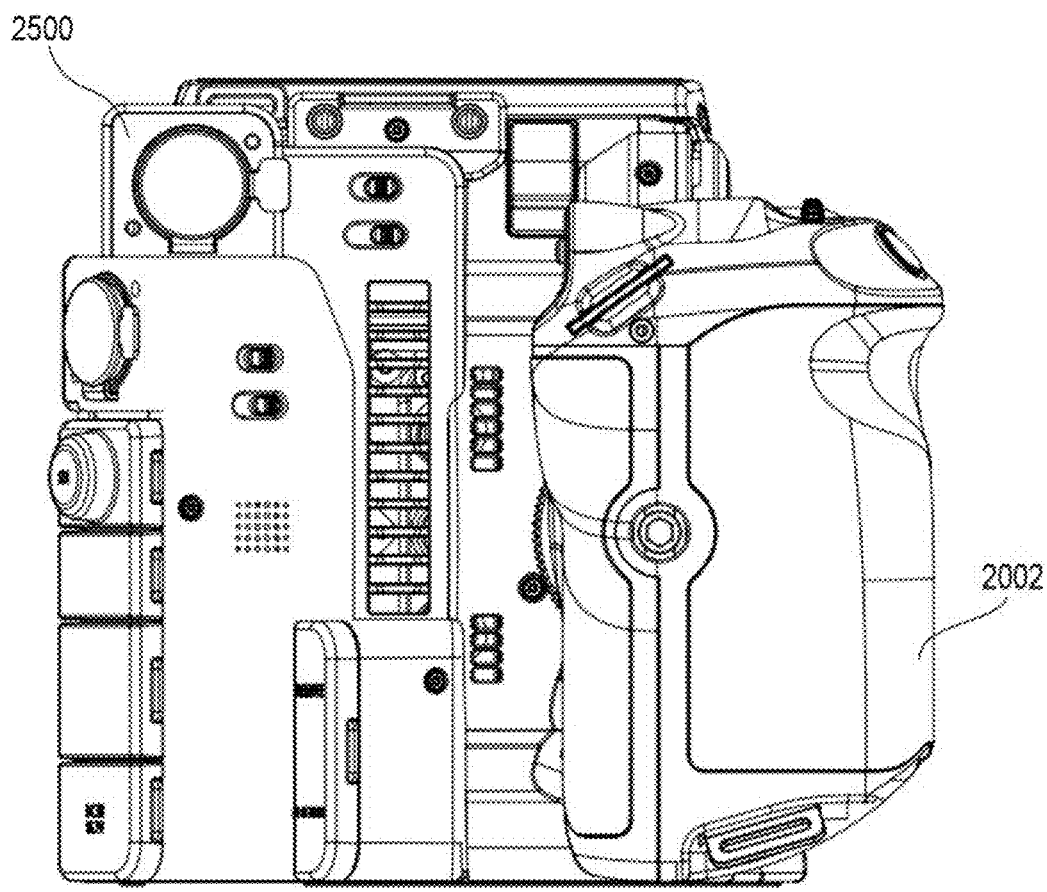
FIG. 17 is a left side view of the image capture apparatus body shown in FIG. 16, in a state in which the grip has been attached thereto.

As shown in FIG. 17, the grip 2002 which can be rotated with respect to the image capture apparatus body 2500 through 360 degrees has been attached to the image capture apparatus body 2500. The configuration of the grip 2002 is the same as the grip described above, and hence description thereof is omitted.

Figure 18:
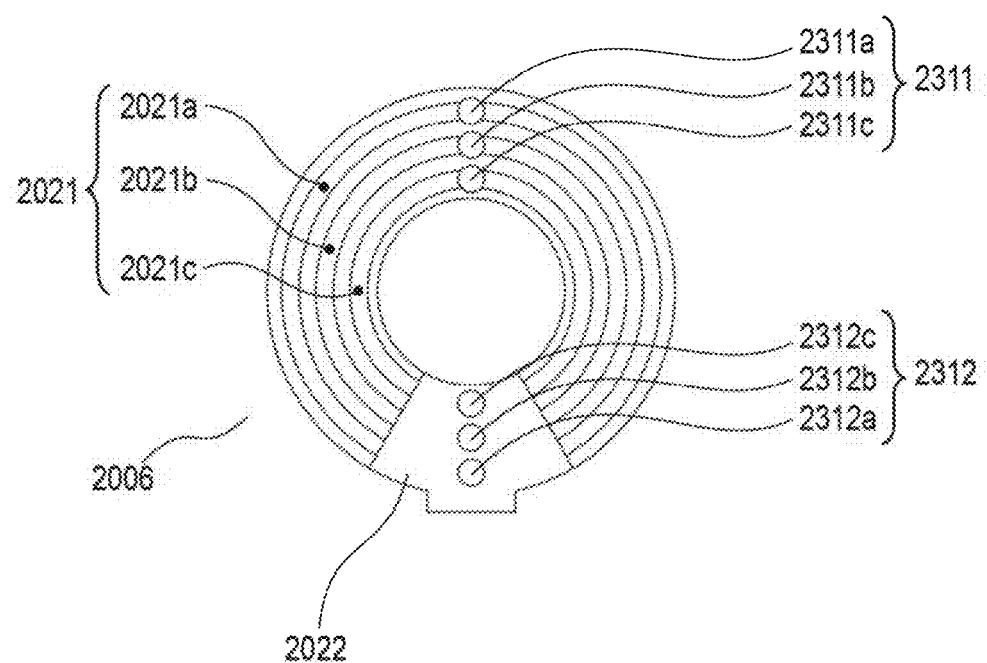
FIG. 18 is a view of the flexible circuit board shown in FIGS. 14A and 14B and the body-side first contact pins and the body-side second contact pins of the image capture apparatus body, extracted for illustration, as viewed from an X direction.

FIG. 18 is a view of the flexible circuit board shown in FIG. 14 and the body-side first contact pins and body-side second contact pins, extracted for illustration from the image capture apparatus body, as viewed from the X direction.

Referring to FIG. 18, contact points 2311a, 2311b, and 2311c of the body-side first contact pins 2311 of the image capture apparatus body 2500 are in contact with the traces 2021a, 2021b, and 2021c, respectively, whereby power supply and communication are performed. Contact points 2312a, 2312b, and 2312c of the body-side second contact pins 2312 are in contact with the cover lay 2022 but not electrically connected.

Thus, communication between the image capture apparatus body 2500 and the grip 2002 is performed via the body-side first contact pins 2311 out of the body-side contact pins, which are electrically connected to the traces 2021a, 2021b, and 2021c of the grip 2002.

Figure 19:
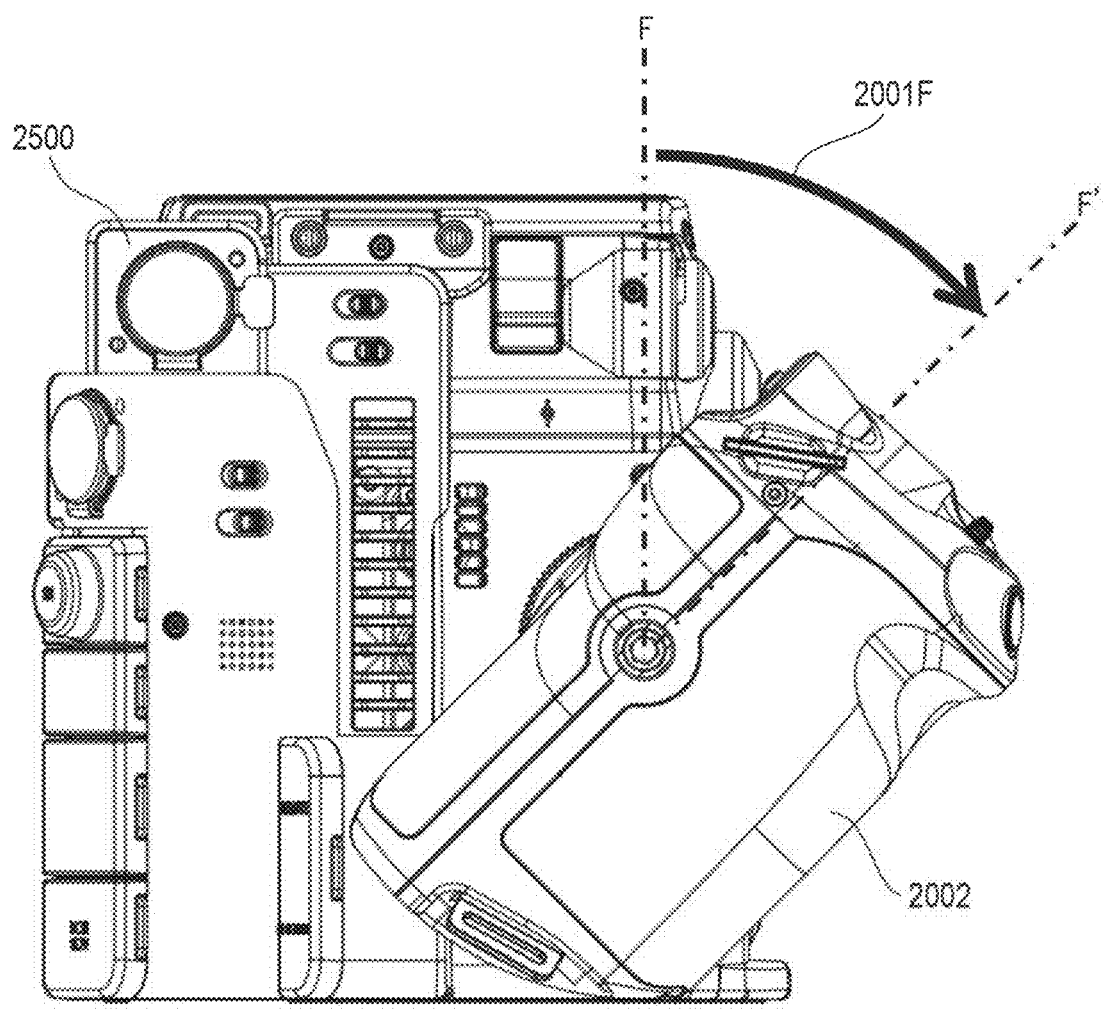
FIG. 19 is a view showing a state in which the grip has been rotated with respect to the image capture apparatus body shown in FIG. 16.
Figure 20:
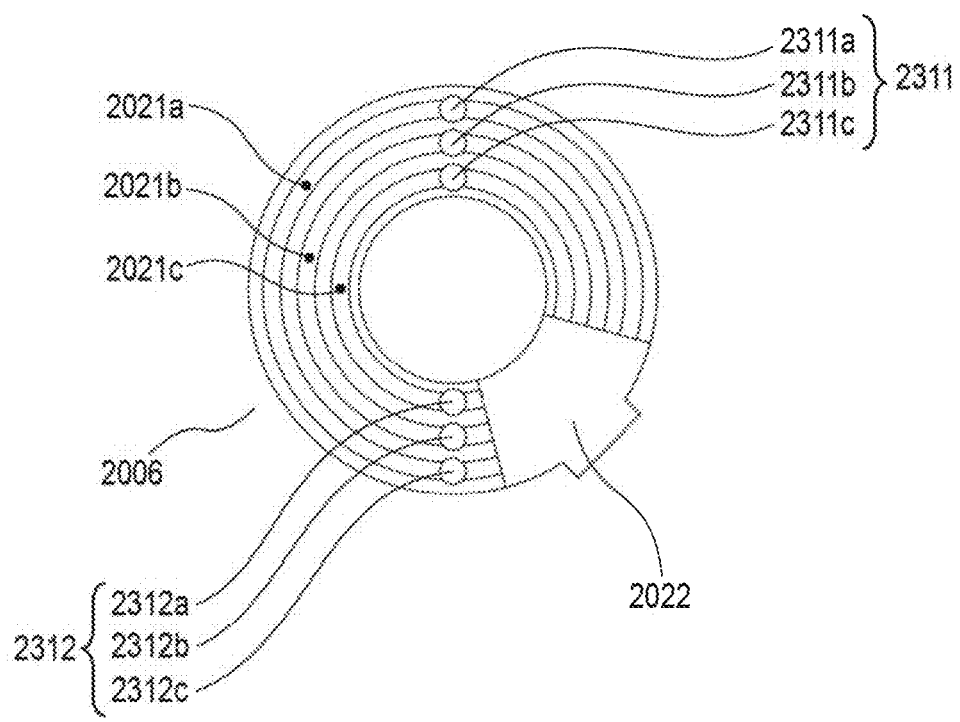
FIG. 20 is a view of the flexible circuit board and the body-side first contact pins and the body-side second contact pins in the state shown in FIG. 19, extracted for illustration, as viewed from the X direction.

FIG. 19 is a view showing a state in which the grip has been rotated with respect to the image capture apparatus body shown in FIG. 16. FIG. 20 is a view showing the flexible circuit board and the body-side first contact pins and body-side second contact pins, extracted for illustration, in the state shown in FIG. 19, as viewed from the X direction.

FIG. 19 shows a state in which the grip 2002 has been rotated through an angle 2001F from an angular position F to an angular position F' with respect to the image capture apparatus body 2500. Here, since the grip 2002 has been rotated with respect to the image capture apparatus body 2500, the flexible circuit board 2006 has been rotated.

As shown in FIG. 20, the contact points 2311a, 2311b, and 2311c of the body-side first contact pins 2311 of the image capture apparatus body 2500 are in contact with the traces 2021a, 2021b, and 2021c, respectively. Further, the contact points 2312a, 2312b, and 2312c of the body-side second contact pins 2312 are also in contact with the traces 2021a, 202b, and 2021c, respectively.

In a case where communication between the image capture apparatus body 2500 and the grip 2002 can be performed via both of the body-side first contact pins 2311 and the body-side second contact pins 2312, power supply and communication are performed preferentially via the body-side first contact pins 2311.

Here, a description will be given of a first variation of the body-side attachment mechanism 1200 of the image capture apparatus body 1000 in the first embodiment of the present invention with reference to FIGS. 21 and 22. Here, a body-side attachment mechanism 3150, appearing in FIG. 21, of an image capture apparatus body 3100 according to a first variation of the first embodiment of the present invention includes a contact protecting structure.

Here, the contact protecting structure included in the image capture apparatus body 3100 will be described. Similar to the above-described body-side attachment mechanism 1200, the accessory attachment mechanism using a so-called rosette mechanism is used for the image capture apparatus body 3100. The image capture apparatus body 3100 has a contact part 3102 arranged radially inside a body-side attachment member 3101. In a case where the contact part 3102 is exposed on a surface of the image capture apparatus body 3100, there can occur the following problems:

For example, if a finger or the like unconsciously touches the contact part 3102, there is a possibility that a film is formed causing a contact failure. Further, if another device touches the contact part 3102, there is a possibility that the contact part 3102 is broken. Further, when attaching an accessory to the body-side attachment member 3101, if an engagement part of the accessory is erroneously hit against the contact part 3102, there is a possibility that the contact part 3102 is broken.

To prevent these problems, the body-side attachment mechanism 3150 uses a structure that causes the contact part 3102 to be exposed only in a case where an accessory having electrical contacts is attached and causes the contact part 3102 to be retracted in the other cases.

Figure 21:
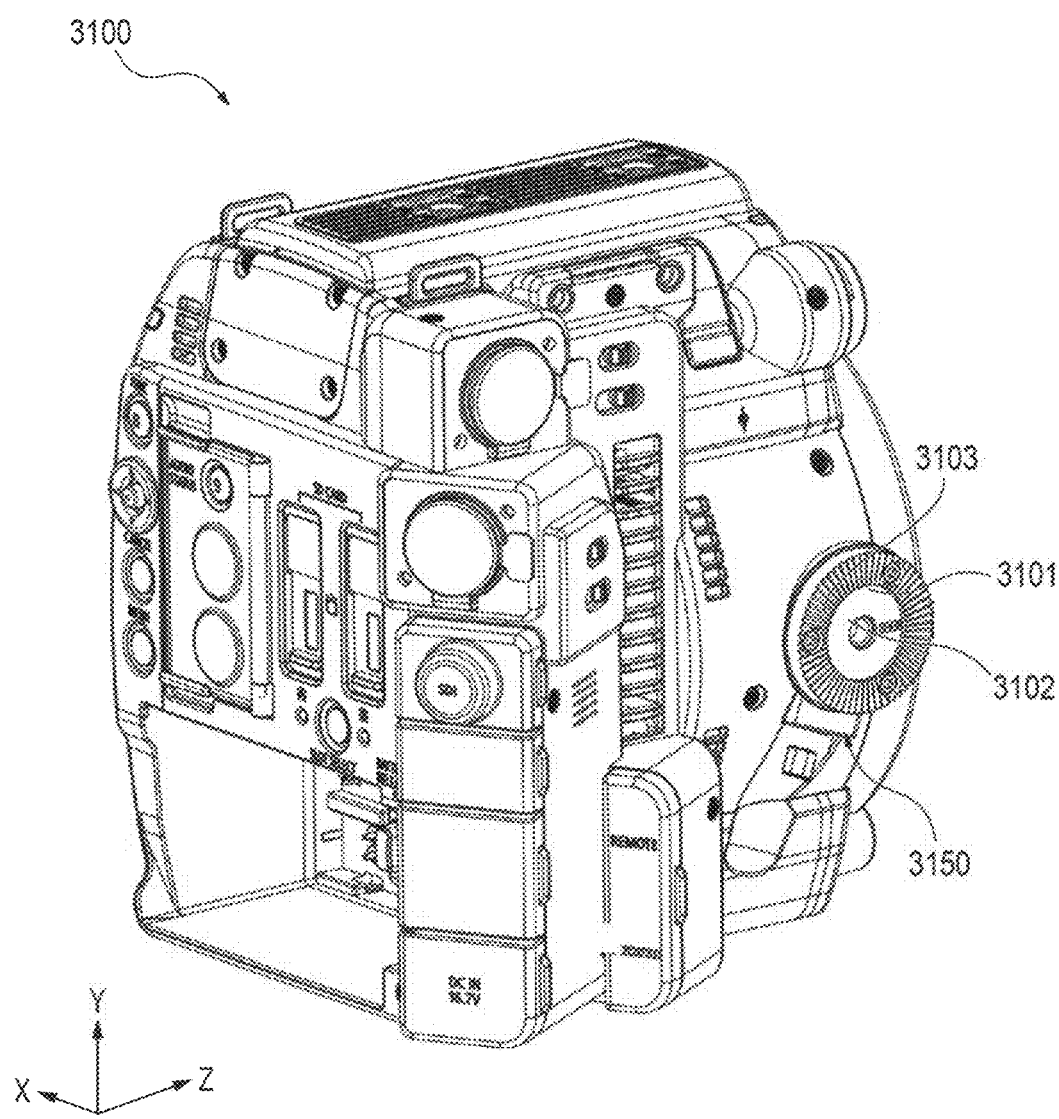
FIG. 21 is a perspective view of the appearance of the image capture apparatus body according to a first variation of the first embodiment of the present invention.

As shown in FIG. 21, the body-side attachment mechanism 3150 includes the body-side attachment member 3101 having a substantially disc-like shape. A first body-side screw 3103 is arranged in the center of the body-side attachment member 3101. The surface of the body-side attachment member 3101 has recessed-shape portions and protruding-shape portions radially formed in the outer periphery thereof in a generally annular shape, for being engaged with corresponding portions of another member, and the contact part 3102 is provided inward of the annular shape of the recessed-shape portions and protruding-shape portions. The contact part 3102 is comprised of electrical contacts for achieving electrical connection between the image capture apparatus body 3100 and a grip 3200 (see FIG. 23) via the body-side attachment mechanism 3150 and is electrically connected to the inside of the image capture apparatus body 3100 by an electrical connection portion 3160 (see FIG. 22B), described hereinafter.

Figure 23:
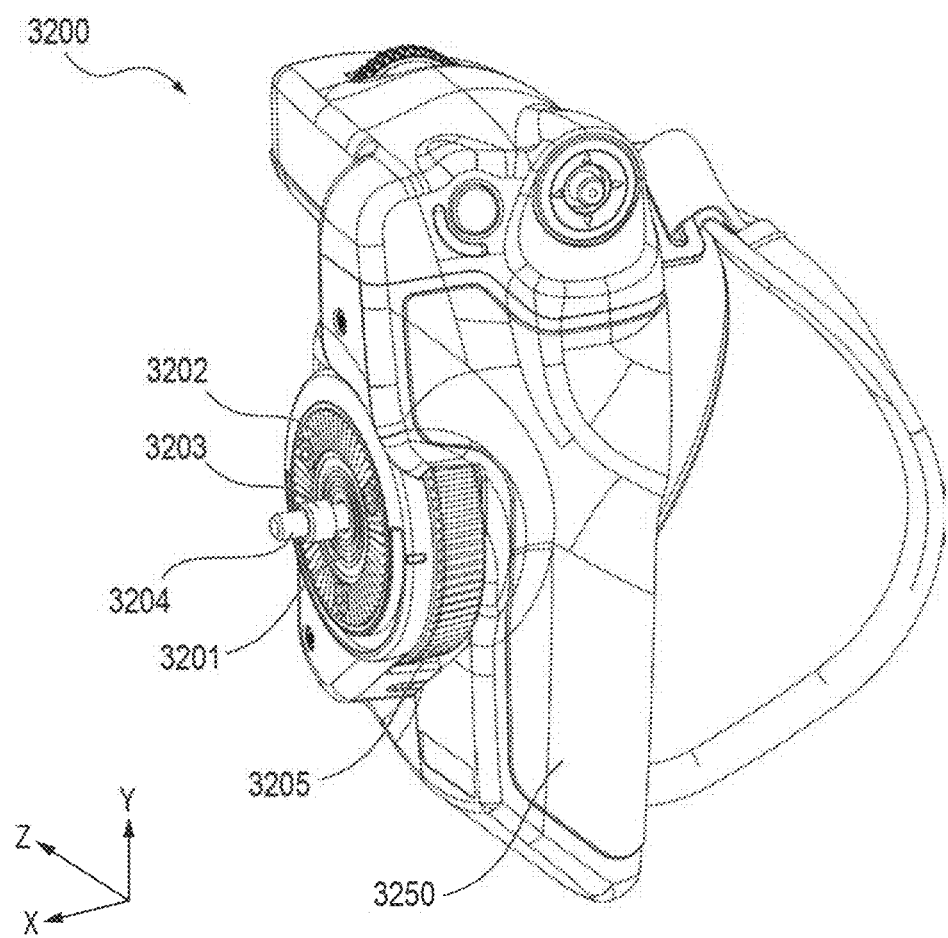
FIG. 23 is a perspective view of the appearance of a grip provided with a grip-side contact pattern and a grip-side attachment member according to the first variation of the first embodiment of the present invention.

On the other hand, as shown in FIG. 23, a grip body 3250 as a component of the grip 3200 is provided with a tightening knob 3205 which can be rotated. A first grip-side screw 3203 is rotated in accordance with the rotational operation of the tightening knob 3205. The first grip-side screw 3203 is arranged at an intermediate portion of a columnar member in an axial direction. A tip end of the columnar member (tip end side of the first grip-side screw 3203) is provided with a second grip-side screw 3204 formed coaxially with the first grip-side screw 3203 at a screw pitch different from the first grip-side screw 3203. The second grip-side screw 3204 has an outer diameter shorter than that of the first grip-side screw 3203.

Similar to the body-side attachment member 3101, recessed-shape portions and protruding-shape portions are radially formed in the outer periphery of the surface of the grip-side attachment member 3202 provided on the grip 3200 and having a substantially disc-like shape. By engaging the recessed-shape portions and the protruding-shape portions of the body-side attachment member 3101 with the protruding-shape portions and the recessed-shape portions of the grip-side attachment member 3202, the position of the grip 3200 with respect to the image capture apparatus body 3100 is determined and rotation of the grip 3200 about the X-axis is restricted. When the tightening knob 3205 is rotated in a state in which the recessed-shape portions and protruding-shape portions of the body-side attachment member 3101 have been thus engaged with the protruding-shape portions and recessed-shape portions of the grip-side attachment member 3202, the first body-side screw 3103 and the first grip-side screw 3203 are screwed with each other. With this, the grip 3200 is fixed to the image capture apparatus body 3100.

The grip 3200 is provided with a grip-side contact pattern 3201 to be electrically connected to the image capture apparatus body 3100, on the inner peripheral side of the recessed-shape portions and protruding-shape portions of the grip-side attachment member 3202. The grip-side contact pattern 3201 has traces concentrically formed. With this, when the grip 3200 is attached to the image capture apparatus body 3100 by rotating the same, the grip-side contact pattern 3201 is brought into contact with the contact part 3102, whereby it is possible to electrically connect between the grip 3200 and the image capture apparatus body 3100. That is, in a state in which the grip 3200 has been fixed to the image capture apparatus body 3100, the contact part 3102 and the grip-side contact pattern 3201 are electrically connected, and hence it is possible to supply electrical power and perform communication between the image capture apparatus body 3100 and the grip 3200. Note that in the illustrated example, the contact part 3102 has three pins, and the grip-side contact pattern 3201 has three traces formed along the circumference so as to be associated with the three pins, respectively.

FIG. 21 is a perspective view of the appearance of the image capture apparatus body according to the first variation of the first embodiment of the present invention.

Figure 22A:
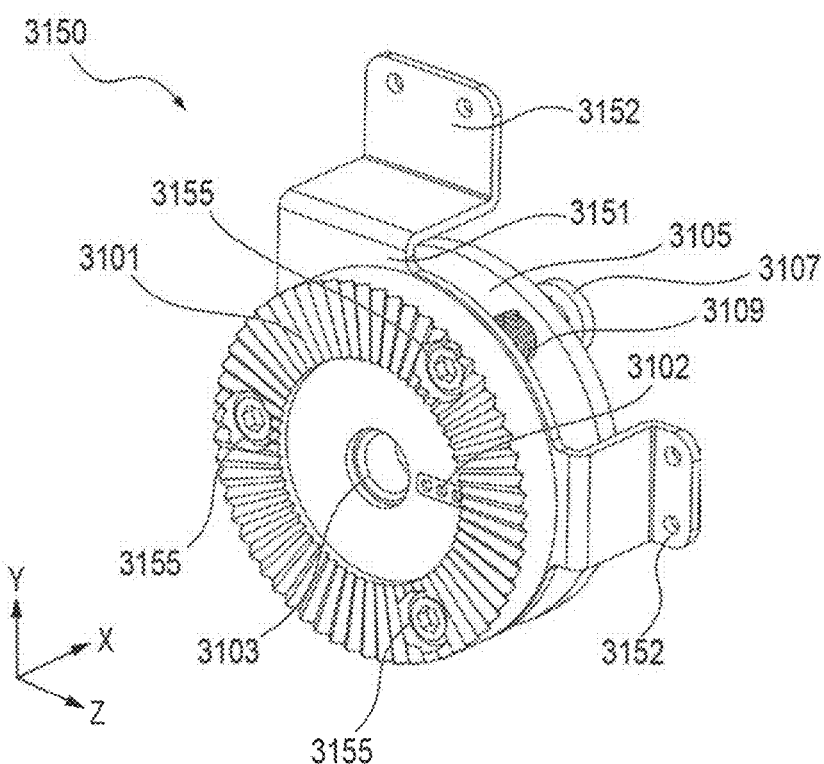
FIGS. 22A and 22B are perspective views of a body-side attachment mechanism according to the first variation of the first embodiment of the present invention.
Figure 22B:
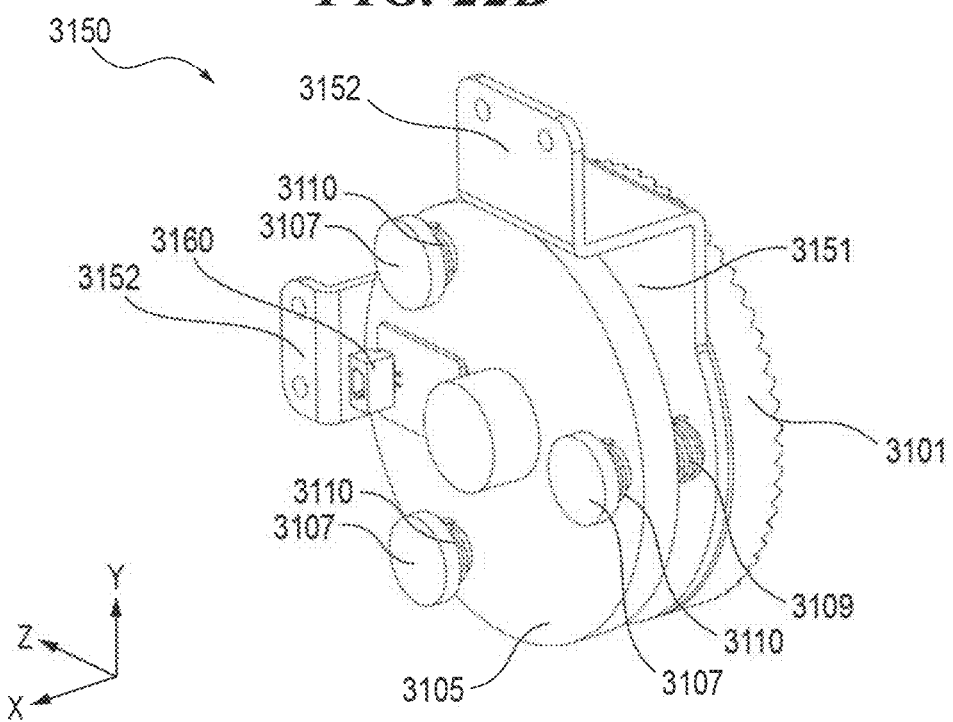

Further, FIGS. 22A and 22B are perspective views of the body-side attachment mechanism according to the first variation of the first embodiment of the present invention. FIG. 22A shows the body-side attachment mechanism as viewed from the appearance side, and FIG. 22B shows the same as viewed from the inside of the image capture apparatus body.

Further, FIG. 23 is a perspective view of the appearance of the grip provided with the grip-side contact pattern and the grip-side attachment member of the first variation of the first embodiment of the present invention.

Note that the coordinate system is defined as shown in FIG. 21 for convenience of explanation. The Z-axis is defined to extend in a front-rear direction of the image capture apparatus (the direction toward a lens on the front side is defined as a +Z direction), the Y-axis is defined to extend in a vertical direction of the image capture apparatus (the direction toward a top side is defined as a +Y direction), and the X-axis is defined to extend in a left-right direction of the image capture apparatus (the direction toward a right side as viewed from the front is defined as a +X direction).

As shown in FIG. 21, the image capture apparatus body 3100 includes the body-side attachment mechanism 3150 for fixing an accessory, such as the grip 3200. As shown in FIGS. 22A and 22B, the body-side attachment mechanism 3150 includes a body-side fixing portion 3152 provided on a body-side attachment sheet metal 3151 and is firmly fixed to the inside of the image capture apparatus body 3100 via the body-side fixing portion 3152 e.g. with fastening members. Since the body-side attachment mechanism 3150 is firmly fixed, even when an accessory, such as the grip 3200, is attached, the body-side attachment mechanism 3130 can support the accessory, such as the grip 3200.

As shown in FIGS. 21, and 22A and 22B, the body-side attachment mechanism 3150 has the body-side attachment member 3101 having a shape of a circle (circular shape). As described hereinabove, the body-side attachment member 3101 has the recessed-shape portions and protruding-shape portions radially formed with the center of the circle as the radial center. Similar to the body-side attachment member 3101, the grip-side attachment member 3202 provided on the grip 3200, shown in FIG. 23, has the recessed-shape portions and protruding-shape portions radially formed with the center of the circle as the radial center. By engaging the recessed-shape portions and protruding-shape portions of the body-side attachment member 3101 and the protruding-shape portions and recessed-shape portions of the grip-side attachment member 3202, the position of the grip 3200 with respect to the image capture apparatus body 3100 is determined.

As described hereinabove, the first body-side screw 3103 is formed in the center of the body-side attachment member 3101. The first body-side screw 3103 is screwed with the first grip-side screw 3203 appearing in FIG. 23 to fix the image capture apparatus body 3100 and the grip 3200 to each other.

The grip 3200 is provided with the tightening knob 3205 which can be rotated with respect to the grip body 3250. The first grip-side screw 3203 is rotated in accordance with the rotational operation of the tightening knob 3205. The second grip-side screw 3204 is arranged on the tip end side of the first grip-side screw 3203, its effect will be described hereinafter.

The body-side attachment member 3101 and the grip-side attachment member 3202 are engaged with each other, and in this state, the tightening knob 3205 is rotated to screw the first body-side screw 3103 with the first grip-side screw 3203. This makes it possible to fix the grip 3200 to the image capture apparatus body 3100.

As shown in FIGS. 22A and 22B, the body-side attachment mechanism 3150 has the contact part 3102 to be electrically connected to the grip 3200. The contact part 3102 is electrically connected to the inside of the image capture apparatus body 3100 via the electrical connection portion 3160.

As shown in FIG. 23, the grip 3200 is provided with the grip-side contact pattern 3201 to be electrically connected to the image capture apparatus body 3100. The grip-side contact pattern 3201 is a pattern to be brought into contact with the contact part 3102 so as to achieve electrical connection. The grip-side contact pattern 3201 has the traces arranged concentrically with the grip-side attachment member 3202. With this, when the grip 3200 is rotated and attached to the image capture apparatus body 3100, the grip-side contact pattern 3201 can be brought into contact with the contact part 3102 and can be thereby electrically connected thereto. Note that in the illustrated example, the contact part 3102 has the three pins, and the grip-side contact pattern 3201 has the three traces formed along the circumference so as to be associated with the three pins, respectively.

As described above, in the case where the grip 3200 has been fixed to the image capture apparatus body 3100 shown in FIG. 21, the contact part 3102 and the grip-side contact pattern 3201 are brought into contact with each other and electrically connected to each other. When the contact part 3102 and the grip-side contact pattern 3201 are electrically connected, it is possible to perform power supply, communication, and so forth, between the image capture apparatus body 3100 and the grip 3200.

On the other hand, in a state in which the grip 3200 has not been fixed to the image capture apparatus body 3100, the contact part 3102 is retracted to protect the contact part 3102. This retracting operation will be described hereinafter.

Figure 24A:
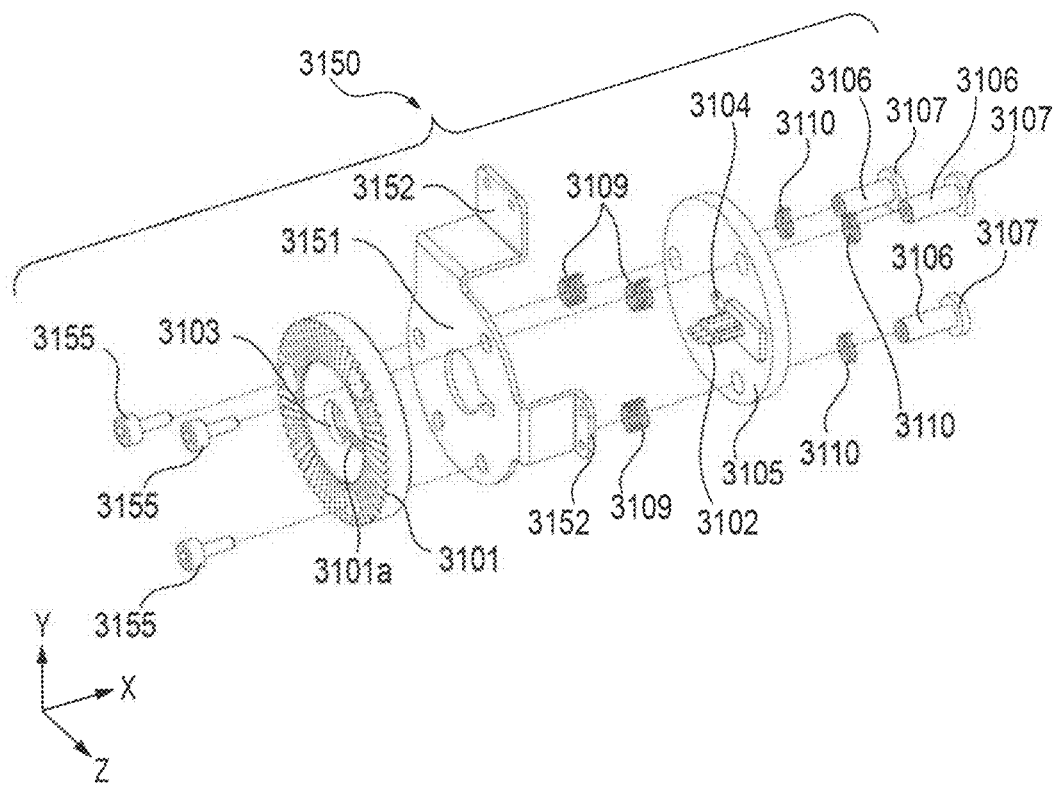
FIGS. 24A and 24B are exploded perspective views of the body-side attachment mechanism shown in FIGS. 22A and 22B.
Figure 24B:
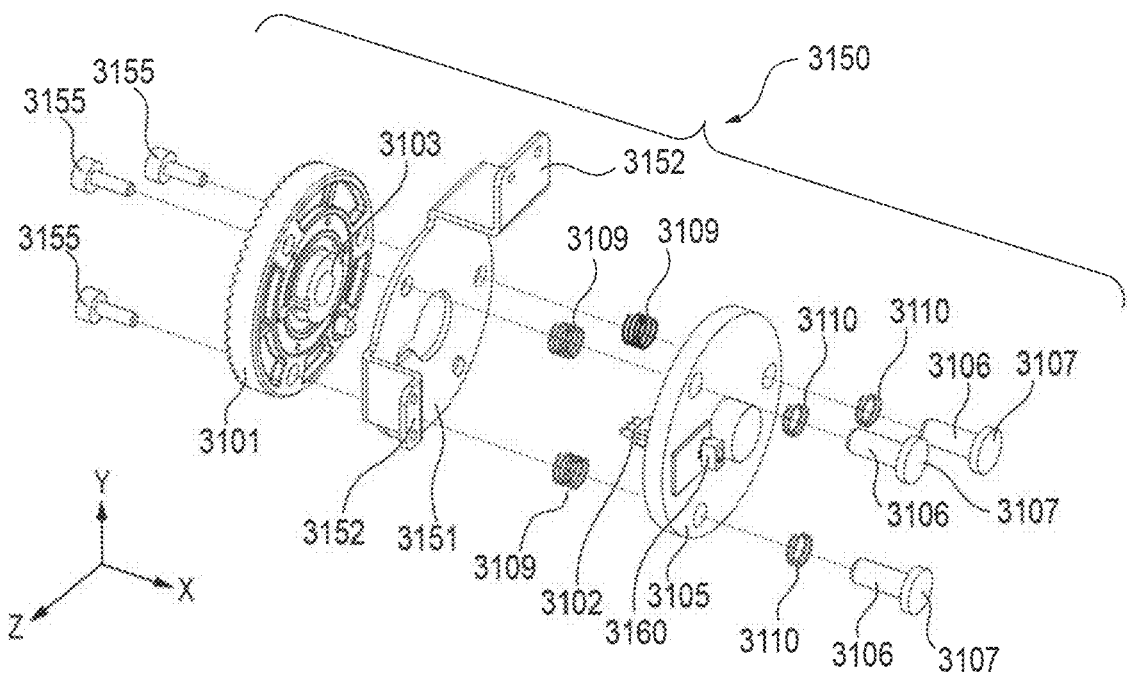

FIGS. 24A and 24B are exploded perspective views of the body-side attachment mechanism shown in FIGS. 22A and 22B. FIG. 24A shows the body-side attachment mechanism 3150 as viewed from the outside of the image capture apparatus body, while FIG. 24B shows the body-side attachment mechanism 3150 as viewed from the inside of the image capture apparatus body.

In the body-side attachment mechanism 3150, the body-side attachment member 3101 and the body-side attachment sheet metal 3151 are jointly fastened to a contact unit (contact holding member) 3105 using three shaft members 3106 and three screws 3155. The shaft members 3106 are inserted through the contact unit 3105 having the contact part 3102 and the contact unit 3105 can be slid along the shaft members 3106 between shaft stoppers 3107 and the body-side attachment sheet metal 3151.

With this, when the contact unit 3105 is slid in the −X direction, the tip end of the contact part 3102 is moved to a −X direction side of an attachment member contact surface 3101*a*, whereby the contact part 3102 is exposed. On the other hand, when the contact unit 3105 is slid in the +X direction, the tip end of the contact part 3102 is moved to a +X direction side of the attachment member contact surface 3101*a*, whereby the contact part 3102 is retracted.

The shaft members 3106 are inserted not only through the contact unit 3105, but also through first springs 3109 and second springs 3110. The first springs 3109 urge the contact unit 3105 in the +X direction whereas the second springs 3110 urge the contact unit 3105 in the −X direction.

The contact unit 3105 is formed with a second body-side screw 3104 for being screwed with the second grip-side screw 3204 and the second body-side screw 3104 has a screw pitch different from the first body-side screw 3103. The axis of the second body-side screw 3104 is positioned on the same axis as that of the first body-side screw 3103. Note that the effect provided by the second body-side screw 3104 will be described hereinafter.

The contact unit 3105 is provided with the contact part 3102 and the electrical connection portion 3160, and the contact part 3102 and the electrical connection portion 3160 are moved together in the −X direction and the +X direction in accordance with the movement of the contact unit 3105. The contact part 3102 has the three pins. Three contact springs 3108 (not shown in FIG. 24) associated with the three pins, respectively, are arranged inward of (on the +X direction side of) the three pins. Therefore, even when a force is applied to the pins of the contact part 3102 in the +X direction, the pins are not broken but pressed inside the contact part 3102 (in the −X direction).

The image capture apparatus body 3100 and the electrical connection portion 3160 are electrically connected and the electrical connection portion 3160 and the three pins of the contact part 3102 are electrically connected. Therefore, when the contact part 3102 is in contact with the grip-side contact pattern 3201, electrical power and signals can be transmitted from the image capture apparatus body 3100 to the grip 3200.

Here, the above-mentioned retracting structure of the contact part 3102 will be described.

Figure 25A:
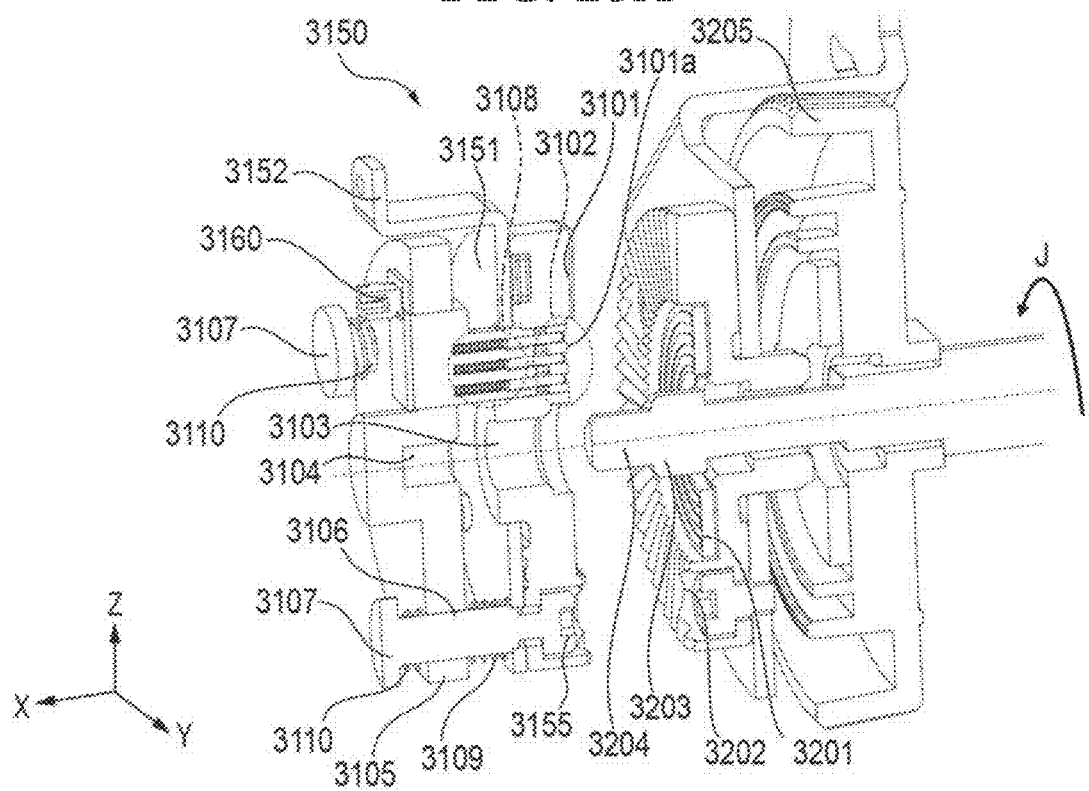
FIGS. 25A and 25B are first broken perspective views of the body-side attachment mechanism and the grip-side attachment member shown in FIGS. 22A to 24B.

FIGS. 25A to 27B are broken perspective views of the body-side attachment mechanism and the grip-side attachment member shown in FIGS. 22A to 24B. FIG. 25A shows a state before the body-side attachment member and the grip-side attachment member are engaged, and FIG. 25B shows a state in which the body-side attachment member and the grip-side attachment member have been engaged.

Figure 26A:
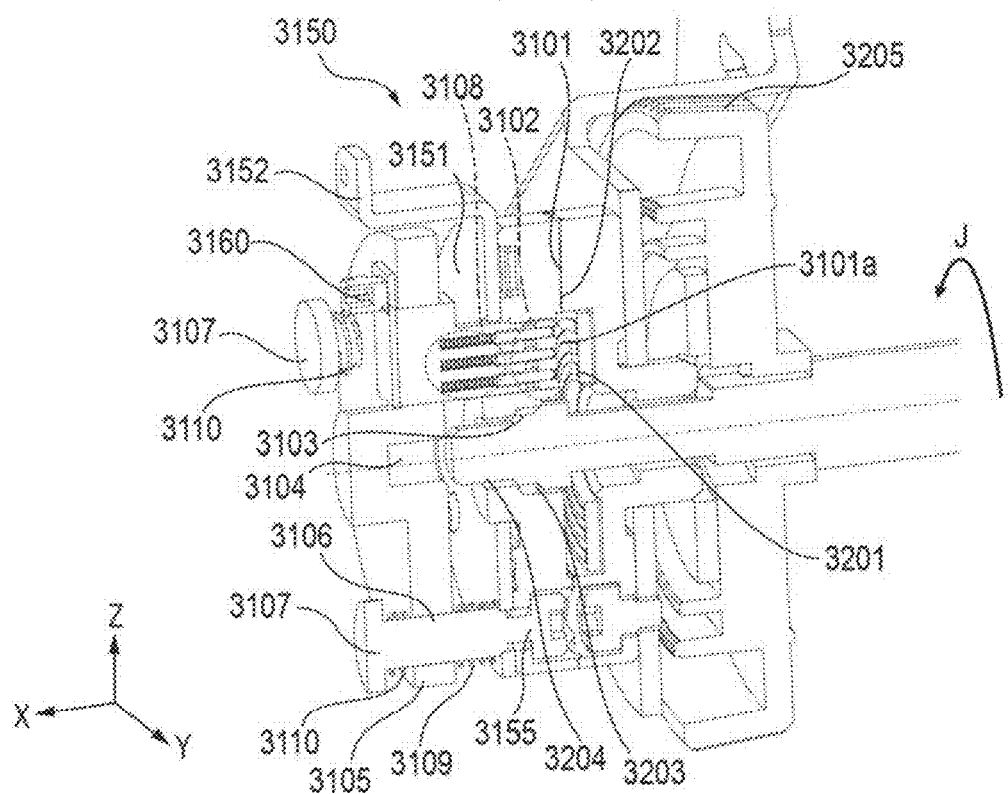
FIGS. 26A and 26B are second broken perspective views of the body-side attachment mechanism and the grip-side attachment member shown in FIGS. 22A to 24B.
Figure 26B:
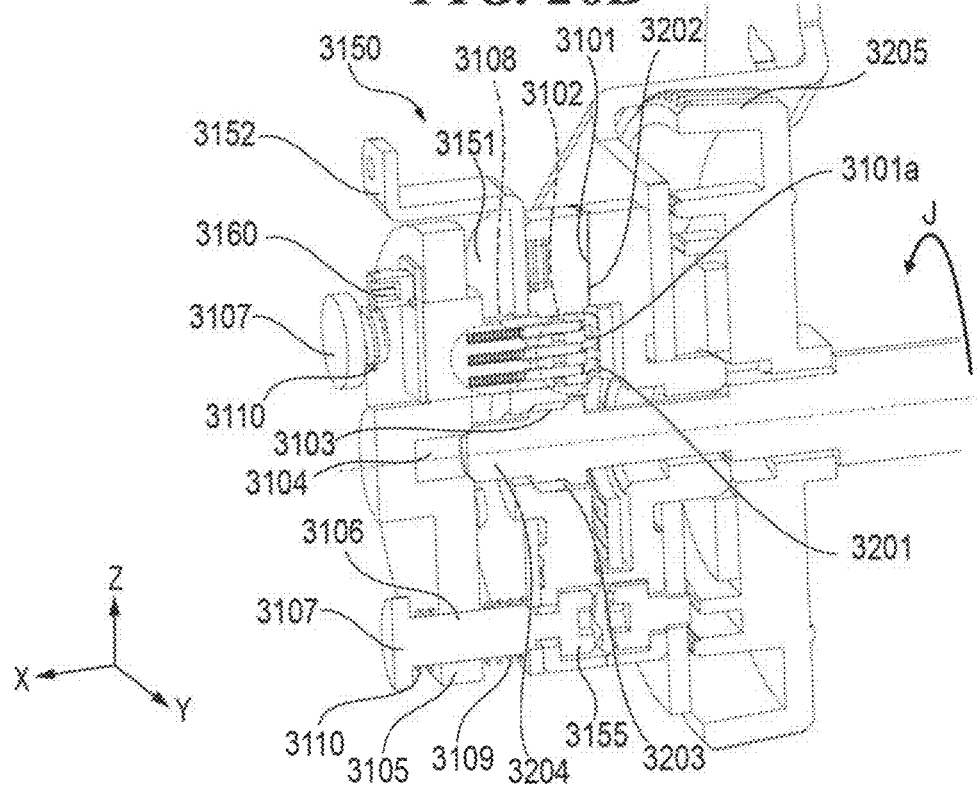

Also, FIG. 26A shows a state in which the second body-side screw and the second grip-side screw have started to be screwed with each other, and FIG. 26B shows a state in which the second body-side screw and the second grip-side screw have been brought into contact with each other.

Figure 27A:
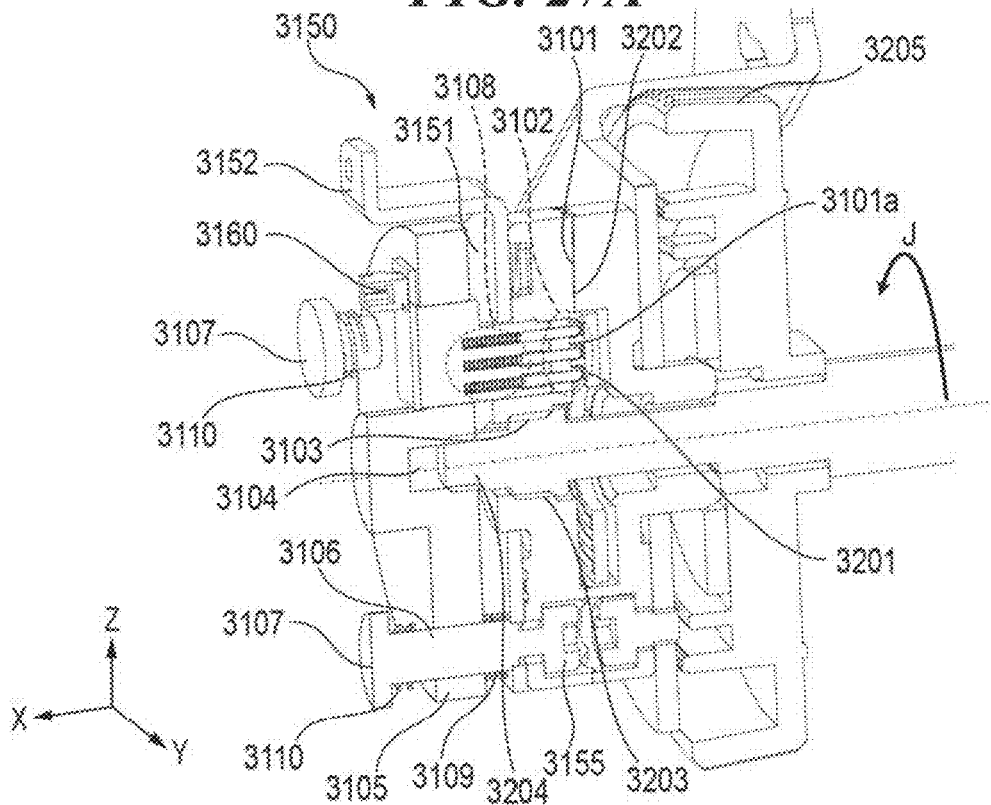
FIGS. 27A and 27B are third broken perspective views of the body-side attachment mechanism and the grip-side attachment member shown in FIGS. 22A to 24B.
Figure 27B:
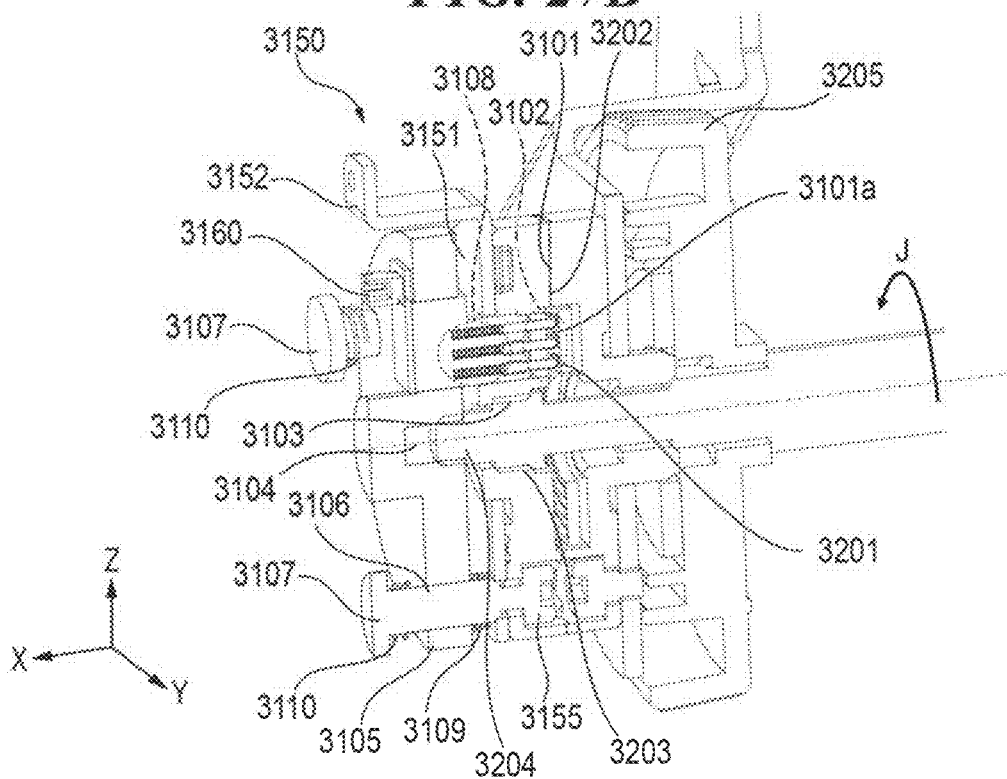

Further, FIG. 27A shows a state in which the second body-side screw and the second grip-side screw have started to be screwed with each other, and FIG. 27B shows a state in which the grip has been fixed to the image capture apparatus body.

Referring to FIG. 25A, the body-side attachment member 3101 and the grip-side attachment member 3202 are not in contact with each other, and the grip 3200 and the image capture apparatus body 3100 are separate. In this state, forces are applied by the first springs 3109 to the body-side attachment member 3101 and the contact unit 3105 in respective directions in which they are moved away from each other along the X-axis, i.e. in a direction in which the contact unit 3105 is urged into the image capture apparatus body. Therefore, the contact part 3102 arranged on the contact unit 3105 is positioned by the first springs 3109 on the +X direction side of the attachment member contact surface 3101a and the contact part 3102 is retracted.

Further, not only the first springs 3109 apply the forces in the directions in which the body-side attachment member 3101 and the contact unit 3105 are moved away from each other along the X-axis, but also the second springs 3110 apply forces to the contact unit 3105 and the shaft stoppers 3107 in a direction in which they are moved away from each other along the X-axis. For this reason, the contact unit 3105 is not stably positioned between the body-side attachment member 3101 and the shaft stoppers 3107, and hence there is a fear that the contact part 3102 is exposed even when the contact part 3102 is in the state shown in FIG. 25A. To prevent this, in the illustrated example, the position of the contact part 3102 is adjusted to be always on the +X direction side of the attachment member contact surface 3101a, whereby the contact part 3102 is caused to be retracted. For example, the balance between the first springs 3109 and the second springs 3110 is adjusted such that the contact part 3102 is placed in the retracted state.

Figure 25B:
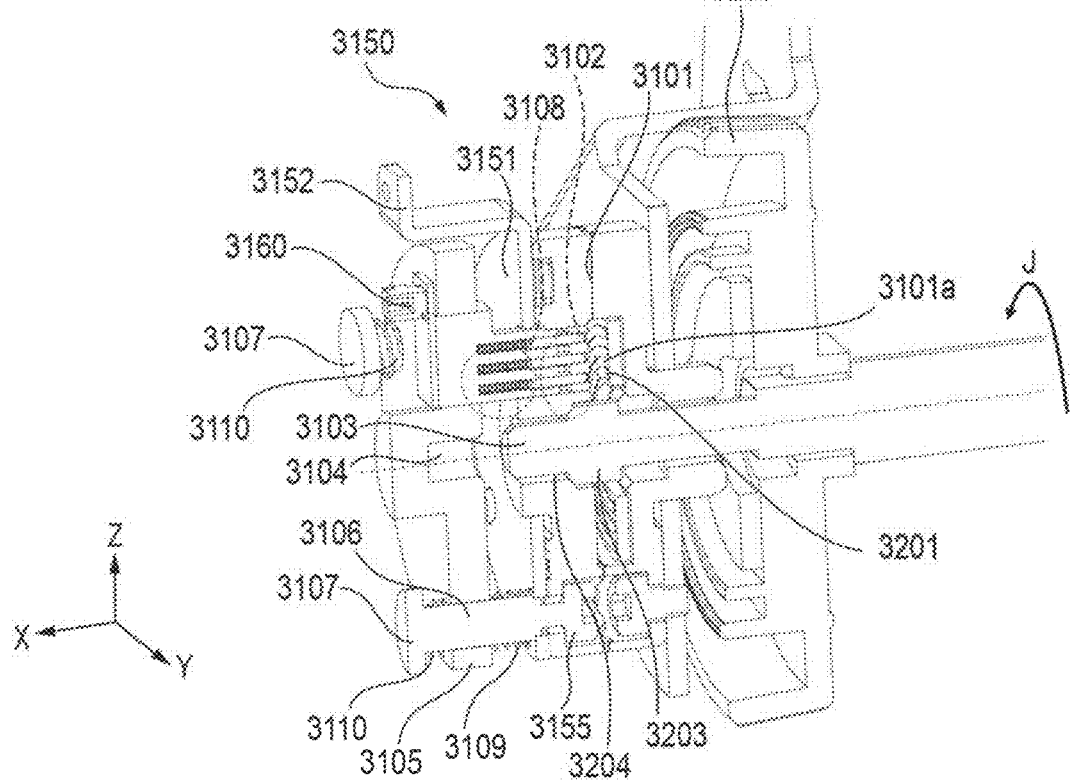

When the body-side attachment member 3101 and the grip-side attachment member 3202 are engaged with each other by adjusting the phases thereof from the state shown in FIG. 25A, this results in a state shown in FIG. 25B. In this state, the tightening knob 3205 is rotated in a clockwise direction (direction indicated by an arrow J). This rotational operation of the tightening knob 3205 causes the first grip-side screw 3203 to be also rotated in the clockwise direction (direction indicated by the arrow J). As the first grip-side screw 3203 is rotated, the first grip-side screw 3203 and the first body-side screw 3103 are screwed with each other, to cause the first grip-side screw 3203 to advance into the image capture apparatus body (+X direction) while rotating. This results in a state shown in FIG. 26A.

In the state shown in FIG. 26A, the diameter of the second grip-side screw 3204 is shorter than the diameter of the first grip-side screw 3203 so as to prevent the second grip-side screw 3204 from interfering with the first body-side screw 3103. As the tightening knob 3205 is further rotated in the clockwise direction (direction indicated by the arrow J) from the state shown in FIG. 26A, the first grip-side screw 3203 further advances into the image capture apparatus body (in the +X direction). As a result, the second grip-side screw 3204 formed on the tip end side of the first grip-side screw 3203 is brought into contact with the second body-side screw 3104 formed in the contact unit 3105, resulting in a state shown in FIG. 26B.

In the illustrated example, the first grip-side screw 3203 and the second grip-side screw 3204 are formed on the same member, and further, these screws have the same rotational axis. Therefore, the first grip-side screw 3203 and the second grip-side screw 3204 are rotated together and advance into the image capture apparatus body.

In the state in which the second grip-side screw 3204 has been brought into contact with the second body-side screw 3104, the first grip-side screw 3203 and the second grip-side screw 3204 are further rotated in the clockwise direction (direction indicated by the arrow J). With this, a force of pressing the contact unit 3105 into the image capture apparatus body (in the +X direction) is applied from portions in contact. When this pressing force is applied, the second springs 3110 are compressed via the contact unit 3105 and the contact unit 3105 advances into the image capture apparatus body (in the +X direction).

At this time, during rotating the second grip-side screw 3204 to press the contact unit 3105 forward, the screw threads of the second grip-side screw 3204 and the second body-side screw 3104 are brought into mesh with each other. To cause the screw threads to mesh with each other, one rotation of the second grip-side screw 3204 is required at the maximum afer the second body-side screw 3104 and the second grip-side screw 3204 have been brought into contact with each other.

For this reason, it is at least required to make the contact unit 3105 movable into the image capture apparatus body (in the +X direction) over a distance over which the first grip-side screw 3203 advances into the image capture apparatus body (+X direction) by one rotation of the first grip-side screw 3203. In the illustrated example, the contact unit 3105, the shaft members 3106, and the second springs 3110 are configured such that the contact unit 3105 can be slid over a distance over which the first grip-side screw 3203 advances by two rotations of the first grip-side screw 3203.

As the tightening knob 3205 is further rotated in the clockwise direction (in the direction indicated by the arrow J) from the state shown in FIG. 26B, the first body-side screw 3103 and the first grip-side screw 3203 are screwed with each other, and the first grip-side screw 3203 further advances into the image capture apparatus body (in the +X direction) while rotating. The second body-side screw 3104 and the second grip-side screw 3204 are also screwed with each other in accordance with the rotation of the first grip-side screw 3203, resulting in a state shown in FIG. 27A.

In the illustrated example, the second grip-side screw 3204 is larger in screw pitch than the first grip-side screw 3203. That is, the second grip-side screw 3204 is larger in distance to move in the axial direction by one rotation than the first grip-side screw 3203. Let it be assumed, for example, that the second grip-side screw 3204 and the first grip-side screw 3203 have the same screw pitch. In this case, even when the first body-side screw 3103 and the first grip-side screw 3203, and the second body-side screw 3104 and the second grip-side screw 3204 are screwed at the same time, the distance between the body-side attachment member 3101 and the contact unit 3105 is not changed.

On the other hand, if the second grip-side screw 3204 is made larger in screw pitch than the first grip-side screw 3203, when they are simultaneously screwed, the contact unit 3105 is slid in a direction in which the contact unit 3105 approaches the body-side attachment member 3101 (in the −X direction). When the contact unit 3105 is slid in the direction of approaching the body-side attachment member 3101 (in the −X direction), the contact part 3102 is moved to a −X direction side of the attachment member contact surface 3101a, whereby the contact part 3102 is exposed. As a result, the contact part 3102 is brought into contact with the grip-side contact pattern 3201.

As shown in FIG. 27A, the contact part 3102 is brought into contact with the grip-side contact pattern 3201 and is electrically connected to the same, whereby it is possible to perform power supply and communication between the image capture apparatus body 3100 and the grip 3200 as described above.

When the tightening knob 3205 is further rotated (in the direction indicated by the arrow J) from the state shown in FIG. 27A, this results in a state shown in FIG. 27B. In this state, the body-side attachment member 3101 and the grip-side attachment member 3202 are tightened by the first grip-side screw 3203 and the first body-side screw 3103. In this state, the grip 3200 has been firmly fixed to the image capture apparatus body 3100.

In the state shown in FIG. 27B, the body-side attachment member 3101 and the contact unit 3105 is closer to each other than in the state shown in FIG. 27A, and a force is applied in a direction of causing the grip-side contact pattern 3201 to crush the contact part 3102. However, the contact springs 3108 at root portions of the contact part 3102 are compressed, whereby the contact part 3102 is prevented from being broken by being crushed.

In removing the grip 3200 from the image capture apparatus body 3100, it is only required to perform an operation in a reverse order from the operation described with reference to FIGS. 25A, 25B, 26A, 26B, 27A, and 27B, whereby it is possible to easily remove the grip 3200.

As described above, only in a case where the grip 3200 having the second grip-side screw 3204 and the grip-side contact pattern 3201 is attached, the contact part 3102 is exposed to thereby make it possible to electrically connect the grip 3200 and the image capture apparatus body 3100 to each other. On the other hand, in a case where the grip 3200 is not attached, the second body-side screw 3104 is not screwed and hence the contact part 3102 is not exposed.

Further, even when a user carelessly touches the grip-side attachment member 3202 and therearound to thereby apply a force in a direction of pressing in the touched portion (in the +X direction), the contact part 3102 is not exposed. With the above-described exposing and retracting structure of the contact part 3102, it is possible to prevent unintended contact with the contact terminals and breakage of the contact terminals.

Here, a description will be given of a second variation of the body-side attachment mechanism 1200 of the image capture apparatus body 1000 in the first embodiment of the present invention.

Figure 28:
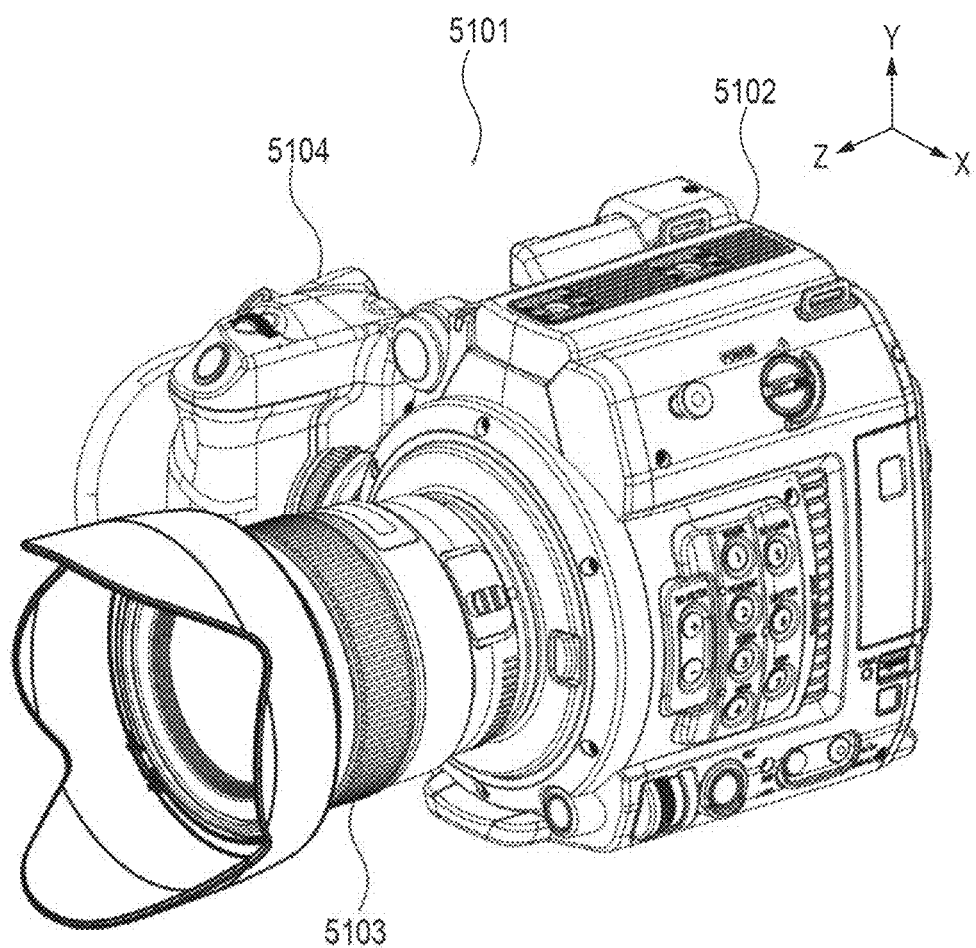
FIG. 28 is a perspective view of the appearance of an image capture apparatus according to a second variation of the first embodiment of the present invention.

FIG. 28 is a perspective view of the appearance of an image capture apparatus 5101 according to a second variation of the first embodiment of the present invention.

The image capture apparatus 5101 includes a body-side attachment mechanism 5111 (not shown in FIG. 28), and further includes an image capture apparatus body 5102, a photographic lens 5103, and a grip 5104.

Figure 29:
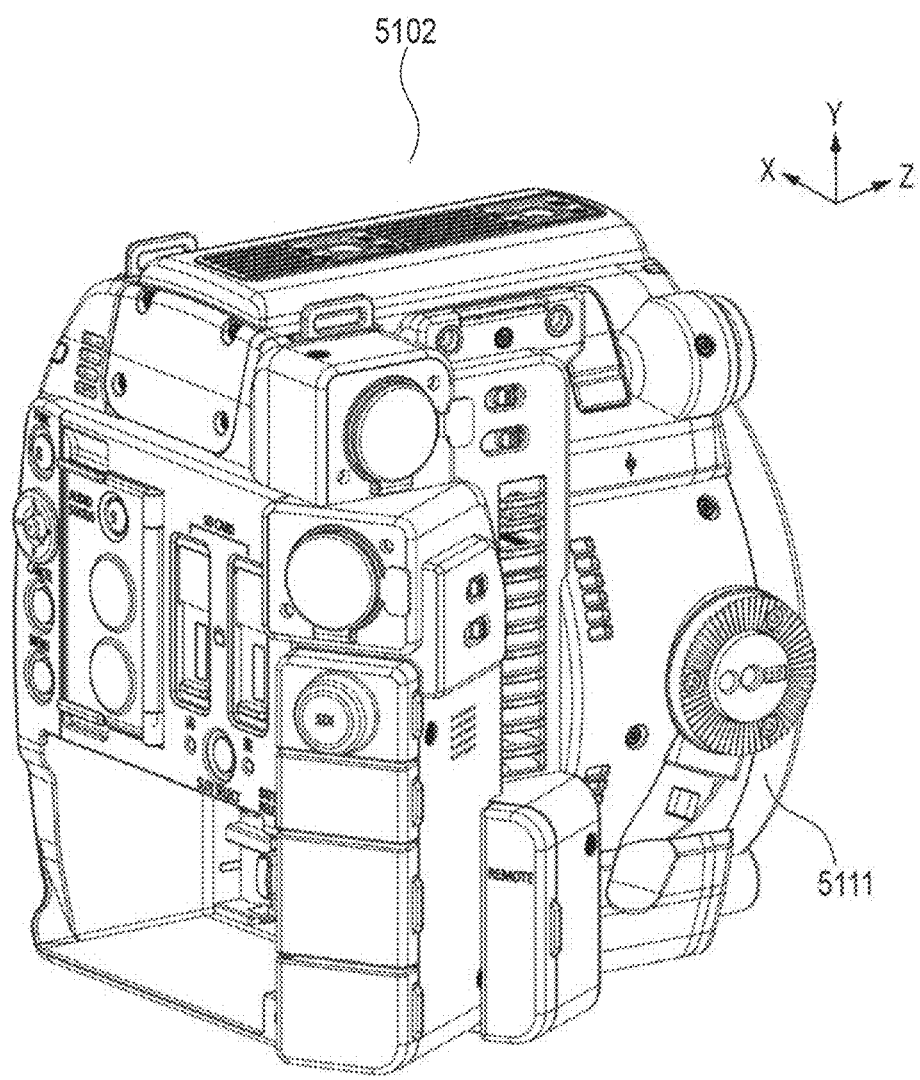
FIG. 29 is a perspective view of the appearance of an image capture apparatus body appearing in FIG. 28.

FIG. 29 is a perspective view of the appearance of the image capture apparatus body 5102 appearing in FIG. 28.

Referring to FIG. 29, the components of the image capture apparatus body 5102, other than the body-side attachment mechanism 5111, are the same as those of the above-described image capture apparatus body 1000, and hence description thereof is omitted.

The body-side attachment mechanism 5111 to which an accessory can be attached is arranged on a side of the image capture apparatus body 5102. As an example of the accessory, the grip 5104 having electrical contacts inside a rosette can be attached to the body-side attachment mechanism 5111.

Figure 30A:
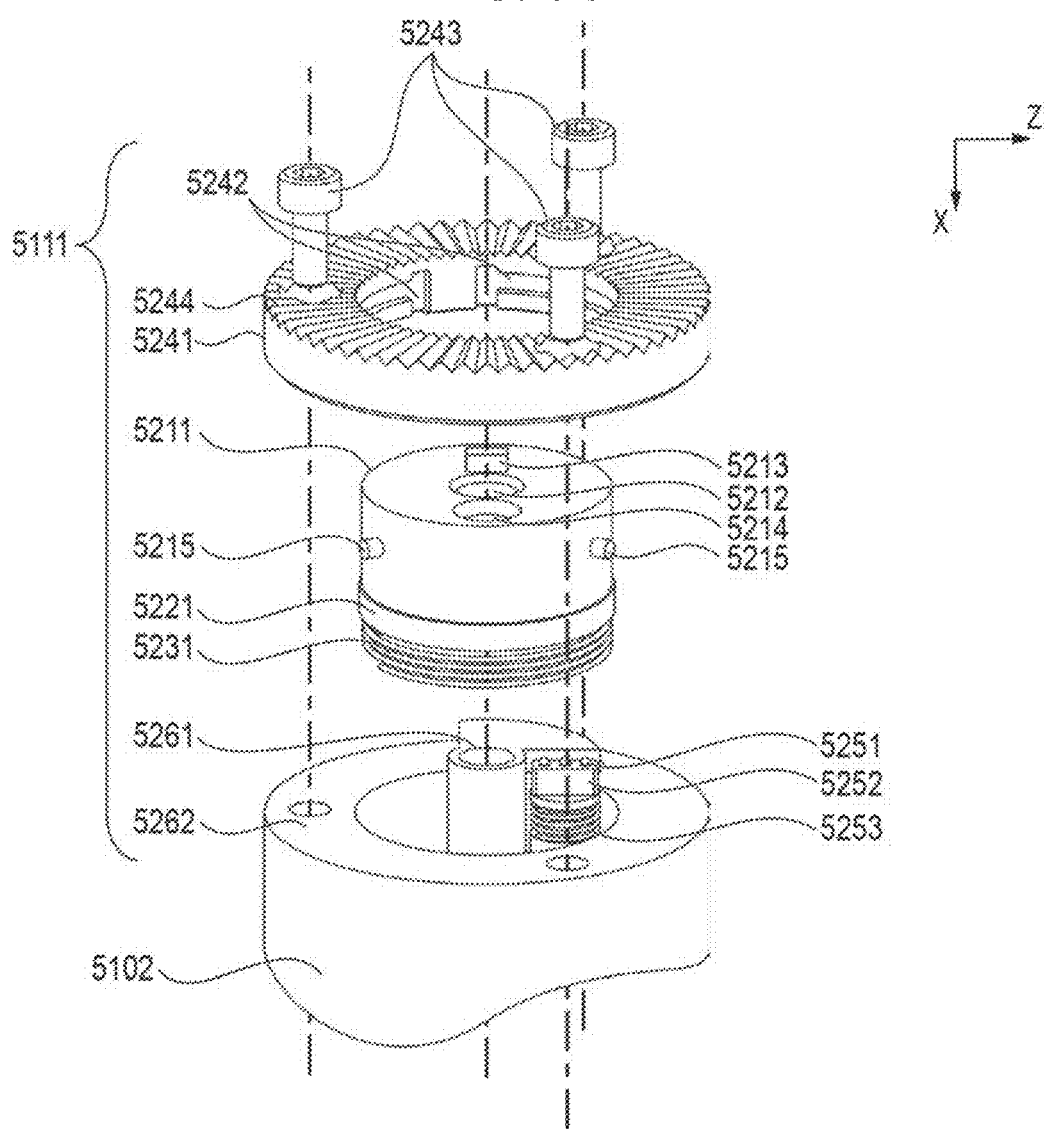
FIGS. 30A and 30B are views useful in explaining a body-side attachment mechanism appearing in FIG. 29.
Figure 30B:
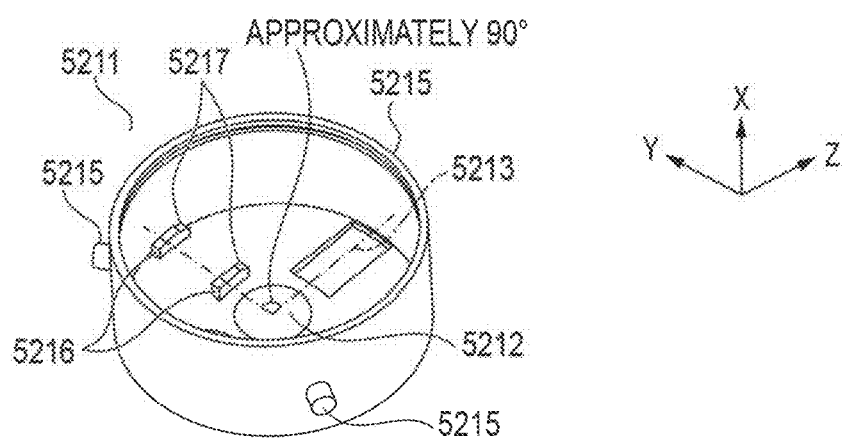

FIGS. 30A and 30B are views useful in explaining the body-side attachment mechanism 5111 appearing in FIG. 29. Further, FIG. 30A is an exploded perspective view of the body-side attachment mechanism 5111, and FIG. 30B is a perspective view of a structure of inside a contact protection cover 5211 appearing in FIG. 30A.

Here, as shown in FIG. 28, the Z-axis is defined to extend in a front-rear direction of the image capture apparatus body 5102 (the direction toward a lens on the front side is defined as a +Z direction), the Y-axis is defined to extend in a vertical direction of the image capture apparatus body 5102 (the direction toward a top side is defined as a +Y direction), and the X-axis is defined to extend in a left-right direction of the image capture apparatus body 5102 (the direction toward a right side as viewed from the front is defined as a +X direction).

A body-side screw 5261 is a female screw to be screwed with a grip-side screw 5311, described hereinafter, included in the grip 5104. A body-side attachment member 5241 is a substantially ring-shaped member fixed to the image capture apparatus body 5102 with screws 5243 and is formed with a body-side engagement part 5244 and cam grooves 5242.

The body-side engagement part 5244 includes recessed-shape portions and protruding-shape portions radially formed in the surface of the body-side attachment member 5241, for causing the body-side engagement part 5244 to be engaged with a grip-side rosette 5313, described hereinafter. The body-side engagement part 5244 and the grip-side rosette 5313 are engaged with each other, whereby it is possible to prevent the grip 5104 from rotating about the X-axis.

The cam grooves 5242 are formed in an inner peripheral side surface of the body-side attachment member 5241 such that it has a predetermined shape. In the cam grooves 5242, protrusions 5215 of the contact protection cover 5211, described hereinafter, can be fitted.

Details of the cam grooves 5242 will be described hereinafter. Further, although in the illustrated example, the cam grooves 5242 are formed in the inner peripheral side surface of the body-side attachment member 5241, the configuration may be such that the body-side engagement part 5244 is formed in a separate different member from a member where the cam grooves 5242 are formed.

Inside the body-side attachment member 5241, body-side contact pins 5251 as electrical contacts for performing power supply and communication between the image capture apparatus body 5102 and the grip 5104 are arranged. Further, the body-side contact pins 5251 are connected to a control circuit (not shown) in the image capture apparatus body 5102 by electrical wiring (not shown).

The body-side contact pins 5251 have predetermined functions assigned thereto, respectively, and thereby function e.g. as a power supply terminal, a communication terminal, and a ground terminal. The body-side contact pins 5251 are electrically connected to associated traces of a grip-side contact pattern 5314, described hereinafter, provided in the grip 5104. The control circuit in the image capture apparatus body 5102 can supply electrical power to and perform communication with the grip 5104 via the body-side contact pins 5251.

A contact block 5252 holds the body-side contact pins 5251. A contact block spring 5253 is a member for urging the contact block 5252 toward a position where the contact block 5252 can be brought into contact with the grip-side contact pattern 5314, described hereinafter, in the X direction.

The contact protection cover 5211 is arranged inside the body-side attachment member 5241 and is provided with an opening 5212, a contact exposing portion 5213, a finger hooking portion 5214, the protrusions 5215, and contact protection cover abutment portions 5216.

The opening 5212 allows insertion of the grip-side screw 5311. The contact exposing portion 5213 allows the body-side contact pins 5251 to protrude therefrom when the contact protection cover 5211 is pressed down in the X direction in accordance with attachment of the grip 5104. The size of the contact exposing portion 5213 is set to a minimum size adapted to the outer shape of the contact block 5252 such that the contact block 5252 can protrude therefrom. With this, it is possible to minimize entering of e.g. dust from the contact exposing portion 5213.

The finger hooking portion 5214 allows a user to hook a finger thereon when performing an operation of rotating the contact protection cover 5211, and in the present example, the finger hooking portion 5214 has a circular recess-shape and is formed at a location opposite to the contact exposing portion 5213. By hooking a finger on the finger hooking portion 5214, the user can easily rotate the contact protecting cover 5211.

Note that the position, shape, and number of the finger hooking portion 5214 is not limited to the above-described examples, insofar as a user can easily hook a finger thereon.

The protrusions 5215 are a plurality of protruding portions having the same shape and arranged on an outer side surface of the contact protection cover 5211. The protrusions 5215 are fitted in the cam grooves 5242 of the body-side attachment member 5241, whereby it is possible to move rotate the contact protection cover 5211 along the loci of the cam grooves 5242.

It is desirable that the contact protection cover 5211 is formed of a material having high strength so as to mechanically protect the body-side contact pins 5251, and further, it is desirable that the contact protection cover 5211 is formed of an insulating material (dielectric material), such as a resin material, so as to electrically protect the body-side contact pins 5251.

The contact protection cover abutment portions 5216 are protruding portions arranged at respective locations away from the contact exposing portion 5213 by approximately 90 degrees in a direction along the circumference of a circle having the X-axis as the center as shown in FIG. 30B, and are brought into abutment with the contact block 5252 when the contact protection cover 5211 is operated to press down the contact block 5252. Note that each contact protection cover abutment portion 5216 may be formed with an inclined surface 5217 so as to enable the contact protection cover abutment portion 5216 to easily climb onto the contact block 5252.

A contact protection cover-holding portion 5221 is a member for holding the contact protection cover 5211 such that the contact protection cover 5211 is rotatable about the X-axis, and for example, the contact protection cover-holding portion 5221 and the contact protection cover 5211 may be made slidable in a state brought into contact with each other, or may be made slidable using a thrust bearing. A contact protection cover spring 5231 is a member for urging the contact protection cover-holding portion 5221 in the −X direction (direction toward the contact protection cover 5211 in the axial direction of the body-side screw 5261), and its position is defined by the above-described cam grooves 5242.

Next, a description will be given of how the contact protection cover 5211 moves along the cam grooves 5242.

Figure 31A:
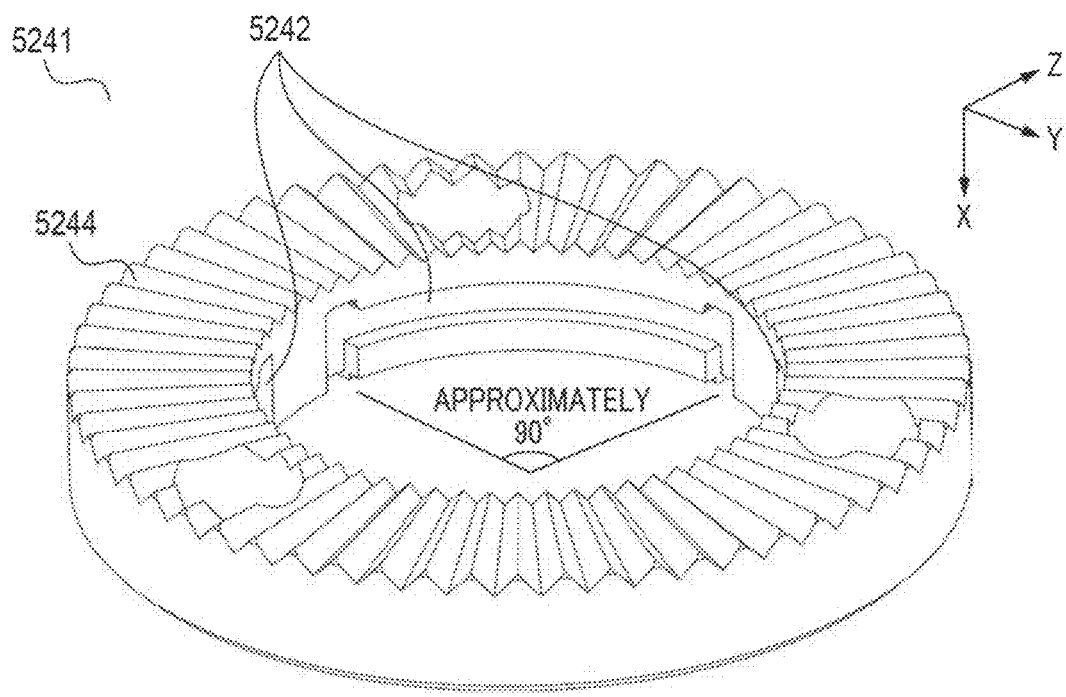
FIGS. 31A and 31B are views useful in explaining a structure of a body-side attachment member of the body-side attachment mechanism shown in FIGS. 30A and 30B.
Figure 31B:
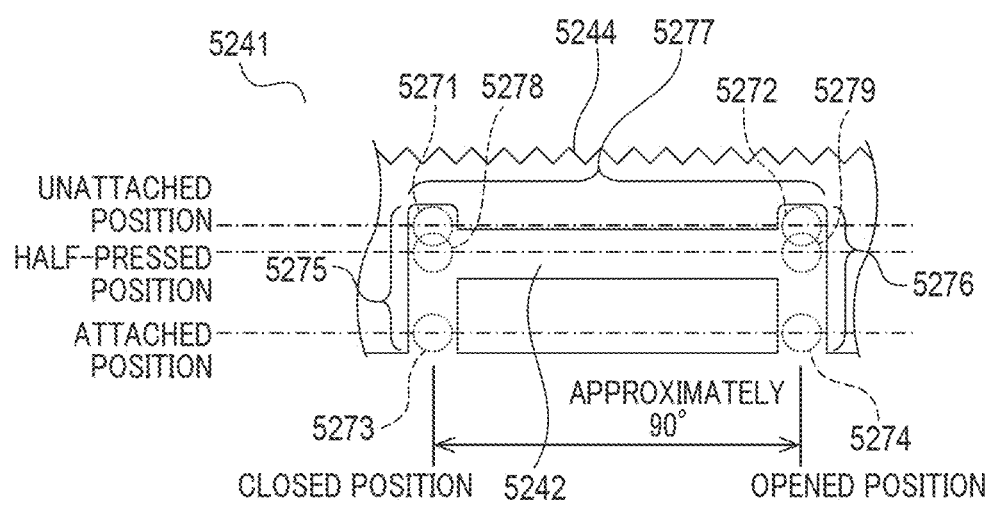

FIGS. 31A and 31B are views useful in explaining a structure of the body-side attachment member 5241 in the body-side attachment mechanism 5111 shown in FIGS. 30A and 30B. Further, FIG. 31A is a perspective view of the body-side attachment member 5241 and FIG. 31B is a development view of one of the cam grooves 5242, developed in the X direction.

As shown in FIG. 31A, in the inner periphery of the body-side attachment member 5241, the plurality of cam grooves 5242 having the same shape are arranged at equally-spaced intervals in a direction along the circumference of a circle having the X-axis as the center. In the illustrated example, the three cam grooves 5242, each extending about an angle of approximately 90 degrees, are arranged in the circumference of 360 degrees. The protrusions 5215 of the contact protection cover 5211 are fitted in the cam grooves 5242 one by one.

Referring to FIG. 31B, the positions (5271, 5372, 5273, 5274, 5278, 5279) of one of the protrusions 5215, which is fitted in the cam groove 5242, are indicated by broken lines. The cam groove 5242 has a substantially U-shaped locus, and has a push-in groove 5275 on a closed-position side, a push-in groove 5276 on an opened-position side, and an opening/closing circumferential groove 5277. The push-in groove 5275 on the closed-position side and the push-in groove 5276 on the opened-position side are grooves parallel with the X-axis through which the protrusion 5215 passes when the contact protection cover 5211 is pressed in.

The opening/closing circumferential groove 5277 is parallel with a direction along the circumferential of the circle having the X-axis as the center, and the protrusion 5215 moves in the opening/closing circumferential groove 5277 when a user performs the operation of rotating the contact protection cover 5211 to open/close the contact protection cover 5211. The cam groove 5242 is formed into the shape shown in FIG. 31B to thereby restrict the moving positions (rotational positions) of the protrusions 5215 and the contact protection cover 5211. Further, the protrusion 5215 is moved between the positions of an unattached and closed position 5271, an unattached and opened position 5272, an attached and closed position 5273, and an attached and opened position 5274. Note that a half-pressed/closed position 5278 and a half-pressed/opened position 5279, indicated in FIG. 31B, will be described hereinafter.

Figure 32A:
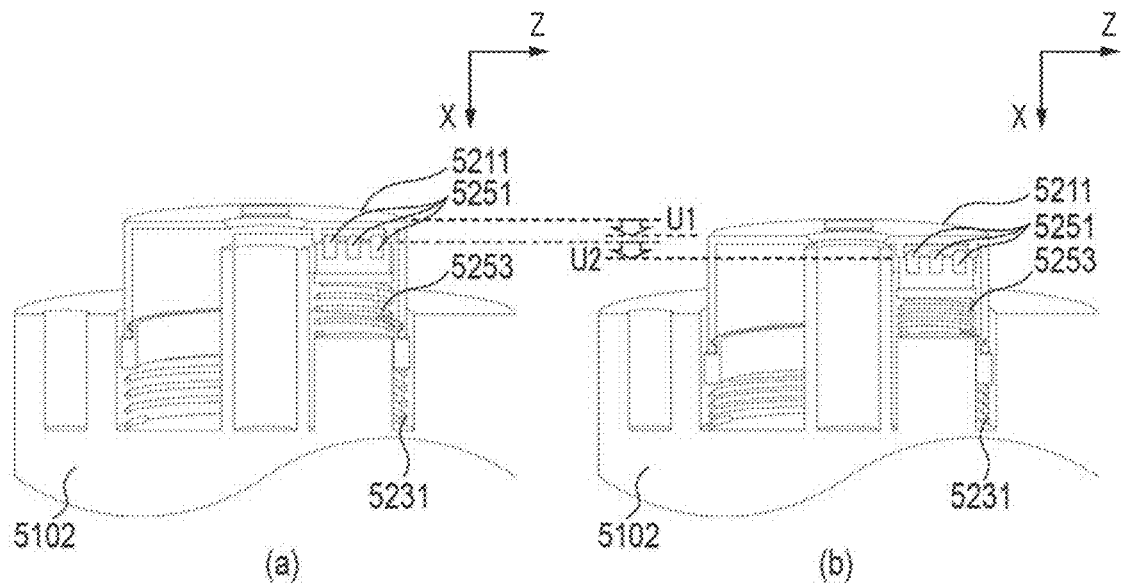
FIGS. 32A and 32B are views useful in explaining positions of a contact protection cover corresponding to positions of a protrusion appearing in FIG. 31.
Figure 32B:
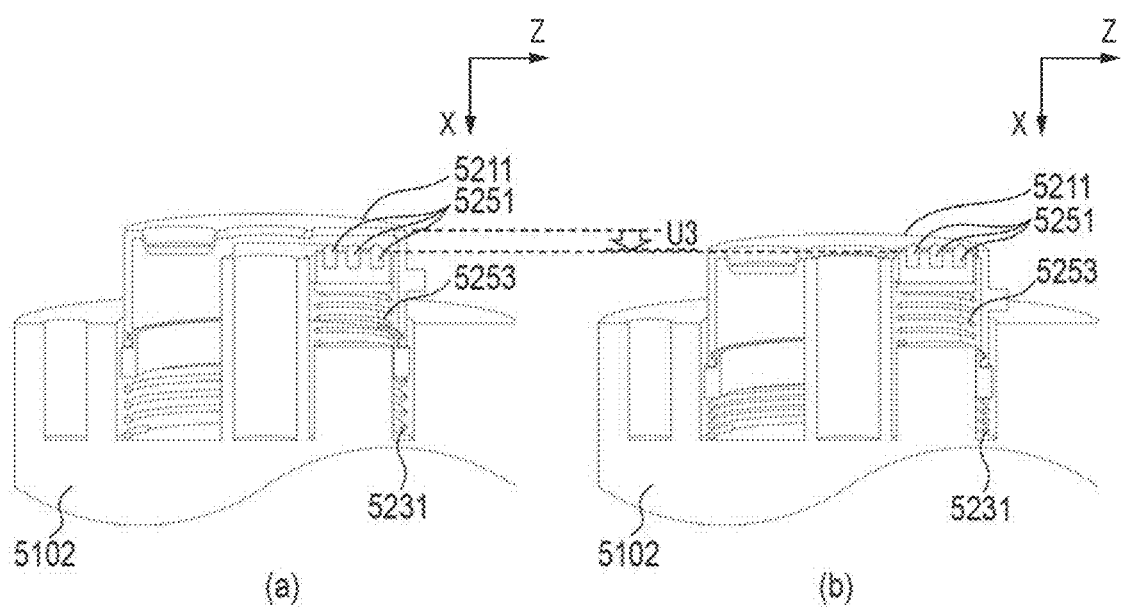

FIGS. 32A and 32B are views useful in explaining the positions of the contact protection cover, corresponding to the positions of the protrusion appearing in FIGS. 31A and 31B. FIG. 32A shows positions of the contact protection cover in a state in which the contact protection cover is closed, in which (a) shows a state in which nothing is attached to the body-side attachment mechanism and (b) shows a state in which a grip without electrical contacts (hereinafter referred to as the "contactless grip") has been attached to the body-side attachment mechanism. Further, FIG. 32B shows positions of the contact protection cover in a state in which the contact protection cover is opened, in which (a) shows a state in which nothing is attached to the body-side attachment mechanism and (b) shows a state in which a grip with electrical contacts has been attached to the body-side attachment mechanism. Note that details of the contactless grip will be described hereinafter with reference to FIGS. 36, 37A, and 37B.

FIGS. 32A and 32B show the positions of the contact protection cover 5211 when each protrusion 5215 is positioned in the unattached and closed position 5271, the unattached and opened position 5272, the attached and closed position 5273, and the attached and opened position 5274, respectively.

In the state shown in (a) of FIG. 32A, the protrusion 5215 is in the unattached and closed position 5271, in which the tip ends of the body-side contact pins 5251 are covered by the contact protection cover 5211 and the body-side contact pins 5251 are not visible from the outside of the image capture apparatus body 5102.

In the state shown in (b) of FIG. 32A, the protrusion 5215 is in the attached and closed position 5273, in which the tip ends of the body-side contact pins 5251 are covered by the contact protection cover 5211 and the body-side contact pins 5251 are not visible from the outside of the image capture apparatus body 5102. Further, the contact protection cover 5211 and the contact block 5252 are in more downward positions in the X direction than in the state shown in (a) of FIG. 32A, by the operation of pressing down the contact protection cover 5211, as indicated by an arrow U1 and an arrow U2, respectively.

Note that the unattached and closed position 5271 and the unattached and opened position 5272 are positions locally protruding from the circumferential groove 5277 shown in FIG. 31B in the −X direction. Further, the protrusion 5215 is fitted in the groove at the unattached and closed position 5271 or the unattached and opened position 5272 by the urging force of the contact protection cover spring 5231. With this, it is possible to stably hold the protrusion 5215 in the unattached and closed position 5271 or the unattached and opened position 5272.

In the state shown in (a) of FIG. 32B, the protrusion 5215 is in the unattached and opened position 5272, in which the body-side contact pins 5251 are visible through the contact exposing portion 5213 of the contact protection cover 5211.

In the state shown in (b) of FIG. 32B, the contact protection cover 5211 is pressed down in the X direction as indicated by an arrow U3 by the operation of pressing down the contact protection cover 5211, compared with the state shown in (a) in FIG. 32B. As a result, the tip ends of the body-side contact pins 5251 are exposed through the contact exposing portion 5213 of the contact protection cover 5211.

Note that in the attached and closed position 5273 and the attached and opened position 5274, an end of the groove in the X direction is not provided. With this structure, it is possible to fit each protrusion 5215 from the attached and closed position 5273 or the attached and opened position 5274 and thereby assemble the body-side attachment member 5241. After the body-side attachment member 5241 is assembled, by fixing the same to the image capture apparatus body 5102, the moving position of the protrusions 5215 is restricted by a contact surface 5262 (see FIG. 30A) of the image capture apparatus body 5102. Therefore, the protrusions 3215 are prevented from being removed from the cam grooves 5242.

Further, by arranging the three cam grooves 5242 and the three protrusions 5125 on the circumference, the orientation of the contact protection cover 5211 is uniquely determined according to the positions of the protrusions 5215. Further, it is possible to stably hold the contact protection cover 5211 in the case where the protrusions 5215 are in the unattached and closed position 5271 and in the case where the protrusions 5215 are in the unattached and opened position 5272. Further, when the operation of pressing down the contact protection cover 5211 is performed, it is possible to stably press down the contact protection cover 5211.

Next, the grip 5104 which can be attached and removed to and from the body-side attachment mechanism 5111 of the image capture apparatus body 5102 will be described.

Figure 33A:
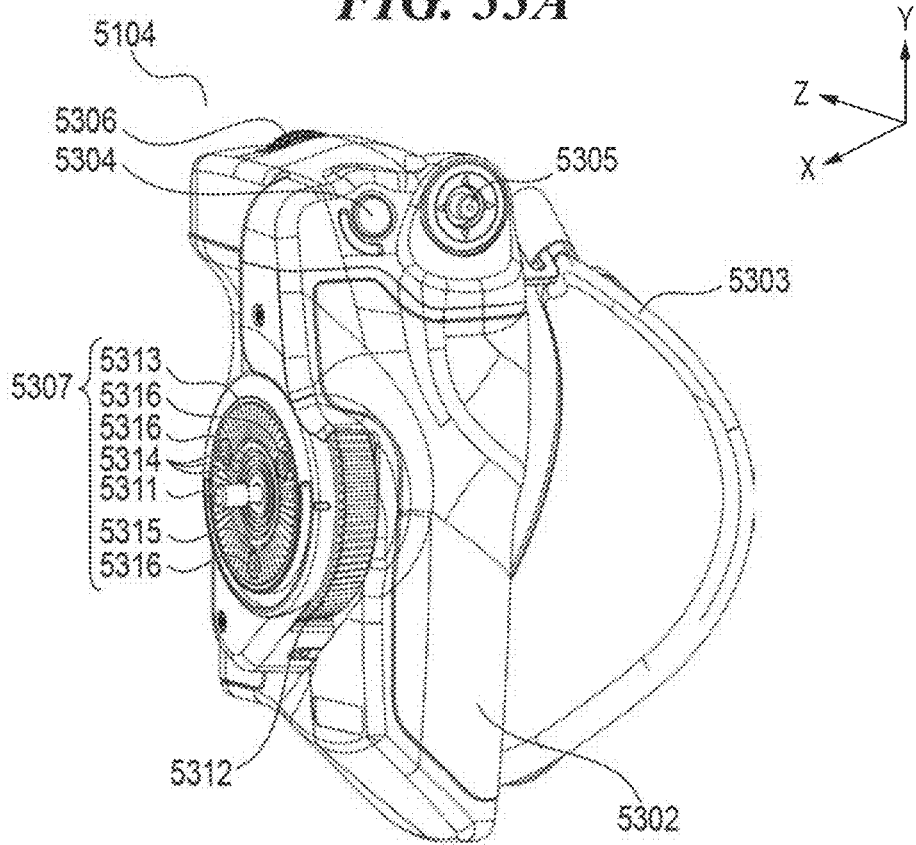
FIGS. 33A and 33B are views useful in explaining a grip appearing in FIG. 28.
Figure 33B:
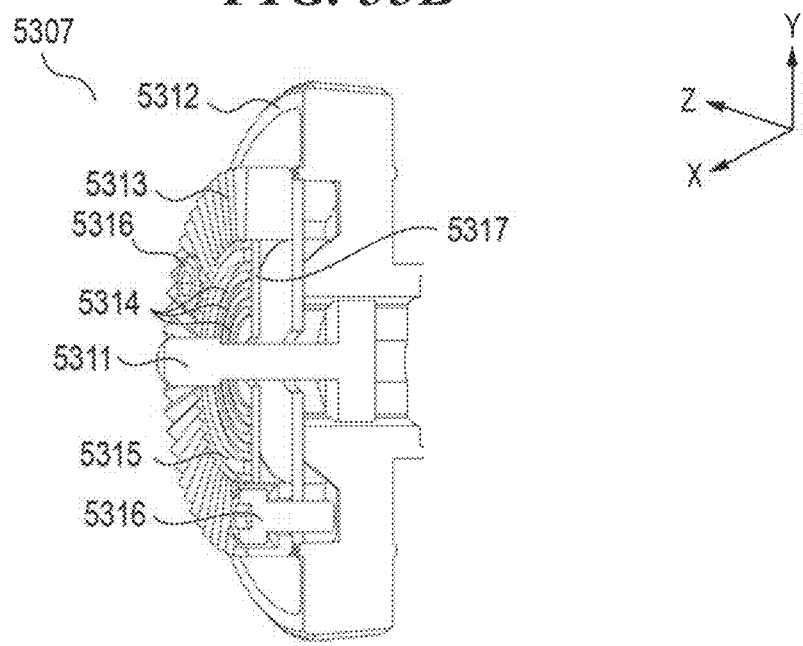

FIGS. 33A and 33B are views useful in explaining the grip 5104 (see FIG. 28) appearing in FIG. 29. FIG. 33A is a perspective view of the appearance of the grip 5104, and FIG. 33B is a cross-sectional view showing the inner structure of a grip-side attachment portion 5307 included in the grip 5104.

The grip 5104 has a holding portion 5302 held by a user with hand. The holding portion 5302 has a shape conforming to the fingers of a human being. A belt 5303 is a member that is tightened to thereby prevent a user's hand from being removed from the holding portion 5302.

A button 5304, a cross key 5305, and a dial 5306 are operation members which are connected to the traces of the grip-side contact pattern 5314 by electrical wiring (not shown). Note that the grip 5104 is only required to have a structure including the grip-side attachment portion 5307 and thereby enabling the grip 5104 to be attached to the body-side attachment mechanism 5111, and its outer shape is not limited to the one shown in FIG. 33A.

The grip-side attachment portion 5307 is a portion to be attached to the body-side attachment mechanism 5111. The members forming the grip-side attachment portion 5307 have functions corresponding to the respective associated members of the body-side attachment mechanism 5111.

The grip-side screw 5311 is a male screw portion to be screwed with the body-side screw 5261. A tightening knob 5312 is mechanically connected to the grip-side screw 5311 and a user can rotate the grip-side screw 5311 by rotating the tightening knob 5312.

The grip-side rosette 5313 is an engagement part (grip-side engagement part) having recessed-shape portions and protruding-shape portions formed on the surface thereof, and is engaged with the body-side engagement part 5244. A grip-side circuit board 5317 is disposed radially inward of the grip-side rosette 5313 and has the traces of the grip-side contact pattern 5314 which are each formed in an annular shape and each serve as an electrical contact.

By attaching the grip 5104 to the image capture apparatus body 5102, the body-side contact pins 5251 and the traces of the grip-side contact pattern 5314 are connected to each other, whereby it is possible to perform power supply and communication between the image capture apparatus body 5102 and the grip 5104. More specifically, the traces of the grip-side contact pattern 5314 are connected to the operation members, such as the button 5304, the cross key 5305, and the dial 5306, by electrical wiring (not shown). When a user operates one of the operation members, a predetermined operation instruction can be sent to the image capture apparatus body 5102 via an associated one of the traces of the grip-side contact pattern 5314.

Since the grip-side contact pattern 5314 is formed in the annular shape, even when the grip 5104 is attached to the image capture apparatus body 5102 at any angle, it is possible to electrically connect the body-side contact pins 5251 and the traces of the grip-side contact pattern 5314. Note that the operation members of the grip 5104 may be electrically connected directly to the traces of the grip-side contact pattern 5314, or via a control circuit (not shown) or the like interposed therebetween.

A grip-side abutment portion 5315 protrudes in the +X direction from the surface on which the grip-side contact pattern 5314 is arranged, and is in the form of e.g. an annular protruding portion disposed along the outer periphery of the grip-side contact pattern 5314. The grip-side abutment portion 5315 is brought into abutment with the contact protection cover 5211 when performing an operation of pressing in the contact protection cover 5211.

Next, how the grip 5104 is attached to the image capture apparatus body 5102 will be described.

Figure 34:
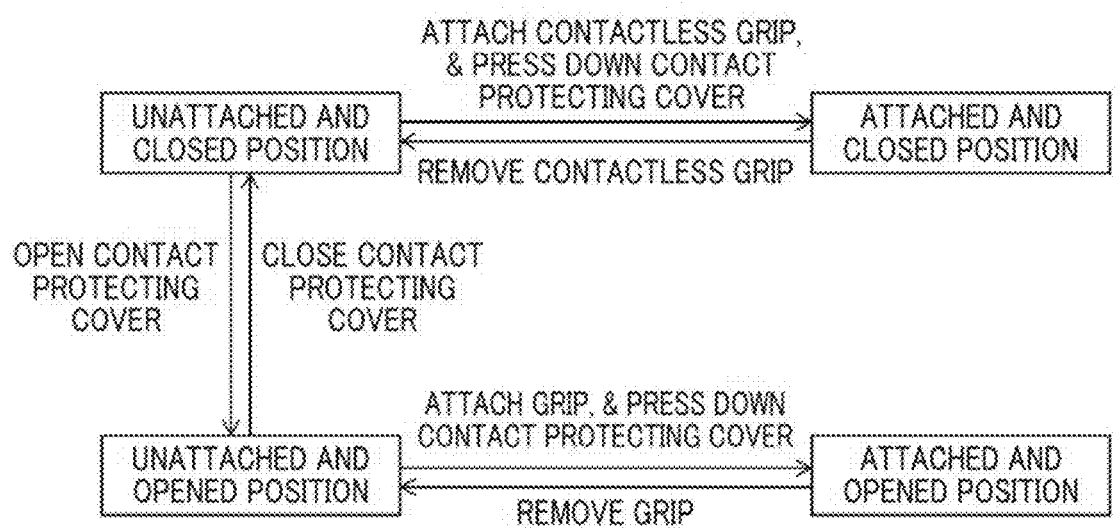
FIG. 34 is a diagram useful in explaining a relationship between the rotational operation and position of the contact protection cover appearing in FIG. 30A and attachment/removal of the grip.

FIG. 34 is a diagram useful in explaining a relationship between the rotational operation of the contact protection cover 5211 and the positions of the protrusions 5215 of the body-side attachment mechanism 5111 shown in FIG. 30A, and the attachment/removal of the grip 5104 shown in FIG. 33A (or the contactless grip (see FIG. 36)). Note that the "grip" referred to in the lower part of FIG. 34 is the grip 5104.

Figure 35A:
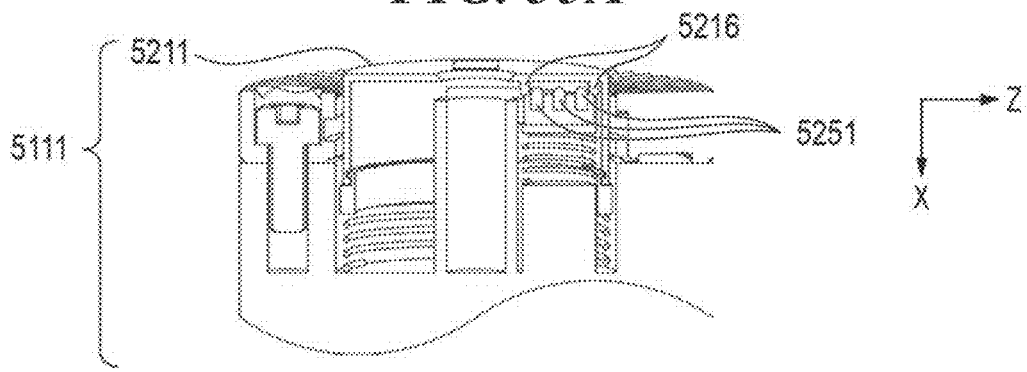
FIGS. 35A to 35C are views showing a positional relationship between members of the body-side attachment mechanism and members of a grip-side attachment portion when attaching the grip shown in FIGS. 33A and 33B.
Figure 35B:
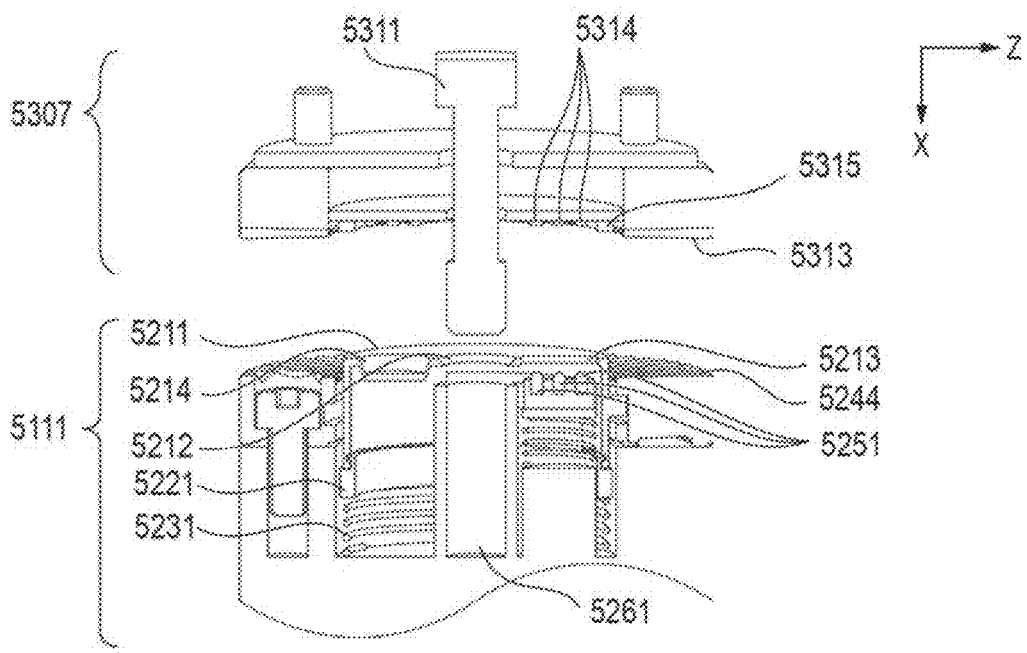
Figure 35C:
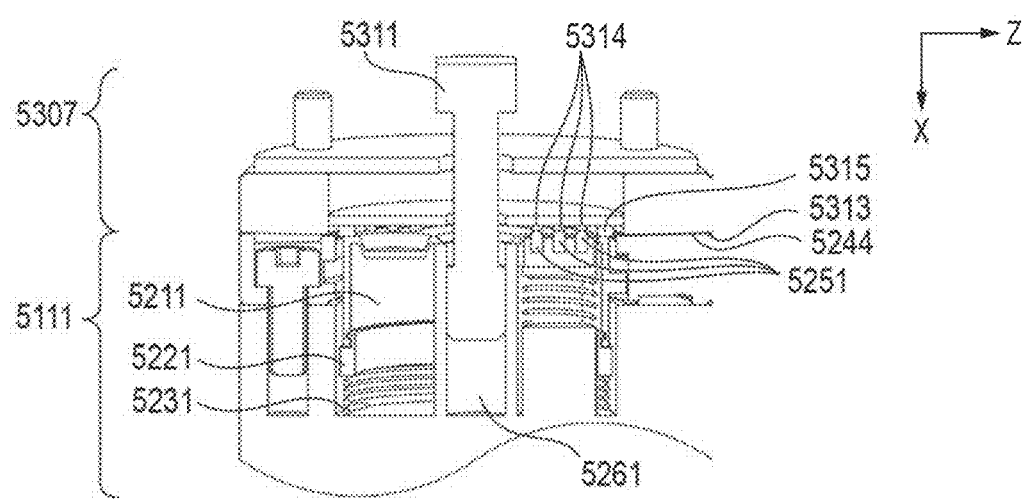

FIGS. 35A to 35C are views showing a positional relationship between the members of the body-side attachment mechanism 5111 and the grip-side attachment portion 5307 when attaching the grip 5104 shown in FIGS. 33A and 33B. FIG. 35A is a view showing a position (initial position) of the contact protection cover 5211 when the protrusions 5215 are in the unattached and closed position 5271 (described in the upper left part of FIG. 34), and FIG. 35B is a view showing a position of the contact protection cover 5211 when the protrusions 5215 are in the unattached and opened position 5272 (described in the lower left part of FIG. 34). FIG. 35C is a view showing a position of the contact protection cover 5211 when the protrusions 5215 are in the attached and opened position 5274 (described in the lower right part of FIG. 34) in which the grip 5104 is in a state attached to the image capture apparatus body 5102.

The initial position of the contact protection cover 5211 of the body-side attachment mechanism 5111 is defined as the position shown in FIG. 35A. In the initial position, the body-side contact pins 5251 are covered by the contact protection cover 5211 and are not visible from the outside of the image capture apparatus body 5102. At this time, the contact protection cover 5211 is urged by the contact protection cover spring 5231 in the −X direction, and the protrusions 5215 are held in the unattached and closed position 5271 indicated in FIG. 31B (described in the upper left part of FIG. 34) in the cam grooves 5242.

Next, to electrically connect between the image capture apparatus body 5102 and the grip 5104, the user performs an operation of opening the contact protection cover 5211. More specifically, the user hooks a finger on the finger hooking portion 5214, and rotates the contact protection cover 5211 in the clockwise direction as viewed from the −X direction, while pressing the contact protection cover 5211 in the X direction against the urging force of the contact protection cover spring 5231. At this time, the contact protection cover-holding portion 5221 allows the contact protection cover 5211 to be smoothly rotated about the X-axis with respect to the contact protection cover spring 5231. With this, the protrusions 5215 of the contact protection cover 5211, appearing in FIG. 31B, are moved from the unattached and closed position 5171, pass the half-pressed/closed position 5278, and enter the opening/closing circumferential groove 5277.

When the contact protection cover 5211 is further rotated through approximately 90 degrees in the clockwise direction as viewed from the −X direction, the protrusions 5215 continue to pass the opening/closing circumferential groove 5277, pass the half-pressed/opened position 5279, and enter the unattached and opened position 5272. The protrusions 5215 having entered the unattached and opened position 5272 are held in this position by the urging force of the contact protection cover spring 5231.

FIG. 35B shows the position of the contact protection cover 5211 when the protrusions 5215 are in the unattached and opened position 5272. In the case where the protrusions 5215 are in the unattached and opened position 5272, although the body-side contact pins 5251 are visible from the outside of the image capture apparatus body 5102, the tip ends of the body-side contact pins 5251 do not protrude from the contact protection cover 5211.

Next, the user performs an operation of attaching the grip 5104 to the body-side attachment mechanism 5111. More specifically, the user rotates the tightening knob 5312 to screw the grip-side screw 5311 into the body-side screw 5261. With this, the grip-side abutment portion 5315 approaches the contact protection cover 521 to be brought into abutment with the contact protection cover 5211, and then presses down the contact protection cover 5211 in the X direction. As a result, the body-side contact pins 5251 come out through the contact exposing portion 5213 of the contact protection cover 5211, so that the tip ends of the body-side contact pins 5251 protrude from the contact protection cover 5211 in the −X direction.

With this, as shown in FIG. 35C, the body-side contact pins 5251 and the traces of the grip-side contact pattern 5314 are brought into contact with each other and are electrically connected. At this time, the protrusions 5215 are moved to the attached and opened position 5274 through the push-in groove 5276 on the opened-position side, indicated in FIG. 31B. Here, the grip-side rosette 5313 and the body-side engagement part 5244 are engaged at an angle desired by the user, whereby it is possible to fix the grip 5104 to the image capture apparatus body 5102 at a desired angle.

FIG. 35C shows the state in which the grip 5104 has been attached to the image capture apparatus body 5102. Note that, instead of causing the traces of the grip-side contact pattern 5314 to directly press in the contact protection cover 5211, by causing the grip-side abutment portion 5315 to press in the contact protection cover 5211, it is possible to prevent wear of the traces of the grip-side contact pattern 5314.

As described above, by opening the contact protection cover 5211 of the image capture apparatus body 5102 and attaching the grip 5104 to the image capture apparatus body 5102 at a desired attachment angle, the user can easily hold the image capture apparatus in a state capable of image capturing. Further, the body-side contact pins 5251 and the traces of the grip-side contact pattern 5314 are electrically connected to each other as soon as the grip 5104 is attached, which enables power supply and communication between the image capture apparatus body 5102 and the grip 5104. Thus, the user is enabled to send an operation instruction to the image capture apparatus body 5102 by operating the operation members of the grip 5104.

To remove the grip 5104 attached to the image capture apparatus body 5102 therefrom, it is only required to perform a reverse operation to the above-described attachment operation. More specifically, when the user rotates the tightening knob 5312 to loosen the grip-side screw 5311, the grip 5104 is removed, and at the same time, the protrusions 5215 of the contact protection cover 5211 are moved to the unattached and opened position 5272. Then, when the user rotates the contact protection cover 5211 through approximately 90 degrees in the counterclockwise direction as viewed from the −X direction, the protrusions 5215 are moved to the unattached and closed position 5271, whereby the contact protection cover 5211 covers the tip ends of the body-side contact pins 5251. With this, the body-side contact pins 5251 become invisible from the outside of the body-side attachment mechanism 5111.

Next, the operation performed when a grip 5105 without electrical contacts (hereinafter referred to as the "contactless grip") is attached to the image capture apparatus body 5102 will be described.

Figure 36:
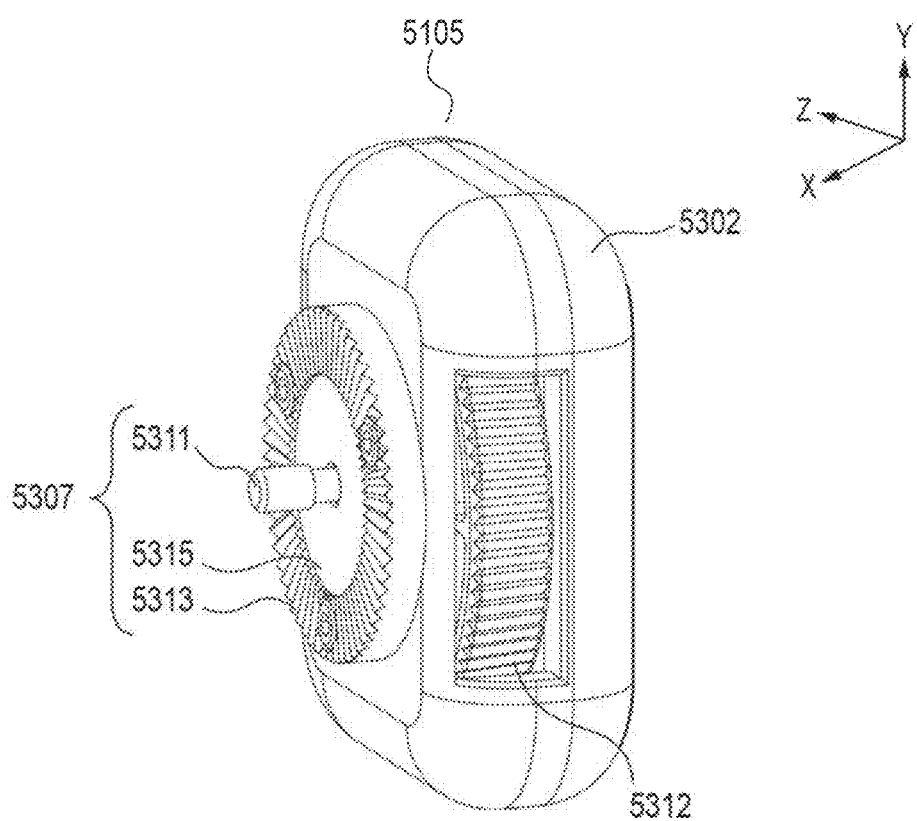
FIG. 36 is a perspective view of the appearance of a contactless grip used in the image capture apparatus according to the second variation of the first embodiment of the present invention.

FIG. 36 is a perspective view of the appearance of the contactless grip 5105 according to the second variation of the first embodiment which can be attached and removed to and from the image capture apparatus body 5102.

Similar to the grip 5104, the contactless grip 5105 includes the holding portion 5302 and the grip-side attachment portion 5307. Note that the contactless grip 5105 may be provided with an operation section including a button, a cross key, and a dial. In this case, the image capture apparatus body 5102 and the contactless grip 5105 are connected by cables (not shown), whereby it is possible to supply electrical power from the image capture apparatus body 5102 to the contactless grip 5105 and perform communication between the image capture apparatus body 5102 and the contactless grip 5105.

Figure 37A:
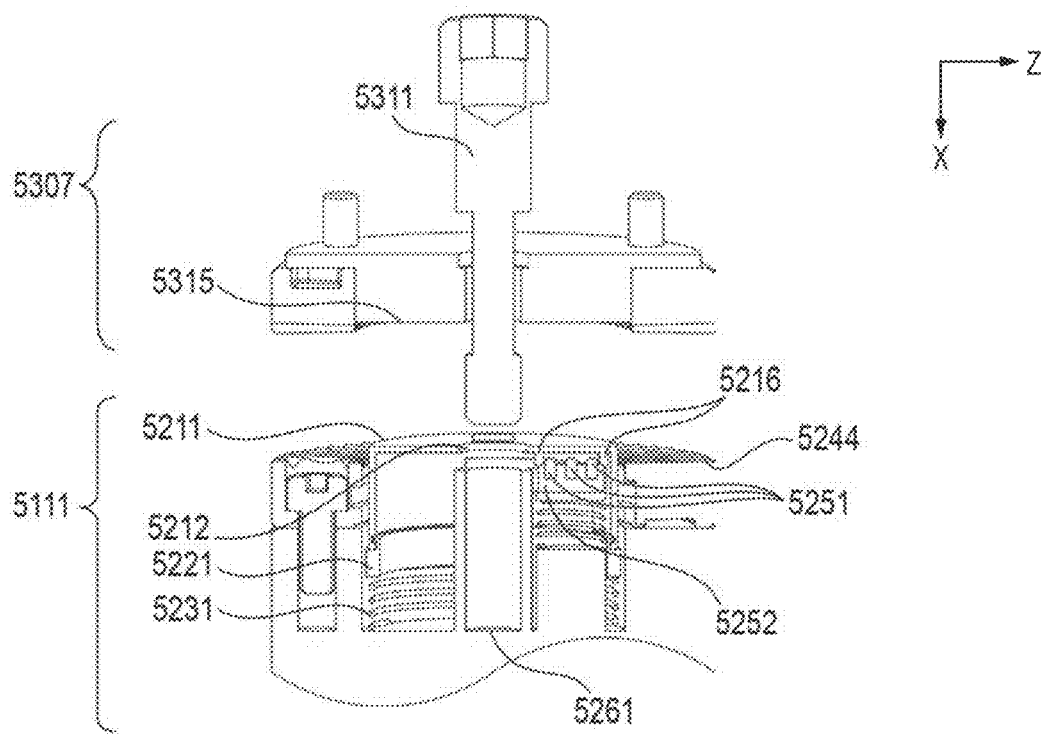
FIGS. 37A and 37B are views showing a positional relationship between members of the body-side attachment mechanism and members of the grip-side attachment portion when attaching the contactless grip shown in FIG. 36.
Figure 37B:
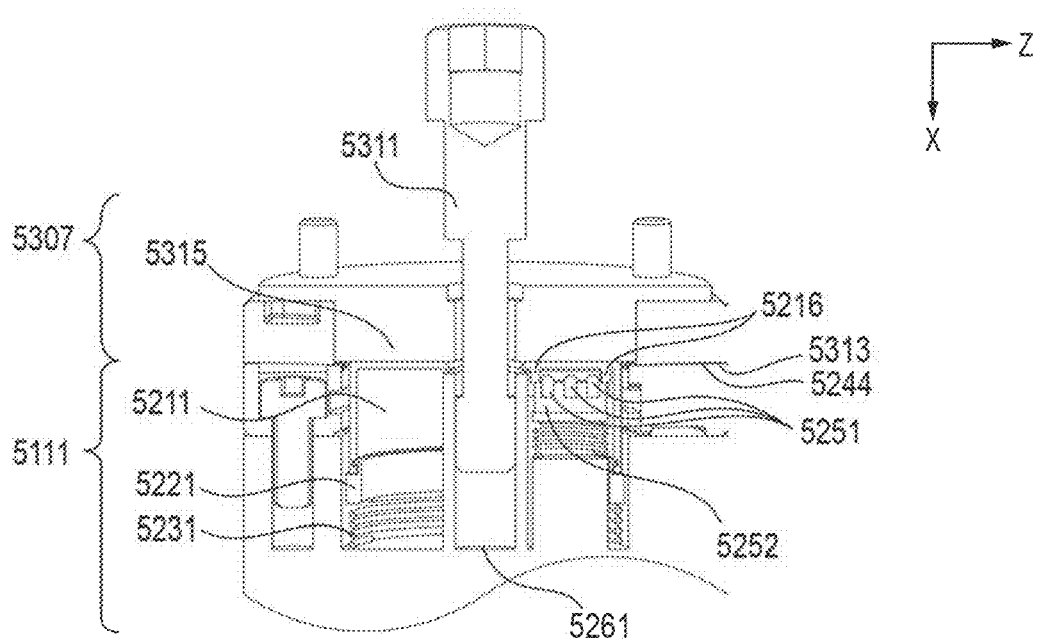

FIGS. 37A and 37B are views showing a positional relationship between the body-side attachment mechanism 5111 and the members forming the grip-side attachment portion 5307 when attaching the contactless grip 5105 to the image capture apparatus body 5102. FIG. 37A shows the initial state (unattached and closed position), whereas FIG. 37B shows a state in which the contactless grip 5105 has been attached to the image capture apparatus body 5102 (attached and closed position).

First, let it be assumed that the contact protection cover 5211 is in the initial position shown in FIG. 37A. In this case, similar to the case where the grip 5104 is attached, the body-side contact pins 5251 are covered by the contact protection cover 5211 and the protrusions 5215 are held in the unattached and closed position 5271 in the cam grooves 5242. Further, in the case where the contact protection cover 5211 is in the initial position, the contact block 5252 is positioned on the +X direction side of the contact protection cover abutment portions 5216.

Next, the user performs an operation of attaching the contactless grip 5105 to the body-side attachment mechanism 5111 of the image capture apparatus body 5102 without performing the operation of opening the contact protection cover 5211. More specifically, when the user rotates the tightening knob 5312, the grip-side screw 5311 and the body-side screw 5261 are screwed with each other, and the grip-side abutment portion 5315 presses down the contact protection cover 5211 in the +X direction against the urging force of the contact block spring 5253. At the same time, the contact block 5252 is pressed down in the +X direction by the contact protection cover abutment portion 5216 engaged therewith.

At this time, the protrusions 5215 pass the push-in groove 5275 on the closed position side indicated in FIG. 31B and are moved to the attached and closed position 5273. When the grip-side screw 5311 is tightened until the body-side engagement part 5244 and the grip-side rosette 5313 are engaged with each other, rotation of the contactless grip 5105 with respect to the image capture apparatus body 5102 is restricted. Thus, the contactless grip 5105 is placed in the state attached to the image capture apparatus body 5102 as shown in FIG. 37B As described above, the user can attach the contactless grip 5105 while maintaining the state in which the contact protection cover 5211 of the image capture apparatus body 5102 is closed, and in doing this, it is possible to prevent the tip ends of the body-side contact pins 5251 from being brought into contact with any other member.

Note that there is a case where the grip-side abutment portion 5315 has an unusual shape or the recessed-shape portions and protruding-shape portions of the grip-side rosette 5313 are formed up to the vicinity of the grip-side screw 5311. In this case, by attaching the contactless grip 5105 in a state in which the contact protection cover 5211 is closed, it is possible to prevent a situation in which an unintended external force is applied to the body-side contact pins 5251, causing breakage of the body-side contact pins 5251.

To remove the contactless grip 5105 from the image capture apparatus body 5102, it is only required to perform a reverse operation to the above-described attachment operation. More specifically, when the user rotates the tightening knob 5312 to loosen the grip-side screw 5311, the contactless grip 5105 is removed, and the protrusions 5215 of the contact protection cover 5211 are moved to the unattached and closed position 5271.

Here, the function of the contact protection cover 5211 for protecting the body-side contact pins 5251 will be described.

In a case where an accessory or the like of the mage pickup apparatus body 5102 is not attached via the body-side attachment mechanism 5111, the contact protection cover 5211 is closed and is held in the unattached and closed position 5271 (the above-mentioned initial position). With this, the body-side contact pins 5251 are covered by the contact protection cover 5211. This makes it possible to prevent a finger or the like from directly touching the body-side contact pins 5251.

Let it be assumed that when the contact protecting cover 5211 is in the unattached and closed position 5271, the contact protecting cover 5211 is unintendedly pressed in by a finger or another device. In this case, similar to the operation performed when attaching the above-described contactless grip 5105 to the image capture apparatus, the contact block 5252 is pressed in by the contact protecting cover abutment portion 5216 engaged therewith. This causes the contact block 5252 and the body-side contact pins 5251 to be retracted in the X-direction, and hence the tip ends of the body-side contact pins 5251 are prevented from being brought into contact with any other member.

Further, let it be assumed that a user intends to attach the grip 5104 or the like to the body-side attachment mechanism 5111 and the contact protecting cover 5211 is in the unattached and opened position 5272. In this case, although the body-side contact pins 5251 are visible from the outside of the image capture apparatus body 5102, the contact protecting cover spring 5231 urging the contact protecting cover 5211 prevents the tip ends of the body-side contact pins 5251 from protruding from the contact protecting cover 5211. Therefore, even when a finger, another device, or the like touches the contact protecting cover 5211 in a state in which the grip 5104 has not been attached, unless the contact protecting cover 5211 is pressed in, the body-side contact pins 5251 are prevented from being contacted, and hence the body-side contact pins 5251 are prevented from being damaged.

As described above, even in a case where a user's finger, another device or the like unintendedly touches the body-side attachment mechanism 5111, the contact protecting cover 5211 prevents the tip ends of the body-side contact pins 5251 from being directly touched by the user's finger, the other device or the like. As a result, it is possible to prevent occurrence of a connection failure e.g. due to a film formed by a touch of a finger on the body-side contact pins 5251.

Similarly, it is possible to prevent the body-side contact pins 5251 from being damaged by another device brought into contact therewith.

Incidentally, depending on a user, there is a case where the user uses the grip 5104 to hold the image capture apparatus, but does not desire to use the operation members, such as the button 5304, the cross key 5305, and the dial 5306, so as to prevent an erroneous operation and the like. Further, there is a case where, to suppress power consumption in the grip 5104, even when the grip 5104 is mechanically connected to the image capture apparatus body 5102, a user does not desire to electrically connect the grip 5104 to the image capture apparatus body 5102.

In such cases, it is only required to attach the grip 5104 to the image capture apparatus body 5102 by the same method as employed in the operation of attaching the above-described contactless grip 5105 to the image capture apparatus body 5102. More specifically, the grip 5104 is attached in a state in which the contact protecting cover 5211 is closed. With this, although the user can easily hold the image capture apparatus using the grip 5104, the body-side contact pins 5251 are not brought into electrical contact with the traces of the grip-side contact pattern 5314.

Therefore, no operation instruction is sent to the image capture apparatus body 5102 even when the user operates the operation member of the grip 5104, and hence it is possible to prevent an erroneous operation of the image capture apparatus. Further, since electrical power is not supplied from the image capture apparatus body 5102 to the grip 5104, it is possible to reduce power consumption.

Next, a description will be given of a third variation of the body-side attachment mechanism 1200 of the image capture apparatus body 1000 in the first embodiment of the present invention.

First, another form of the contact protection structure will be described with respect to the body-side attachment mechanism of the image capture apparatus body and the grip-side attachment mechanism of the grip according to the first embodiment of the present invention.

Figure 38:
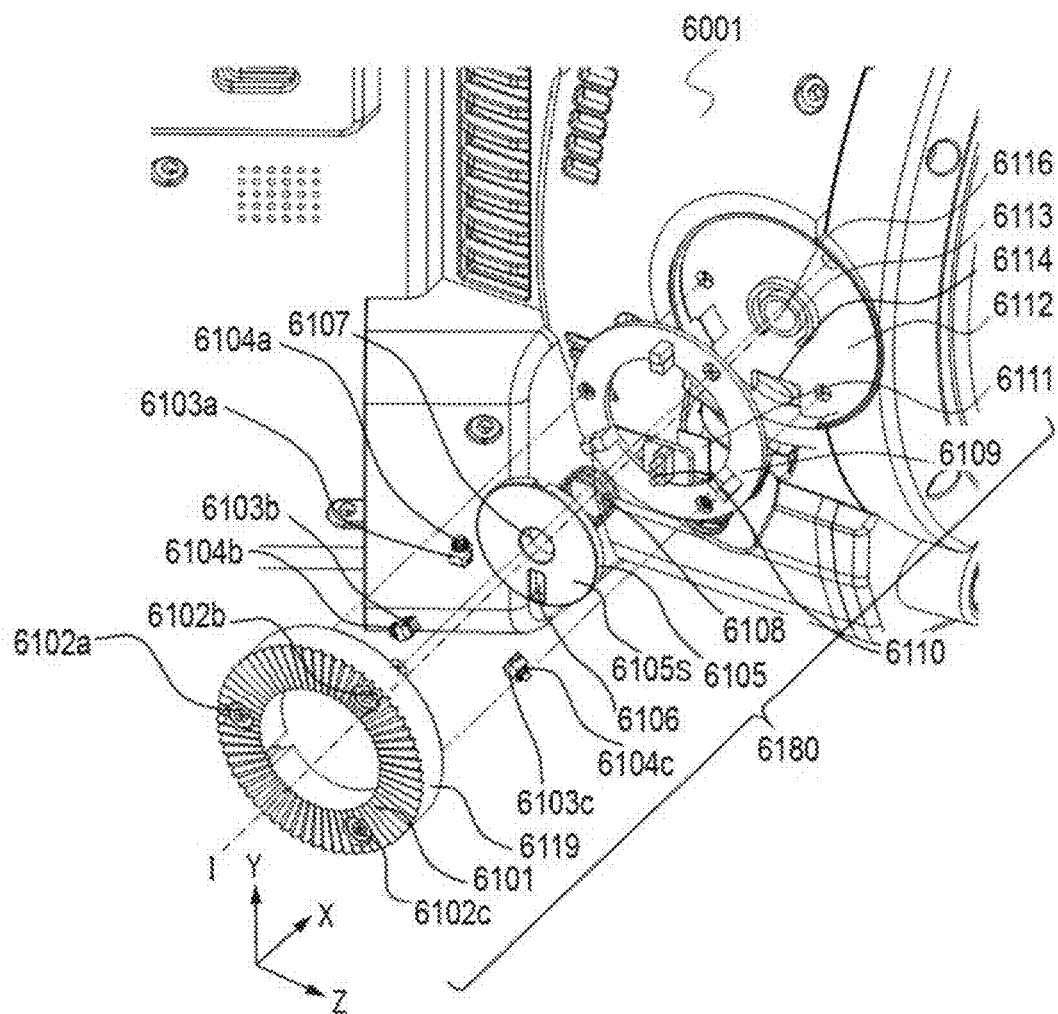
FIG. 38 is a exploded perspective view of the body-side attachment mechanism included in the image capture apparatus body according to a third variation of the first embodiment of the present invention.

FIG. 38 is an exploded perspective view of a body-side attachment mechanism 6180 included in an image capture apparatus body 6001 according to a third variation of the first embodiment of the present invention.

Although the whole image capture apparatus body 6001 is not shown in FIG. 38, here, the Z-axis is defined to extend in a front-rear direction of the image capture apparatus body 6001 (the direction toward a lens on the front side is defined as a +Z direction), the Y-axis is defined to extend in a vertical direction of the image capture apparatus body 6001 (the direction toward a top side is defined as a +Y direction), and the X-axis is defined to extend in a left-right direction of the image capture apparatus body 6001 (the direction toward a right side as viewed from the front, is defined as a +X direction).

A body-side attachment sheet metal 6112 mounted on the image capture apparatus body 6001 is formed with a cutout 6114 for inserting an FPC 6111 that transmits and receives electrical signals to and from body-side contact pins 6110 (first electrical contacts). Further, the image capture apparatus body 6001 is formed with a spring accommodating portion 6113 for accommodating a protection cover spring 6108 (first urging member) for urging a protection cover 6105 having a substantially annular shape in the −X direction, i.e. toward a side where a grip 6003 is attached.

The protection cover 6105 is movable inside a body-side attachment member 6119 in the X direction, and the outer periphery of the protection cover 6105 is engaged with engagement portions 6125 (see FIGS. 41 and 42) of lock levers 6103a to 6103c (lock members) and is supported in a predetermined position. Further, the lock levers 6103a to 6103c are urged by lock springs 6104a to 6104c in a direction toward a central axis I (see FIG. 41) (hereinafter referred to as the central axis direction) of the protection cover 6105. Further, a surface of the body-side attachment member 6119 is formed with a body-side engagement part 6101 (first engagement part) as an engagement part having recessed-shape portions and protruding-shape portions.

The body-side contact pins 6110 are attached to a contact holding portion 6109 such that they are movable in the X direction (see FIGS. 43 and 44), and are arranged on a projected shadow of a contact exposing portion 6106 of the protection cover 6105. Further, the body-side engagement part 6101 is fixed together with the contact holding portion 6109 to the body-side attachment sheet metal 6112 with screws 6102a to 6102c.

Figure 39A:
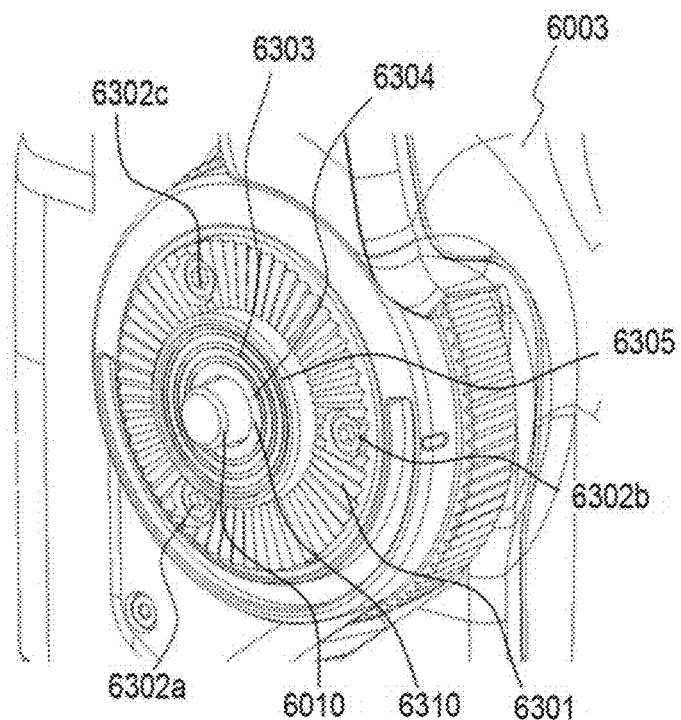
FIGS. 39A and 39B are views useful in explaining a grip-side attachment mechanism arranged in a grip according to the third variation of the first embodiment of the present invention.
Figure 39B:
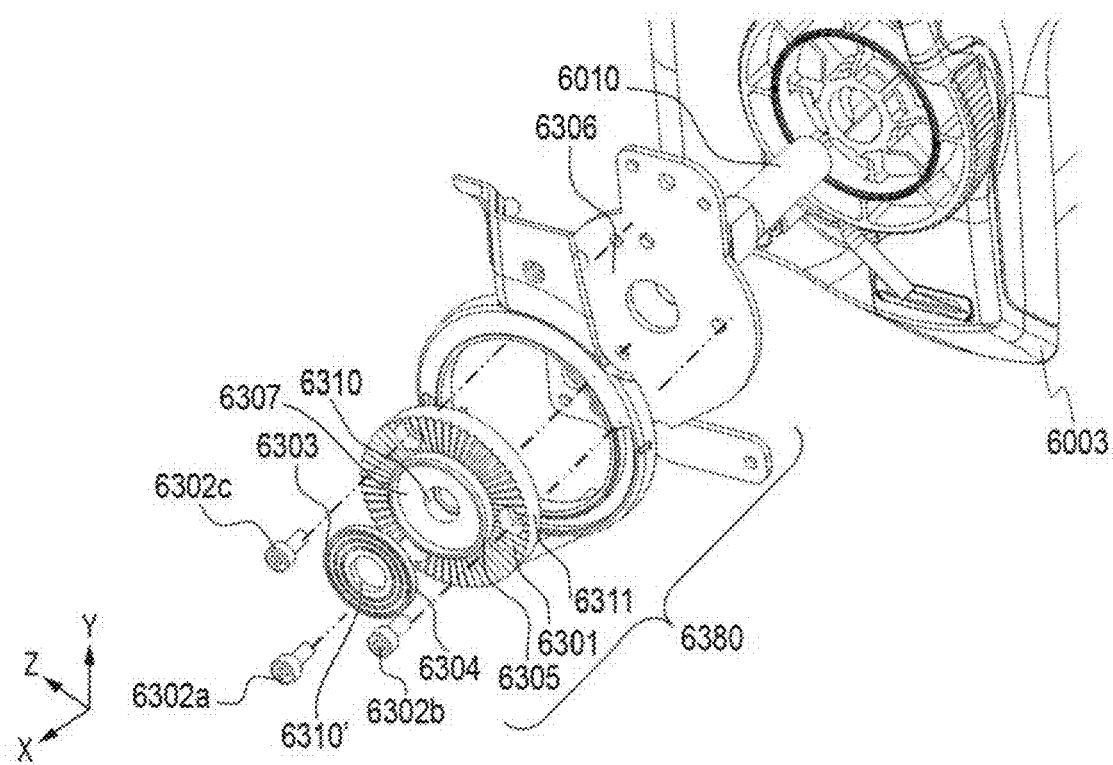

FIGS. 39A and 39B are views useful in explaining the grip-side attachment mechanism arranged in the grip according to the third variation of the first embodiment of the present invention. FIG. 39A is a perspective view of the appearance of the grip-side attachment mechanism, and FIG. 39B is an exploded perspective view of the grip-side attachment mechanism.

Similar to the body-side attachment member 6119, a surface of a grip-side attachment member 6311 is formed with a grip-side engagement part 6301 (second engagement part) as an engagement part having recessed-shape portions and protruding-shape portions. The grip-side attachment member 6311 is fixed to a grip-side attachment sheet metal 6306 with grip screws 6302a to 6302c.

A central portion of the grip-side attachment member 6311 is formed with a recessed portion 6307 for disposing a grip circuit board 6304 having a circular shape and formed with traces (second electrical contacts) of a contact pattern 6303. Further, the grip circuit board 6304 is fixed in the recessed portion 6307 of the grip-side attachment member 6311 e.g. with a double-sided adhesive tape. Further, the central portion of the grip-side engagement part 6301 and a central portion of the grip circuit board 6304 are formed with screw insertion holes 6310 and 6310', respectively, for inserting therethrough a grip-fixing screw 6010 (second screw portion) for fixing the grip 6003 to the image capture apparatus body 6001.

The grip-side attachment member 6311 has a protruding portion 6305 formed along the inner circumference of the grip-side engagement part 6301 such that the protruding portion 6305 extends between the grip-side engagement part 6301 and the grip circuit board 6304, and protrudes toward the body side (+X direction side) than the recessed-shape portions and protruding-shape portions of the grip-side engagement part 6301. Further, the protruding portion 6305 is inserted in an inner wall of the body-side engagement part 6101 when attaching the grip 6003 to the image capture apparatus body 6001, and urges the protection cover 6105 held in the predetermined position toward the inside (+X direction) of the image capture apparatus body 6001.

Next, attachment of the grip 6003 to the image capture apparatus body 6001 will be described.

Figure 40:
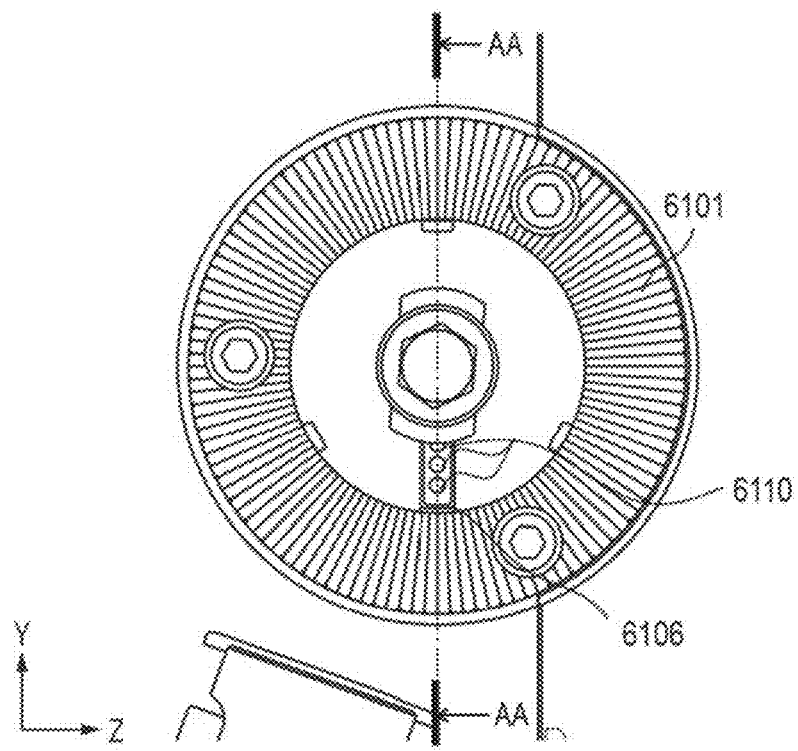
FIG. 40 is a view showing a body-side engagement part appearing in FIG. 38.
Figure 41:
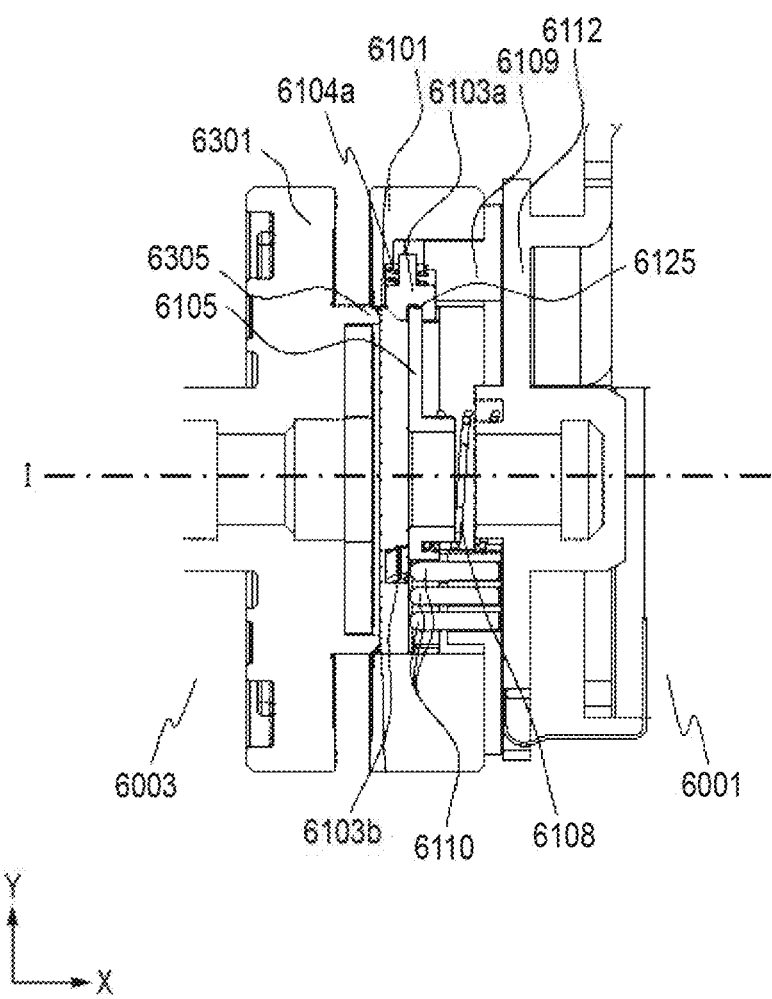
FIG. 41 is a cross-sectional view taken along AA-AA in FIG. 40, showing a state in which the image capture apparatus body appearing in FIG. 38 and the grip appearing in FIGS. 39A and 39B have not been connected to each other.
Figure 42:
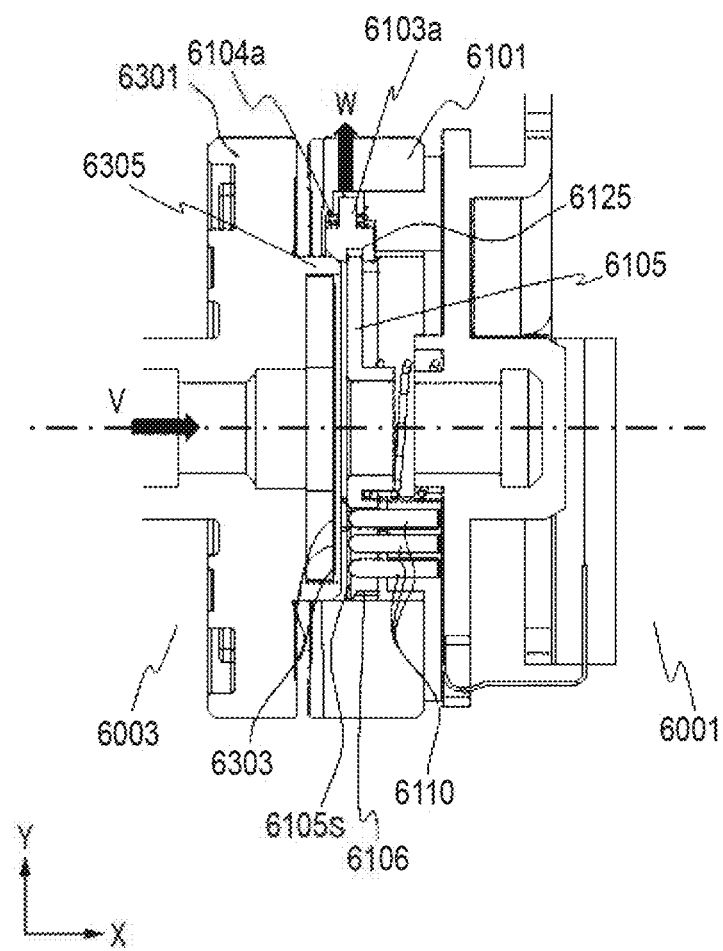
FIG. 42 is a cross-sectional view taken along AA-AA in FIG. 40, showing a state in which a protruding portion of the grip appearing in FIGS. 39A and 39B has been inserted in an inner wall of the body-side engagement part of the image capture apparatus body and has been brought into abutment with lock levers.

FIG. 40 is a view showing the body-side engagement part 6101 appearing in FIG. 38. FIG. 41 is a cross-sectional view taken along AA-AA in FIG. 40, showing a state in which the image capture apparatus body 6001 shown in FIG. 38 and the grip 6003 shown in FIGS. 39A and 39B have not been connected. FIG. 42 is a cross-sectional view taken along AA-AA in FIG. 40, showing a state in which the protruding portion 6305 of the grip 6003 shown in FIGS. 39A and 39B has been inserted in the inner wall of the body-side engagement part 6101 of the image capture apparatus body 6001 and has been brought into abutment with the lock levers 6103a to 6103c.

Figure 43:
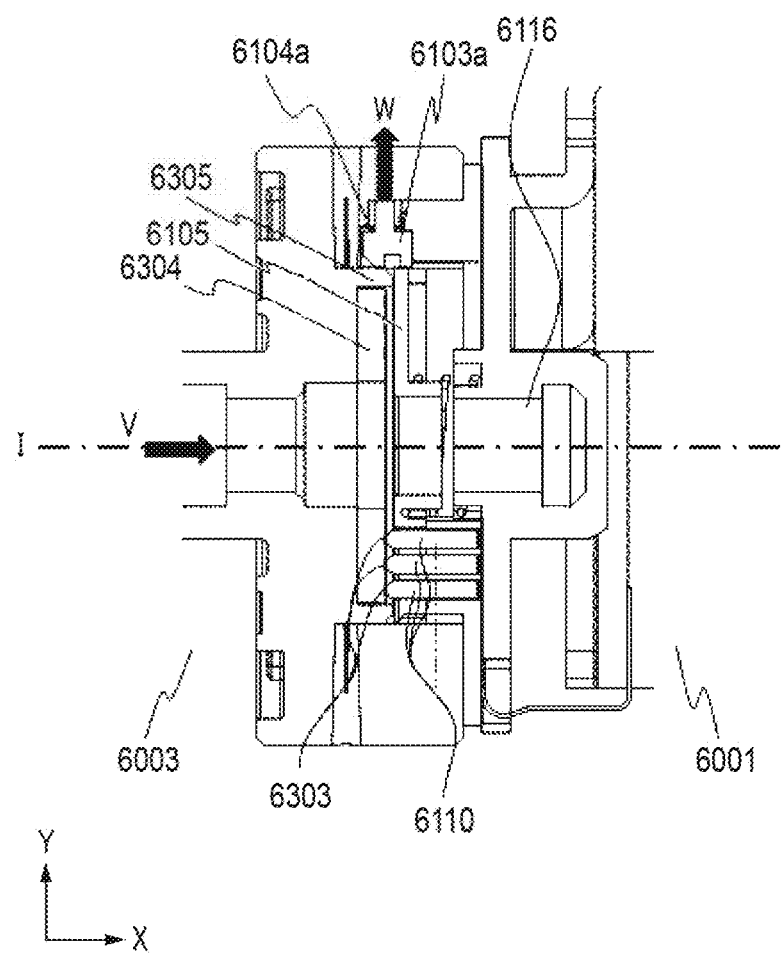
FIG. 43 is a cross-sectional view taken along AA-AA in FIG. 40, showing a state in which the protruding portion of the grip appearing in FIGS. 39A and 39B has pressed in a protection cover toward the image capture apparatus body, and body-side contact pins and a contact pattern have been brought into contact with each other.
Figure 44:
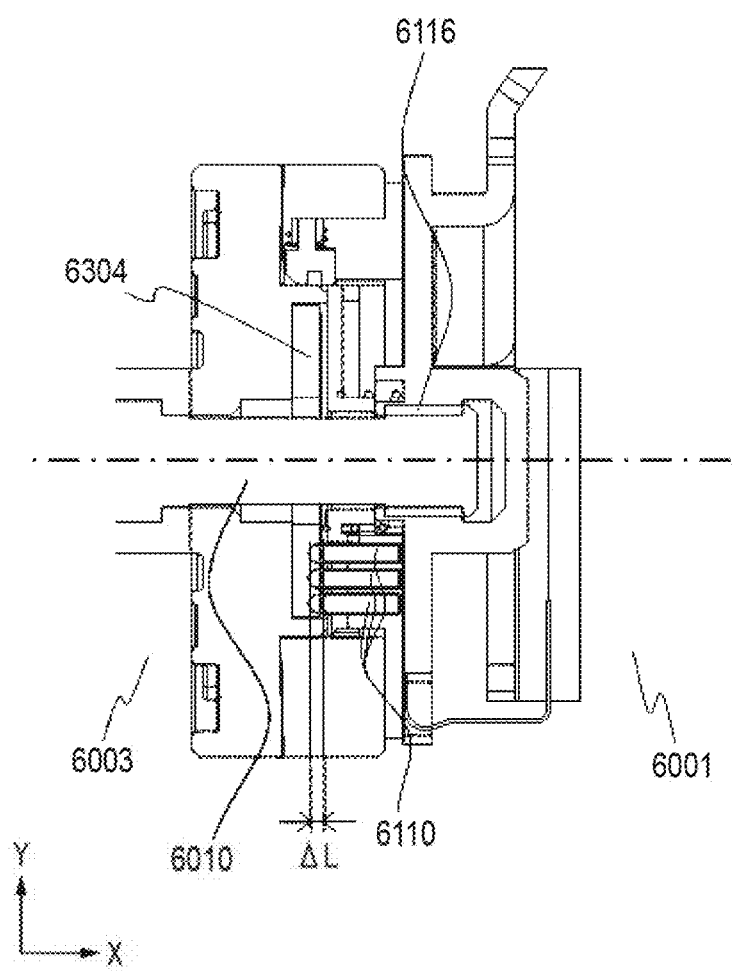
FIG. 44 is a cross-sectional view taken along AA-AA in FIG. 40, showing a state in which the grip has been fastened to the image capture apparatus body with a grip fixing screw.

FIG. 43 is a cross-sectional view taken along AA-AA in FIG. 40, showing a state in which the protruding portion 6305 of the grip 6003 shown in FIG. 39 has pressed in the protection cover 6105 toward the image capture apparatus body 6001, and the contact pattern 6303 has been brought into contact with the body-side contact pins 6110. FIG. 44 is across-sectional view taken along AA-AA in FIG. 40, showing a state in which the grip 6003 has been fastened to the image capture apparatus body 6001 using the grip fixing screw 6010 (second screw portion).

As shown in FIG. 41, in the state in which the grip 6003 has not been connected to the image capture apparatus body 6001, the protection cover 6105 is urged by the protection cover spring 6108 in the −X direction. Further, the lock levers 6103a to 6103c are each in a position engaged with the contact protection cover 6105. That is, the contact protection cover 6105 is engaged with the lock levers 6103a to 6103c urged toward the central axis by the lock springs 6104a to 6104c from the outer periphery toward the center. Therefore, even when an external force is applied to the contact protection cover 6105 in the +X direction, the protection cover 6105 is not pressed in the +X direction. Further, the body-side contact pins 6110, which can be extended and compressed, do not protrude from the protection cover 6105.

Referring to FIG. 42, when the grip 6003 is pressed in the X direction (direction indicated by an arrow V) which is the direction toward the image capture apparatus body 6001, the lock levers 6103a to 6103c are pressed toward the outer peripheral side (direction indicated by an arrow W) by the protruding portion 6305 of the grip 6003. This causes the engagement portions 6125 of the lock levers 6103a to 6103c to be disengaged from the protection cover 6105.

When the grip 6003 is further pressed in the +X direction and the lock levers 6103a to 6103c pressed by the protruding portion 6305 have completely retracted to the outer peripheral side, the protection cover 6105 can be pressed in the +X direction by the protruding portion 6305. Therefore, when the grip 60103 is further pressed in the +X direction, the contact protection cover 6105 is pressed in the +X direction, whereby the body-side contact pins 6110 protrude from a surface 6105S of the protection cover 6105 through the contact exposing portion 6106.

When the body-side contact pins 6110 protrude, as shown in FIG. 43, the contact pattern 6303 of the grip 6003 is brought into contact with the body-side contact pins 6110. Then, when the grip-fixing screw 6010 provided in the grip 6003 is fastened into body-side screw 6116 (first screw portion) provided in the image capture apparatus body 6001, this results in a state shown in FIG. 44.

In the state shown in FIG. 44, the body-side contact pins 6110 maintain electrical contact with the contact pattern 6303, in a state in which the body-side contact pins 6110 are pressed and urged by the contact pattern 6303 in the +X direction by ΔL.

Next, self-cleaning of the body-side contact pins 6110 and the contact pattern 6303 will be described.

Figure 45B:
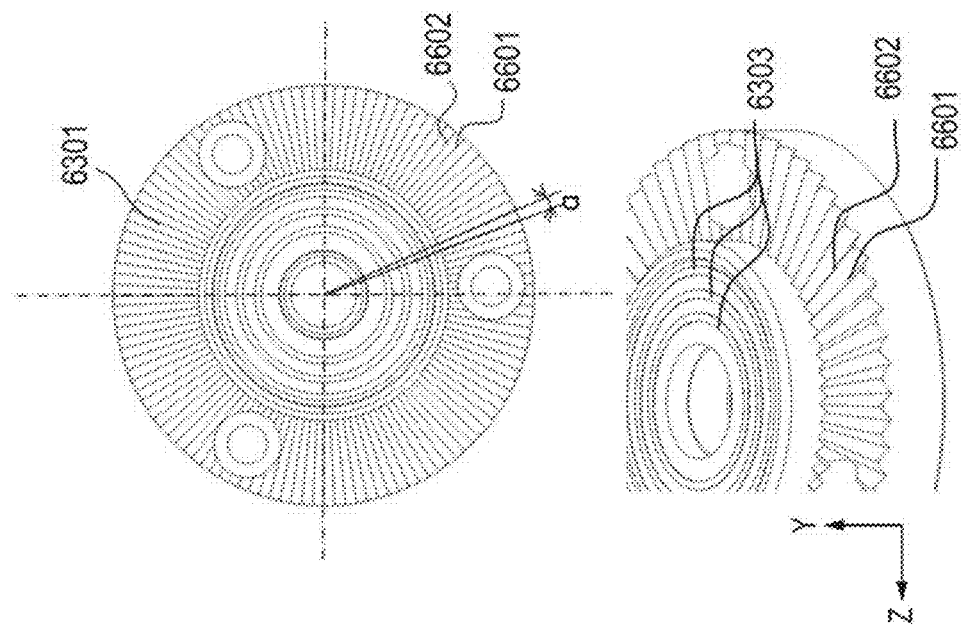
FIGS. 45A and 45B are views useful in explaining self-cleaning of the body-side contact pins and the contact pattern appearing in FIG. 38.
Figure 45A:
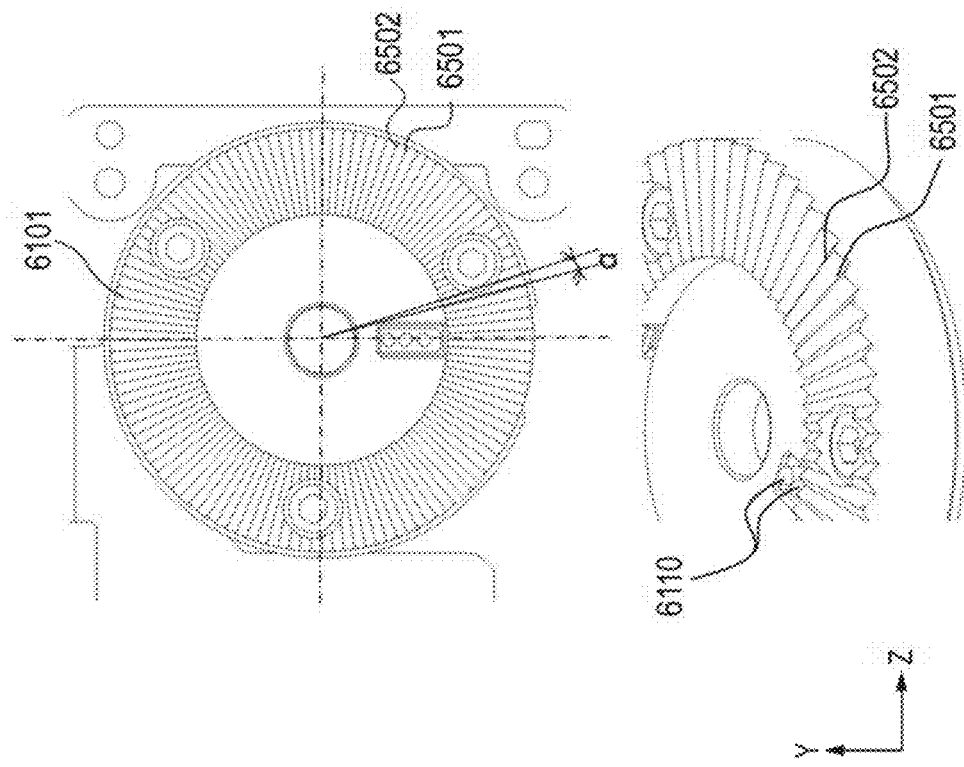

FIGS. 45A and 45B are views useful in explaining self-cleaning of the body-side contact pins 6110 and the contact pattern 6303. FIG. 45A shows the body-side engagement part 6101, and FIG. 45B shows the grip-side engagement part 6301. Note that FIGS. 45A and 45B are each formed by a front view and a partial perspective view.

The body-side engagement part 6101 and the grip-side engagement part 6301 are each formed with the recessed-shape portions and protruding-shape portions at an angle pitch of α. Between the body-side engagement part 6101 and the grip-side engagement part 6301 opposed to each other, the recessed-shape portions and the protruding-shape portions mesh with each other, whereby rotation of them about the X-axis is restricted to determine the engagement position therebetween. Further, the recessed-shape portions and the protruding-shape portions of the body-side engagement part 6101, i.e. the body-side recessed-shape portions 6501 and the body-side protruding-shape portions 6502 are radially formed, with the center of the body-side engagement part 6101 as the radial center. Similarly, the recessed-shape portions and the protruding-shape portions of the grip-side engagement part 6301, i.e. the grip-side recessed-shape portions 6601 and the grip-side protruding-shape portions 6602 are radially formed, with the center of the grip-side engagement part 6301 as the radial center.

Figure 46A:
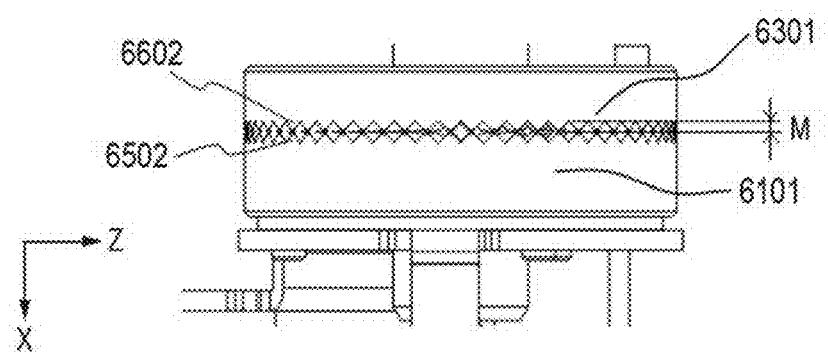
FIGS. 46A and 46B are views showing a state before the body-side engagement part and a grip-side engagement part shown in FIGS. 45A and 45B are engaged with each other.
Figure 46B:
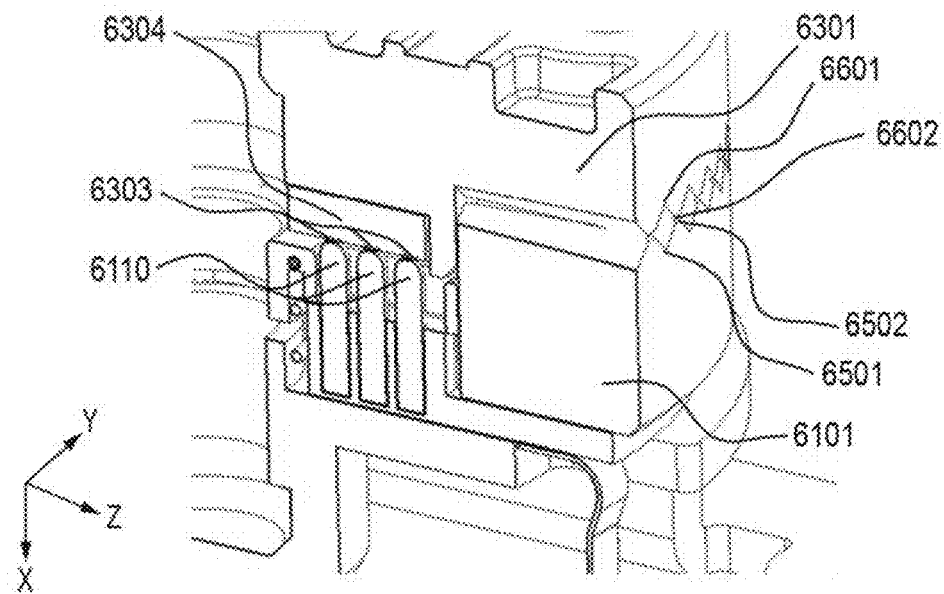

FIGS. 46A and 46B are views showing a state before the body-side engagement part 6101 and the grip-side engagement part 6301 appearing in FIGS. 45A and 45B are engaged with each other. FIG. 46A shows a state in which the body-side protruding-shape portions 6502 and the grip-side protruding-shape portions 6602 are brought into contact with each other, and FIG. 46B is a perspective cross-sectional view showing a state of the contact pattern 6303 and the body-side contact pins 6110 brought into contact with each, in the state shown in FIG. 46A.

As described above, in the state shown in FIG. 46A, in which the body-side protruding-shape portions 6502 and the grip-side protruding-shape portions 6602 are in contact with each other, the body-side contact pins 6110 and the contact pattern 6303 are in contact with each other. In other words, when attaching the grip 6003 to the image capture apparatus body 6001, the body-side protruding-shape portions 6502 and the grip-side protruding-shape portions 6602 are brought into contact with each other as soon as or after the contact pattern 6303 is brought into contact with the body-side contact pins 6110. At this time, the positional relationship between the body-side contact pins 6110 and the contact pattern 6303 corresponds to the relationship described with reference to FIG. 43.

When the grip fixing screw 6010 is fastened from the state shown in FIG. 46, the body-side protruding-shape portions 6502 and the grip-side recessed-shape portions 6601 mesh with each other, whereby a distance between the contact pattern 6303 and the body-side contact pins 6110 is reduced in the X direction by an amount M at the maximum.

Figure 47A:
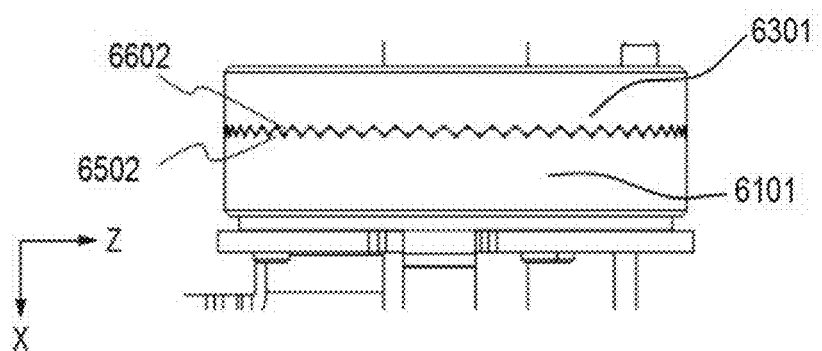
FIGS. 47A and 47B are views showing a state in which the body-side engagement part and the grip-side engagement part appearing in FIGS. 45A and 45B have been engaged with each other.
Figure 47B:
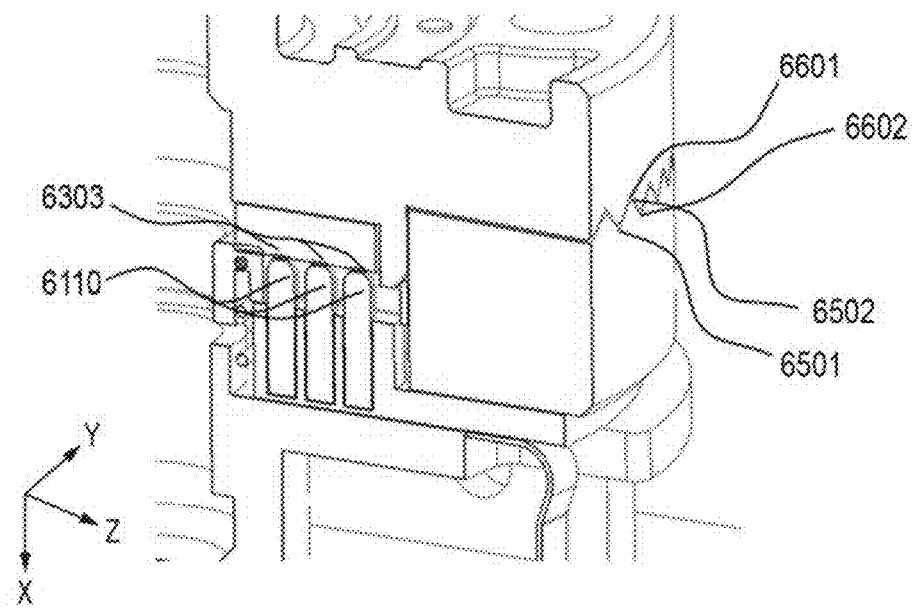

FIGS. 47A and 47B are views showing a state in which the body-side engagement part 6101 and the grip-side engagement part 6301 appearing in FIGS. 45A and 45B have been engaged with each other. FIG. 47A shows a state in which the body-side protruding-shape portions 6502 and the grip-side recessed-shape portions 6601 are brought into contact with each other, and FIG. 47B is a perspective cross-sectional view showing a state in which the contact pattern 6303 is brought into contact with the body-side contact pins 6110, in the state shown in FIG. 47A.

When the distance between the contact pattern 6303 and the body-side contact pins 6110 has been reduced in the X direction by the amount M at the maximum as mentioned above, this results in the state shown in FIGS. 47A and 47B.

As described above, the body-side recessed-shape portions 6501 and the body-side protruding-shape portions 6502 and the grip-side recessed-shape portions 6601 and the grip-side protruding-shape portions 6602 are radially formed. For this reason, it is difficult to cause the grip-side protruding-shape portions 6602 to be engaged with the body-side recessed-shape portions 6501, only by moving the grip-side engagement part 6301 linearly (in the X direction) to the body-side engagement part 6101. Therefore, to cause the grip-side protruding-shape portions 6602 to be engaged with the body-side recessed-shape portions 6501 (to cause the grip-side recessed-shape portions 6601 to be engaged with the body-side protruding-shape portions 6502), it is necessary to rotate the body-side engagement part 6101 and the grip-side engagement part 6301 about the X-axis relative to each other.

That is, to shift the state shown in FIGS. 46A and 46B to the state shown in FIGS. 47A and 47B, it is necessary to rotate the grip-side engagement part 6301 in the circumferential direction by the angle α. With this rotation, the contact pattern 6303 formed on the grip circuit board 6304 fixed to the grip-side engagement part 6301 is rotated. Thus, the contact pattern 6303 is slid by the angle α in the state in which the body-side contact pins 6110 are in contact with the contact pattern 6303, whereby portions in contact between the body-side contact pins 6110 and the traces of the contact pattern 6303 are rubbed against each other whereby self-cleaning is performed.

As described above, in the state of the image capture apparatus body 6001 in which the grip 6003 is not attached thereto, the body-side contact pins 6110 do not protrude from the protection cover 6105 and the protection cover 6105 is fixed in the predetermined position. Therefore, even when a finger, another device, or the like, touches the protection cover 6105, the body-side contact pins 6110 are prevented from being touched. This makes it possible to prevent occurrence of a connection failure of the body-side contact pins 6110 due to a film formed by unintended contact and breakage of of the body-side contact pins 6110 caused by unintended contact of another device.

Further, when the grip 6003 is attached to the image capture apparatus body 6001, the body-side contact pins 6110 and the contact pattern 6303 are rubbed against each other whereby self-cleaning is performed. Therefore, it is possible to ensure reliability of electrical connection between the body-side contact pins 6110 and the contact pattern 6303 without using another method or mechanism.

Next, a description will be given of an example of an image capture apparatus according to a second embodiment of the present invention.

Figure 48:
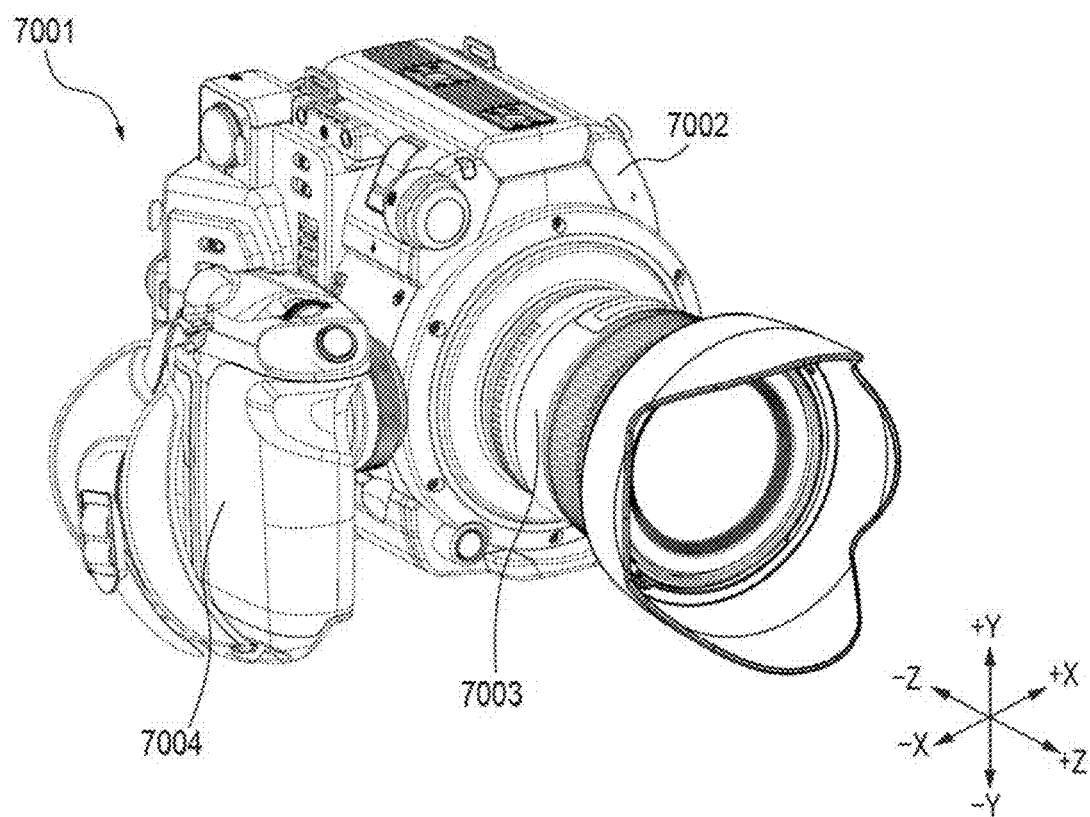
FIG. 48 is a perspective view of an image capture apparatus according to a second embodiment of the present invention, as viewed from the front.
Figure 49:
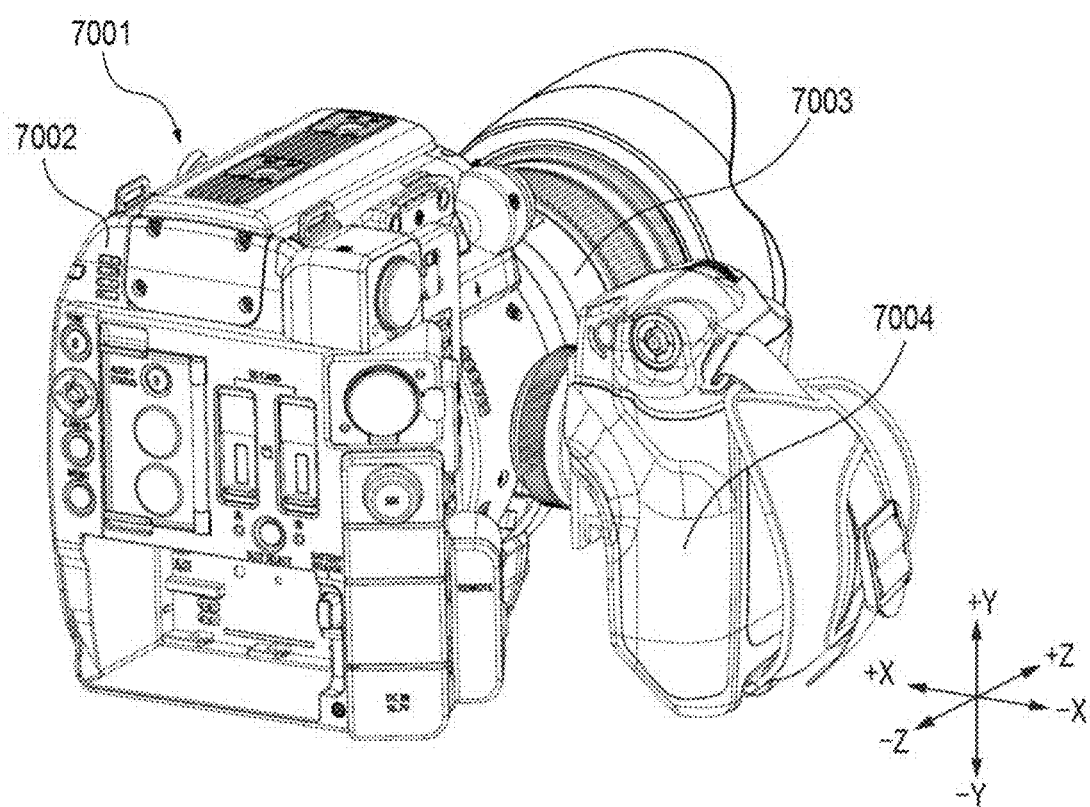
FIG. 49 is a perspective view of the mage pickup apparatus according to the second embodiment of the present invention, as viewed from the rear.

FIG. 48 is a perspective view of an image capture apparatus according to the second embodiment of the present invention as viewed from the front. Further, FIG. 49 is a perspective view of the image capture apparatus as viewed from the rear.

Here, the coordinate system is defined as illustrated, with a side as viewed from a side of a photographic lens side, referred to hereinafter, (side as viewed from a +Z direction in FIG. 48) being defined as the front side, a side opposite to the front side being defined as the rear side, a side on the right side as viewed from the front being defied as the right side, and a side on the left side as viewed from the front being defined as the left side. Further, a side on the upper side as viewed from the front is defined as the top side, and a side on the lower side as viewed from the front is defined as the bottom side. Further, an axis in the Z direction, which passes the center of the photographic lens, is defined as the optical axis.

The image capture apparatus includes an image capture apparatus body 7002, a photographic lens 7003, and a grip 7004. The image capture apparatus body 7002 includes an image capture device, a circuit board, a recording medium, and so forth (none of which are shown).

As the image capture device, a CCD or a CMOS sensor is used, and the image capture device outputs image signals corresponding to an optical image formed thereon through the photographic lens 7003. The circuit board controls the image capture apparatus body 7002 and an accessory or the like connected to the image capture apparatus body 7002. For example, an image processing IC and a system control IC (neither of which is shown) that perform predetermined image processing on the image signals obtained by capturing an image of an object are mounted on the circuit board, and perform various signal processing on the image signals output from the image capture device to generate video data and the like.

The recording medium stores video data and voice data, processed by the image processing IC and the system control IC, and is implemented, for example, by a nonvolatile memory or a hard disk drive.

Figure 50:
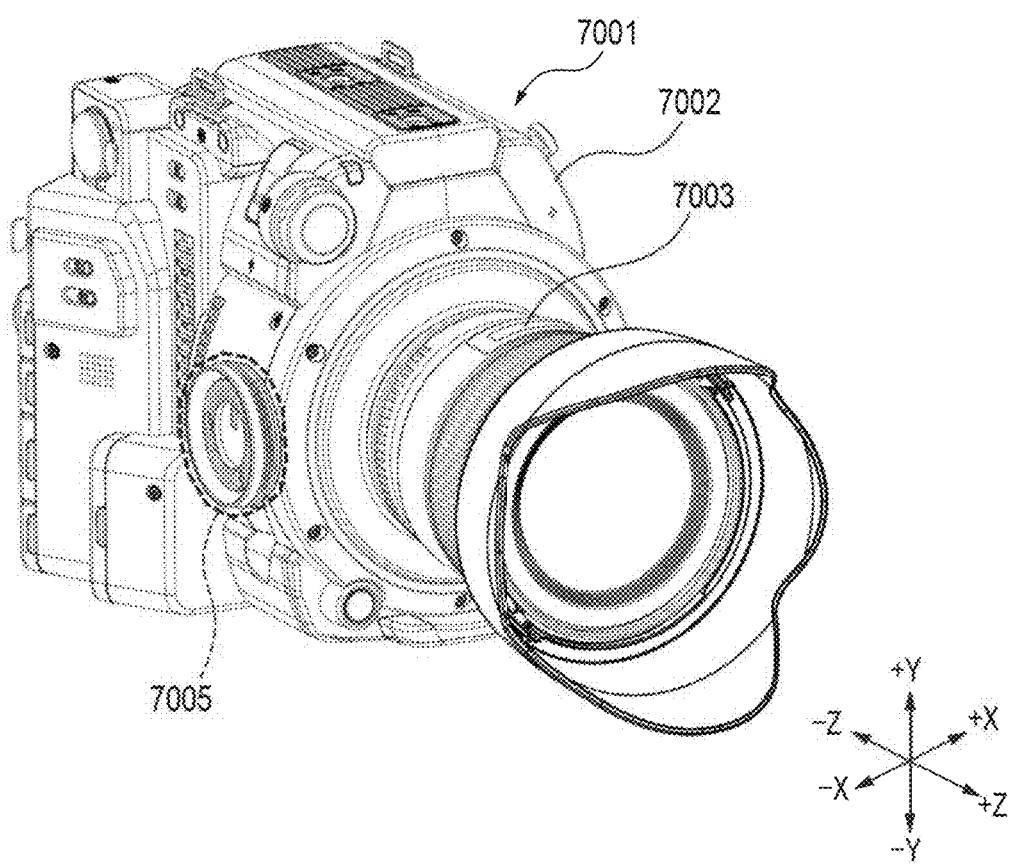
FIG. 50 is a perspective view of the mage pickup apparatus in a state in which a grip has been removed from the state shown in FIG. 48, as viewed from the front.
Figure 51:
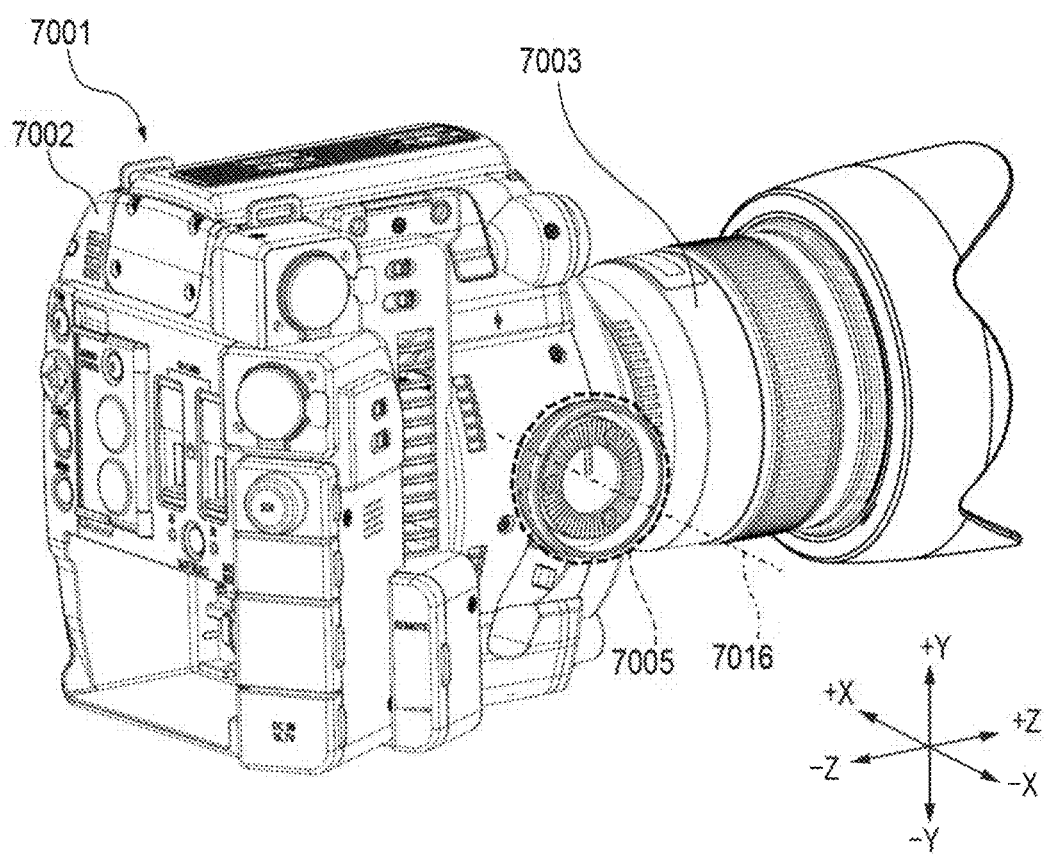
FIG. 51 is a perspective view of the mage pickup apparatus in a state in which the grip has been removed from the state shown in FIG. 49, as viewed from the rear.

FIG. 50 is a perspective view showing a state of the image capture apparatus from which the grip 7004 has been removed, as viewed from the front. Further, FIG. 51 is a perspective view of the state of the image capture apparatus from which the grip 7004 has been removed, as viewed from the rear.

The right side of the image capture apparatus body 7002 is provided with a body-side attachment mechanism 7005 (area surrounded by a broken line, appearing in FIGS. 50 and 51) to which an accessory, such as the grip 7004, can be attached.

Figure 52A:
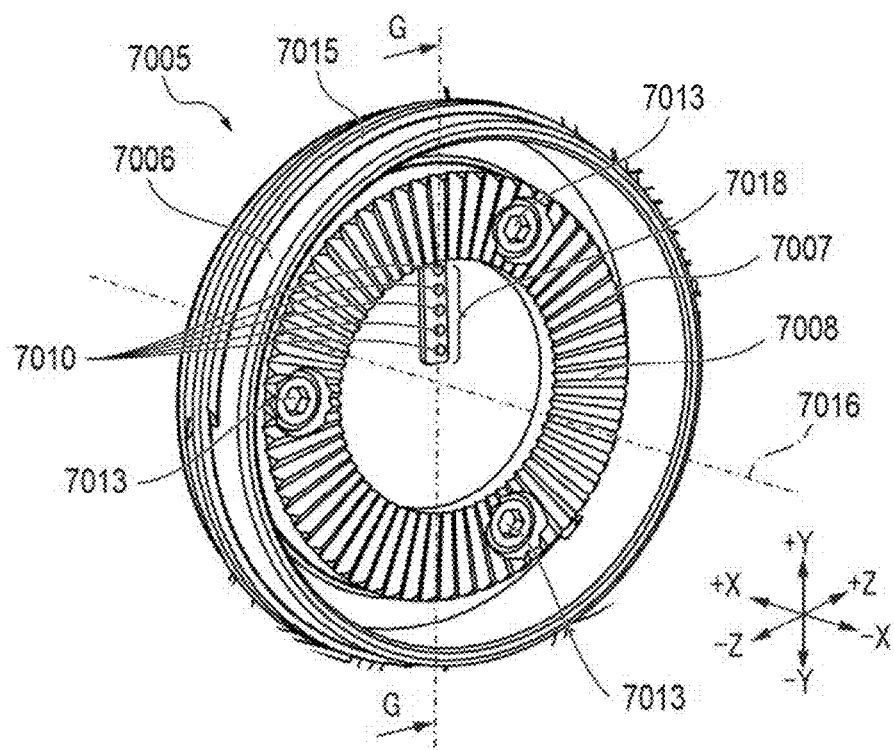
FIG. 52A is a partial enlarged view of a body-side attachment mechanism appearing in FIG. 50.
Figure 52B:
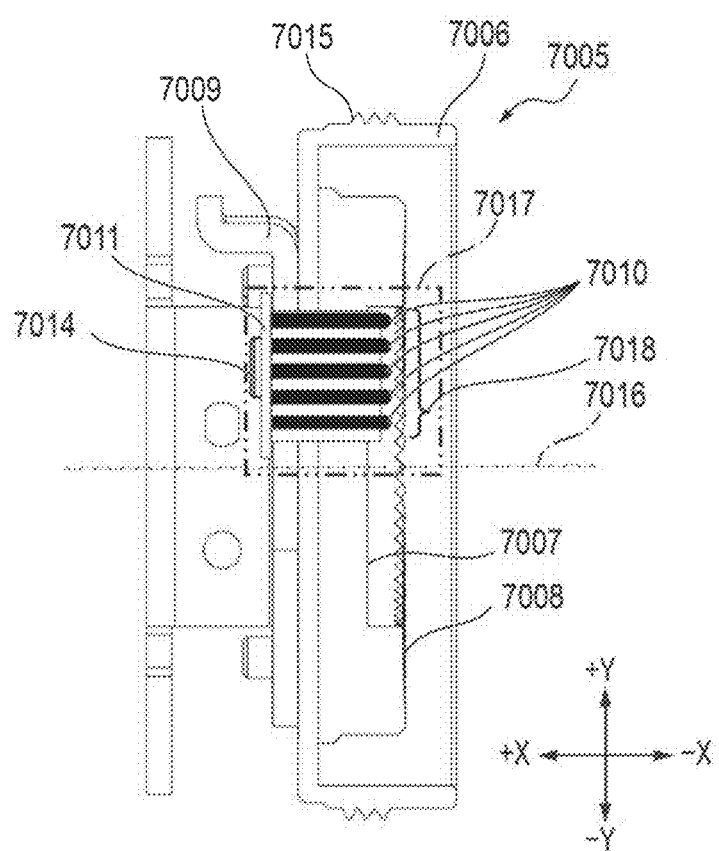
FIG. 52B is a cross-sectional view taken along G-G in FIG. 52A.
Figure 52C:
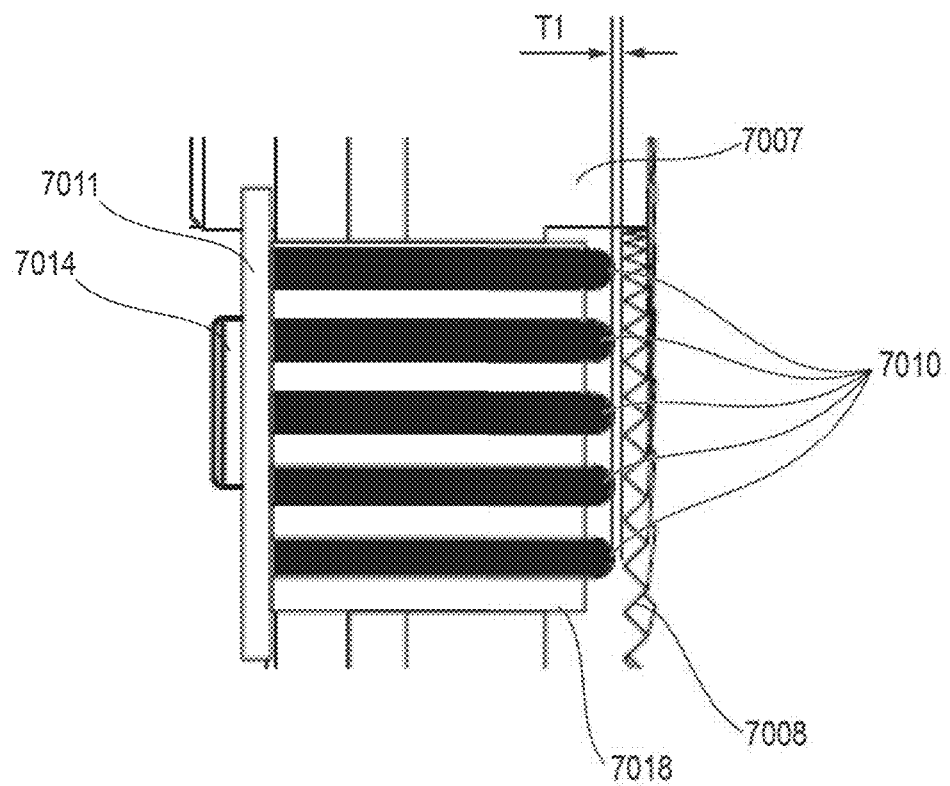
FIG. 52C is an enlarged view of part of the cross-sectional view shown in FIG. 52B.

FIG. 52A is a partially enlarged view of the body-side attachment mechanism 7005 appearing in FIG. 50, and FIG. 52B is a cross-sectional view taken along G-G in FIG. 52A. Further, FIG. 52C is an enlarged view of part of the cross-sectional view shown in FIG. 52B. FIG. 52C shows an area 7017 surrounded by a two-dot chain line, appearing in FIG. 52B, in an enlarged form.

Figure 53:
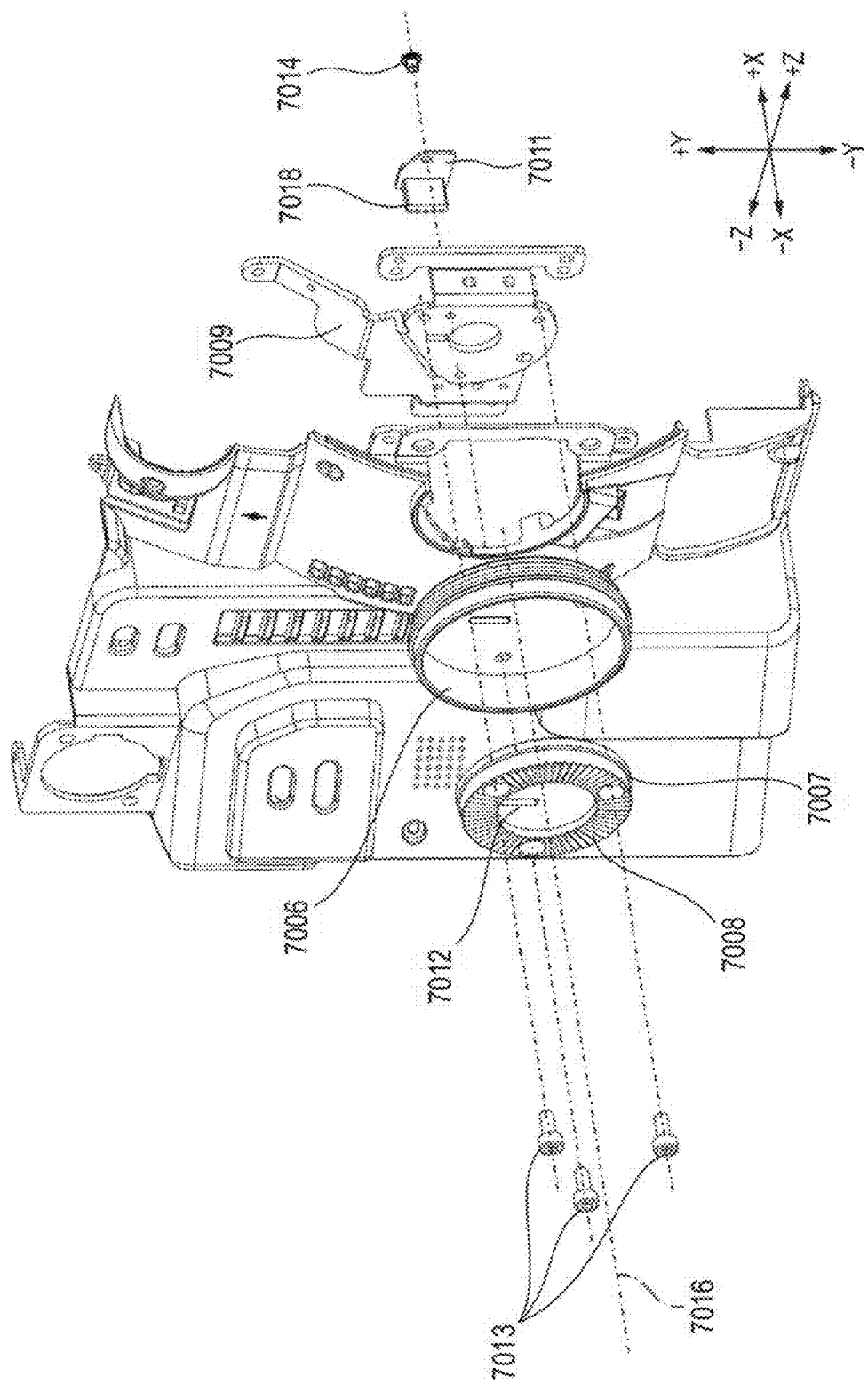
FIG. 53 is an exploded perspective view of the body-side attachment mechanism appearing in FIG. 50.

FIG. 53 is an exploded perspective view of the body-side attachment mechanism 7005 appearing in FIG. 50.

First, referring to FIGS. 52A and 53, a body-side screwing member 7006 includes a screw 7015 to be screwed with a grip-side screwing member 7101 of the grip 7004, described hereinafter. In the illustrate example, the screw 7015 is a male screw having a central axis 7016 as the center.

A body-side attachment member 7007 is formed into a substantially disc-like outer shape, and has a body-side engagement part 7008, on which recessed-shape portions and protruding-shape portions are radially arranged at predetermined pitch, with the center thereof as the radial center. Note that a member having such a shape is generally referred to as the rosette.

The body-side engagement part 7008 is engaged with a grip-side engagement part 7104 having protruding-shape portions and recessed-shape portions similar to those of the body-side attachment member 7007, thereby restricting rotation of the grip 7004.

The body-side screwing member 7006 and the body-side attachment member 7007 are fixed to a body-side attachment sheet metal 7009 arranged within the image capture apparatus body 7002, with screws 7013, concentrically with the central axis 7016.

Body-side contact pins 7010 are electrical contacts for performing power supply and communication between the image capture apparatus body 7002 and the grip 7004. The body-side contact pins 7010 are arranged at predetermined radially spaced intervals from the center of the body-side engagement part 7008 and are electrically connected to grip-side contact pattern 7103. The body-side contact pins 7010 have respective predetermined functions assigned thereof, thereby functioning e.g. as a power supply terminal, a communication terminal, a ground terminal, and the like, respectively.

A control circuit arranged in the image capture apparatus body 7002 causes electrical power to be supplied to the grip 7004 and can communicate with the grip 7004, via the body-side contact pins 7010.

The body-side contact pins 7010 are urged by compression springs (not shown) accommodated in a contact block 7018 in a direction of protruding from the image capture apparatus body 7002 (−X direction). With this, a predetermined contact pressure is secured when the grip 7004 is connected to the image capture apparatus body 7002.

The body-side contact pins 7010 accommodated in the contact block 7018 each have one end electrically connected to a body-side circuit board 7011 e.g. by soldering, which is opposite to the other end in contact with the grip-side contact pattern 7103, described hereinafter. The body-side circuit board 7011 is electrically connected to a body-side control circuit board (not shown) by electrical wiring (not shown).

The body-side circuit board 7011 is fixed to the body-side attachment sheet metal 7009 with a screw 7014, and the body-side contact pins 7010 are inserted through the body-side screwing member 7006. Then, the body-side contact pins 7010 are exposed to the outside of the image capture apparatus body 7002 through a contact exposing portion 7012 formed on the inner peripheral side of the body-side engagement part 7008.

As shown in FIGS. 52A and 52B, the body-side screwing member 7006 is arranged on the outer peripheral side of the body-side engagement part 7008. The contact exposing portion 7012 is formed in the inner peripheral side of the body-side engagement part 7008. That is, the body-side contact pins 7010 are arranged on the inner peripheral side of the body-side engagement part 7008, and exposed to the outside of the image capture apparatus body 7002 in the −X direction. At this time, the tip ends of the body-side contact pins 7010 and the recessed-shape portions of the body-side engagement part 7008 are designed such that a predetermined clearance (indicated by T1 in FIG. 52C) is ensured between the tip ends and the deepest position of the recessed-shape portions formed on the body-side engagement part 7008. That is, the body-side contact pins 7010 and the body-side engagement part 7008 have a structure in which the tip ends do not protrude outward from the deepest position of the body-side engagement part 7008.

Figure 54:
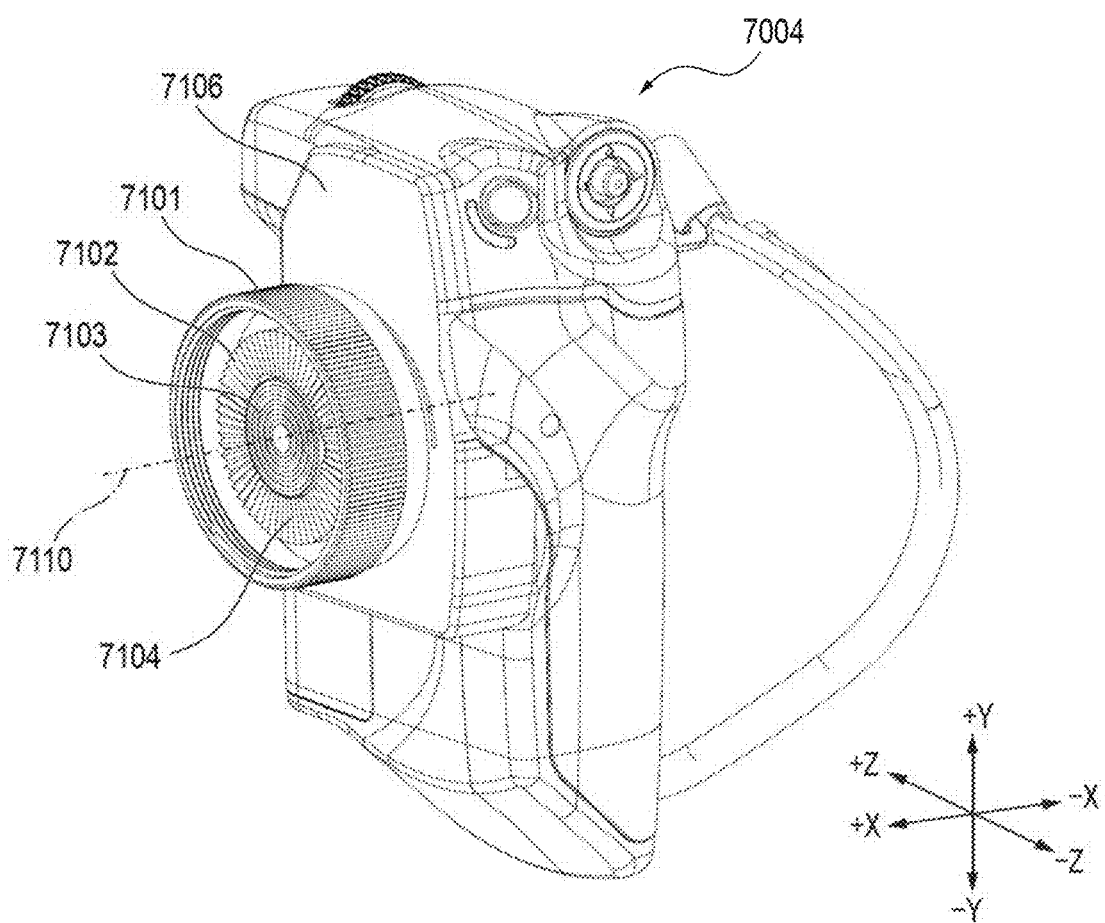
FIG. 54 is a perspective view of the grip appearing in FIG. 48, as viewed from the rear.
Figure 55:
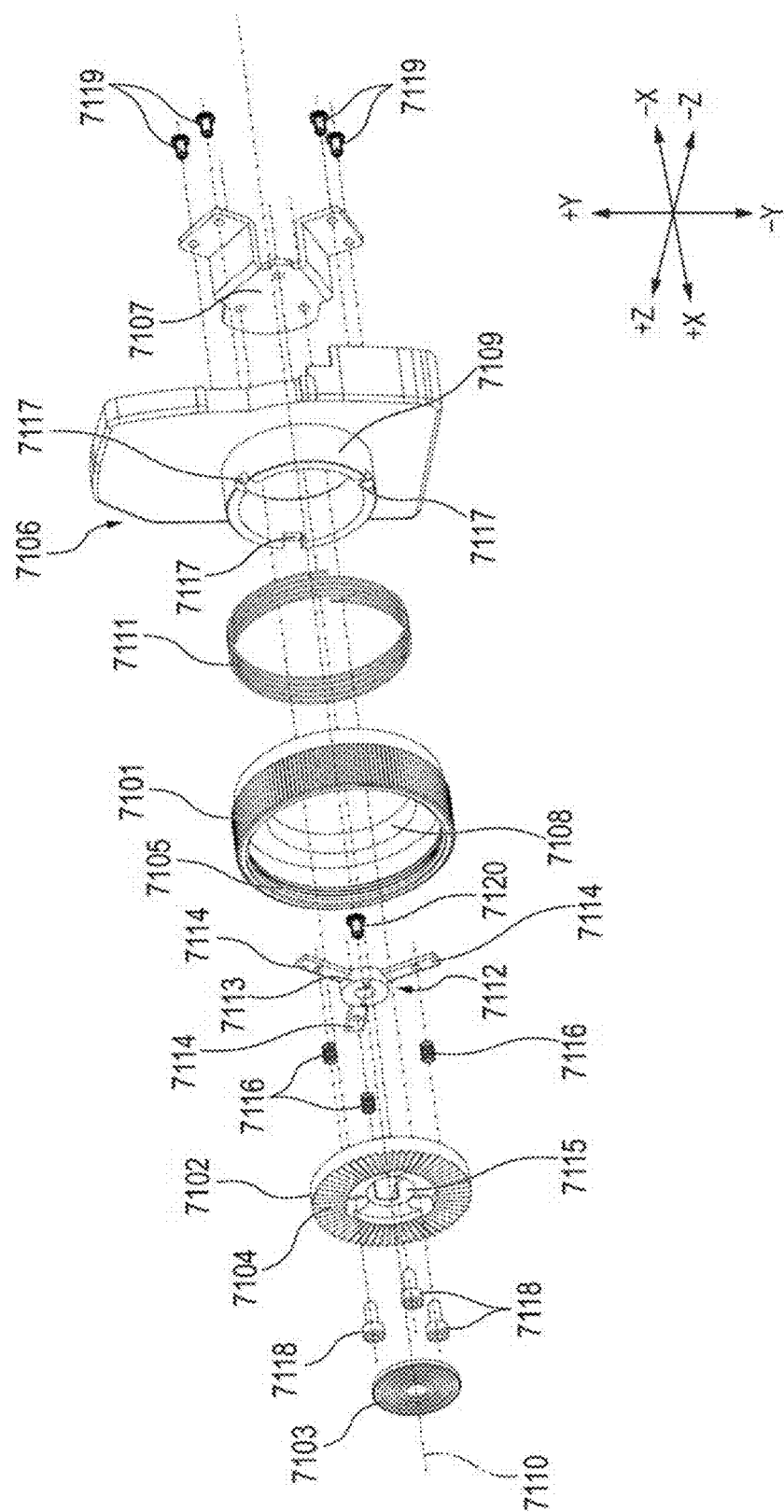
FIG. 55 is an exploded perspective view of the grip appearing in FIG. 48.
Figure 56:
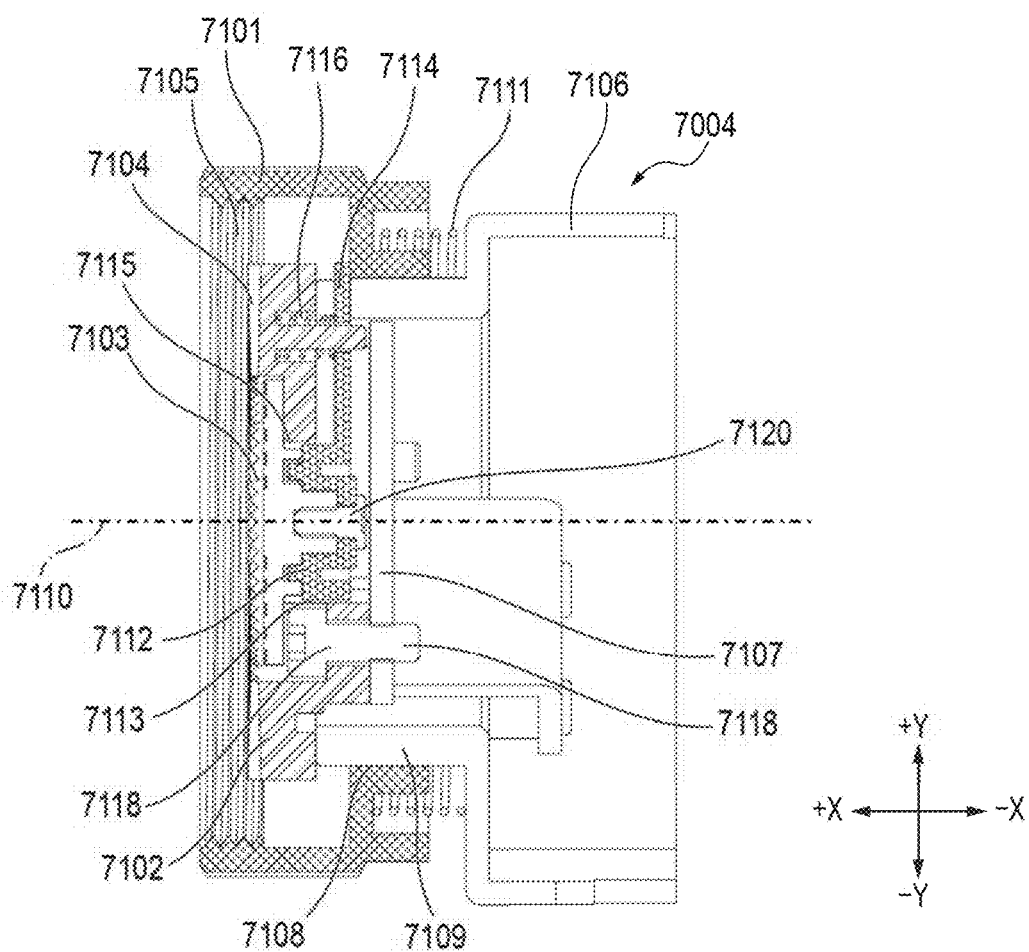
FIG. 56 is a partial cross-sectional view showing a structure of part, joined to the image capture apparatus body, of the grip appearing in FIG. 48.

FIG. 54 is a perspective view of the grip 7004 as viewed from the rear. FIG. 55 is an exploded perspective view of the grip 7004. FIG. 56 is a partial cross-sectional view of part and therearound of the grip 7004, attached to the image capture apparatus body 7002.

The grip 7004 is a type of accessory that is removably attached to the image capture apparatus body 7002 and is used to make it easy for a user to perform shooting while holding the image capture apparatus body 7002. Note that the accessory attached to the image capture apparatus body 7002 is not limited to the grip 7004, but it may be any suitable accessory insofar as it has a structure which enables the accessory to be attached to the body-side attachment mechanism 7005.

In the grip 7004, an exterior member 7106 contains a circuit board, an electrical wiring member, and a structure member (none of which are shown) and has a portion held by a user and a portion where an operation section including a push button and a dial is exposed. Part of the exterior member 7106 is provided with a hollow cylindrical protruding portion 7109 on which the grip-side screw member 7101 is rotatably fitted. Further, the tip end of the hollow cylindrical protruding portion 7109 in the +X direction is formed with a plurality of fitting recess portions 7117 in which a contact pattern-holding member 7112, described hereinafter, is accommodated.

The grip-side screwing member 7101 has a screw 7105 formed on the inner peripheral surface thereof for being screwed with the body-side screwing member 7006. In the illustrate example, the screw 7105 of the grip-side screwing member 7101 is formed as a female screw to be screwed with the male screw of the body-side screwing member 7006. Further, the grip-side screwing member 7101 has an inner peripheral fitting portion 7108. Further, the grip-side screwing member 7101 is fitted on the outer peripheral surface of the hollow cylindrical protruding portion 7109 formed on the exterior member 7106 and is movable about a rotational axis 7110 with respect to the exterior member 7106.

The grip-side screwing member 7101 is always urged toward a grip-side attachment member 7102 (+X direction), described hereinafter, by an urging member 7111 formed by a compression coil spring. The urging member 7111 is sandwiched and held between the exterior member 7106 and the grip-side screwing member 7101 in a compressed state.

The grip-side attachment member 7102 is formed into a disc-like outer shape similar to the body-side attachment member 7007 and includes the grip-side engagement part 7104 having the recessed-shape portions and protruding-shape portions radially formed, with the center of the grip-side attachment member 7102 as the radial center. The grip-side engagement part 7104 is engaged with the body-side engagement part 7008 to restrict rotation of the grip 7004 about the rotational axis 7110. The grip-side attachment member 7102 is fixed to a grip-side attachment sheet metal 7107 with screws 7118. The grip-side attachment sheet metal 7107 is fixed inside the exterior member 7106 of the grip 7004 with screws 7119.

The grip-side contact pattern 7103 has traces formed concentrically on a circuit board as electrical contacts to be electrically connected to the body-side contact pins 7010 of the image capture apparatus body 7002. The grip-side contact pattern 7103 is electrically connected by the circuit board (not shown) and the wiring member (not shown) contained in the exterior member 7106 of the grip 7004. Further, by connecting the body-side contact pins 7010 and the grip-side contact pattern 7103, it is possible to perform power supply and communication between the image capture apparatus body 7002 and the grip 7004.

The grip-side contact pattern 7103 is formed e.g., by a molded interconnect device (MID), and is connected to the contact pattern-holding member 7112 with a screw 7120 such that the grip-side attachment member 7102 is sandwiched between the grip-side contact pattern 7103 and the contact pattern-holding member 7112.

As shown in FIG. 55, the contact pattern-holding member 7112 includes a fitting cylindrical portion 7113 and a plurality of extending portions 7114 radially extending from the fitting cylindrical portion 7113. The fitting cylindrical portion 7113 is fitted in a through hole 7115 formed in the innermost part of the grip-side attachment member 7102. Springs 7116 are accommodated between the extending portions 7114 of the contact pattern-holding member 7112 and the grip-side attachment member 7102 in a compressed state. With this, a load is applied in a direction of urging the grip-side contact pattern 7103 connected to the contact pattern-holding member 7112 toward the grip-side attachment member 7102 (−X direction).

The extending portions 7114 of the contact pattern-holding member 7112 are accommodated in the fitting recess portions 7117 formed in the tip end of the hollow cylindrical protruding portion 7109 such that the extending portions 7114 are capable of performing translational movement over a predetermined stroke in the X direction. Since the grip-side contact pattern 7103 and the contact pattern-holding member 7112 are connected by the screw 7120, the two members operate in unison.

Next, mechanical connection and electrical connection when the grip 7004 is attached to the image capture apparatus body 7002 will be described.

Figure 57A:
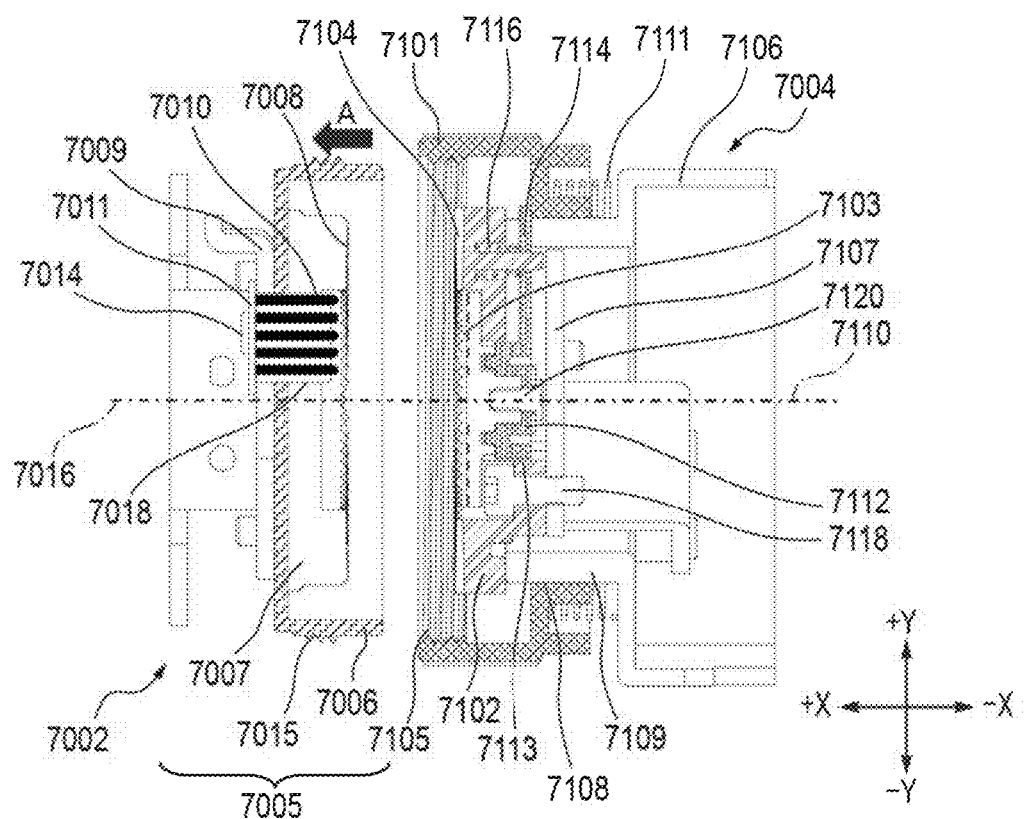
FIG. 57A is a partial cross-sectional view showing a state in which the grip is before being attached to the image capture apparatus body appearing in FIG. 48.
Figure 57B:
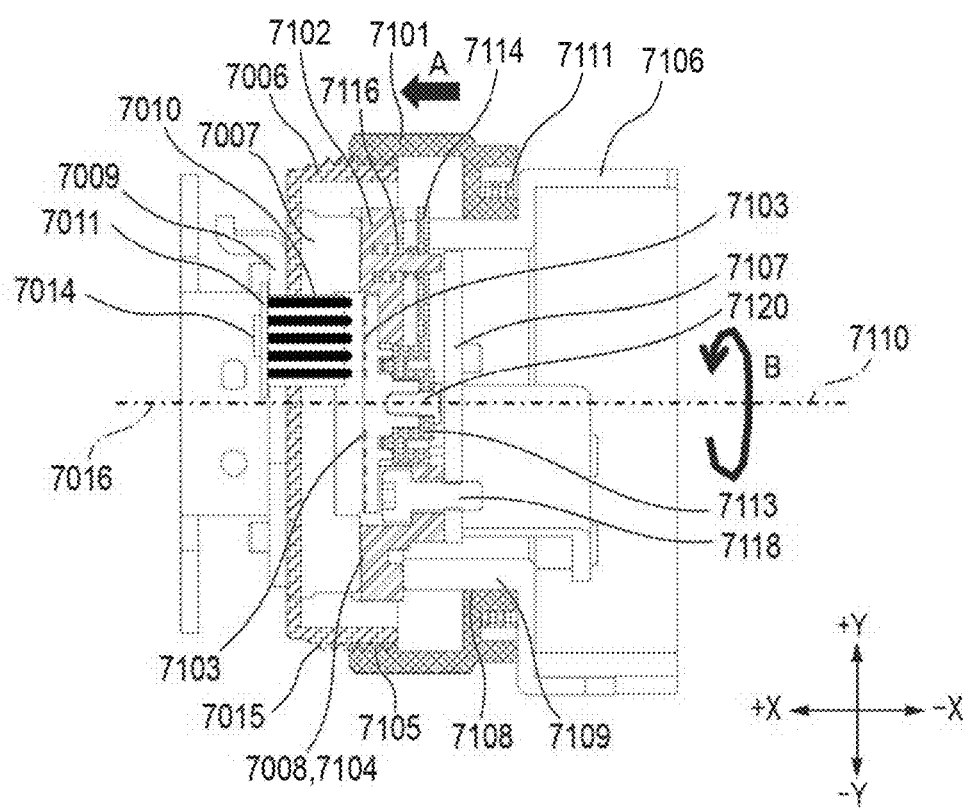
FIG. 57B is a partial cross-sectional view showing a state in which the grip is being attached to the image capture apparatus body appearing in FIG. 48.
Figure 57C:
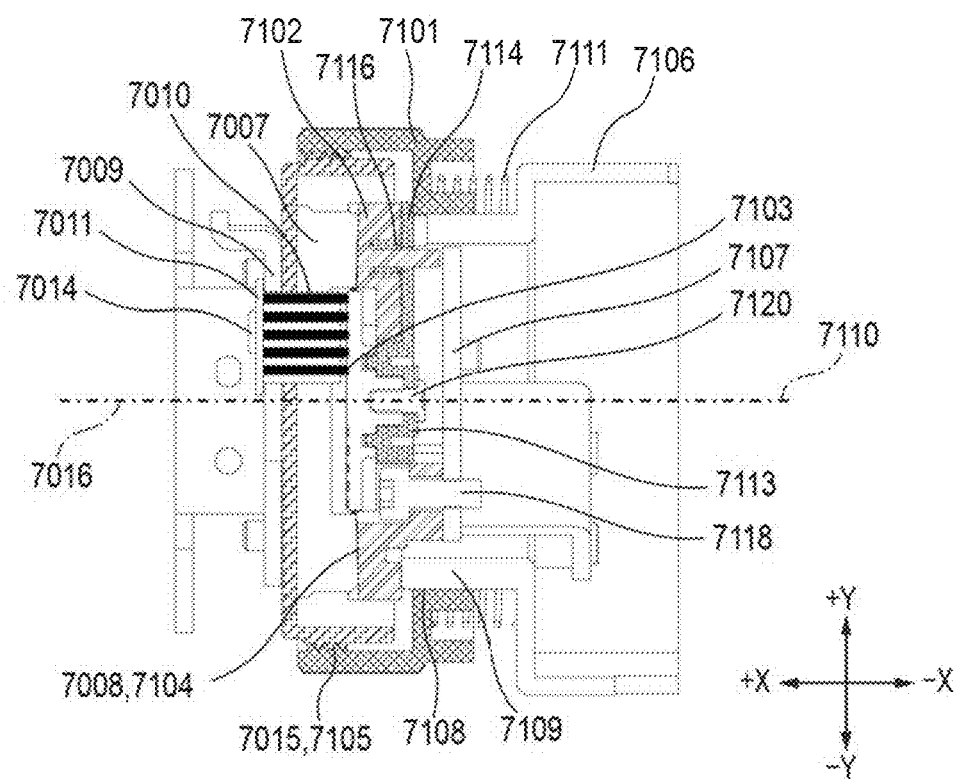
FIG. 57C is a partial cross-sectional view showing a state in which the grip has been attached to the image capture apparatus body appearing in FIG. 48.
Figure 57D:
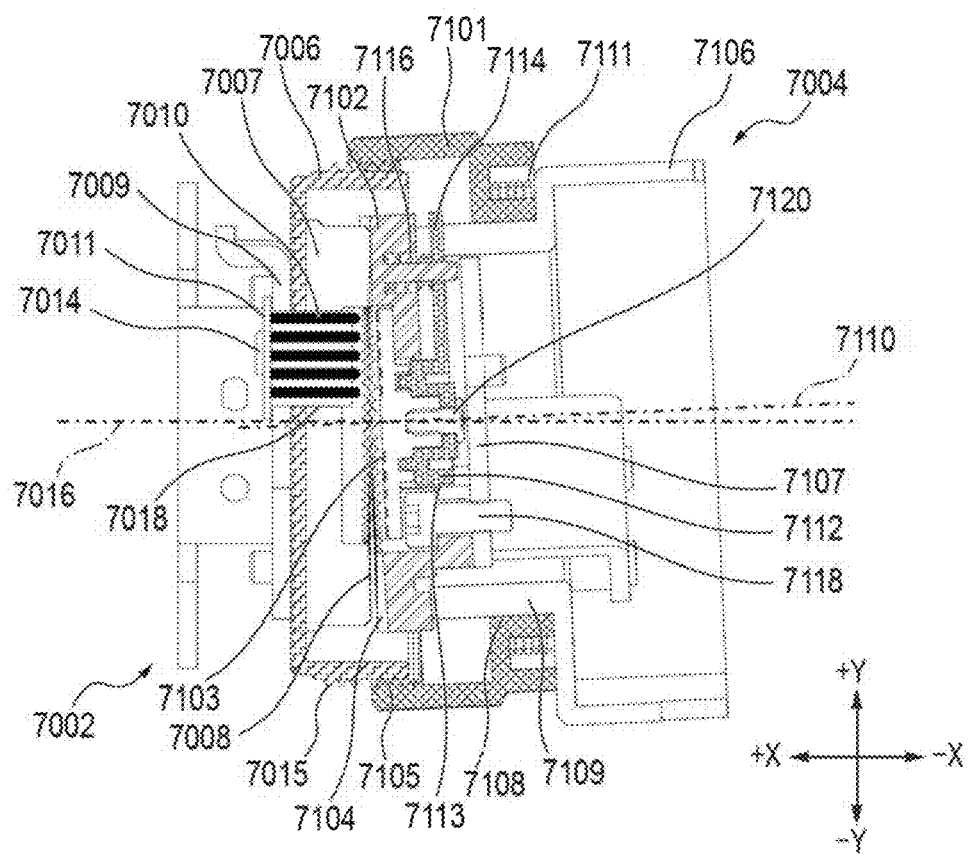
FIG. 57D is a partial cross-sectional view of the image capture apparatus body in a state in which a body-side engagement part and a grip-side engagement part have been brought into contact with each other.

FIG. 57A is a partial cross-sectional view showing a state before the grip 7004 is attached to the image capture apparatus body 7002 appearing in FIG. 48, and FIG. 57B is a partial cross-sectional view showing a state in which the grip 7004 is being attached to the image capture apparatus body 7002. Further, FIG. 57C is a partial cross-sectional view showing a state in which the grip 7004 has been attached to the image capture apparatus body 7002, and FIG. 57D is a partial cross-sectional view showing a state in which the body-side engagement part and the grip-side engagement part have been brought into contact with each other.

As shown in FIG. 57A, when attaching the grip 7004 to the image capture apparatus body 7002, the body-side screwing member 7006 and the grip-side screwing member 7001 are aligned in position. Then, the grip 7004 is pressed toward the image capture apparatus body 7002 (direction indicated by an arrow A in FIG. 57A (+X direction)). In the state shown in FIG. 57A, the grip 7004 has been neither fixed nor electrically connected to the image capture apparatus body 7002.

When the grip 7004 is pressed toward the image capture apparatus body 7002 in the direction indicated by the arrow A (+X direction) in FIG. 57A, the state shown in FIG. 57A is shifted to a state shown in FIG. 57B in which the body-side engagement part 7008 and the grip-side engagement part 7104 have been engaged with each other.

The engagement between the body-side engagement part 7008 and the grip-side engagement part 7104 determines an attachment angle of the grip 7004 with respect to the image capture apparatus body 7002. At this time, since the body-side engagement part 7008 and the grip-side engagement part 7104 each have the recessed-shape portions and protruding-shape portions radially formed, it is possible to set the grip 7004 to a desired angle before fixing the grip 7004 to the image capture apparatus body 7002.

In the state shown in FIG. 57B, the grip-side contact pattern 7103 fixed to the contact pattern-holding member 7112 is urged toward the grip-side attachment member 7102 (in the −X direction) by the action of the springs 7116. Therefore, the grip-side contact pattern 7103 is arranged in a position lower than the recessed-shape portions of the grip-side engagement part 7104. On the other hand, the body-side contact pins 7010 are arranged in a location lower than the recessed-shape portions of the body-side engagement part 7008. Therefore, in the state shown in FIG. 57B, although the body-side engagement part 7008 and the grip-side engagement part 7104 are engaged with each other, the body-side contact pins 7010 and the grip-side contact pattern 7103 are spaced from each other and hence are not electrically connected to each other.

With the above-described arrangement, when causing the body-side engagement part 7008 and the grip-side engagement part 7104 to be engaged with each other, it is possible to prevent the engagement portions of the body-side contact pins 7010 and the races of the grip-side contact pattern 7103, opposed to each other, from being carelessly brought into contact with each other.

When the grip-side screwing member 7101 is rotated in a direction indicated by an arrow B in FIG. 57B (in a clockwise direction, as viewed from the −X direction) in the state in which the grip 7004 has been pressed in the direction indicated by the arrow A (+X direction), this results in the state shown in FIG. 57C. With this, in the state shown in FIG. 57C, the body-side engagement part 7008 and the grip-side engagement part 7104 are engaged with each other, and the grip-side screwing member 7101 has been screwed on the body-side screwing member 7006, whereby the grip 7004 has been firmly fixed to the image capture apparatus body 7002 without looseness.

When the grip-side screwing member 7101 is rotated in the direction indicated by the arrow B (see FIG. 57B), the extending portions 7114 provided on the contact pattern-holding member 7112 and the grip-side screwing member 7101 are brought into contact with each other. When the grip-side screwing member 7101 is further rotated in the direction indicated by the arrow B, the contact pattern-holding member 7112 is moved in the direction indicated by the arrow A in FIG. 57B. As a result, the grip-side contact pattern 7103 connected to the contact pattern-holding member 7112 is pressed in the direction indicated by the arrow A. The grip-side contact pattern 7103 pressed in in the direction indicated by the arrow A is brought into contact with the body-side contact pins 7010 of the image capture apparatus body 7002 and is electrically connected thereto. That is, the grip 7004 is firmly fixed to the image capture apparatus body 7002, and it is possible to easily electrically connect the two. Further, since electrical connection is achieved in the state in which the grip 7004 has been firmly fixed to the image capture apparatus body 7002, it is possible to ensure electrical connection with high reliability.

To remove the grip 7004 from the image capture apparatus body 7002, it is only required to perform a reverse operation to the attachment operation described with reference to FIGS. 57A to 57C. More specifically, first, the grip-side screwing member 7101 is rotated in a direction opposite to the direction indicated by the arrow B to loosen the grip-side screwing member 7101. With this, the contact pattern-holding member 7112 is moved in a direction opposite to the direction indicated by the arrow A by the urging force of the springs 7116. As a result, the grip-side contact pattern 7103 connected to the contact pattern-holding member 7112 is separated from the body-side contact pins 7010 in conjunction with the operation of the grip-side screwing member 7101.

As a result, the image capture apparatus body 7002 and the grip 7004 are no longer electrically connected to each other. Also, the grip-side screwing member 7101 is removed from the body-side screwing member 7006, whereby the grip 7004 is no longer fixed to the image capture apparatus body 7002. Then, by moving the grip 7004 away in the direction opposite to the direction indicated by the arrow A, the grip 7004 can be removed from the image capture apparatus body 7002.

Next, a case where a user moves the grip 7004 toward the image capture apparatus body 7002 from an oblique direction will be described.

FIG. 57D shows a state in which the grip 7004 has been moved close to the image capture apparatus body 7002 from an oblique direction and the body-side engagement part 7008 and the grip-side engagement part 7104 have been brought into contact with each other.

In the case where the grip 7004 has been moved close to the image capture apparatus body 7002 from the oblique direction, first, the grip-side screwing member 7101 is brought into contact with the body-side screwing member 7006 of the image capture apparatus body 7002. Even when the user intends to attach the grip 7004 to the image capture apparatus body 7002 in this state, the body-side screwing member 7006 and the grip-side screwing member 7101 do not fit in shape and are not screwed with each other. For this reason, the grip 7004 cannot be fixed to the image capture apparatus body 7002.

In this case, if the user roughly moves the grip 7004 so as to attach the grip 7004 to the image capture apparatus body 7002, a state in which the body-side engagement part 7008 and the grip-side engagement part 7104 are brought into abutment with each other frequently occurs.

However, as shown in FIG. 52C, the clearance T1 (see FIG. 52C) is provided between the body-side engagement part 7008 and the body-side contact pins 7010. This makes it possible to prevent the body-side contact pins 7010 from being damaged by collision of the grip-side engagement part 7104 against the body-side contact pins 7010.

Next, a description will be given of a first variation of the body-side attachment mechanism 7005 of the image capture apparatus body 7002 in the second embodiment of the present invention.

Similar to the body-side attachment member 7007 provided on the above-described image capture apparatus body 7002, an accessory attachment mechanism, called a rosette, is used for an image capture apparatus body 3600 according to a first variation of the second embodiment of the present invention. Although the image capture apparatus body 3600 has a contact part 3602 inside a body-side attachment member 3601, in a case where the contact part 3602 is exposed on the surface of the image capture apparatus body 3600, the following problems may be caused.

For example, if a finger or the like unintendedly touches the contact part 3602, there is a possibility that a film is formed causing a contact failure. Further, if another device touches the contact part 3602, there is a possibility that the contact part 3602 is broken. Further, when an accessory is attached to the body-side attachment member 3601, if the engagement part of the accessory is erroneously hit against the contact part 3602, there is a possibility that the contact part 3602 is broken.

To prevent these problems, a body-side attachment mechanism 3650 of the image capture apparatus 3600 uses a structure that causes the contact part 3602 to be exposed only in a case where an accessory having electrical contacts and a rosette is attached and causes the contact part 3602 to be retracted in the other cases.

Figure 58:
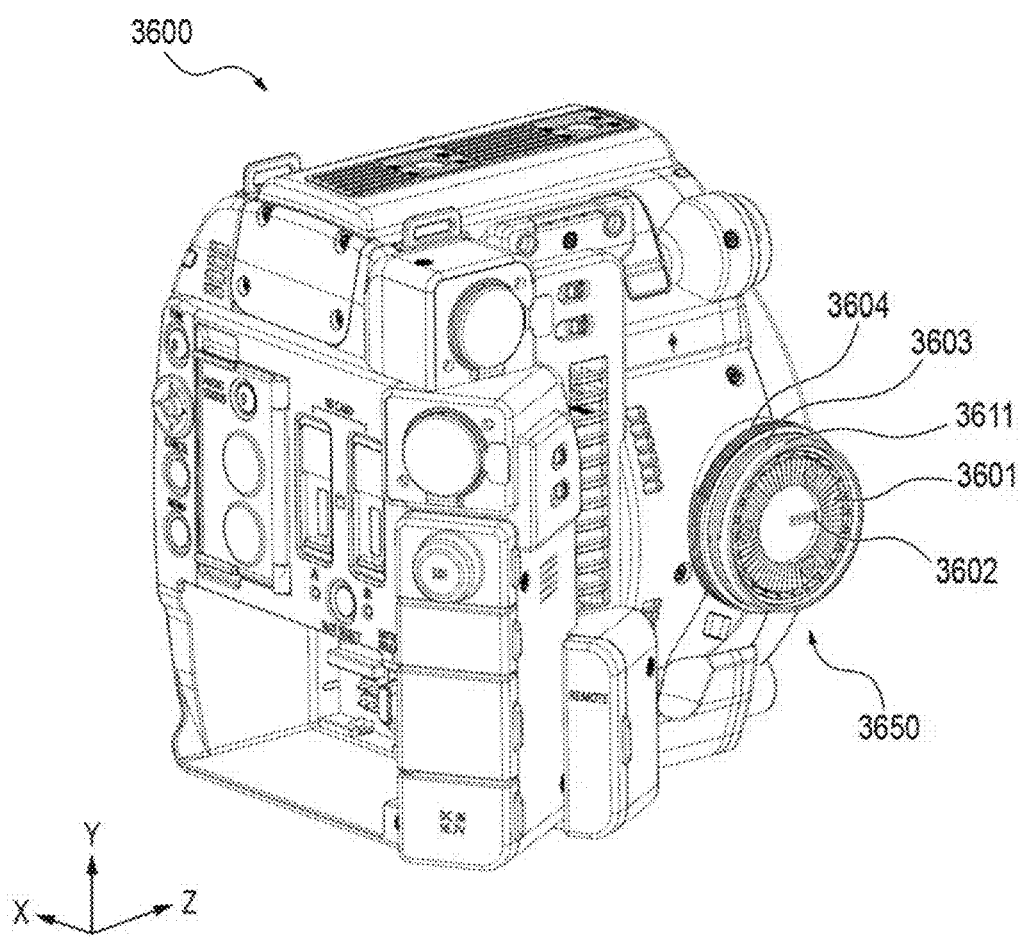
FIG. 58 is a perspective view of the appearance of an image capture apparatus body according to a first variation of the second embodiment of the present invention.

FIG. 58 is a perspective view of the appearance of the image capture apparatus body according to the first variation of the second embodiment of the present invention.

Figure 59A:
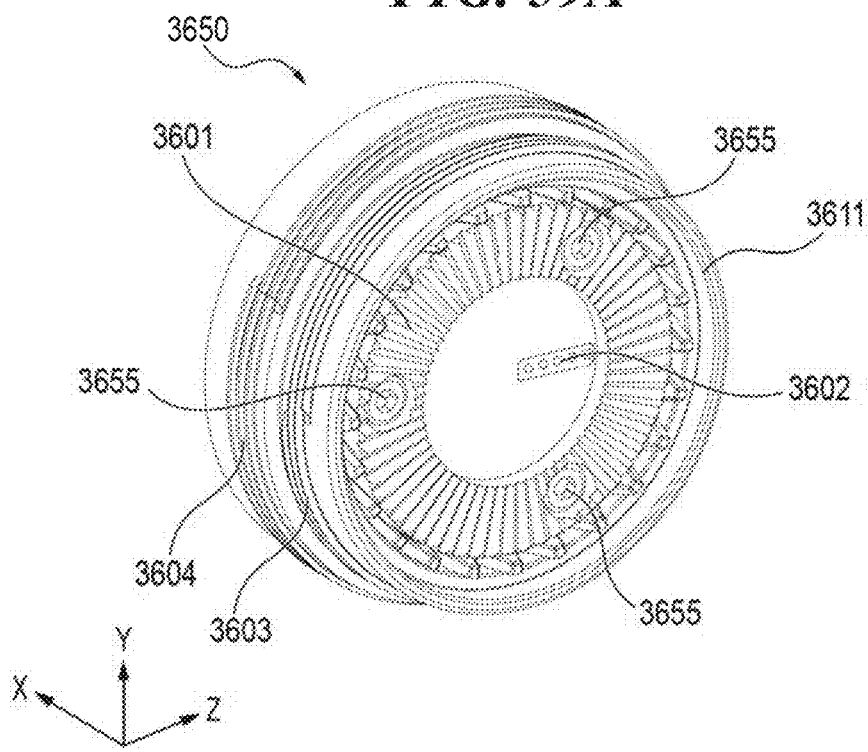
FIGS. 59A and 59B are views useful in explaining a body-side attachment mechanism included in the image capture apparatus body appearing in FIG. 58.
Figure 59B:
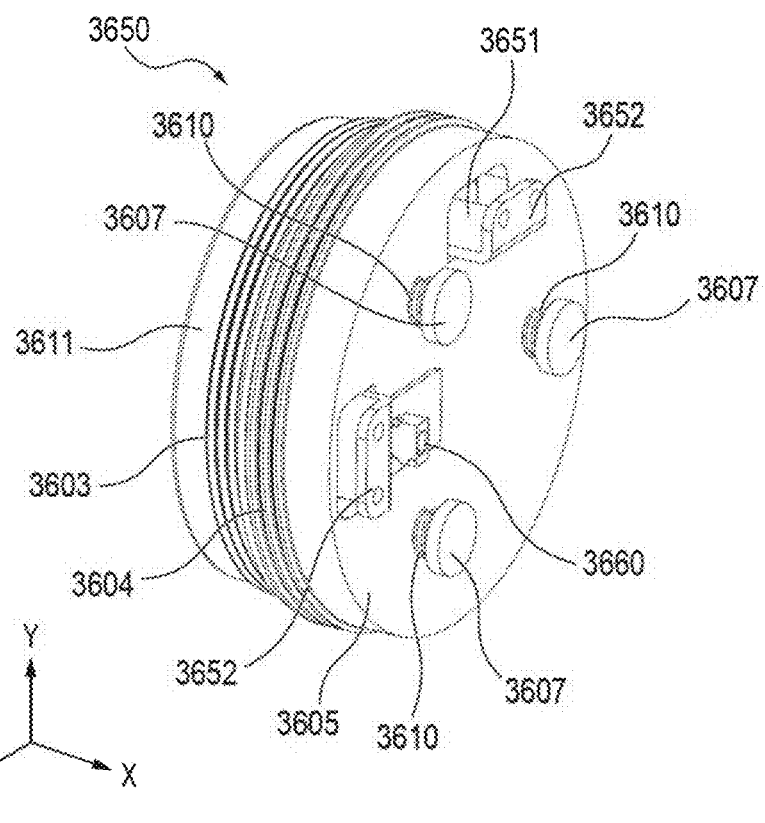

FIGS. 59A and 59B are views useful in explaining the body-side attachment mechanism 3650 included in the image capture apparatus body 3600 shown in FIG. 58. FIG. 59A is a perspective view of the body-side attachment mechanism 3650 as viewed from the outside of the image capture apparatus body 3600, while FIG. 59B is a perspective view of the body-side attachment mechanism 3650 as viewed from the inside of the image capture apparatus body 3600.

Figure 60:
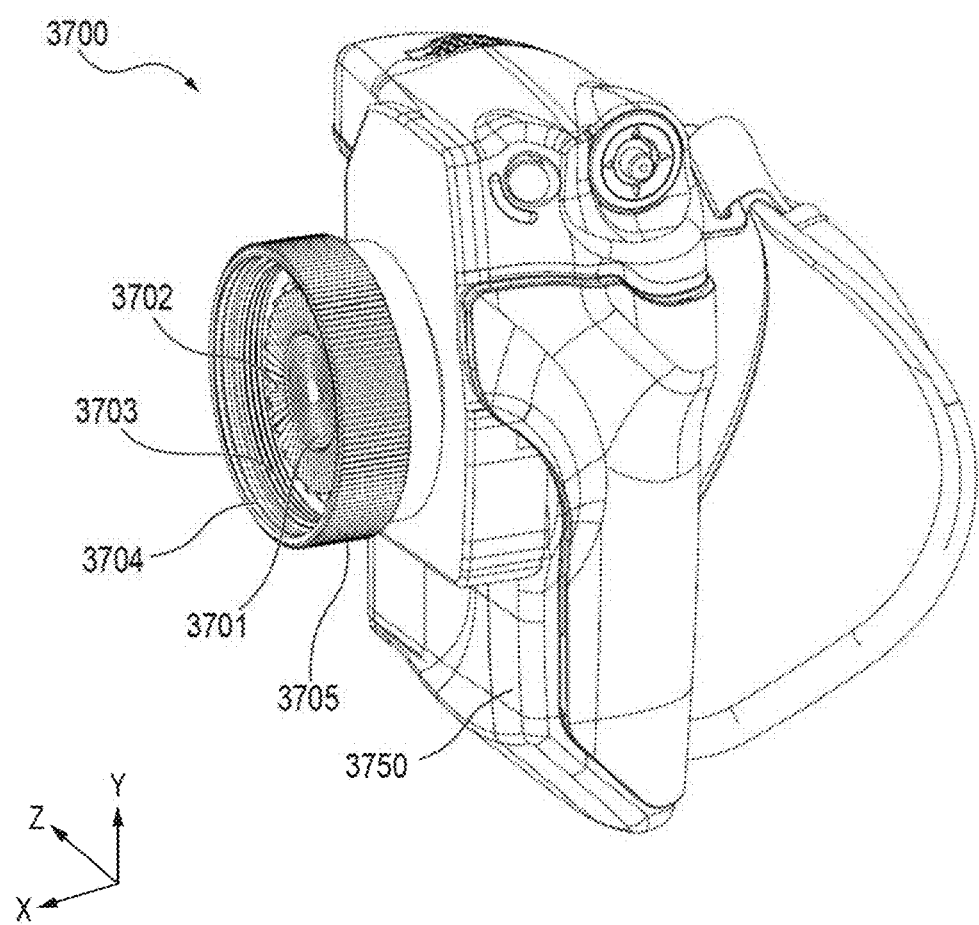
FIG. 60 is a perspective view of the appearance of a grip used in the image capture apparatus body according to the first variation of the second embodiment of the present invention.

Further, FIG. 60 is a perspective view of the appearance of a grip 3700 which can be removably attached to the image capture apparatus body 3600.

Note that the coordinate system is defined as shown in FIG. 58 for convenience of explanation. The Z-axis is defined to extend in a front-rear direction of the image capture apparatus body 3600 (the direction toward a lens on the front side is defined as a +Z direction), the Y-axis is defined to extend in a vertical direction of the image capture apparatus body 3600 (the direction toward a top side is defined as a +Y direction), and the X-axis is defined to extend in a left-right direction of the image capture apparatus body 3600 (the direction toward a right side as viewed from the front, is defined as a +X direction).

Referring to FIG. 58, the image capture apparatus body 3600 includes the body-side attachment mechanism 3650 for fixing an accessory, such as the grip 3700. As shown in FIGS. 59A and 59B, similar to the body-side attachment member 7007 provided in the image capture apparatus body 7002 in the above-described second embodiment, an accessory attachment member called a rosette is used for the body-side attachment mechanism 3650. The body-side attachment mechanism 3650 is firmly fixed to the inside of the image capture apparatus body 3600 by a body-side fixing portion 3652 of a body-side attachment sheet metal 3651 (see FIG. 59B) e.g. with a fastening member. Since the body-side attachment mechanism 3650 is firmly fixed, the body-side attachment mechanism 3650 can strongly support an accessory, such as the grip 3700, attached thereto.

As shown in FIGS. 58, 59A and 59B, the body-side attachment mechanism 3650 includes the body-side attachment member 3601 having a shape of a circle (circular shape). The body-side attachment member 3601 has recessed-shape portions and protruding-shape portions radially formed on a surface thereof exposed to the outside with the center of the circle as the radial center. Similar to the body-side attachment member 3601, a grip-side attachment member 3702 provided on the grip 3700, shown in FIG. 60, has recessed-shape portions and protruding-shape portions radially formed with the center of the circle as the radial center, to form an annular shape.

When the recessed-shape portions and protruding-shape portions of the body-side attachment member 3601 and the protruding-shape portions and recessed-shape portions of the grip-side attachment member 3702 are engaged with each other, the position of the grip 3700 with respect to the image capture apparatus body 3600 is determined.

A first body-side screw 3603 is formed on an outer periphery of an accessory fixing portion 3611 having a bottomed cylindrical shape, for accommodating the body-side attachment member 3601. The first body-side screw 3603 is a screw portion to be screwed with a first grip-side screw 3703 of the grip 3700 shown in FIG. 60 to thereby fix the image capture apparatus body 3600 and the grip 3700.

Further, the grip 3700 is provided with a tightening knob 3705 which can be rotated with respect to a grip body 3750. The first grip-side screw 3703 is formed on the inner peripheral surface of the tightening knob 3705, and the first grip-side screw 3703 is rotated in accordance with the rotational operation of the tightening knob 3705. A second grip-side screw 3704 is formed on the inner peripheral surface of the tightening knob 3705 at a location closer to the tip end (opening end) than the first grip-side screw 3703. With this, the second grip-side screw 3704 is rotated in accordance with rotation of the tightening knob 3705.

The first body-side screw 3603 formed as a male screw is screwed with the first grip-side screw 3703 formed as a female screw to thereby fix the image capture apparatus body 3600 and the grip 3700. That is, the body-side attachment member 3601 and the grip-side attachment member 3702 are engaged with each other, and the first body-side screw 3603 and the first grip-side screw 3703 are screwed with each other by rotating the tightening knob 3705. With this, it is possible to fix the grip 3700 to the image capture apparatus body 3600.

Since the second grip-side screw 3704 is formed on the tip end (opening end) of the tightening knob 3705 as a female screw, when the tightening knob 3705 is rotated, the first grip-side screw 3703 and the second grip-side screw 3704 are rotated in unison. The inner diameter of the second grip-side screw 3704 is larger than the inner diameter of the first grip-side screw 3703. This is because the outer diameter of a second body-side screw 3604, described hereinafter, to be screwed with the second grip-side screw 3704 is larger than the outer diameter of the first body-side screw 3603 to be screwed with the first grip-side screw 3703. The function of the second grip-side screw 3704 will be described hereinafter.

As shown in FIGS. 59A and 59B, the body-side attachment mechanism 3650 has the contact part 3602 to be connected to the grip 3700. The contact part 3602 is electrically connected to the inside of the image capture apparatus body 3600 via an electrical connection portion 3660.

On the other hand, as shown in FIG. 60, the grip 3700 is formed with a grip-side contact pattern 3701 to be electrically connected to the image capture apparatus body 3600. The grip-side contact pattern 3701 is brought into contact with the contact part 3602 to achieve electrical connection thereto.

The grip-side contact pattern 3701 is formed by concentric traces with the axial center of the grip-side attachment member 3702 as the center. With this, when the grip 3700 is attached to the image capture apparatus body 3600 by rotating through a desired angle, the grip-side contact pattern 3701 and the contact part 3602 are brought into contact with each other, whereby it is possible to electrically connect the grip 3700 and the image capture apparatus body 3600. In this state, power supply, communication, and so forth can be performed between the image capture apparatus body 360 and the grip 3700. In the illustrated example, the contact part 3602 has five pins and the grip-side contact pattern 3701 has five circumferential traces so as to be associated with the five pins, respectively.

In a state in which the grip 3700 has not been fixed to the image capture apparatus body 3600, the contact part 3602 is retracted so as to protect the contact part 3602. This retracting operation will be described hereinafter.

Figure 61A:
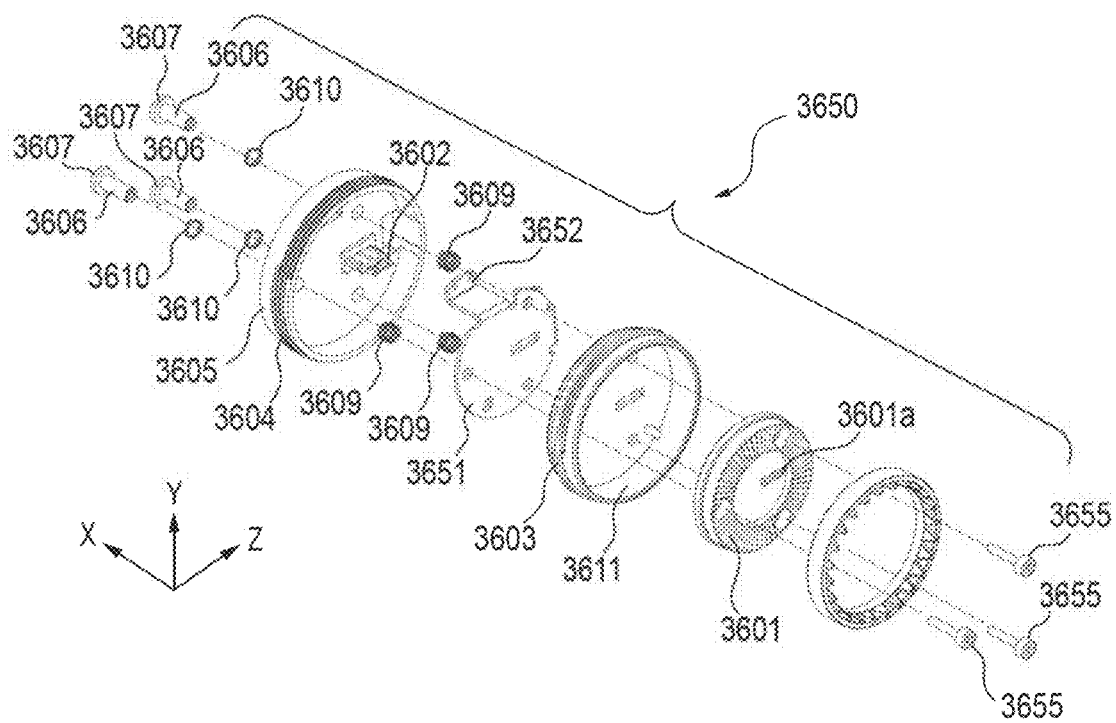
FIGS. 61A and 61B are exploded perspective views of the body-side attachment mechanism shown in FIGS. 59A and 59B.
Figure 61B:
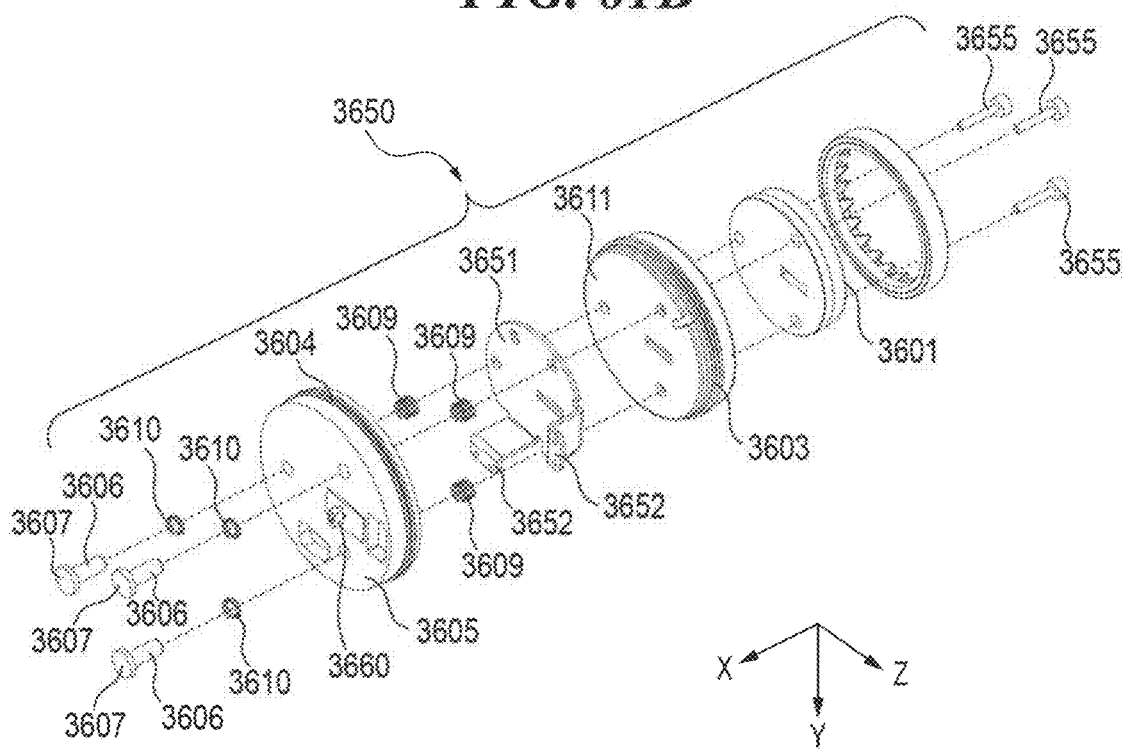

FIGS. 61A and 61B are exploded perspective views of the body-side attachment mechanism 3650 shown in FIGS. 59A and 59B. FIG. 61A shows the body-side attachment mechanism 3650 as viewed from the outside of the image capture apparatus body 3600, and FIG. 61B shows the body-side attachment mechanism 3650 as viewed from the inside of the image capture apparatus body 3600.

In the body-side attachment mechanism 3650, the body-side attachment member 3601, the accessory fixing portion 3611, and the body-side attachment sheet metal 3651 are jointly fastened by three shaft members 3606 and three screws 3655. The shaft members 3606 are inserted through a contact unit 3605 having the contact part 3602 and the electrical connection portion 3660. The contact unit 3605 is slidable along the shaft members 3606 between shaft stoppers 3607 and the body-side attachment sheet metal 3651.

With this, when the contact unit 3605 is slid in the −X direction, a tip end of the contact part 3602 is moved to the −X direction side of an attachment member contact surface 3601a, whereby the contact part 3602 is exposed. On the other hand, when the contact unit 3605 is slid in the +X direction, the tip end of the contact part 3602 is moved to the +X direction side of the attachment member contact surface 3601a, whereby the contact part 3602 is retracted.

The shaft members 3606 are inserted not only the contact unit 3605, but also through first springs 3609 and second springs 3610. The first springs 3609 urge the contact unit 3605 in the +X direction while the second springs 3610 urge the contact unit 3605 in the −X direction.

The contact unit 3605 has the second body-side screw 3604 formed on the outer peripheral surface thereof as a male screw, which has a screw pitch different from the first body-side screw 3603 and is screwed with the second grip-side screw 3704. The axis of the second body-side screw 3604 is positioned on the same axis as that of the first body-side screw 3603 (the second body-side screw 3604 and the first body-side screw 3603 are coaxially arranged).

Since the contact unit 3605 is slidable along the shaft members 3606 between the shaft stoppers 3607 and the body-side attachment sheet metal 3651, as described above, when the contact unit 3605 is slid in the −X direction, the tip end of the contact part 3602 is moved to the −X direction side of the attachment member contact surface 3601a, whereby the contact part 3602 is exposed.

On the other hand, when the contact unit 3605 is slid in the +X direction, the tip end of the contact part 3602 is moved to the +X direction side of the attachment member contact surface 3601a, whereby the contact part 3602 is retracted. Five contact springs 3608 (see FIGS. 62A and 62B) are arranged inward of (on the +X direction side of) the five pins of the contact part 3602 in association therewith, respectively. In a case where a force is applied to the pins of the contact part 3602 in the +X direction, the contact springs 3608 are compressed, whereby the pins are pressed inward of the contact part 3602 (in the +X direction) to be prevented from being broken.

The electrical connection portion 3660 is electrically connected to the inside of the image capture apparatus body 3600 and the electrical connection portion 3660 and the five pins of the contact part 3602 are electrically connected to each other. Therefore, in a case where the contact part 3602 is in contact with the grip-side contact pattern 3701, it is possible to send electrical power and electrical signals from the inside of the image capture apparatus body 3600 to the grip 3700.

Figure 62A:
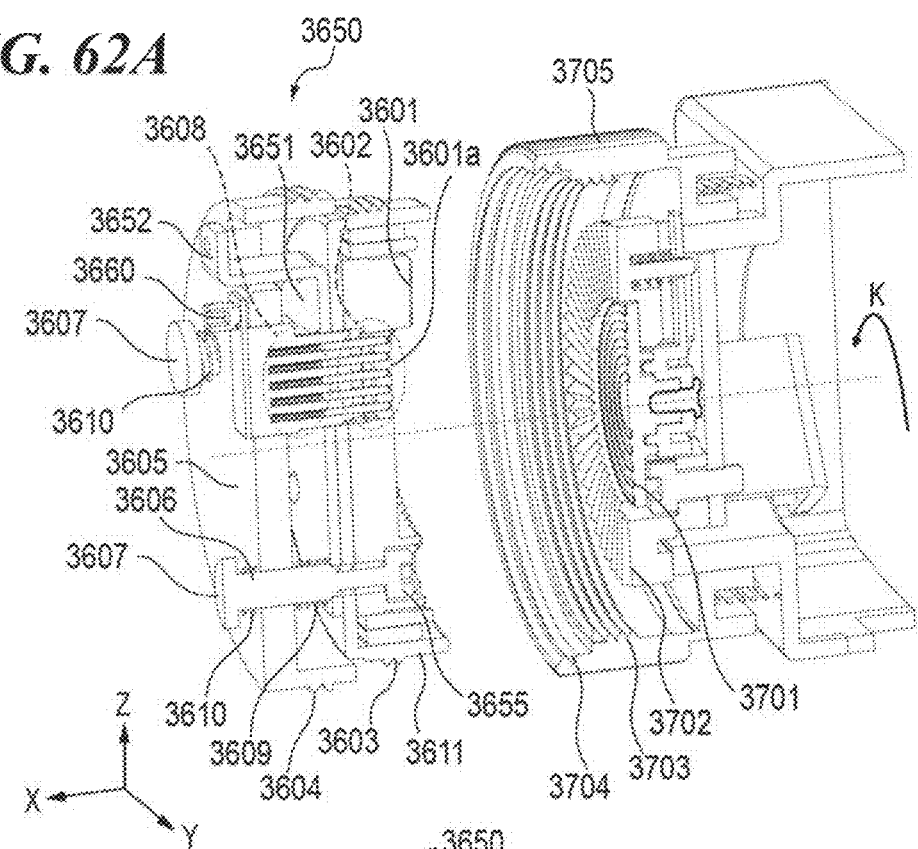
FIGS. 62A and 62B are first broken perspective views of the body-side attachment mechanism shown in FIGS. 59A and 59B and a grip-side attachment member appearing in FIG. 60.
Figure 62B:
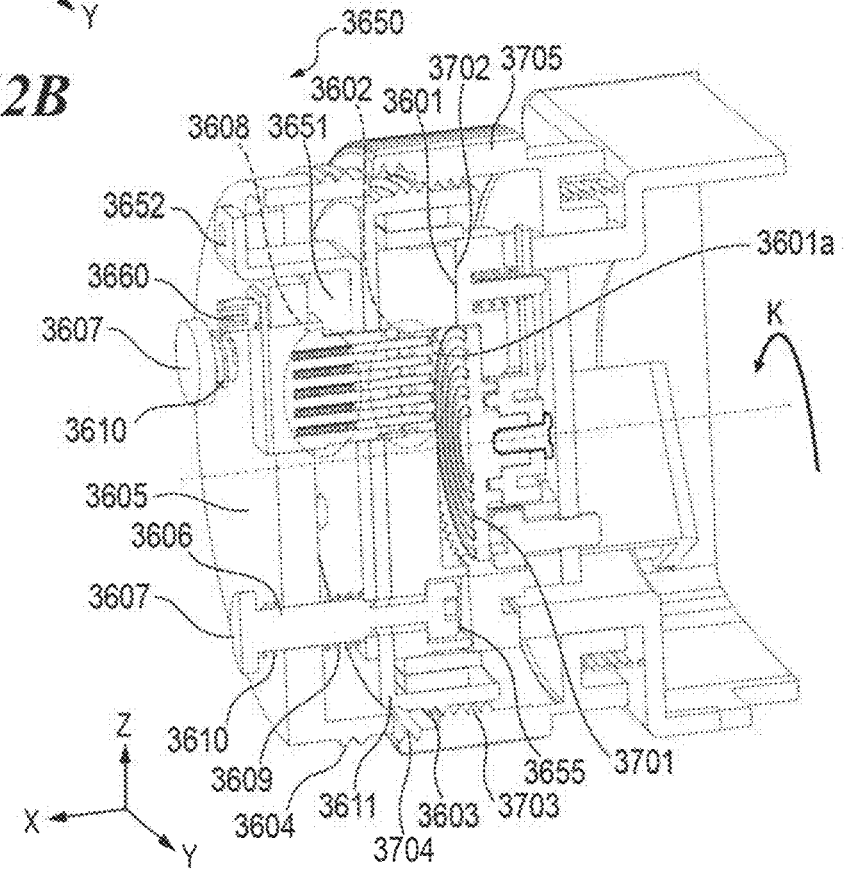
Figure 63A:
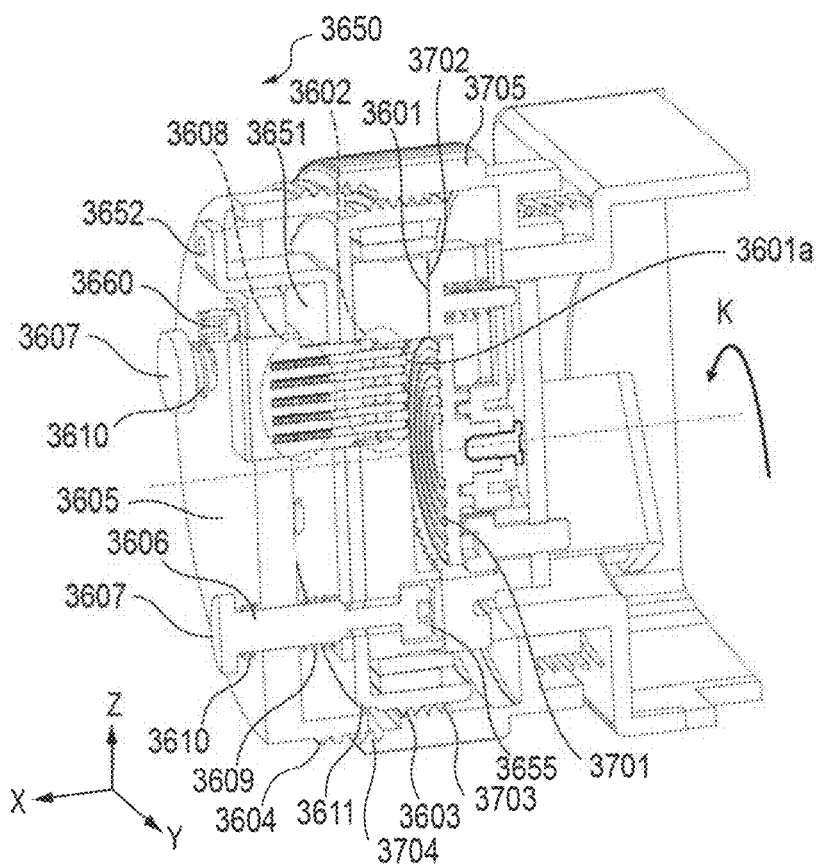
FIGS. 63A and 63B are second broken perspective views of the body-side attachment mechanism shown in FIGS. 59A and 59B and the grip-side attachment member appearing in FIG. 60.
Figure 63B:
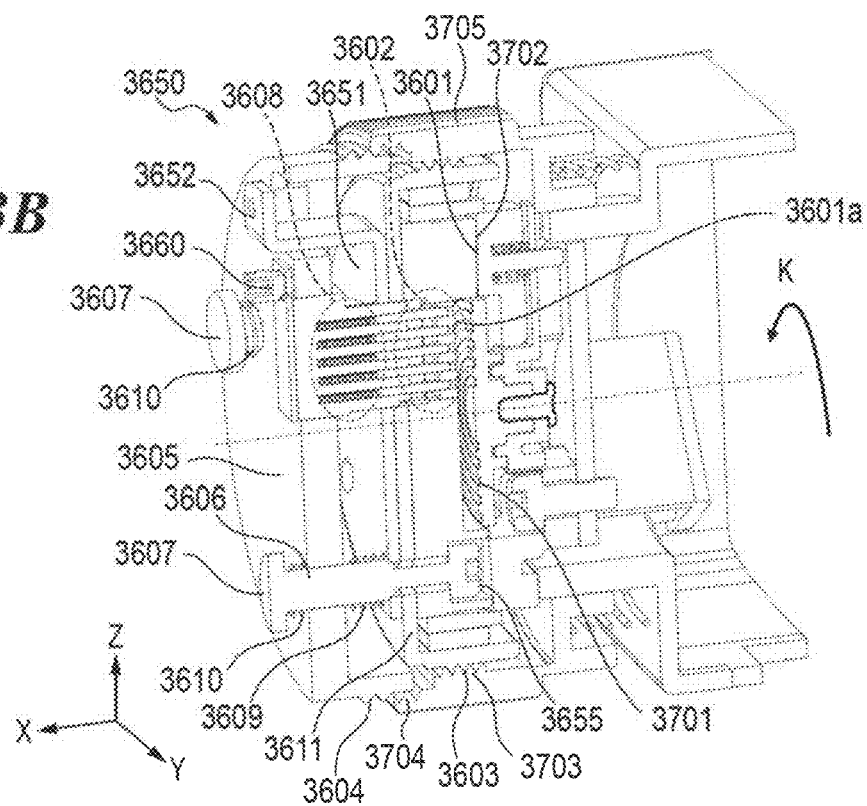
Figure 64A:
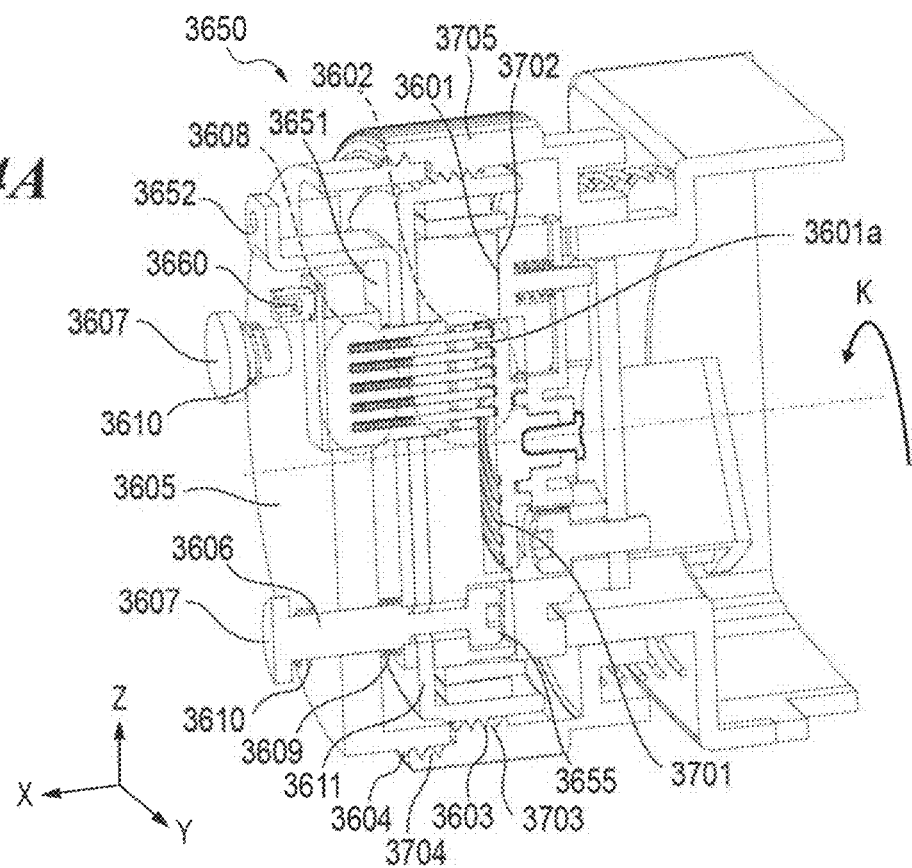
FIGS. 64A and 64B are third broken perspective views of the body-side attachment mechanism shown in FIGS. 59A and 59B and the grip-side attachment member appearing in FIG. 60.
Figure 64B:
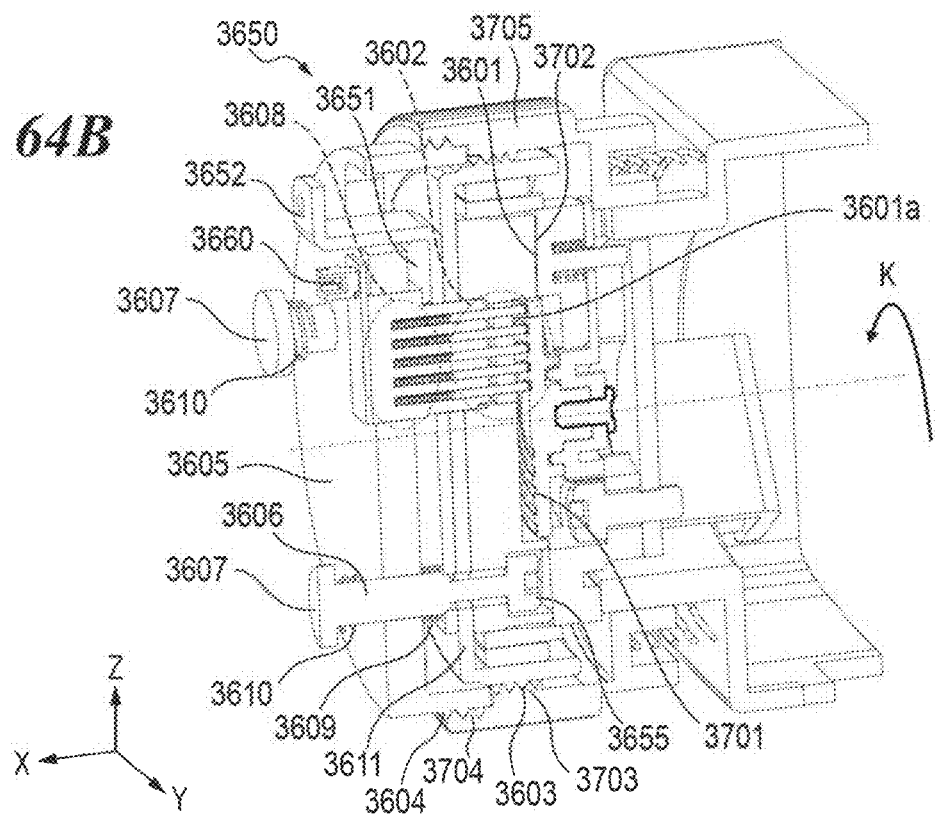

FIGS. 62A to 64B are broken perspective views of the body-side attachment mechanism 3650 and the grip-side attachment member 3702. FIG. 62A shows a state before the body-side attachment member 3601 and the grip-side attachment member 3702 are engaged with each other, and FIG. 62B shows a state in which the body-side attachment member 3601 and the grip-side attachment member 3702 have been engaged with each other. Further, FIG. 63A shows a state in which the first body-side screw 3603 and the first grip-side screw 3703 have started to be screwed with each other, and FIG. 63B shows a state in which the second body-side screw 3604 and the second grip-side screw 3704 have been brought into contact with each other. Further, FIG. 64A shows a state in which the second body-side screw 3604 and the second grip-side screw 3704 have started to be screwed with each other, and FIG. 64B shows a state in which the grip 3700 has been fixed to the image capture apparatus body 3600.

In FIG. 62A, the body-side attachment member 3601 and the grip-side attachment member 3702 are not engaged with each other, and the grip 3700 and the image capture apparatus body 3600 are separate from each other. In this state, the first springs 3609 apply forces in a direction in which the body-side attachment member 3601 and the contact unit 3605 are moved away from each other along the X-axis, i.e. in a direction in which the contact unit 3605 is urged into the image capture apparatus body. Therefore, the first springs 3609 position the contact part 3602 provided on the contact unit 3605 on a +X direction side of the attachment member contact surface 3601a, thereby placing the same in a retracted position.

Further, in the state shown in FIG. 62A, the second springs 3610 apply forces in a direction in which the contact unit 3605 and the sha stoppers 3607 are moved away from each other along the X-axis.

For this reason, the contact unit 3605 is not stably positioned between the body-side attachment member 3601 and the shaft stoppers 3607, and there is a possibility that the contact part 3602 is exposed even in the state shown in FIG. 62A. To prevent this, in the illustrated example, the spring balance between the first springs 3609 and the second springs 3610 is adjusted such that the contact part 3602 is always positioned on the +X direction side of the attachment member contact surface 3101a to place the contact part 3102 in the retracted position, in the state shown in FIG. 62A.

From the state shown in FIG. 62A, when the body-side attachment member 3601 and the grip-side attachment member 3702 are engaged by adjusting the phases thereof, this results in the state shown in FIG. 62B. When the tightening knob 3705 is rotated in the clockwise direction (direction indicated by an arrow K) in this state, the first grip-side screw 3703 is rotated in the clockwise direction (direction indicated by the arrow K) in accordance with this rotational operation. As the first grip-side screw 3703 is rotated, the first grip-side screw 3703 and the first body-side screw 3603 are screwed with each other, whereby the first grip-side screw 3703 advances into the image capture apparatus body 3600 (in the +X direction) while rotating. This results in the state shown in FIG. 63A.

The diameter of the second grip-side screw 3704 is set to be larger than the diameter of the first grip-side screw 3703 so as to prevent the second grip-side screw 3704 from interfering with the first body-side screw 3603 in the state shown in FIG. 63A.

As the tightening knob 3705 is further rotated in the clockwise direction (direction indicated by the arrow K), the first grip-side screw 3703 further advances into the image capture apparatus body 3600 (in the +X direction). As a result, the second grip-side screw 3704 formed on the tip end of the first grip-side screw 3703 is brought into contact with the second body-side screw 3604 formed in the contact unit 3605, resulting in the state shown in FIG. 63B.

The first grip-side screw 3703 and the second grip-side screw 3704 are formed on the same member, and further, these screws have the same rotational axis, and hence the first grip-side screw 3703 and the second grip-side screw 3704 are rotated together and advance into the image capture apparatus body 3600.

When the first grip-side screw 3703 and the second grip-side screw 3704 are further rotated in the clockwise direction (direction indicated by the arrow K) in the state in which the second grip-side screw 3704 and the second body-side screw 3604 have been brought into contact with each other, a force of pressing the contact unit 3605 into the image capture apparatus body 3600 (+X direction) is applied from portions in contact and the second springs 3610 are compressed via the contact unit 3605, whereby the contact unit 3605 advances into the image capture apparatus body 3600 (in the +X direction).

Thus, as the second grip-side screw 3704 is rotated to press the contact unit 3605 forward, the screw thread of the second grip-side screw 3704 and that of the second body-side screw 3604 come to mesh with each other. Here, to cause the screw thread of the second grip-side screw 3704 and the screw thread of the second body-side screw 3604 to mesh with each other, one rotation of the second grip-side screw 3704 is required at the maximum after these screws have come into contact with each other. For this reason, it is necessary to make the contact unit 3605 movable into the image capture apparatus body 3600 (in the +X direction) over at least a distance in which the first grip-side screw 3703 advances into the image capture apparatus body 3600 (in the +X direction) by one rotation of the first grip-side screw 3703.

In the illustrated example, the contact unit 3605, the shaft members 3606, and the second springs 3610 are configured such that the contact unit 3605 can be slid over a distance over which the first grip-side screw 3703 advances by two rotations of the first grip-side screw 3703.

When the tightening knob 3705 is further rotated in the clockwise direction (direction indicated by the arrow K) from the state shown in FIG. 63B, the first grip-side screw 3703 meshed with the first body-side screw 3603 advances into the image capture apparatus body 3600 (in the +X direction) while rotating. With this, the second body-side screw 3604 and the second grip-side screw 3704 also come to be screwed with each other, resulting in the state shown in FIG. 64A.

In the illustrated example, the second grip-side screw 3704 is larger in screw pitch than the first grip-side screw 3703. Therefore, the second grip-side screw 3704 is moved over a larger distance in the axial direction by one rotation than the first grip-side screw 3703.

Let it be assumed, for example, that the second grip-side screw 3704 and the first grip-side screw 3703 have the same screw pitch. In this case, even when the first body-side screw 3603 and the first grip-side screw 3703 are screwed and also the second body-side screw 3604 and the second grip-side screw 3704 are screwed, the distance between the body-side attachment member 3601 and the contact unit 3605 is not changed.

On the other hand, by making the second grip-side screw 3704 larger in screw pitch than the first grip-side screw 3703, it is possible to cause the contact unit 3605 to slide in a direction in which the contact unit 3605 approaches the body-side attachment member 3601 (−X direction).

When the contact unit 3605 is slid in the direction of approaching the body-side attachment member 3601 (−X direction), the contact part 3602 is moved to the −X direction side of the attachment member contact surface 3601a. With this, the contact part 3602 is exposed and is brought into contact with the grip-side contact pattern 3701, resulting in the state shown in FIG. 64A, whereby it is possible to perform power supply and communication between the image capture apparatus body 3600 and the grip 3700.

When the tightening knob 3705 is further rotated in the clockwise direction (direction indicated by the arrow K) from the state shown in FIG. 64A, this results in the state shown in FIG. 648. In this state, the body-side attachment member 3601 and the grip-side attachment member 3702 are tightened by the first grip-side screw 3703 and the first body-side screw 3603, whereby the grip 3700 is firmly fixed to the image capture apparatus body 3600.

In the state shown in FIG. 64B, the body-side attachment member 3601 and the contact unit 3605 is closer to each other than in the state shown in FIG. 64A, and a force is applied in a direction of causing the grip-side contact pattern 3701 to crush the contact part 3602. However, the contact springs 3608 arranged at the root part of the contact part 3602 are compressed, whereby the contact part 3602 is prevented from being broken by being crushed.

To remove the grip 3700 from the image capture apparatus body 3600, it is only required to perform a reverse operation to the operation described with reference to FIGS. 62A to 64B. This makes it possible to easily remove the grip 3700.

As described above, only in a case where the grip 3700 having the second grip-side screw 3704 and the grip-side contact pattern 3701 is attached to the body-side attachment mechanism 3650, it is possible to cause the contact part 3602 to be exposed, and thereby electrically connect the same with the grip-side contact pattern 3701.

On the other hand, in a case where the grip 3700 is not attached to the body-side attachment mechanism 3650, the second body-side screw 3604 is not screwed, and hence the contact part 3602 is not exposed. Further, even when another device or the like carelessly touches the components around the grip-side attachment member 3702, thereby applying an external force in direction in which the grip-side attachment member 3702 is pressed in (in the +X direction), the contact part 3602 is prevented from being exposed.

As described above, the contact part 3602 is caused to be exposed and retract depending on a situation, whereby it is possible to prevent unintended contact with contact terminals and breakage of the contact terminals.

Next, a description will be given of an example of an image capture apparatus according to a third embodiment of the present invention.

Figure 65:
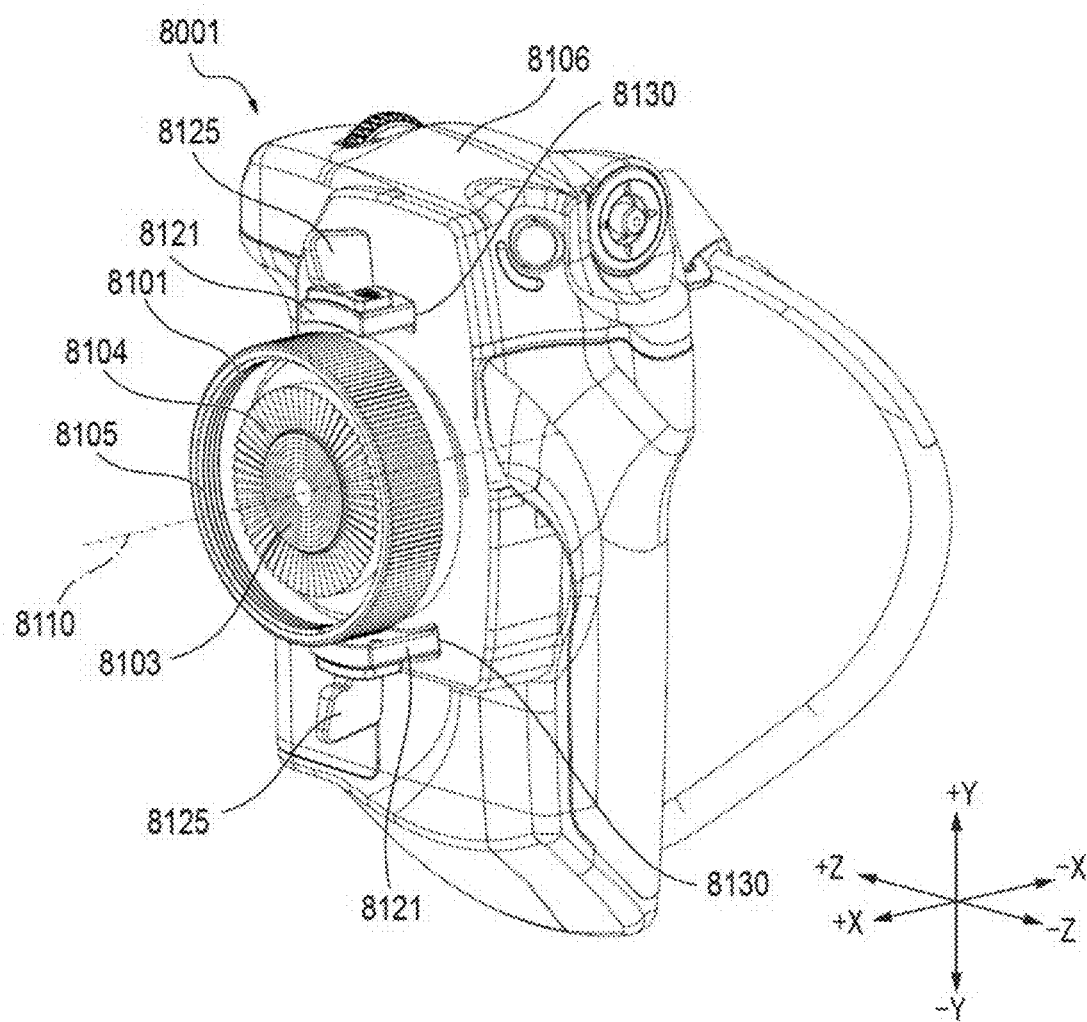
FIG. 65 is a rear perspective view of a grip used in an image capture apparatus according to a third embodiment of the present invention, as viewed from the rear.
Figure 66:
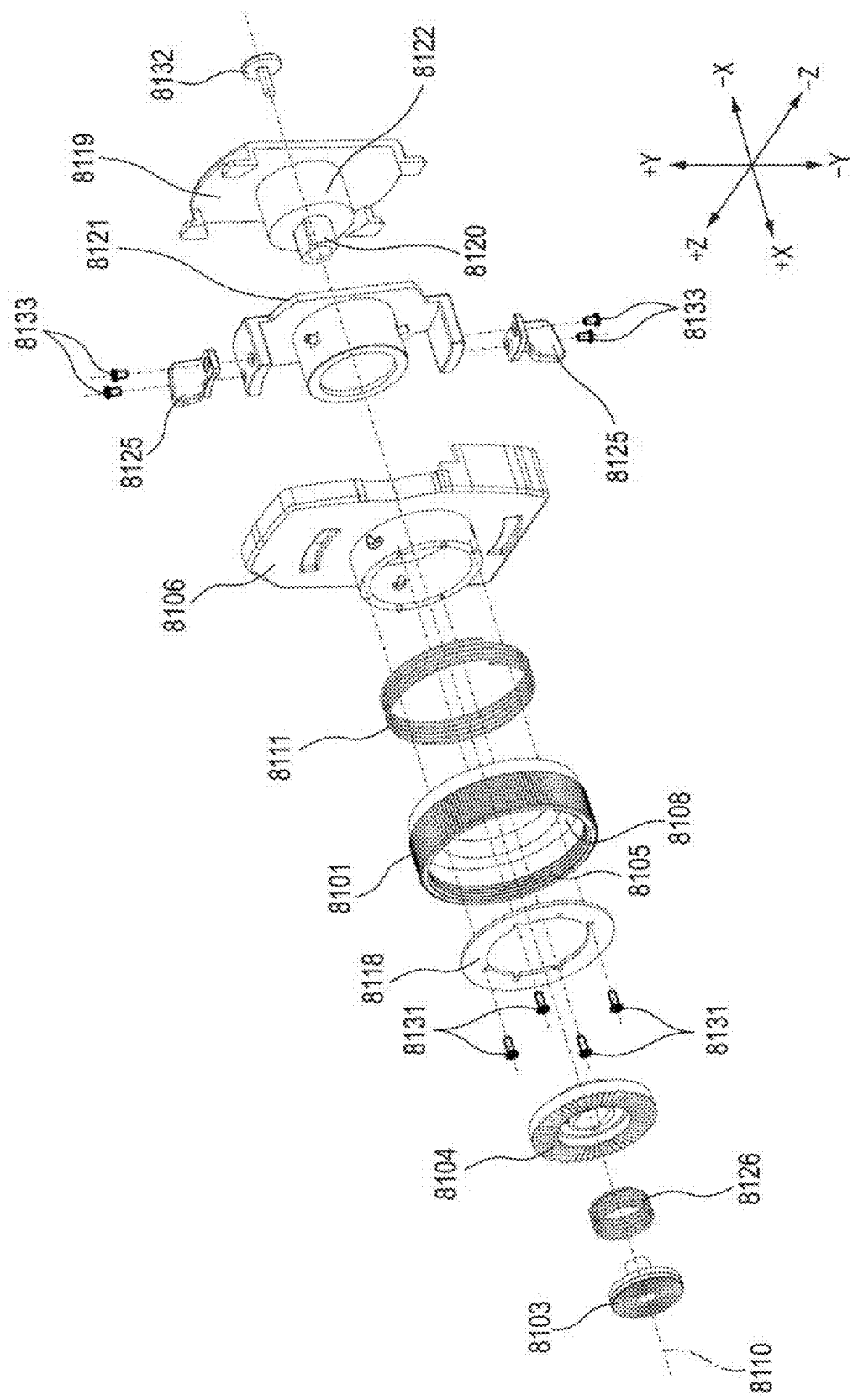
FIG. 66 is an exploded perspective view of the grip shown in FIG. 65.
Figure 67:
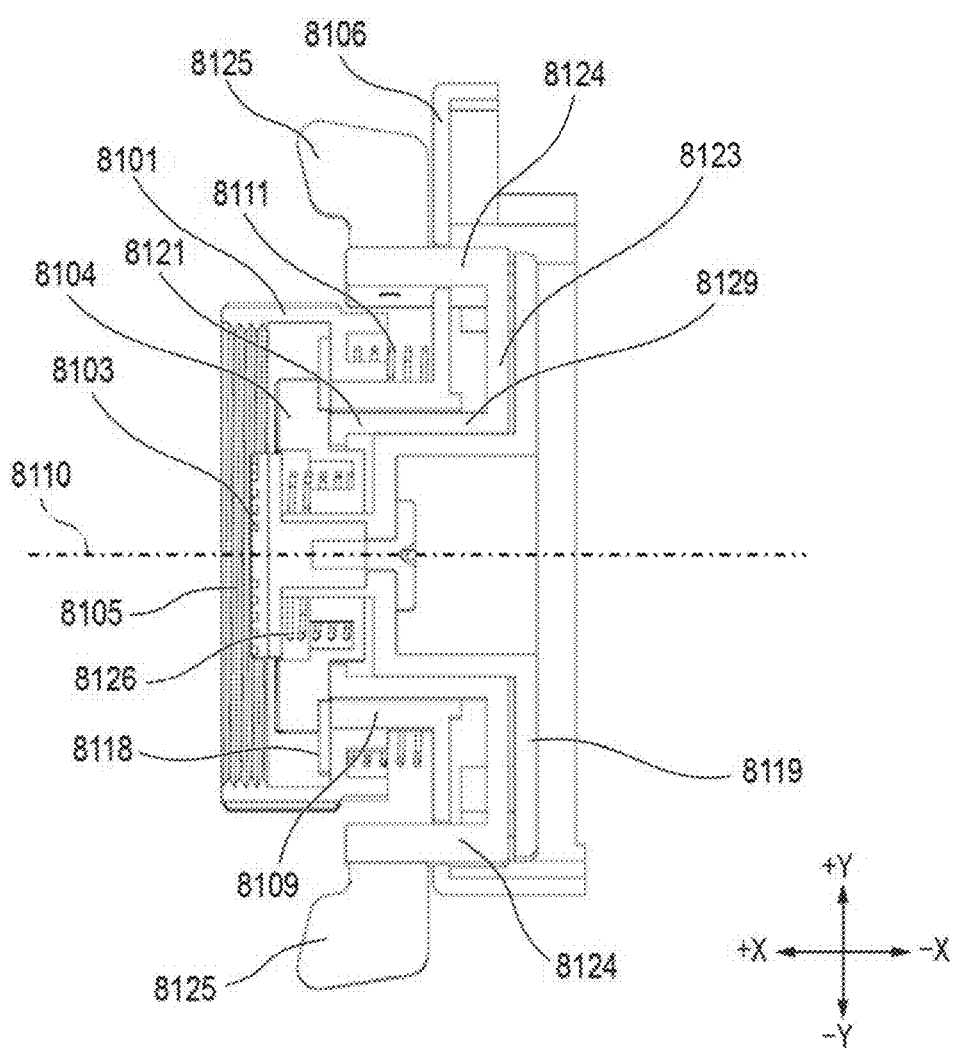
FIG. 67 is a partial cross-sectional view showing a structure of part, joined to the image capture apparatus body, of the grip appearing in FIG. 65.
Figure 68:
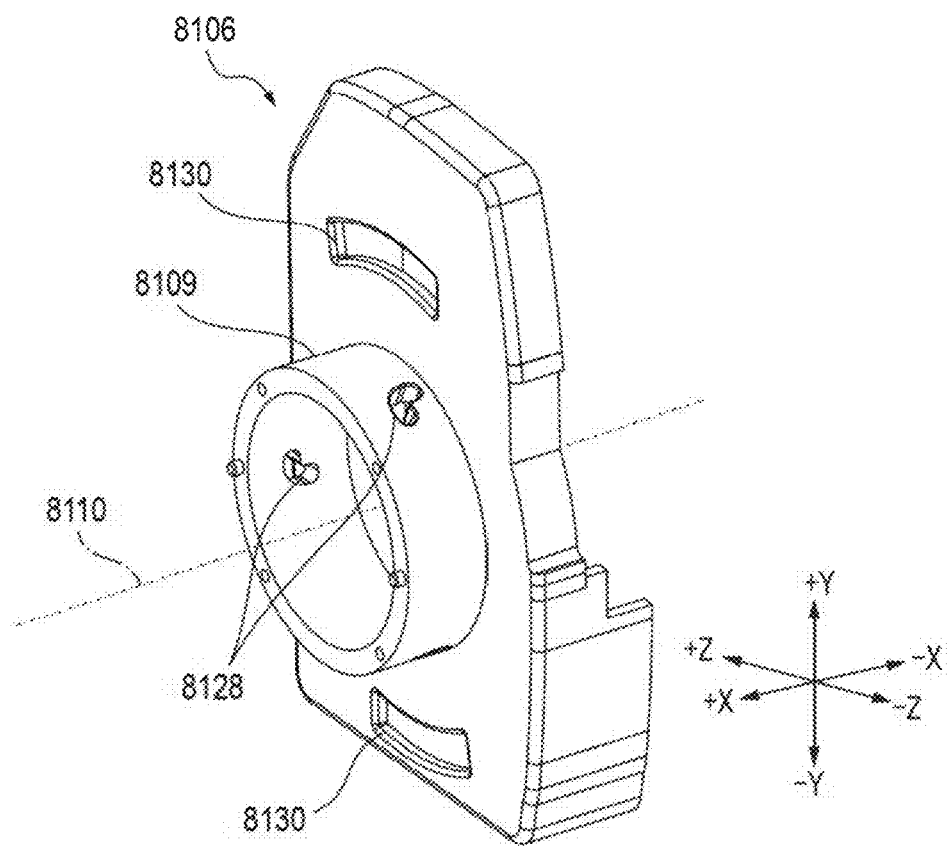
FIG. 68 is a view of details of part of an exterior member of the grip shown in FIG. 65.

FIG. 65 is a perspective view of a grip 8001 used in the image capture apparatus according to the third embodiment of the present invention, as viewed from the rear. FIG. 66 is an exploded perspective view of an attachment part provided in the grip 8001, shown in FIG. 65, which is attached to an image capture apparatus body. FIG. 67 is a partial cross-sectional view of the attachment part of the grip 8001 shown in FIG. 65. FIG. 68 is a view of details of part of an exterior member of the grip 8001.

Figure 69A:
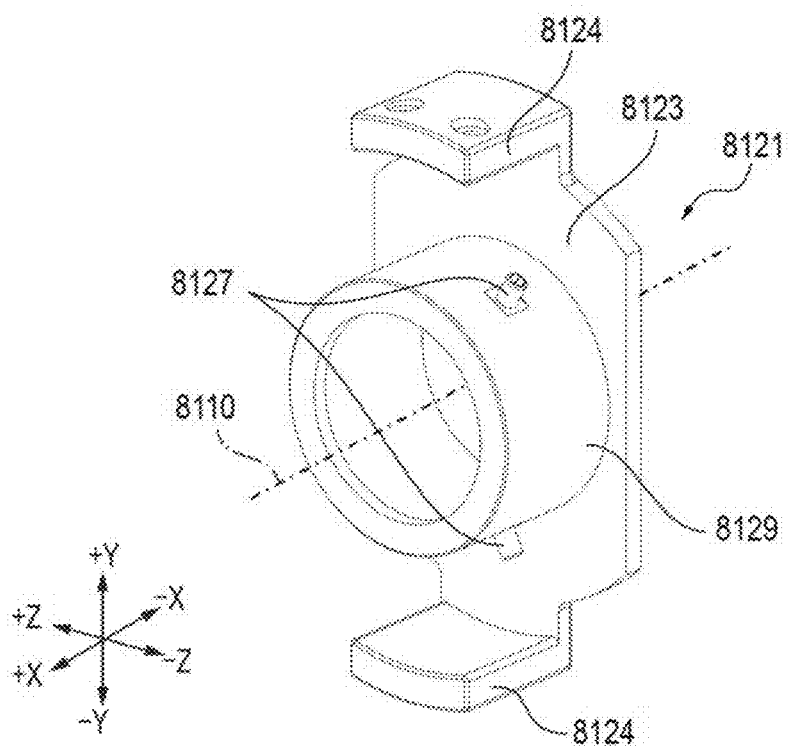
FIG. 69A is a perspective view of an attachment member-driving lever used in the grip shown in FIG. 65.
Figure 69B:
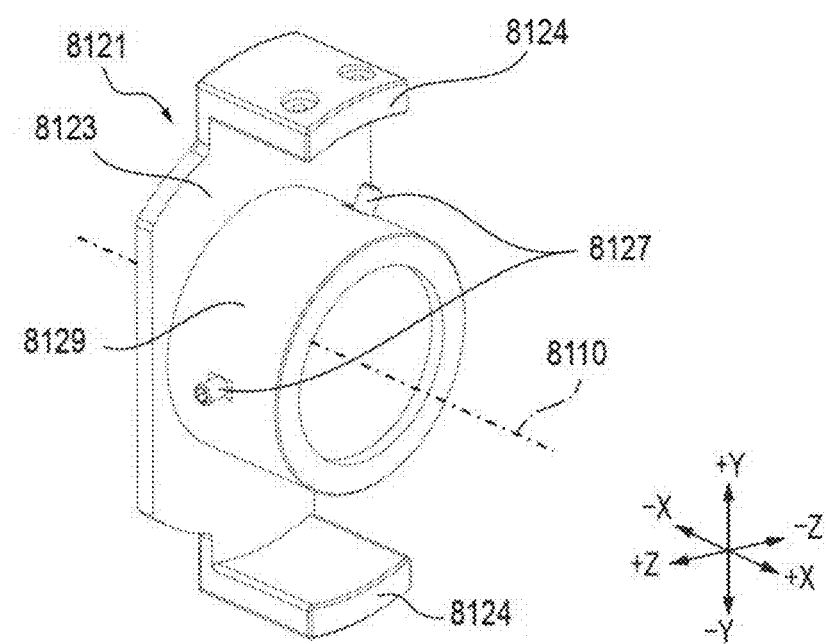
FIG. 69B is another perspective view of the attachment member-driving lever used in the grip shown in FIG. 65.
Figure 69C:
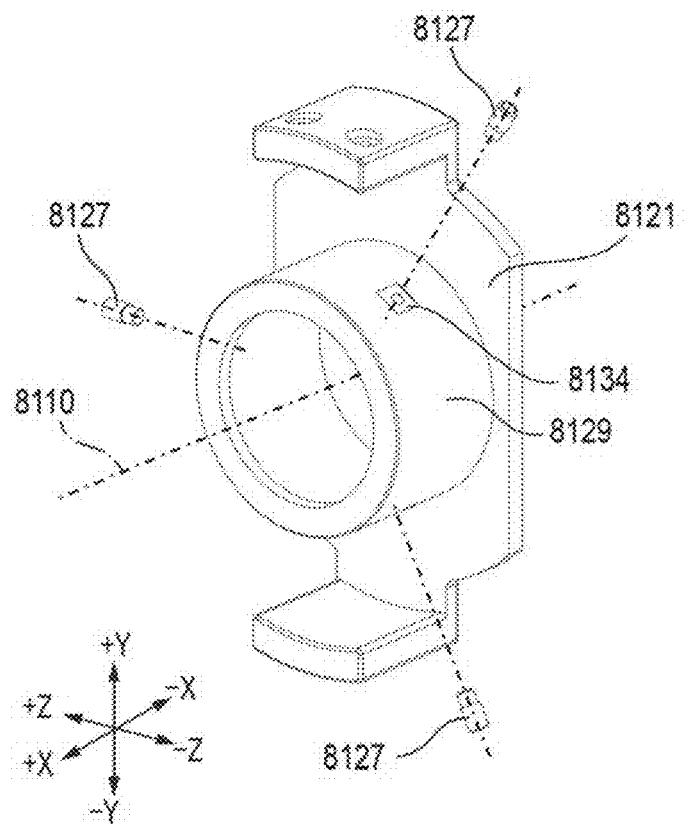
FIG. 69C is an exploded perspective view of the attachment member-driving lever and guide pins.
Figure 69D:
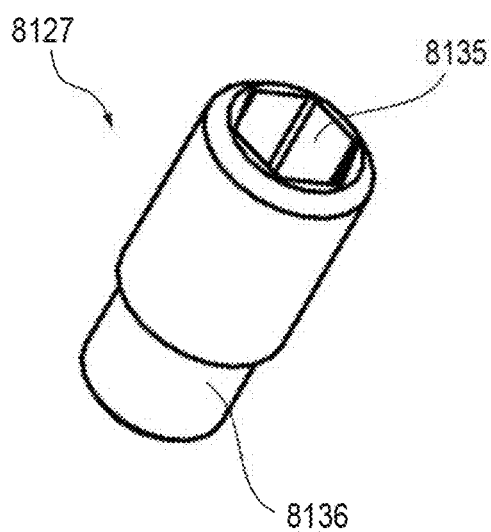
FIG. 69D is a perspective view of the guide pin.

FIGS. 69A and 69B are perspective views of an attachment member-driving lever 8121 used in the grip 8001 shown in FIG. 65, FIG. 69C is an exploded perspective view of the attachment member-driving lever 8121 and guide pins 8127, and FIG. 69D is a perspective view of a guide pin 8127.

The grip 8001 is a type of accessory that is used to facilitate user's action for performing shooting while holding the above-described image capture apparatus body 7002 (see e.g. FIG. 48), and is removably attached to the image capture apparatus body 7002. Note that the accessory attached to the image capture apparatus body 7002 is only required to have a structure that enables the accessory to be attached to the body-side attachment mechanism 7005, and is not limited to the grip 8001. Further, the construction of the image capture apparatus body 7002 has been described in detail, and hence description thereof is omitted here.

An exterior member 8106 of the grip 8001 contains a circuit board, a wiring pattern, and a structure member (none of which are shown) and has a portion held by a user and a portion where operation members including a push button and a dial are exposed.

As shown in FIG. 68, the exterior member 8106 has a portion formed with a hollow cylindrical protruding portion 8109 on which a grip-side screwing member 8101, described hereinafter, is fitted. Further, a plurality of guide holes 8128 opens in the cylindrical side surface of the hollow cylindrical protruding portion 8109, and the guide pins 8127 arranged on the attachment member-driving lever 8121, described hereinafter, are fitted, in the guide holes 8128, respectively. Further, the side surface of the exterior member 8106 has attachment portion opening holes 8130 formed therethrough for causing operating-knob attachment portions 8124 formed on the attachment member-driving lever 8121 to be exposed to the outside of the grip 8001.

The grip-side screwing member 8101 has a screw shape portion 8105 formed in an inner peripheral side surface thereof, for being screwed with the body-side screwing member 7006. In the illustrated example, the screw shape portion 8105 is formed into a female screw shape portion so as to be screwed with a male screw shape portion of the body-side screwing member 7006.

The grip-side screwing member 8101 has an inner peripheral fitting portion 8108, and the inner peripheral fitting portion 8108 is fitted on the outer peripheral surface of the hollow cylindrical protruding portion 8109 formed on the exterior member 8106. With this, the grip-side screwing member 8101 is made rotatable about a rotational axis 8110 with respect to the exterior member 8106. Note that the rotational axis 8110 is parallel to the X axis passing the center of the grip-side screwing member 8101.

The grip-side screwing member 8101 is always urged toward a stopper member 8118 (in the +X direction) by a screwing member-urging spring 8111 formed by a compression spring. The screwing member-urging spring 8111 is sandwiched and held between the exterior member 8106 and the grip-side screwing member 8101 in a compressed state.

The stopper member 8118 prevents the grip-side screwing member 8101 receiving the urging force generated by compression of the screwing member-urging spring 8111 from coming off from the hollow cylindrical protruding portion 8109 and is fixed to the tip end of the hollow cylindrical protruding portion 8109 with screws 8131.

A contact pattern 8103 is formed by traces concentrically formed on a circuit board as electrical contacts which can be electrically connected to the body-side contact pins 7010 of the image capture apparatus body 7002. When the body-side contact pins 7010 and the traces of the contact pattern 8103 are electrically connected to each other, it is possible to perform power supply and communication between the image capture apparatus body 7002 and the grip 8001.

The contact pattern 8103 is formed e.g. by a molded interconnect device (MID), and is fixed to the inside of the exterior member 8106 via a contact pattern-holding member 8119 with a screw 8132.

The contact pattern-holding member 8119 is fixed to the inside of the grip 8001 with screws (not shown). The contact pattern-holding member 8119 has an attachment member-fitting portion 8120 and a driving lever-fitting portion 8122. A grip-side engagement part 8104 is fitted on the attachment member-fitting portion 8120 such that the grip-side engagement part 8104 is translationally movable with respect to the contact pattern-holding member 8119. Further, the attachment member-driving lever 8121 is fitted on the driving lever-fitting portion 8122 such that the attachment member-driving lever 8121 is rotatable and translationally movable with respect to the contact pattern-holding member 8119.

As shown in FIGS. 66, 69A, and 69B, the attachment member-driving lever 8121 has a holding member-fitting portion 8129 that is fitted on the driving lever-fitting portion 8122. A base portion 8123 extends from the periphery of the holding member-fitting portion 8129. The operating-knob attachment portions 8124 are arranged on the base portion 8123. Further, the operating-knob attachment portions 8124 are partially exposed from the attachment portion opening holes 8130 formed in the exterior member 8106.

Lever operating knobs 8125 are fixed from the outside of the attachment member-driving lever 8121 with screws 8133, and a user uses the lever operating knobs 8125 when operating the attachment member-driving lever 8121.

Guide pin attachment portions 8134 are arranged on the outer peripheral surface of the holding member-fitting portion 8129 and the guide pins 8127 are fixed on the guide pin attachment portions 8134, respectively. After the attachment member-driving lever 8121 has been attached to the exterior member 8106, the guide pins 8127 are mounted on the guide pin attachment portions 8134 from outside the hollow cylindrical protruding portion 8109 such that the guide pins 8127 fitted in the guide holes 8128 formed through circumferential portions of the hollow cylindrical protruding portion 8109.

As shown in FIG. 69D, each guide pin 8127 has a tool hole 8135 and a male screw portion 8136. When attaching the guide pin 8127 to the attachment member-driving lever 8121, a predetermined tool is inserted in the tool hole 8135 and the guide pin 8127 is rotated using the tool. With this, the male screw portion 8136 is fixed to a female screw portion (not shown) formed in each guide pin attachment portion 8134. It is desirable to apply an adhesive to the male screw portion 8136 to prevent the guide pin 8127 from coming off during use.

The grip-side engagement part 8104 has predetermined recessed-shape portions and protruding-shape portions on a surface thereof and is engaged with the above-described body-side engagement part 7008. With this, the grip-side engagement part 8104 restricts the grip 8001 from rotating about the rotational axis 8110.

The grip-side engagement part 8104 is always pressed toward the tip end of the holding member-fitting portion 8129 of the attachment member-driving lever 8121 (in the −X direction) by an attachment member-urging spring 8126 held between the contact pattern 8103 and the grip-side engagement part 8104 in a compressed state. The grip-side engagement part 8104 is moved in the X direction by the pressing force of the attachment member-urging spring 8126 in conjunction with the translational movement (movement in the X direction) of the attachment member-driving lever 8121.

Here, mechanical connection and electrical connection when the grip 8001 is attached to the image capture apparatus body 7002 will be described.

Figure 70:
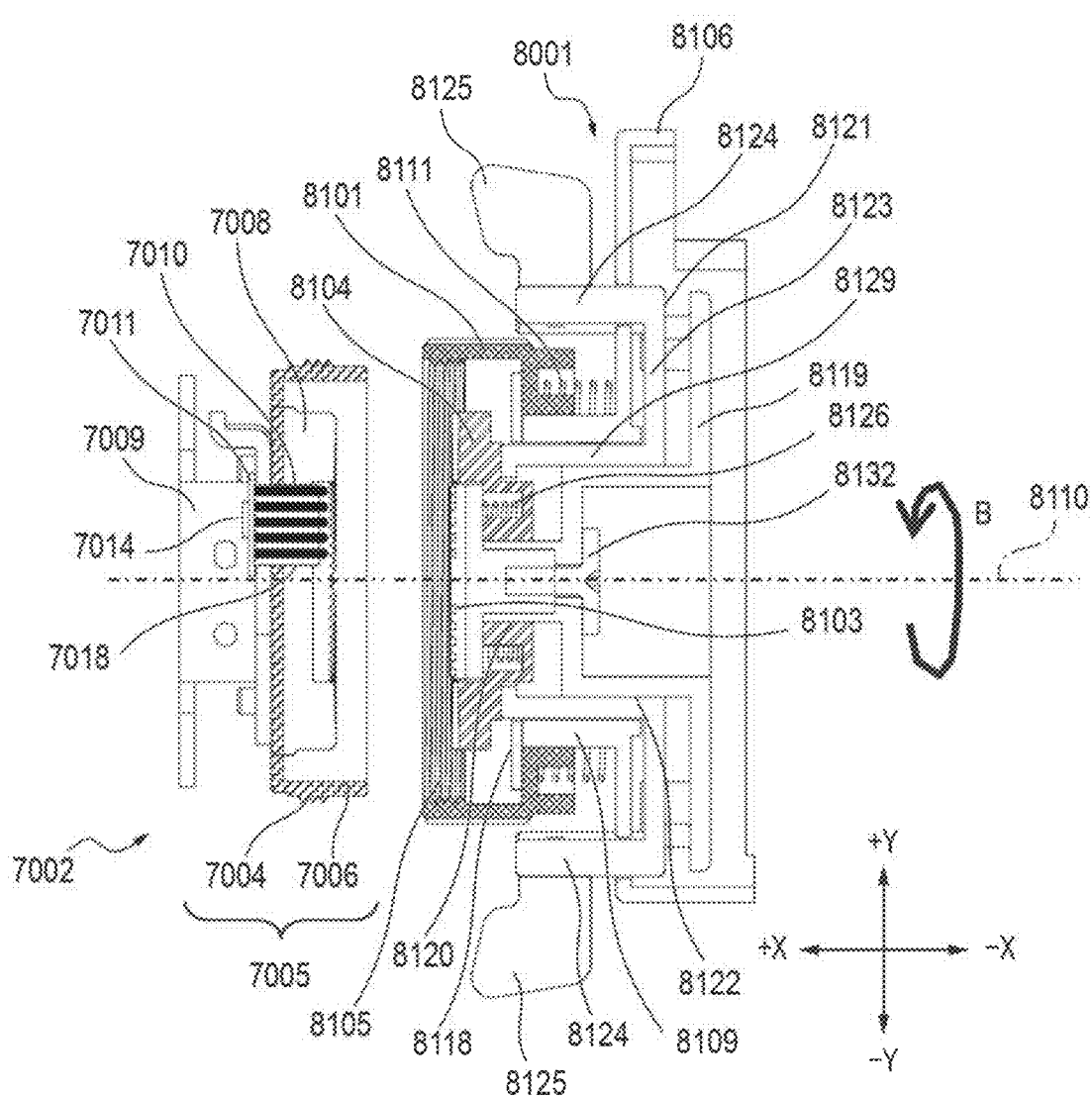
FIG. 70 is a partial cross-sectional view showing a state in which the grip is before being attached to the image capture apparatus body according to the third embodiment of the present invention.
Figure 71:
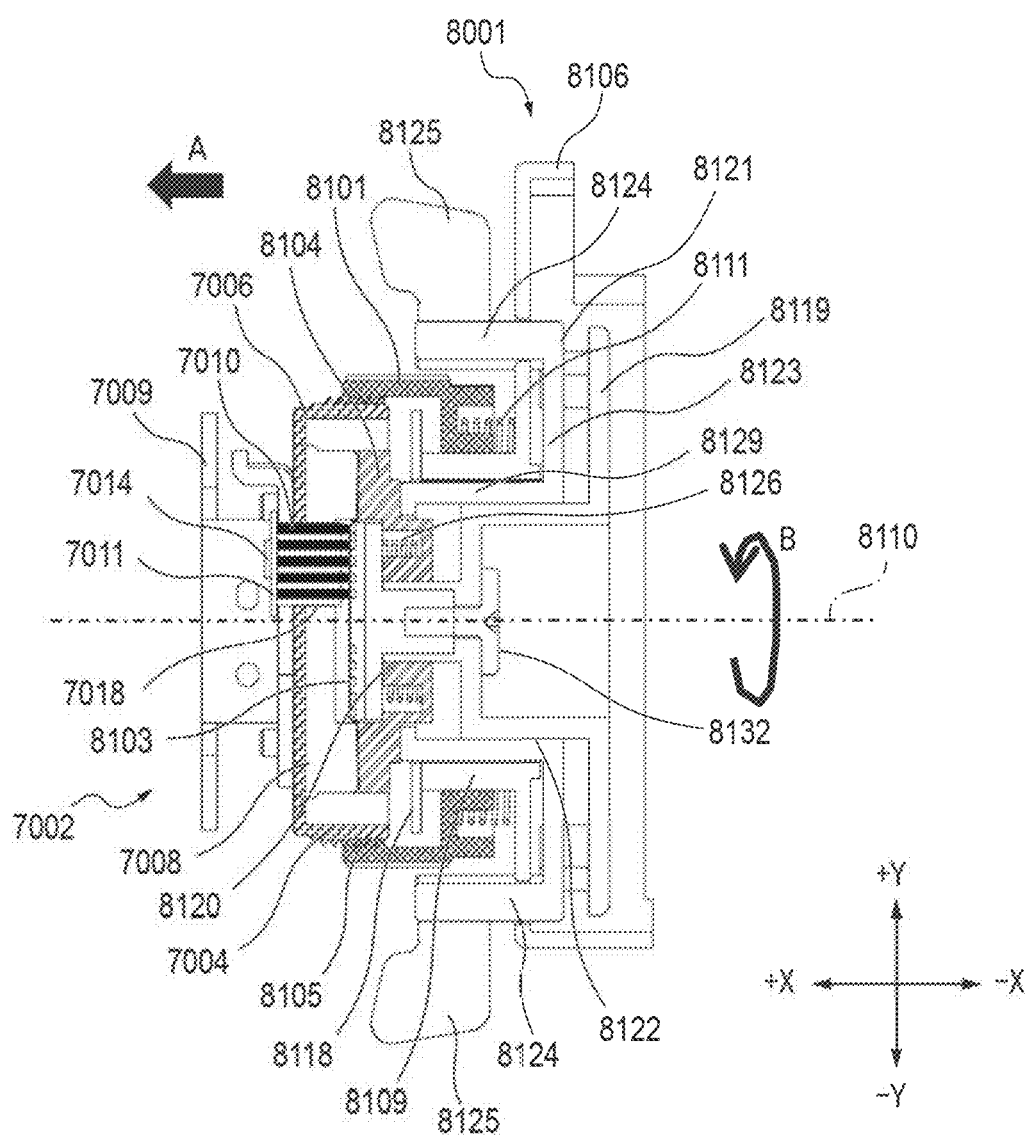
FIG. 71 is a partial cross-sectional view showing a state in which the grip is being attached to the image capture apparatus body according to the third embodiment of the present invention.
Figure 72:
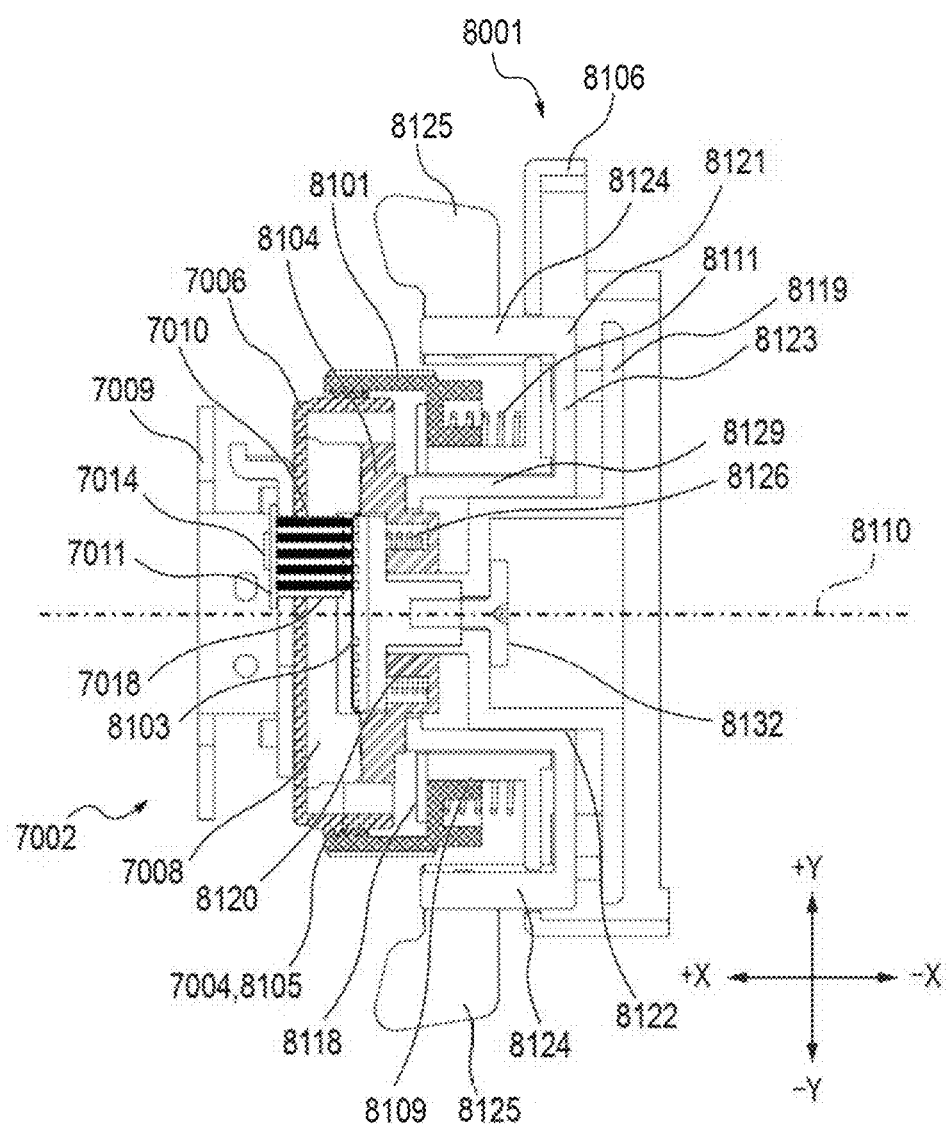
FIG. 72 is a partial cross-sectional view showing a state in which the grip has been attached to the image capture apparatus body according to the third embodiment of the present invention.

FIG. 70 is a cross-sectional view showing a state before the grip 8001 is attached to the image capture apparatus body 7002. FIG. 71 is a cross-sectional view showing a state in which the grip 8001 is being attached to the image capture apparatus body 7002. FIG. 72 is a cross-sectional view showing a state in which the grip 8001 has been attached to the image capture apparatus body 7002.

When attaching the grip 8001 to the image capture apparatus body 7002, as shown in FIG. 70, the body-side screwing member 7006 and the grip-side screwing member 8101 are aligned in position. Then, as shown in FIG. 71, the grip 8001 is pressed in a direction indicated by an arrow A (in the +X direction) which is a direction toward the image capture apparatus body 7002, whereby the body-side engagement part 7008 and the grip-side engagement part 8104 are engaged with each other.

The engagement between the body-side engagement part 7008 and the grip-side engagement part 8104 determines an attachment angle of the grip 8001 with respect to the image capture apparatus body 7002. In doing this, since the recessed-shape portions and protruding-shape portions of the body-side engagement part 7008 and those of the grip-side engagement part 8104 are formed radially, it is possible to engage the grip 8001 at a desired angle before fixing the grip 8001 to the image capture apparatus body 7002. Note that in the state shown in FIG. 71, the image capture apparatus body 7002 and the grip 8001 have been neither fixed nor electrically connected to each other.

The grip-side screwing member 8101 is rotated in a direction indicated by an arrow B in FIG. 71 (in a clockwise direction, as viewed from the −X direction) in the state in which the grip 8001 has been pressed in the direction indicated by the arrow A (in the +X direction). With this, the grip-side screwing member 8101 comes to be screwed with the body-side screwing member 7006, resulting in the state shown in FIG. 72.

As shown in FIG. 72, the body-side screwing member 7006 and the grip-side screwing member 8101 are screwed with each other in the state in which the body-side engagement part 7008 and the grip-side engagement part 8104 have been engaged with each other. With this, it is possible to firmly fix the grip 8001 to the image capture apparatus body 7002 without looseness. Further, at this time, the contact pins 7010 and the contact pattern 8103 are in contact and electrically connected to each other.

To remove the grip 8001 from the image capture apparatus body 7002, it is only required to perform a reverse operation to the attachment operation described with reference to FIGS. 70 to 72. More specifically, first, the grip-side screwing member 8101 is rotated in a direction opposite to the direction indicated by the arrow B to loosen the grip-side screwing member 8101. With this, the contact pattern 8103 is separated from the contact pins 7010 by the urging force of the springs 7116, whereby electrical connection between the image capture apparatus body 7002 and the grip 8001 is cut off. Further, the grip-side screwing member 8101 is removed from the body-side screwing member 7006, whereby fixing of the image capture apparatus body 7002 and the grip 8001 is released. Then, by moving the grip 8001 away in a direction opposite to the direction indicated by the arrow A, the grip 8001 can be removed from the image capture apparatus body 7002.

Next, a procedure for changing the angle of the grip 8001 in a state in which the grip 8001 has been attached to the image capture apparatus body 7002 will be described.

Figure 73:
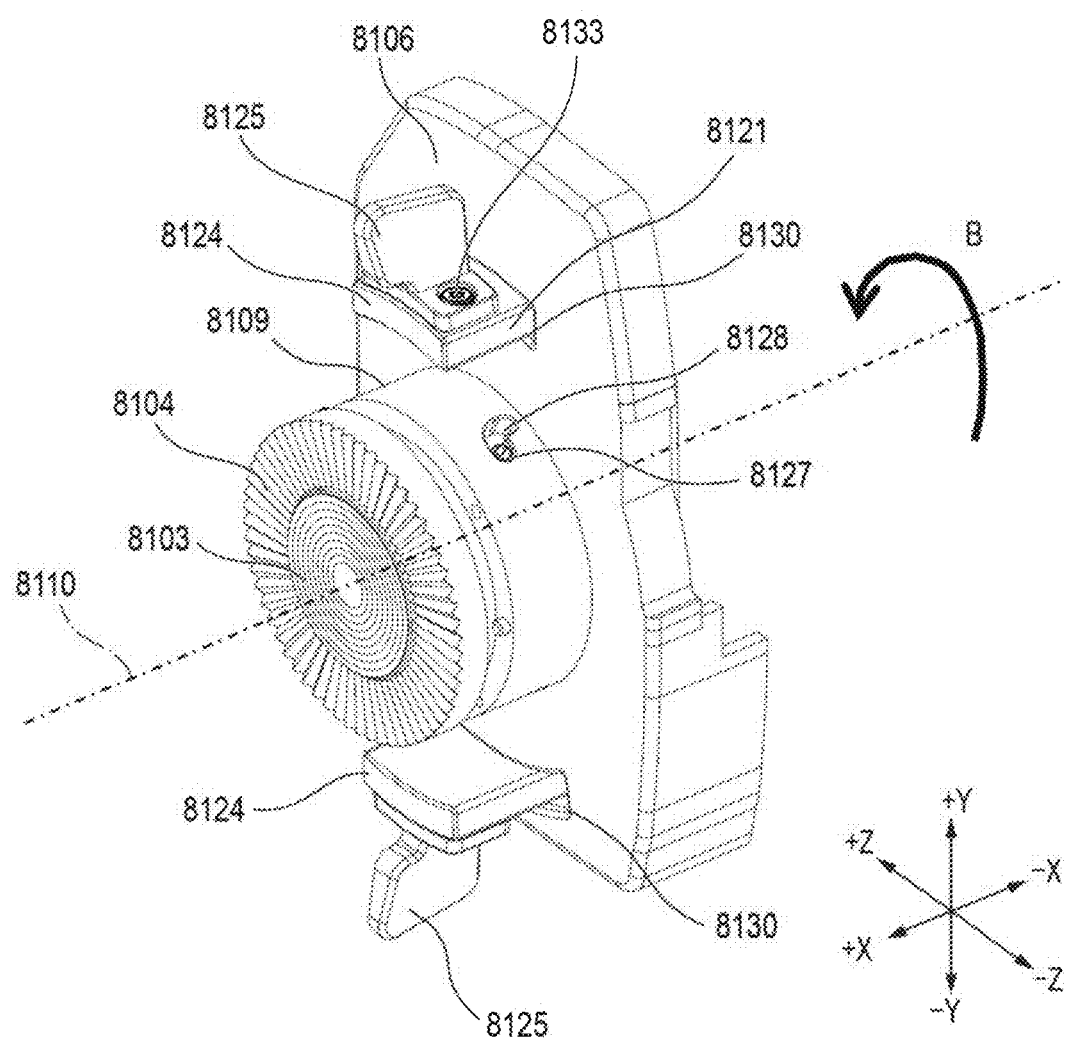
FIG. 73 is a partial perspective view showing a state in which the grip-side engagement part is in a position in which it is to be engaged with the body-side engagement part in the third embodiment of the present invention.
Figure 74:
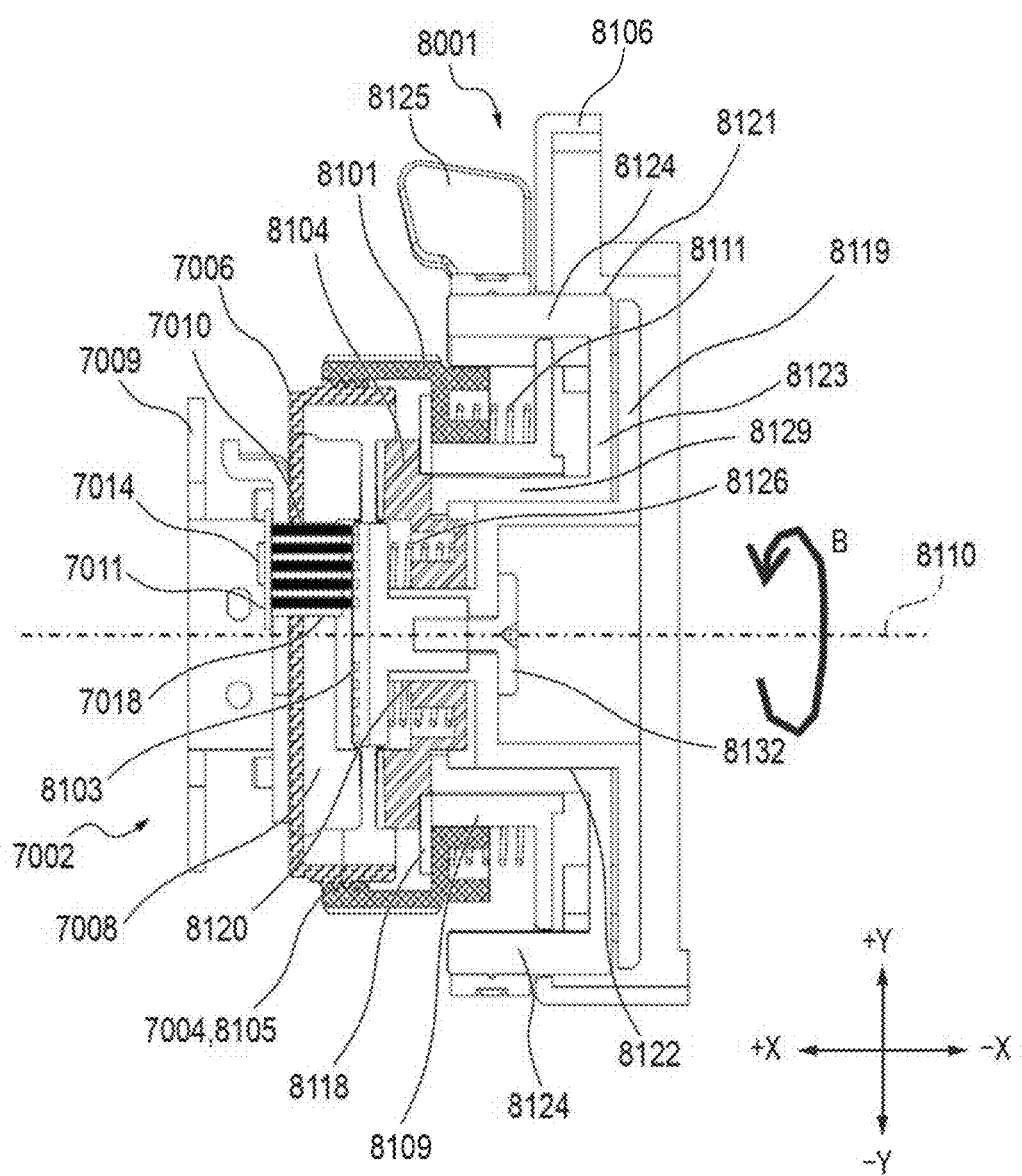
FIG. 74 is a cross-sectional view showing a state of the image capture apparatus body according to the third embodiment of the present invention, in which the grip-side engagement part has been disengaged therefrom, with the grip attached thereto.
Figure 75:
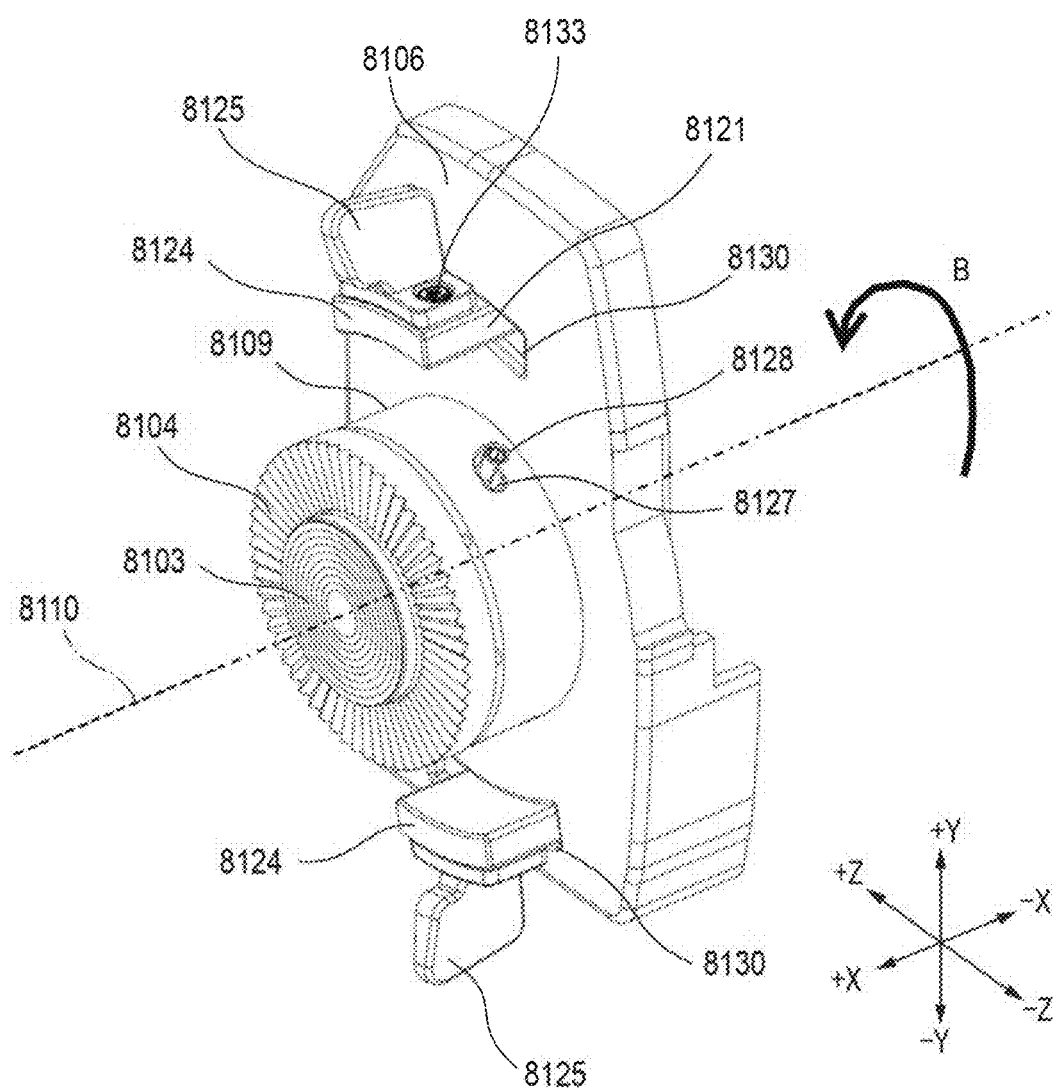
FIG. 75 is a partial perspective view showing a state in which the grip-side engagement part is in a position separated from the body-side engagement part in the third embodiment of the present invention.

FIG. 73 is a partial perspective view showing a state in which the grip-side engagement part 8104 is in a position in which it is to be engaged with the body-side engagement part. FIG. 74 is a cross-sectional view showing a state in which the grip-side engagement part 8104 has been disengaged in a state in which the grip 8001 has been attached to the image capture apparatus body 7002. FIG. 75 is a partial perspective view showing a state in which the grip-side engagement part 8104 is in a position separated from the body-side engagement part 7008. Note that in FIGS. 73 and 75, the grip-side screwing member 8101, the screwing member-urging spring 8111, and the stopper member 8118 are omitted from illustration.

Figure 76A:
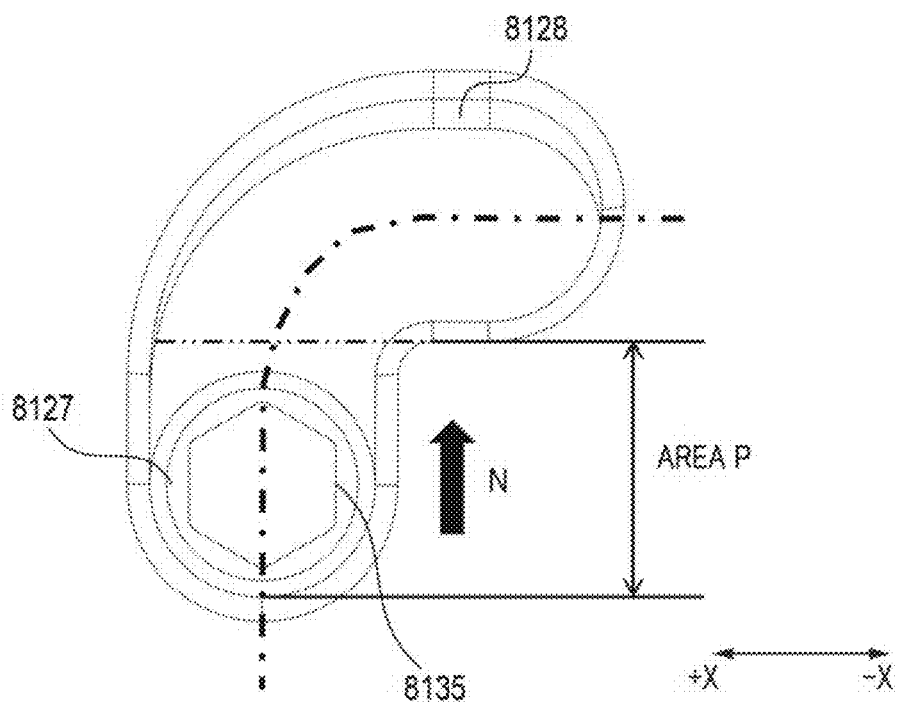
FIGS. 76A and 76B are views useful in explaining a relationship between a guide pin and a guide hole in the third embodiment of the present invention.
Figure 76B:
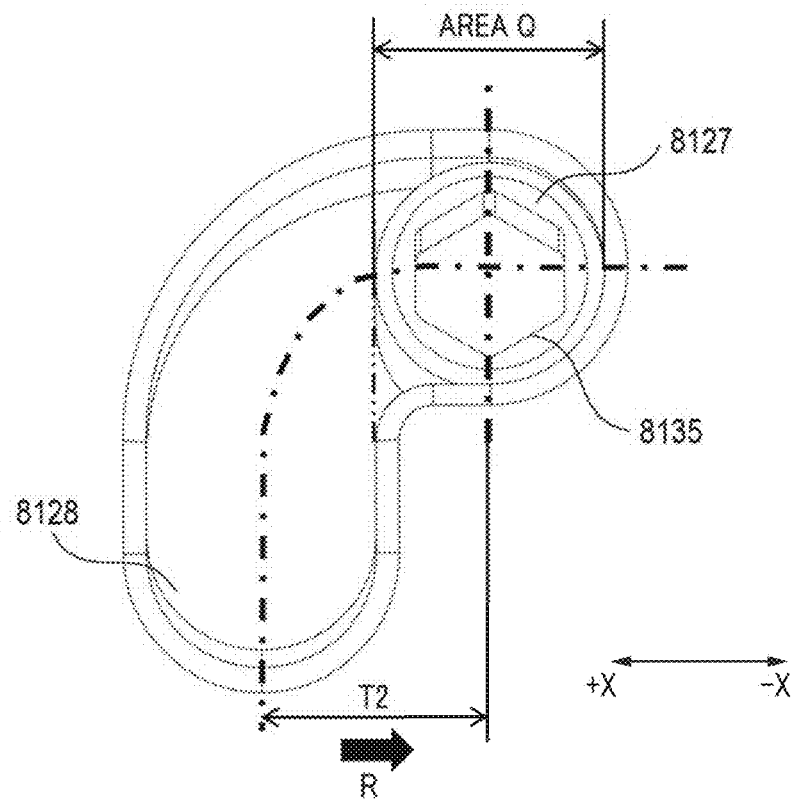

FIGS. 76A and 76B are views useful in explaining a relationship between a guide pin 8127 and a guide hole 8128 associated therewith. FIG. 76A shows the relationship between the guide pin 8127 and the guide hole 8128 in a state in which the body-side engagement part 7008 and the grip-side engagement part 8104 have been engaged with each other. FIG. 76B shows the relationship between the guide pin 8127 and the guide hole 8128 in a state in which the body-side engagement part 7008 and the grip-side engagement part 8104 have been separated from each other.

First, from the state shown in FIG. 72, in which the grip 8001 has been attached to the image capture apparatus body 7002 and the grip-side engagement part 8104 and the body-side engagement part 7008 have been engaged with each other, the attachment member-driving lever 8121 is operated for rotation in a direction indicated by an arrow B in FIG. 73.

In response to user's operation of the attachment member-driving lever 8121, each guide pin 8127 of the attachment member-driving lever 8121 is moved along an associated one of the guide holes 8128 of the exterior member 8106 in a direction indicated by an arrow N in FIG. 76A. At this time, the guide pin 8127 is moved in an area P of the guide hole 8128 arranged on a plane (Y-Z plane) orthogonal to the rotational axis 8110 of the attachment member-driving lever 8121. At this time, the guide pin 8127 is rotated in the state in which the body-side engagement part 7008 and the grip-side engagement part 8104 maintain the engaged state.

When the user continues to rotate the attachment member-driving lever 8121, the guide pin 8127 continues to be moved in the direction indicated by the arrow N within the area P of the guide hole 8128 and eventually reaches an inflexion point of the guide hole 8128.

After the guide pin 8127 has reached the inflexion point of the guide hole 8128, the attachment member-driving lever 8121 is moved along the guide hole 8128 to an area Q. At this time, the grip-side engagement part 8104 receives a load in the −X direction by the action of the attachment member-urging spring 8126, thereby being urged toward the attachment member-driving lever 8121. Therefore, as the attachment member-driving lever 8121 is moved to the area Q, the grip-side engagement part 8104 is moved in a direction indicated by an arrow R over a distance T2. That is, the grip-side engagement part 8104 is separated from the body-side engagement part 7008 as shown in FIG. 74, and hence the grip 8001 is disengaged. In other words, the grip comes to be capable of changing its rotational position.

On the other hand, even when the body-side engagement part 7008 and the grip-side engagement part 8104 have been disengaged from each other, the body-side contact pins 7010 of the image capture apparatus body 7002 and the contact pattern 8103 of the grip 8001 maintain the connected state. That is, only mechanical connection between the body-side engagement part 7008 and the grip-side engagement part 8104 is released but electrical connection therebetween is maintained.

Therefore, it is possible to rotate the grip 8001 with respect to the image capture apparatus body 7002 while maintaining the fixed state and the electrically connected state between the image capture apparatus body 7002 and the grip 8001.

To fix the grip 8001 after setting the attachment angle to a desired angle, first, the user moves the attachment member-driving lever 8121 in the +X direction from a position indicated in FIGS. 74 and 75 using the lever operating knobs 8125. At this time, the guide pin 8127 is moved from the area Q to the area P of the guide hole 8128. This causes the grip-side engagement part 8104 to be shifted from the state separated from the body-side engagement port 7008 to the state engaged with the body-side engagement part 7008 in conjunction with movement of the attachment member-driving lever 8121.

Then, the user rotates the attachment member-driving lever 8121 in a direction opposite to the direction indicated by the arrow B. With this, the guide pin 8127 is moved to the area P of the guide hole 8128 as shown in FIG. 76A, whereby it is possible to maintain the engaged state between the grip-side engagement part 8104 and the body-side engagement part 7008.

Thus, it is possible to change the angle of the grip 8001 without removing the grip 8001 from the image capture apparatus body 7002. In doing this, it is possible to maintain the state in which the grip-side engagement part 8104 is separated while maintaining electrical connection between the grip 8001 and the image capture apparatus body 7002, and hence the user can perform shooting while changing the shooting posture e.g. from low-angle shooting to high-angle shooting.

As described above, according to the embodiments of the present invention, it is possible to firmly fix and also easily electrically connect between the image capture apparatus body and the grip. As a result, it is possible to enhance the user-friendliness of the image capture apparatus. Further, since electrical connection is positively achieved in a state in which the image capture apparatus body and the grip have been firmly fixed to each other, it is possible to ensure electrical connection with high reliability.

Figure 77:
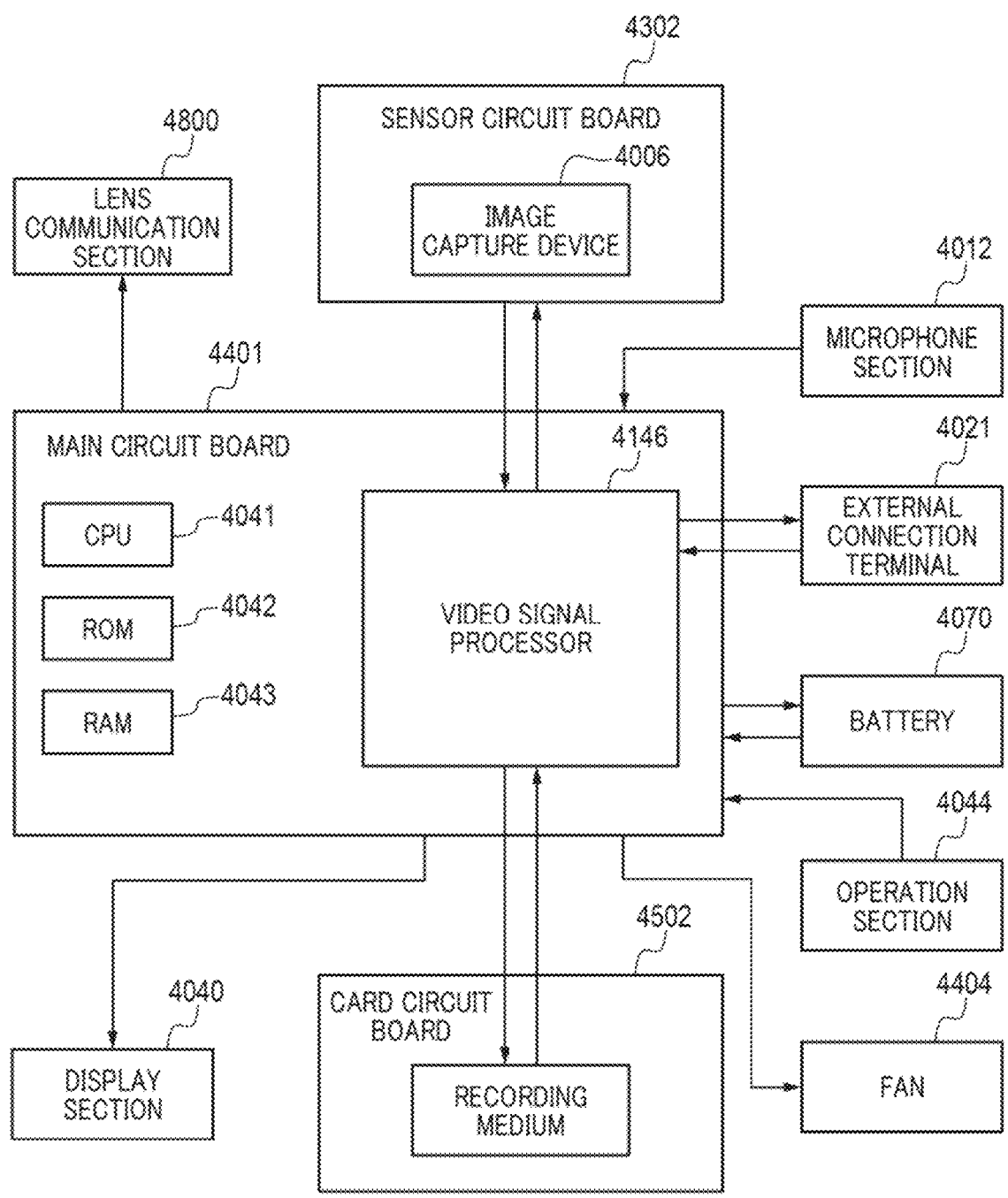
FIG. 77 is a schematic block diagram showing the configuration of the image capture apparatus according to the first to third embodiments of the present invention.

FIG. 77 is a schematic block diagram showing the configuration of the image capture apparatus body denoted by 1000, 5101, and 7001 in the first to third embodiments, respectively (hereinafter reference numeral 1000 is used as a representative, for simplicity of explanation). The configuration of the image capture apparatus body 1000 will be described with reference to FIG. 77.

The image capture apparatus body 1000 includes a lens communication section 4800, an image capture device 4006 mounted on a sensor circuit board 4302, a main circuit board 4401, a card circuit board 4502, and a microphone section 4012. Further, the image capture apparatus body 1000 includes an external connection terminal 4021, a removable battery 4070, an operation section 4044, a fan 4404, and a display section 4040. Further, a CPU 4041, a ROM 4042, and a RAM 4043 are mounted on the main circuit board 4401.

The ROM 4042 is an electrically erasable and recordable memory, and for example, an EEPROM is used. The ROM 4042 stores constants, programs, etc. for the operation of the CPU 4041. The CPU 4041 realizes the centralized control of the image capture apparatus body 1000 by executing the programs stored in the ROM 4042 to thereby control the operations of the components of the image capture apparatus body 1000.

The RAM 4043 is used as a system memory, a work memory, an image memory, a sound/voice memory, etc., and the constants, variables, and the programs read from the ROM 4042, etc., for the operation of the CPU 4041 are loaded in the RAM 4043.

The image capture device 4006 is a CCD or a CMOS sensor, and includes an analog-to-digital converter. A lens device attached to the image capture apparatus body 1000 forms an optical image of incident light on the image capture device 4006. The image capture device 4006 converts the optical image formed thereon to analog electrical signals, further converts the analog electrical signals to digital signals using the analog-to-digital converter, and outputs the digital signals as video signals. The generated digital video signals are output to a video signal processor 4146 on the main circuit board 4401.

The video signal processor 4146 performs predetermined processing on the input digital video signals, and generates video data by combining audio signals, which have been separately input, and various meta data, with the processed digital video signals. The video data thus generated by the video signal processor 4146 is sent to the display section 4040 and is displayed as a video. At this time, the operation status of the image capture apparatus body 1000 is displayed as on-screen display information on an as-needed basis.

The image capture device 4006 has a plurality of phase difference detecting pixels. The video signal processor 4146 is capable of performing auto focusing based on an imaging plane phase difference detection method, by performing correlation calculation using output signals from the plurality of phase difference detecting pixels and controlling the focus position of an attached lens device based on a result of the correlation calculation.

Further, when recording is selected by a photographer, the video data generated by the video signal processor 4146 is sent to the card circuit board 4502 after being converted to one of various formats by being subjected to predetermined processing, and is stored in a recording medium as a video.

On the other hand, when a predetermined connector has been connected to the external connection terminal 4021, it is possible to output video signals from the video signal processor 4146 to the external connection terminal 4021 to thereby transmit the video signals to an external device.

Note that the image capture apparatus body 1000 is capable of regenerating original video data by loading recording data stored in a recording medium into the video signal processor 4146. Then, the regenerated video data can be output to the display section 4040 or the external connection terminal 4021.

Audio signals input from the microphone section 4012 are subjected to gain control to a predetermined level and thereafter converted from analog to digital to form digital audio data. The video data and the audio data are temporarily stored in the RAM 4043.

The CPU 4041 sends the video data and audio data temporarily stored in the RAM 4043 to the card circuit board 4502. A recording medium can be inserted and removed in and from the card circuit board 4502, and the video data and audio data is recorded in the recording medium. As the recording medium, an SD card or a removal flash memory, such as a memory card, conforming to the standard of CF, CFast, XQD, CFexpress, or the like, is used.

The fan 4404 is operated based on a temperature acquired by a temperature detection section (not shown), and sucks and discharges air into and from the inside of the image capture apparatus body 1000. The rotational state of the fan 4404 is controlled by the CPU 4041. The operation section 4044 transfers an instruction input by a user's operation to the CPU 4041. The operation section 4044 includes a REC button, a power switch, operation keys, and so forth.

When the operation section 4044 is operated by a user, various instructions from the user are transmitted to the CPU 4041.

A power supply controller, not shown, is formed by a battery detection circuit, a DC-DC converter, and a switch circuit for switching a block to be energized, etc., and detects whether or not a battery is attached, a battery type, and a battery remaining amount. The battery 4070 which supplies electrical power to the image capture apparatus body 1000 is removable with respect to the image capture apparatus body 1000, and is e.g. a lithium ion battery.

The display section 4040 is e.g. a liquid crystal display device, and displays the operation status of the image capture apparatus body 1000, etc., as the on-screen display information on an as-needed basis.

When a lens contact part provided on the lens communication section 4800 of the image capture apparatus body 1000 and a lens contact part on the lens device side are brought into contact with each other to be electrically connected to each other, the CPU 4041 of the image capture apparatus body 1000 detects attachment of the lens device. When attachment of the lens device is detected, the CPU 4041 reads lens information from an internal memory of the lens device, and stores the read lens information in the RAM 4043.

In the image capture apparatus body 1000 of the present embodiments, for example, light received by the image capture device 4006 is converted to digital image data of at least approximately 23 frames per second (fps), and the digital image data is recorded in a recording medium by the card circuit board 4502. The frame rate can be set within a range from approximately 1 fps to approximately 250 fps. For example, the image capture apparatus body 1000 may change the frame rate according to a set resolution.

More specifically, a frame rate within a range from approximately 1 fps to approximately 100 fps is set in a "5K" resolution mode, and a frame rate within a range from approximately 1 fps to approximately 125 fps is set in a "4K" resolution mode. A frame rate within a range from approximately 1 fps to approximately 125 fps is set in a quad HD mode, a frame rate within a range from approximately 1 fps to approximately 160 fps is set in a "3K" resolution mode, and a frame rate within a range from approximately 1 fps to approximately 250 fps is set in a "2K" resolution mode. For example, as the frame rate, 20, 23, 976, 24, 30, 60 and 120 fps, or other frame rates between these frame rates, or frame rates not lower than these frame rates may be set.

The image capture apparatus body 1000 can output image data at a resolution of "2K" (such as 16:9 (2048×1152 pixels) and 2:1 (2048×1024 pixels)) and a resolution of "3K" (such as 16:9 (3072×1728 pixels) and 2:1 (3072×1536 pixels)). Further, the image capture apparatus body 1000 can output image data at a resolution of "4K" (such as 4096× 2540 pixels, 16:9 (4096×2304 pixels), and 2:1 (4096×2048 pixels)) and a horizontal resolution of "4.5K".

Further, the image capture apparatus body 1000 can output image data at a resolution of quad HD (such as 3840×2160 pixels), a horizontal resolution of "5K" (such as 5120×2700 pixels), a horizontal resolution of "6K" (such as 6144×3160 pixels), and a resolution of "8K" (such as 7680×4320 pixels). Further, the image capture apparatus body 1000 can output image data at a resolution higher than 8K. The image capture apparatus body 1000 can be configured to record or output image data having a horizontal resolution at least between any values of the above-mentioned resolutions.

Further, the resolution is at least one of the above-mentioned values (or some value between the above-mentioned values), and can take approximately 6.5K, 7K, 8K, 9K, or 10K, or some value between the above-mentioned values. In the present embodiment, in a word expressed by the form of xK (such as the above-mentioned 2K and 4K), the number of "x" refers to an approximate horizontal resolution. Therefore, the resolution of "4K" corresponds to the number of horizontal pixels which is approximately not smaller than 4000, and the resolution of "2K" corresponds to the number of horizontal pixels which is approximately not smaller than 2000.

The image capture device 4006 can be adapted to a range from approximately 0.5 inch (8 mm) to ⅔ inch, S35 for a movie, 35 mm full-frame for a still camera, and up to 645, and can be adapted to at least approximately 1.0 inch or 6 cm×17 cm or more. Further, the image capture device 4006 can have sizes of at least approximately 10.1×5.35 mm, 24.4×13.7 mm, 30×15 mm, 36×24 mm, 56×42 mm, and 186×56 mm.

Further, the image capture device 4006 can be configured to provide a variable resolution by selectively outputting only predetermined part of the pixel area. The image capture device 4006 can include e.g. color filters arranged in the Bayer array. Therefore, the image capture device 4006 outputs data indicating an amount of red light, green light, or blue light, detected by each photoelectric conversion element of the image capture device 4006.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2019-089928, filed May 10, 2019, No. 2019-095297, filed May 21, 2019, No. 2019-095298, filed May 21, 2019, No. 2019-095299, filed May 21, 2019, No. 2019-089929, filed May 10, 2019, No. 2019-089926, filed May 10, 2019, No. 2019-089927, filed May 10, 2019 and No. 2020-068879, filed Apr. 7, 2020, which are hereby incorporated by reference herein in their entirety.

What is claimed is:

1. An electronic apparatus to which an accessory is removably attached,
wherein one of the accessory and a body of the electronic apparatus includes a first attachment part opposed to the other of the accessory and the body,
the first attachment part comprising:
a first screw portion disposed in the center of the first attachment part;
a first electrical connection part disposed outside the first screw portion; and
a first engagement part formed outside the first electrical connection part,
wherein the other of the accessory and the body includes a second attachment part opposed to the one of the accessory and the body,
the second attachment part comprising:
a second screw portion disposed in the center of the second attachment part, for being screwed with the first screw portion;
a second electrical connection part disposed outside the second screw portion, for being electrically connected to the first electrical connection part; and
a second engagement part formed outside the second electrical connection part, for being engaged with the first engagement part, and
wherein when the first screw portion and the second screw portion are screwed with each other, the first engagement part and the second engagement part are engaged with each other, and the first electrical connection part and the second electrical connection part are electrically connected to each other.

2. The electronic apparatus according to claim 1, wherein the first electrical connection part and the second electrical connection part are held by a first contact-holding member and a second contact-holding member, respectively,
wherein at least one of the first contact-holding member and the second contact-holding member is urged by an urging member in a direction away from a mating contact, and
wherein when the first screw portion and the second screw portion are screwed with each other, the contact-holding member urged by the urging member is pressed in a direction toward the mating contact by at least one of the first screw portion and the second screw portion.

3. The electronic apparatus according to claim 1, wherein the first electrical connection part and the second electrical connection part are positioned on surfaces different from respective engaging surfaces of the rust engagement part and the second engagement part.

4. The electronic apparatus according to claim 1, further comprising:
an image capture unit that captures an image of an object, and
an image processor that performs predetermined image processing on an image obtained by the image capture unit.

5. The electronic apparatus according to claim 1, wherein the accessory is attached to the body such that the accessory is capable of rotating through a predetermined angle,
wherein the one of the first electrical connection part and the second electrical connection part includes a plurality of contact pins radially arranged from the center of the attachment part having the one electrical connection part,
wherein the other of the first electrical connection part and the second electrical connection part includes a circuit member having a wiring part on which a plurality of traces of a pattern are concentrically formed about the center of the attachment part having the other electrical connection part,
wherein the circuit member comprises:
a connection portion connected to a predetermined circuit board of the body or the accessory including the circuit member, and
a pattern wiring lead portion connecting between the connection portion and the wiring part,
wherein when the accessory is rotated with respect to the body, the plurality of contact pins are brought into contact only with respective different traces of the pattern.

6. The electronic apparatus according to claim 5, wherein the first attachment part and the second attachment part are each formed in a circular shape.

7. The electronic apparatus according to claim 5, wherein the circuit member is a circuit board, and the pattern wiring lead portion is a through hole.

8. The electronic apparatus according to claim 5, wherein the circuit member is a flexible circuit board, and the pattern wiring lead portion is covered with a cover lay.

9. The electronic apparatus according to claim 5, wherein the plurality of contact pins include a first contact pin and a second contact pin, and
wherein in a case where the accessory is rotated with respect to the body, when one of the first contact pin and the second contact pin is brought into contact with the pattern wiring lead portion, the other of the first contact pin and the second contact pin is brought into contact with the wiring part.

10. The electronic apparatus according to claim 9, further comprising a unit configured to give priority to a signal output from the first contact pin in a case where both of the first contact pin and the second contact pin are brought into contact with the wiring part.

11. An electronic apparatus to which an accessory is removably attached,
wherein one of the accessory and a body of the electronic apparatus includes a first attachment part opposed to the other of the accessory and the body,
the first attachment part comprising:
a first screw portion;
a first electrical connection part; and
a first engagement part,
wherein the other of the accessory and the body includes a second attachment part opposed to the one of the accessory and the body,
the second attachment part comprising:
a second screw portion for being screwed with the first screw portion;
a second electrical connection part for being electrically connected to the first electrical connection part; and
a second engagement part for being engaged with the first engagement part,
wherein one of the first electrical connection part and the second electrical connection part is formed by a plurality of traces of a contact pattern, which are concentrically formed at predetermined spaced intervals from the center of the attachment part where the one of the first electrical connection part and the second electrical connection part is disposed,
wherein the other of the first electrical connection part and the second electrical connection part is formed by a plurality of contact pins arranged in a line in a radial direction at the same intervals as those of the plurality of traces of the contact pattern, and
wherein when the first screw portion and the second screw portion are screwed with each other, the first engagement part and the second engagement part are engaged with each other and the first electrical connection part and the second electrical connection part are electrically connected to each other.

12. The electronic apparatus according to claim 11, wherein the first electrical connection part and the second electrical connection part are held by a first contact-holding member and a second contact-holding member, respectively,
wherein at least one of the first contact-holding member and the second contact-holding member is urged by an urging member in a direction away from a mating contact, and
wherein when the first screw portion and the second screw portion are screwed with each other, the contact-holding member urged by the urging member is pressed in a direction toward the mating contact by at least one of the first screw portion and the second screw portion.

13. The electronic apparatus according to claim 11, wherein the first electrical connection part and the second electrical connection part are positioned on surfaces different from respective engaging surfaces of the first engagement part and the second engagement part.

14. The electronic apparatus according to claim 11, further comprising:
an image capture unit that captures an image of an object, and
an image processor that performs predetermined image processing on an image obtained by the image capture unit.

15. The electronic apparatus according to claim 11, further comprising a circuit member having the plurality of traces of the contact pattern formed thereon,
wherein the circuit member comprises:
a connection portion connected to a predetermined circuit board of the body or the accessory, which includes the circuit member, and
a pattern wiring lead portion connecting between the connection portion and the wiring part,
wherein when the accessory is rotated with respect to the body, the plurality of contact pins are brought into contact only with respective different traces of the contact pattern.

16. The electronic apparatus according to claim 15, wherein the first attachment part and the second attachment part are each formed in a circular shape.

17. The electronic apparatus according to claim 15, wherein the circuit member is a circuit board, and the pattern wiring lead portion is a through hole.

18. The electronic apparatus according to claim 15, wherein the circuit member is a flexible circuit board, and the pattern wiring lead portion is covered with a cover lay.

19. The electronic apparatus according to claim 15, wherein the plurality of contact pins include a first contact pin and a second contact pin, and
wherein in a case where the accessory is rotated with respect to the body, when one of the first contact pin and the second contact pin is brought into contact with the pattern wiring lead portion, the other of the first contact pin and the second contact pin is brought into contact with the wiring part.

20. The electronic apparatus according to claim 19, further comprising a unit configured to give priority to a signal output from the first contact pin in a case where both of the first contact pin and the second contact pin are brought into contact with the wiring part.

21. The electronic apparatus according to claim 11, wherein the first engagement part is provided on an inner peripheral side of the first screw portion,
wherein the second engagement part restricts a rotational position of the other of the accessory and the body with respect to the one of the accessory and the body, and
wherein the second engagement part can be moved between a first position for restricting the rotational position of the other of the accessory and the body, and a second position where the rotational position of the other of the accessory and the body can be changed.

22. The electronic apparatus according to claim 21, wherein the first engagement part and the second engagement part are each have recessed-shape portions and protruding-shape portions.

23. The electronic apparatus according to claim 21, wherein the plurality of contact pins are provided on an inner peripheral side of the fust engagement part,
 wherein the plurality of traces of the contact pattern are provided on an inner peripheral side of the second engagement part, and
 wherein the plurality of contact pins are slidably brought into contact with the plurality of traces of the contact pattern.

24. The electronic apparatus according to claim 21, wherein the plurality of contact pins are exposed from the attachment part on which the plurality of contact pins are provided.

25. The electronic apparatus according to claim 11, wherein the first engagement part is provided on an inner peripheral side of the first screw portion, and the plurality of contact pins are provided on an inner peripheral side of the first engagement part,
 wherein the plurality of traces of the contact pattern are provided on an inner peripheral side of the second engagement part,
 wherein the second engagement part restricts the rotational position of the other of the accessory and the body with respect to the one of the accessory and the body, and
 wherein the plurality of contact pins are slidably brought into contact with the plurality of races of the contact pattern.

26. The electronic apparatus according to claim 25, wherein the first engagement part and the second engagement part are each have recessed-shape portions and protruding-shape portions.

27. The electronic apparatus according to claim 26, wherein the tip ends of the plurality of contact pins are each positioned lower than the recessed-shape portions of the first engagement part.

28. The electronic apparatus according to claim 27, wherein the second screw portion is arranged such that the second screw portion surrounds an outer periphery of the plurality of traces of the contact pattern,
 wherein when the accessory is attached to the body, the second screw portion protrudes closer to the one of the accessory and the body than the second engagement part, and
 wherein in a case where the accessory is about to be attached to the body in a state in which a central axis of the first screw portion and a central axis of the second screw portion are misaligned, the second screw portion and the first engagement part are brought into contact with each other, thereby preventing the plurality of traces of the contact pattern from colliding against the first engagement part.

29. The electronic apparatus according to claim 25, wherein the plurality of contact pins are exposed from the attachment part on which the plurality of contact pins are provided.

30. A system including an electronic apparatus, and an accessory that is removably attached to a body of the electronic apparatus,
 wherein one of the accessory and a body of the electronic apparatus includes a first attachment part opposed to the other of the accessory and the body,
 the first attachment part comprising:
 a first screw portion disposed in the center of the first attachment part,
 a first electrical connection part disposed outside the first screw portion; and
 a first engagement part formed outside the first electrical connection part,
 wherein the other of the accessory and the body includes a second attachment part opposed to the one of the accessory and the body,
 the second attachment part comprising:
 a second screw portion disposed in the center of the second attachment part, for being screwed with the first screw portion;
 a second electrical connection part disposed outside the second screw portion, for being electrically connected to the first electrical connection part; and
 a second engagement part formed outside the second electrical connection part, for being engaged with the first engagement part, and
 wherein when the first screw portion and the second screw portion are screwed with each other, the first engagement part and the second engagement part are engaged with each other, and the first electrical connection part and the second electrical connection part are electrically connected to each other.

31. A system including an electronic apparatus, and an accessory that is removably attached to a body of the electronic apparatus,
 wherein one of the accessory and a body of the electronic apparatus includes a first attachment part opposed to the other of the accessory and the body,
 the first attachment part comprising:
 a first screw portion;
 a first electrical connection part; and
 a first engagement part,
 wherein the other of the accessory and the body includes a second attachment part opposed to the one of the accessory and the body,
 the second attachment part comprising:
 a second screw portion for being screwed with the first screw portion;
 a second electrical connection part for being electrically connected to the first electrical connection part; and
 a second engagement part for being engaged with the first engagement part,
 wherein one of the first electrical connection part and the second electrical connection part is formed by a plurality of traces of a contact pattern, which are concentrically formed at predetermined spaced intervals from the center of the attachment part where the one of the first electrical connection part and the second electrical connection part is disposed,
 wherein the other of the first electrical connection part and the second electrical connection part is formed by a plurality of contact pins arranged in a line in a radial direction at the same intervals as those of the plurality of traces of the contact pattern, and
 wherein when the first screw portion and the second screw portion are screwed with each other, the first engagement part and the second engagement part are engaged with each other and the first electrical connection part and the second electrical connection part are electrically connected to each other.

32. An accessory that can be attached and removed to and from an electronic apparatus,
 wherein one of the accessory and a body of the electronic apparatus includes a first attachment part opposed to the other of the accessory and the body,
 the first attachment part comprising:
 a first screw portion disposed in the center of the first attachment part;

a first electrical connection part disposed outside the first screw portion; and a first engagement part formed outside the first electrical connection part, wherein the other of the accessory and the body includes a second attachment part opposed to the one of the accessory and the body, the second attachment part comprising:

a second screw portion disposed in the center of the second attachment part, for being screwed with the first screw portion;

a second electrical connection part disposed outside the second screw portion, for being electrically connected to the first electrical connection part; and a second engagement part formed outside the second electrical connection part, for being engaged with the first engagement part, and wherein when the first screw portion and the second screw portion are screwed with each other, the first engagement part and the second engagement part are engaged with each other, and the first electrical connection part and the second electrical connection part are electrically connected to each other.

33. An accessory that can be attached and removed to and from an electronic apparatus, wherein one of the accessory and a body of the electronic apparatus includes a first attachment part opposed to the other of the accessory and the body, the first attachment part comprising:

a first screw portion;

a first electrical connection part; and a first engagement part, wherein the other of the accessory and the body includes a second attachment part opposed to the one of the accessory and the body, the second attachment part comprising:

a second screw portion for being screwed with the first screw portion;

a second electrical connection part for being electrically connected to the first electrical connection part; and a second engagement part for being engaged with the first engagement part, wherein one of the first electrical connection part and the second electrical connection part is formed by a plurality of traces of a contact pattern, which are concentrically formed at predetermined spaced intervals from the center of the attachment part where the one of the first electrical connection part and the second electrical connection part is disposed, wherein the other of the first electrical connection part and the second electrical connection part is formed by a plurality of contact pins arranged in a line in a radial direction at the same intervals as those of the plurality of traces of the contact pattern, and wherein when the first screw portion and the second screw portion are screwed with each other, the first engagement part and the second engagement part are engaged with each other and the first electrical connection part and the second electrical connection part are electrically connected to each other.

* * * * *